(12) United States Patent
Shinohara

(10) Patent No.: US 9,679,908 B2
(45) Date of Patent: Jun. 13, 2017

(54) METHOD OF MANUFACTURING SEMICONDUCTOR DEVICE

(71) Applicant: Renesas Electronics Corporation, Tokyo (JP)

(72) Inventor: Masaaki Shinohara, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/062,504

(22) Filed: Mar. 7, 2016

(65) Prior Publication Data
US 2016/0190144 A1 Jun. 30, 2016

Related U.S. Application Data

(63) Continuation of application No. 14/085,825, filed on Nov. 21, 2013, now Pat. No. 9,318,500.

(30) Foreign Application Priority Data

Feb. 12, 2013 (JP) ................................ 2013-025005

(51) Int. Cl.
*H01L 21/336* (2006.01)
*H01L 27/1157* (2017.01)
(Continued)

(52) U.S. Cl.
CPC .... *H01L 27/1157* (2013.01); *H01L 21/28282* (2013.01); *H01L 27/11568* (2013.01);
(Continued)

(58) Field of Classification Search
CPC ......... H01L 21/28282; H01L 27/11568; H01L 27/1157; H01L 27/11573; H01L 27/11575; H01L 29/42344; H01L 29/792
(Continued)

(56) References Cited

U.S. PATENT DOCUMENTS 6,333,223 B1 12/2001 Moriwaki et al.
9,159,843 B2 10/2015 Saito et al.
(Continued)

FOREIGN PATENT DOCUMENTS

JP 2000-195966 7/2000
JP 2003-332463 11/2003
(Continued)

OTHER PUBLICATIONS

Japanese Office Action dated May 17, 2016, with English Translation; Application No. 2013-025005.

*Primary Examiner* — Kimberly Rizkallah
*Assistant Examiner* — Maria Ligai
(74) *Attorney, Agent, or Firm* — Young & Thompson

(57) ABSTRACT

Provided is a semiconductor device having improved performance. In a semiconductor substrate located in a memory cell region, a memory cell of a nonvolatile memory is formed while, in the semiconductor substrate located in a peripheral circuit region, a MISFET is formed. At this time, over the semiconductor substrate located in the memory cell region, a control gate electrode and a memory gate electrode each for the memory cell are formed first. Then, an insulating film is formed so as to cover the control gate electrode and the memory gate electrode. Subsequently, the upper surface of the insulating film is polished to be planarized. Thereafter, a conductive film for the gate electrode of the MISFET is formed and then patterned to form a gate electrode or a dummy gate electrode for the MISFET in the peripheral circuit region.

11 Claims, 86 Drawing Sheets

(51) Int. Cl.
*H01L 29/423* (2006.01)
*H01L 29/792* (2006.01)
*H01L 27/11568* (2017.01)
*H01L 27/11573* (2017.01)
*H01L 27/11575* (2017.01)
*H01L 21/28* (2006.01)
*H01L 29/66* (2006.01)

(52) U.S. Cl.
CPC .. *H01L 27/11573* (2013.01); *H01L 27/11575* (2013.01); *H01L 29/42344* (2013.01); *H01L 29/66537* (2013.01); *H01L 29/66545* (2013.01); *H01L 29/66833* (2013.01); *H01L 29/792* (2013.01)

(58) Field of Classification Search
USPC ......... 438/267, 283, 261; 257/326, E21.179, 257/E21.18, E21.423
See application file for complete search history.

(56) References Cited

U.S. PATENT DOCUMENTS

| | | |
|---|---|---|
| 2001/0031535 A1 | 10/2001 | Agnello et al. |
| 2006/0286749 A1* | 12/2006 | Tseng ............ H01L 27/105 438/261 |
| 2008/0283900 A1* | 11/2008 | Nakagawa ...... H01L 27/105 257/321 |
| 2012/0299084 A1 | 11/2012 | Saito et al. |
| 2013/0267074 A1* | 10/2013 | Hall ................ H01L 21/82 438/299 |
| 2013/0334584 A1 | 12/2013 | Tang et al. |

FOREIGN PATENT DOCUMENTS

| | | |
|---|---|---|
| JP | 2011049282 | 3/2011 |
| JP | 2011-187562 | 9/2011 |
| JP | 2012248652 | 12/2012 |

* cited by examiner

| APPLIED VOLTAGE OPERATION | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

METHOD OF MANUFACTURING SEMICONDUCTOR DEVICE

BACKGROUND

The present invention relates to a method of manufacturing a semiconductor device which can be applied appropriately to a method of manufacturing a semiconductor device including, e.g., a nonvolatile memory.

As an electrically writable/erasable nonvolatile semiconductor memory device, an EEPROM (Electrically Erasable and Programmable Read Only Memory) has been used widely. Such a memory device represented by a currently widely used flash memory has, under the gate electrode of a MISFET, a conductive floating gate electrode or a trapping insulating film surrounded by an oxide film. A charge stored state in the floating gate or the trapping insulating film is used as stored information, which is read out as the threshold of the transistor. The trapping insulating film indicates an insulating film capable of storing therein charges. Examples of the trapping insulating film that can be mentioned include a silicon nitride film. By the injection/release of charges into/from such a charge storage region, the threshold of the MISFET is shifted to cause the MISFET to function as a memory element. Examples of the flash memory include a split-gate cell using a MONOS (Metal-Oxide-Nitride-Oxide-Semiconductor) film. In such a memory, a silicon nitride film is used as a charge storage region to provide such advantages that, due to discrete storage of charges therein, the data retention reliability thereof is higher than that of a conductive floating gate film, that the higher data retention reliability allows reductions in the thicknesses of oxide films over and under the silicon nitride film, and that a voltage for a write/erase operation can be reduced.

Each of Japanese Unexamined Patent Publications Nos. 2003-332463 (Patent Document 1), 2000-195966 (Patent Document 2), and 2011-187562 (Patent Document 3) discloses a technique related to a nonvolatile semiconductor memory device.

RELATED ART DOCUMENTS

Patent Documents

[Patent Document 1]
Japanese Unexamined Patent Publication No. 2003-332463
[Patent Document 2]
Japanese Unexamined Patent Publication No. 2000-195966
[Patent Document 3]
Japanese Unexamined Patent Publication No. 2011-187562

SUMMARY

In a semiconductor device having a nonvolatile memory also, it is desired to maximally improve the performance thereof. Alternatively, it is desired to improve the manufacturing yield of the semiconductor device or achieve both the maximal performance improvement and the manufacturing yield improvement.

Other problems and novel features of the present invention will become apparent from a statement in the present specification and the accompanying drawings.

According to an embodiment, in a method of manufacturing a semiconductor device including a memory cell of a nonvolatile memory formed in a semiconductor substrate located in a first region, and a MISFET formed in the foregoing semiconductor substrate located in a second region, a gate electrode for the foregoing memory cell is formed first over the foregoing semiconductor substrate located in the foregoing first region. Then, after a first insulating film is formed so as to cover the foregoing gate electrode for the memory cell, the upper surface of the foregoing first insulating film is polished to be planarized. Subsequently, a conductive film for the gate electrode of the foregoing MISFET is formed and then patterned to form the gate electrode for the foregoing MISFET in the foregoing second region. Thereafter, the foregoing first insulating film is removed.

Also, according to the embodiment, in a method of manufacturing a semiconductor device including a memory cell of a nonvolatile memory formed in a semiconductor substrate located in a first region, and a MISFET formed in the foregoing semiconductor substrate located in a second region, a gate electrode for the foregoing memory cell is formed first over the foregoing semiconductor substrate located in the foregoing first region. Then, after a first insulating film is formed so as to cover the foregoing gate electrode for the memory cell, the upper surface of the foregoing first insulating film is polished to be planarized. Subsequently, a first conductive film is formed and then patterned to form a dummy gate electrode for forming the gate electrode of the foregoing MISFET in the foregoing second region. Then, after the foregoing first insulating film is removed, over the foregoing semiconductor substrate, a second insulating film is formed so as to cover the foregoing gate electrode for the memory cell and the foregoing dummy gate electrode, and then the upper surface of the foregoing second insulating film is polished to expose the foregoing dummy gate electrode. Thereafter, at least one part of the foregoing dummy gate electrode is removed and then a second conductive film is embedded in a region from which the foregoing dummy gate electrode has been removed to form the gate electrode of the foregoing MISFET.

According to the embodiment, it is possible to improve the performance of the semiconductor device. Alternatively, it is possible to improve the manufacturing yield of the semiconductor device or achieve both the maximal performance improvement and the manufacturing yield improvement.

DETAILED DESCRIPTION

Figure 1:
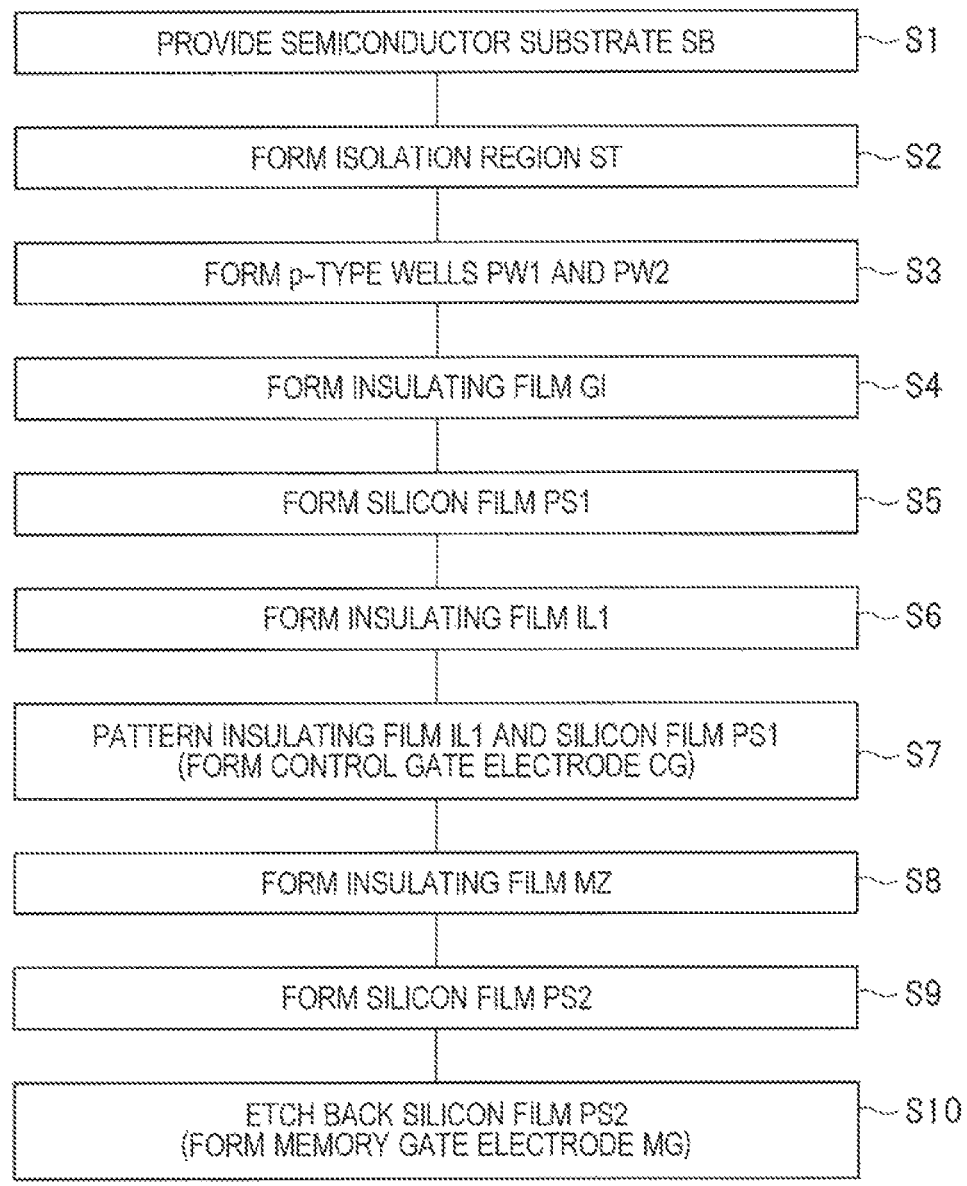
FIG. 1 is a process flow chart showing a part of the manufacturing process of a semiconductor device as an embodiment.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, details, supplementary explanation, and so forth of part or the whole of the others. Also in the following embodiments, when the number and the like (including the number, numerical value, amount, range, and the like) of elements are mentioned, they are not limited to the mentioned numbers unless particularly explicitly described otherwise or unless they are obviously limited to specific numbers in principle. The number and the like of the elements may be not less than or not more than the mentioned numbers. Also in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

Hereinbelow, the embodiments will be described in detail based on the drawings. Note that, throughout all the drawings for illustrating the embodiments, members having the same functions are designated by the same reference numerals, and the repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

Embodiment 1

A semiconductor device of each of the present and following embodiments is a semiconductor device including a nonvolatile memory (nonvolatile memory element, flash memory, or nonvolatile semiconductor memory device). In each of the present and following embodiments, the nonvolatile memory will be described based on a memory cell based on an n-channel MISFET (Metal Insulator Semiconductor Field Effect Transistor). In each of the present and following embodiments, a polarity (the polarity of a voltage applied during a write/erase/read operation or the polarity of a carrier) is for illustrating the operation of the memory cell when it is based on the n-channel MISFET. When the memory cell is based on a p-channel MISFET, by inverting all the polarities including the conductivity types of an applied potential and a carrier, the same operation can be obtained in principle.

Referring to the drawings, a method of manufacturing a semiconductor device of the present embodiment will be described.

FIGS. 1 to 4 are process flow charts each showing a part of the manufacturing process of the semiconductor device in the present embodiment. FIGS. 5 to 35 are main-portion cross-sectional views of the semiconductor device in the present embodiment during the manufacturing process thereof. Note that, as the cross-sectional view of each of FIGS. 5 to 9 and FIGS. 11 to 35, the main-portion cross-sectional view of a memory cell region 1A and a peripheral circuit region 1B is shown, in which a memory cell MC is formed in the memory cell region 1A and a MISFET is formed in the peripheral circuit region 1B. FIG. 10 is a partially enlarged cross-sectional view of FIG. 9, in which a part of the memory cell region 1A is shown in enlarged relation.

Note that the memory cell region 1A is an area in a semiconductor substrate SB where the memory cell MC of a nonvolatile memory is to be formed, and the peripheral circuit region 1B is an area in the semiconductor substrate B where a peripheral circuit is to be formed. The memory cell region 1A and the peripheral circuit region 1B exist in the same semiconductor substrate SB.

Here, the peripheral circuit is a circuit other than the nonvolatile memory. Examples of the peripheral circuit include a processor such as a CPU, a control circuit, a sense amplifier, a column decoder, a row decoder, and an input/output circuit. The MISFET formed in the peripheral circuit region 1B is a MISFET for the peripheral circuit.

In the present embodiment, a description will be given of the case where the n-channel MISFETs (a control transistor and a memory transistor) are formed in the memory cell region 1A. However, it is also possible to invert the conductivity type and form p-channel MISFETs (the control transistor and the memory transistor) in the memory cell region 1A. Likewise, in the present embodiment, a description will be given of the case where the n-channel MISFET is formed in the peripheral circuit region 1B, but it is also possible to invert the conductivity type and form a p-channel MISFET in the peripheral circuit region 1B. Alternatively, it is also possible to form a CMISFET (Complementary MISFET) or the like in the peripheral circuit region 1B.

Figure 5:
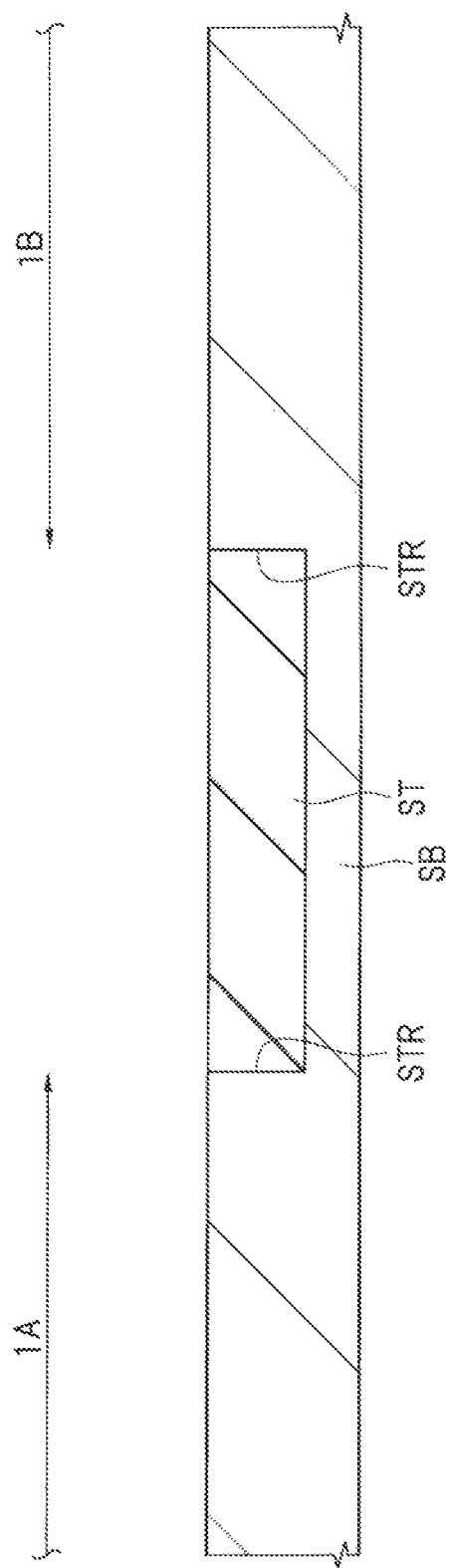
FIG. 5 is a main-portion cross-sectional view of the semiconductor device in the embodiment during the manufacturing process thereof.

As shown in FIG. 5, the semiconductor substrate (semiconductor wafer) SB made of p-type monocrystalline silicon having a specific resistance of, e.g., about 1 to 10 $\Omega$m is provided (prepared) first (Step S1 in FIG. 1). Then, in the main surface of the semiconductor substrate SB, an isolation region (inter-element isolation region) ST for defining (delineating) an active region is formed (Step S2 in FIG. 1).

The isolation region ST is made of an insulator such as a silicon oxide and can be formed by a STI (Shallow Trench Isolation) method, a LOCOS (Local Oxidization of Silicon) method, or the like. For example, the isolation region ST can be formed by, e.g., forming a trench STR for isolation in the main surface of the semiconductor substrate SB, and then embedding an insulating film made of, e.g., a silicon oxide in the trench STR for isolation. More specifically, after the trench STR for isolation is formed in the main surface of the semiconductor substrate SB, an insulating film (e.g., a silicon oxide film) for forming the isolation region is formed over the semiconductor substrate SB so as to fill the trench STR for isolation. Then, by removing the insulating film (insulating film for forming the isolation region) located outside the trench STR for isolation, the isolation region ST made of the insulating film embedded in the trench STR for isolation can be formed.

In the main surface of the semiconductor substrate SB, between the memory cell region 1A and the peripheral circuit region 1B, the isolation region ST is formed. This allows the memory cell region 1A and the peripheral circuit region 1B to serve as regions electrically isolated from each other.

Figure 6:
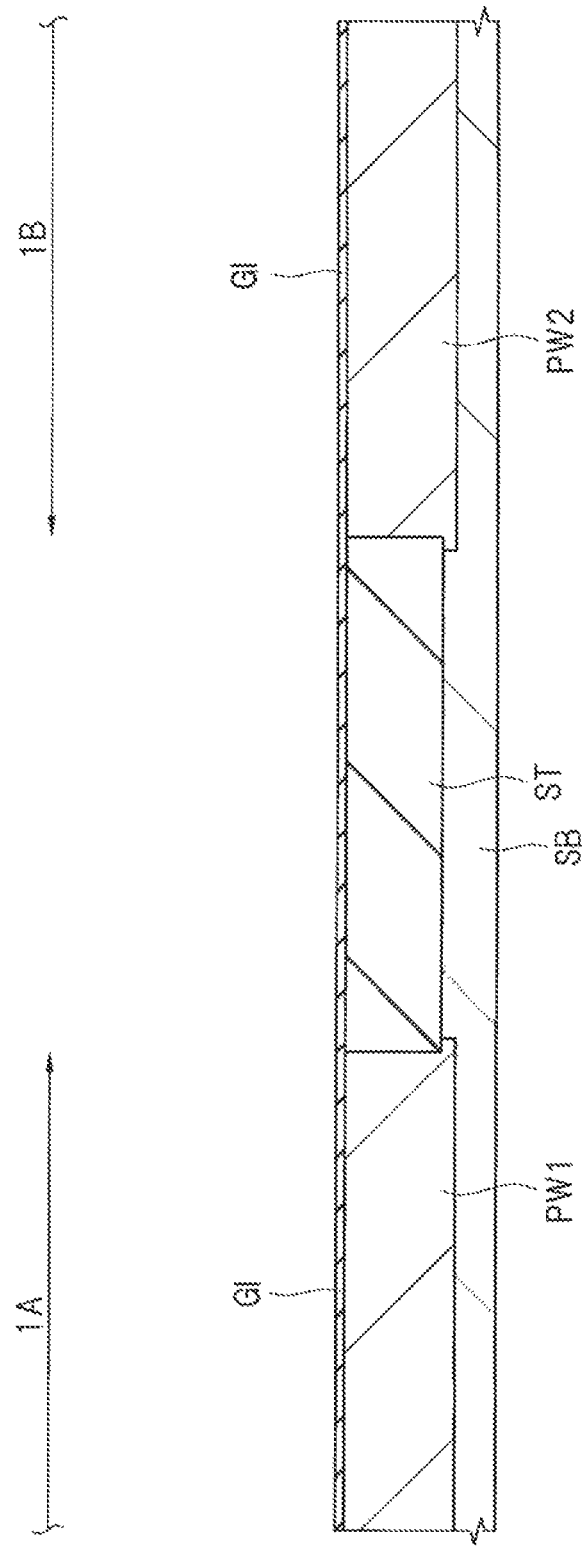
FIG. 6 is a main-portion cross-sectional view of the semiconductor device during the manufacturing process thereof, which is subsequent to FIG. 5.

Next, as shown in FIG. 6, a p-type well PW1 is formed in the semiconductor substrate SB located in the memory cell region 1A, while a p-type well PW2 is formed in the semiconductor substrate SB located in the peripheral circuit region 1B (Step S3 in FIG. 1). The p-type wells PW1 and PW2 can be formed by ion-implanting a p-type impurity such as, e.g., boron (B) into the semiconductor substrate SB. The p-type wells PW1 and PW2 are formed at predetermined depths from the main surface of the semiconductor substrate SB. Since the p-type wells PW1 and PW2 have the same conductivity type, the p-type wells PW1 and PW2 may also be formed in the same ion implantation step or in different ion implantation steps.

Next, to control the threshold voltage of the control transistor formed later in the memory cell region 1A, channel doping ion implantation is performed as necessary with respect to the surface portion (surface layer portion) of the p-type well PW1 in the memory cell region 1A. Also, to adjust the threshold voltage of the n-channel MISFET formed later in the peripheral circuit region 1B, channel doping ion implantation is performed as necessary with respect to the surface portion (surface layer portion) of the p-type well PW2 in the peripheral circuit region 1B.

Next, by diluted hydrofluoric acid cleaning or the like, the surface of the semiconductor substrate SB (p-type wells PW1 and PW2) is cleaned. Then, over the main surface of the semiconductor substrate SB (the surfaces of the p-type wells PW1 and PW2), an insulating film GI1 for a gate insulating film is formed (Step S4 in FIG. 1).

The insulating film GI can be formed of, e.g., a thin silicon oxide film, a thin silicon oxynitride film, or the like. When the insulating film GI is a silicon oxide film, the insulating film GI can be formed by, e.g., a thermal oxidation method. When the insulating film GI is a silicon oxynitride film, the insulating film GI can be formed by, e.g., a rapid thermal oxidation method using $N_2O$, $O_2$, and $H_2$, a method which forms a silicon oxide film by a thermal oxidation method and then performs nitridation treatment (plasma nitridation) thereon in a plasma, or the like. The insulating film GI can be formed to a thickness of, e.g., about 2 to 3 nm.

Note that, in FIG. 6, the case is shown where the insulating film GI is formed not only over the substrate region (Si substrate region) of the semiconductor substrate SB, but also over the isolation region ST. However, when the insulating film GI is formed by a thermal oxidation method, the insulating film GI is formed over the substrate region (Si substrate region) of the semiconductor substrate SB, but is not formed over the isolation region ST.

Figure 7:
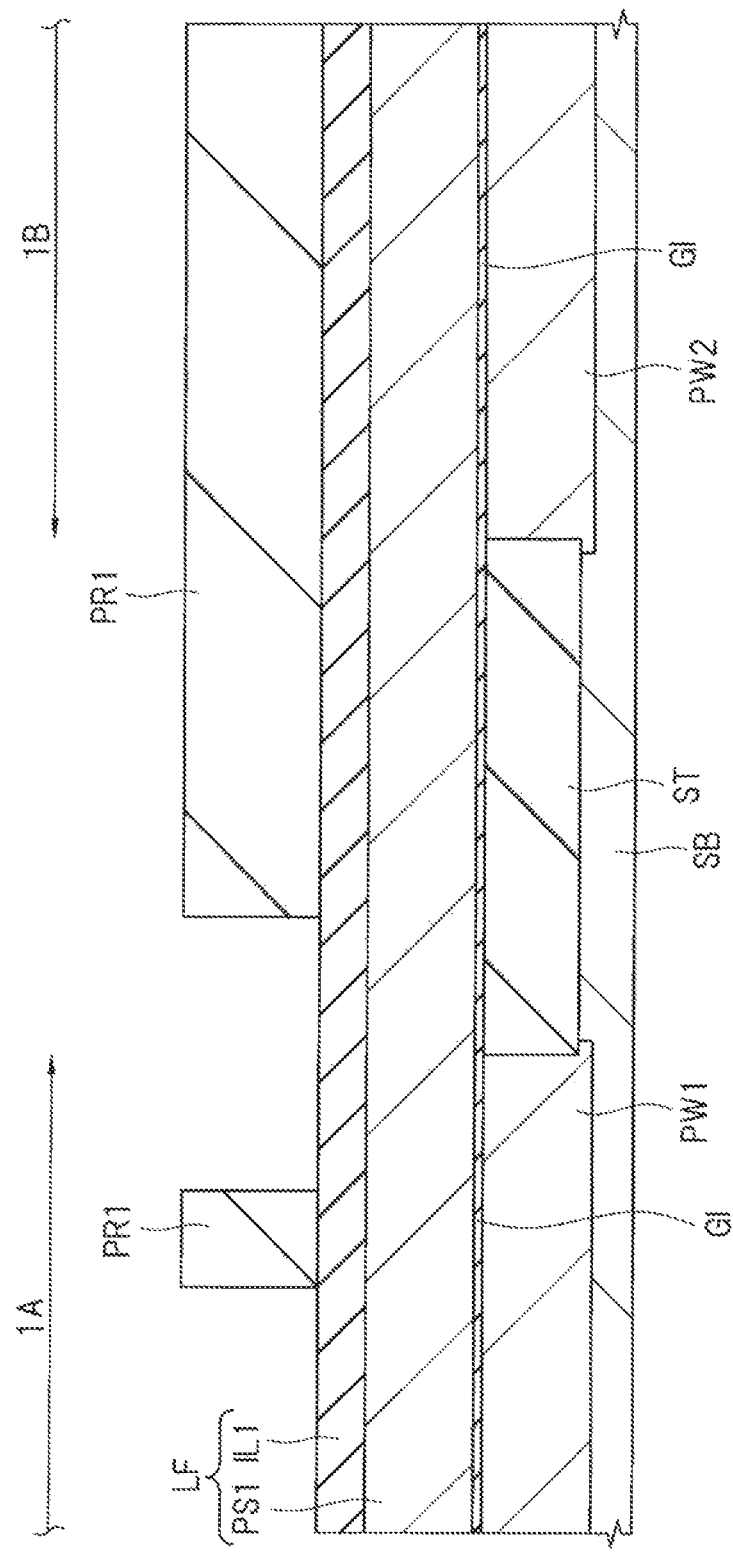
FIG. 7 is a main-portion cross-sectional view of the semiconductor device during the manufacturing process thereof, which is subsequent to FIG. 6.

Next, as shown FIG. 7, over the main surface (entire main surface) of the semiconductor substrate SB, i.e., over the insulating film GI located in the memory cell region 1A and the peripheral circuit region 1B, a silicon film PS1 is formed (deposited) as a conductive film for forming a control gate electrode CG (Step S5 in FIG. 1).

The silicon film PS1 is a conductive film for the gate electrode of the control transistor, i.e., a conductive film for forming the control gate electrode CG described later. The silicon film PS1 is made of a polycrystalline silicon film (polysilicon film) and can be formed using a CVD (Chemical Vapor Deposition) method or the like. The silicon film PS1 can be deposited to a thickness of, e.g., about 50 to 100 nm. It is also possible to form the silicon film PS1 as an amorphous silicon film during the deposition thereof and then change the amorphous silicon film to a polycrystalline silicon film by the subsequent heat treatment. The silicon film PS1 can also be changed to a low-resistance semiconductor film (doped polysilicon film) through introduction of an impurity therein during the deposition thereof, ion implantation of an impurity therein after the deposition thereof, or the like. Preferably, the silicon film PS1 located in the memory cell region 1A is an n-type silicon film into which an n-type impurity such as phosphorous (P) or arsenic (As) has been introduced. The silicon film PS1 located in the peripheral circuit region 1B is removed later so that an n-type impurity may be or may not be introduced therein.

Next, over the main surface (entire main surface) of the semiconductor substrate SB, i.e., over the silicon film PS1, an insulating film IL1 is formed (deposited) (Step S6 in FIG. 1).

The insulating film IL1 is an insulating film for forming a cap insulating film CP described later. The insulating film IL1 is made of, e.g., a silicon nitride film or the like and can be formed using a CVD method or the like. The insulating film IL1 can be deposited to a thickness of, e.g., about 20 to 100 nm. By performing Steps S5 and S6, a state is reached where a laminated film LF of the silicon film PS1 and the insulating film IL1 over the silicon film PS1 is formed. Here, the laminated film LF includes the silicon film PS1 and the insulating film IL1 over the silicon film PS1.

Next, the insulating film IL1 and the silicon film PS1 are patterned using a photolithographic technique and an etching technique to form a laminated body (laminated structure) LM including the control gate electrode CG and the cap insulating film CP over the control gate electrode CG in the memory cell region 1A (Step S7 in FIG. 1).

Figure 8:
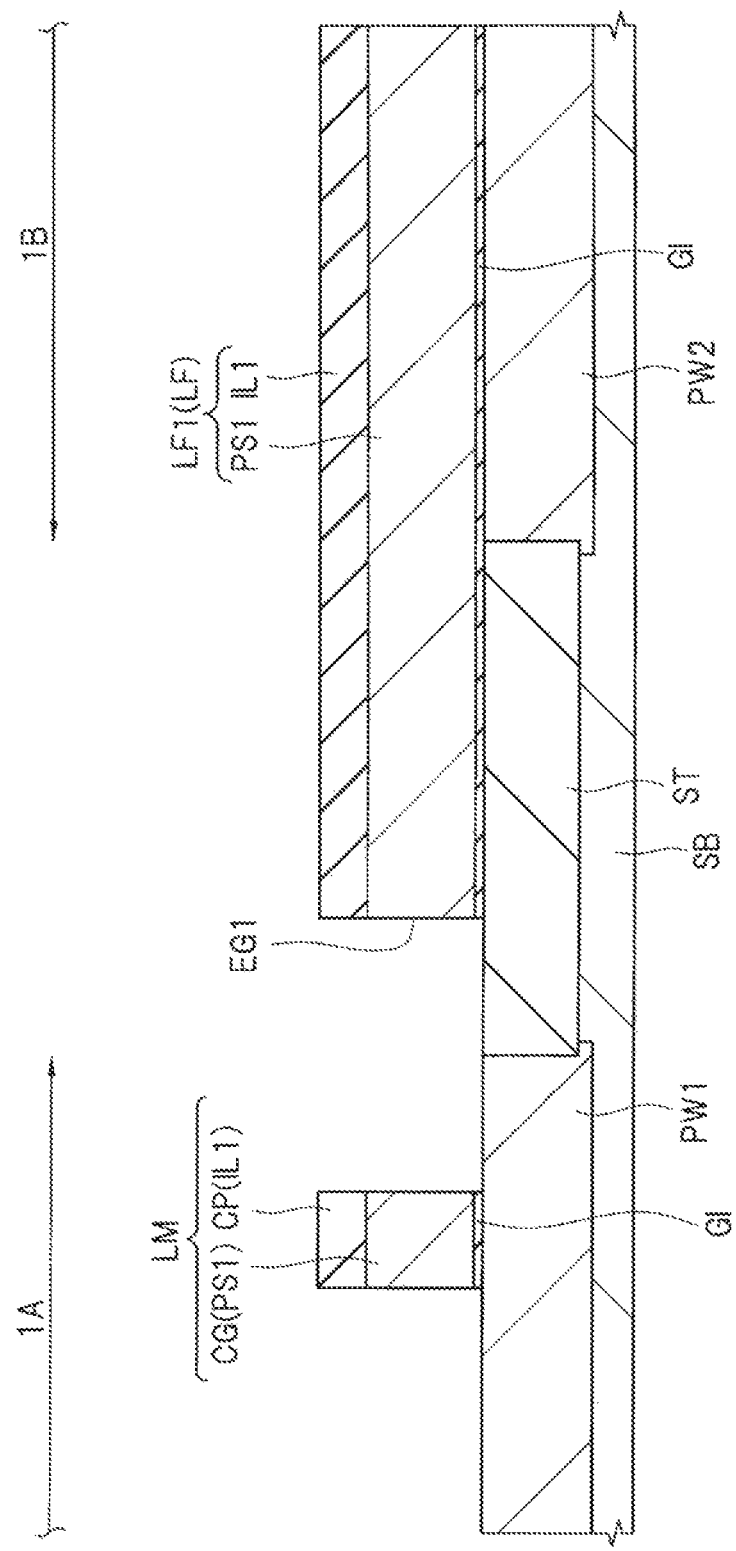
FIG. 8 is a main-portion cross-sectional view of the semiconductor device during the manufacturing process thereof, which is subsequent to FIG. 7.

Step S7 can be performed as follows. That is, as shown in FIG. 7, a photoresist pattern PR1 is formed first as a resist pattern over the insulating film IL1 using a photolithographic method. The photoresist pattern PR1 is formed in the area of the memory cell region 1A where the control gate electrode CG is to be formed and in the entire peripheral circuit region 1B. Then, using the photoresist pattern PR1 as an etching mask, the laminated film LF of the silicon film PS1 and the insulating film IL1 which are located in the memory cell region 1A is etched (preferably dry-etched) to be patterned. Subsequently, the photoresist pattern PR1 is removed. As a result, as shown in FIG. 8, the laminated body LM of the control gate electrode CG made of the patterned silicon film PS1 and the cap insulating film CP made of the patterned insulating film IL1 is formed.

In another form, the laminated body LM can also be formed as follows. First, over the insulating film IL1, the photoresist pattern RP1 is formed. Then, using the photoresist pattern PR1 as an etching mask, the insulating film IL1 is etched (preferably dry-etched) to be patterned, thereby forming the cap insulating film CP made of the patterned insulating film IL1 in the memory cell region 1A. Then, after the photoresist pattern RP1 is removed, using the insulating film IL1 including the cap insulating film CP as an etching mask (hard mask), the silicon film PS1 is etched (preferably dry-etched) to be patterned. As a result, the laminated body LM of the control gate electrode CG made of the patterned silicon film PS1 and the cap insulating film CP made of the patterned insulating film IL1 is formed.

The laminated body LM includes the control gate electrode CG and the cap insulating film CP over the control gate electrode CG and is formed over the semiconductor substrate SB (p-type well PW1) located in the memory cell region 1A via the insulating film GI. The control gate electrode CG and the cap insulating film CP have substantially the same two-dimensional shape in planar view and overlap each other in planar view.

In the memory cell region 1A, the photoresist pattern PR1 is formed selectively in the area thereof where the control gate electrode CG is to be formed. As a result, when Step S7 is performed, in the memory cell region 1A, the silicon film PS1 and the insulating film IL1 except for the portions thereof forming the laminated body LM are removed. On the other hand, in the peripheral circuit region 1B, the photoresist pattern PR1 is formed in the entire peripheral circuit region 1B. As a result, even when Step S7 is performed, in the peripheral circuit region 1B, the laminated film LF of the silicon film PS1 and the insulating film IL1 over the silicon film PS1 is not removed to consequently remain without being patterned. The laminated film LF remaining in the peripheral circuit region 1B will be denoted by a reference numeral LF1 and referred to as a laminated film LF1.

Preferably, a side surface (edge portion) EG1 of the laminated film LF1 is located over the isolation region ST. Thus, the active region (active region defined by the isolation region ST) in the peripheral circuit region 1B is consequently covered with the laminated film LF1. This can prevent the substrate region (Si substrate region) of the semiconductor substrate SB located in the peripheral circuit region 1B from being subjected to unneeded etching.

In the memory cell region 1A, the control gate electrode CG formed of the patterned silicon film PS1 is formed, which is a gate electrode for the control transistor. The insulating film GI remaining under the control gate electrode CG serves as the gate insulating film of the control transistor. As a result, in the memory cell region 1A, a state is reached where the control gate electrode CG made of the silicon film PS1 is formed over the semiconductor substrate SB (p-type well PW1) via the insulating film GI as the gate insulating film.

In the memory cell region 1A, the insulating film GI except for the portion thereof covered with the laminated body LM, i.e., the insulating film GI except for the portion thereof serving as the gate insulating film may be removed by dry etching performed in the patterning step in Step S7 or wet etching performed after the dry etching.

Thus, by Steps S4, S5, S6, and S7, over the semiconductor substrate SB, the laminated body LM including the control gate electrode CG and the cap insulating film CP over the control gate electrode CG is formed via the insulating film GI as the gate insulating film.

Note that, in the present embodiment, the description has been given of the case where the cap insulating film CP is formed over the control gate electrode CG. In another embodiment, the cap insulating film CP may not be formed over the control gate electrode CG. In this case, the step of forming the insulating film IL1 in Step S6 can be omitted and, in Step S7, the silicon film PS1 is patterned using the photoresist pattern PR1 as an etching mask. Thus, a state is achieved where, in the memory cell region 1A, the control gate electrode CG is formed over the semiconductor substrate SB via the insulating film GI, but the cap insulating film CP is not formed over the control gate electrode CG, while the silicon film PS1 remains in the entire peripheral circuit region 1B. However, in the case where the insulating film IL1 is formed, i.e., in the case where the cap insulating film CP is formed, the cap insulating film CP functions as a stopper film in the polishing treatment in Step S14. As a result, the advantage of allowing an improvement in processing accuracy can be obtained.

Next, to adjust the threshold voltage of the memory transistor formed later in the memory cell region 1A, channel doping ion implantation is performed as necessary with respect to the surface portion (surface layer portion) of the p-type well PW1 in the memory cell region 1A.

Next, cleaning treatment is performed to clean the main surface of the semiconductor substrate SB. Then, as shown in FIG. 9, an insulating film MZ for the gate insulating film of the memory transistor is formed over the entire main surface of the semiconductor substrate SB, i.e., over the main surface (top surface) of the semiconductor substrate SB and over the surfaces (upper surface and side surfaces) of the laminated body LM (Step S8 in FIG. 1).

In the peripheral circuit region 1B, the laminated film LF1 remains and therefore the insulating film MZ may be formed also over the surfaces (upper surface and side surfaces) of the laminated film LF1. Accordingly, in Step S8, the insulating film MZ is formed over the semiconductor substrate SB so as to cover the laminated body LM in the memory cell region 1A and the laminated film LF1 in the peripheral circuit region 1B.

The insulating film MZ is an insulating film for the gate insulating film of the memory transistor, which has a charge storage portion therein. The insulating film MZ is made of a laminated film of a silicon oxide film (oxide film) MZ1, a silicon nitride film (nitride film) MZ2 formed over the silicon oxide film MZ1, and a silicon oxide film (oxide film) MZ3 formed over the silicon nitride film MZ2. The laminated film of the silicon oxide film MZ1, the silicon nitride film MZ2, and the silicon oxide film MZ3 can also be regarded as an ONO (oxide-nitride-oxide) film.

Figure 9:
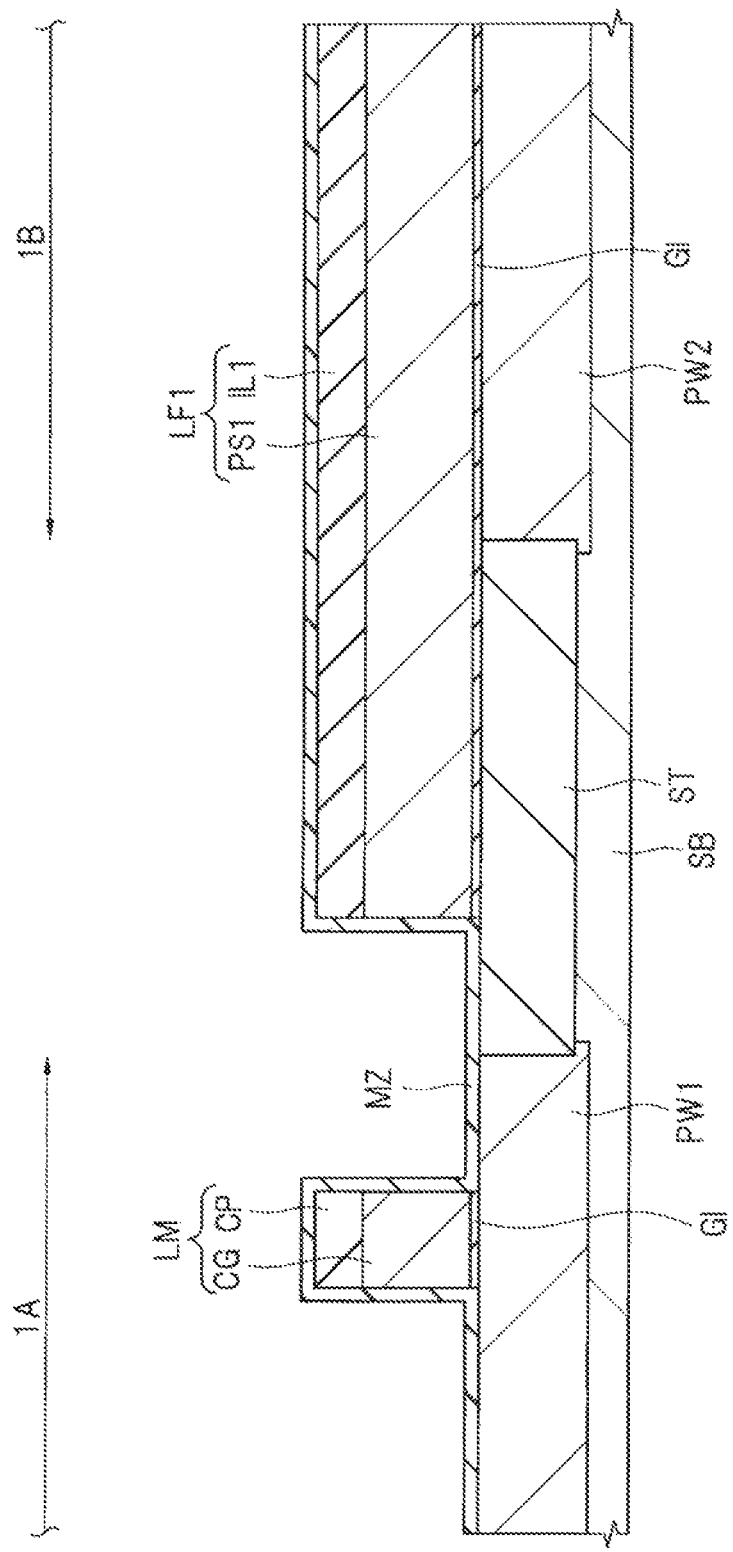
FIG. 9 is a main-portion cross-sectional view of the semiconductor device during the manufacturing process thereof, which is subsequent to FIG. 8.
Figure 10:
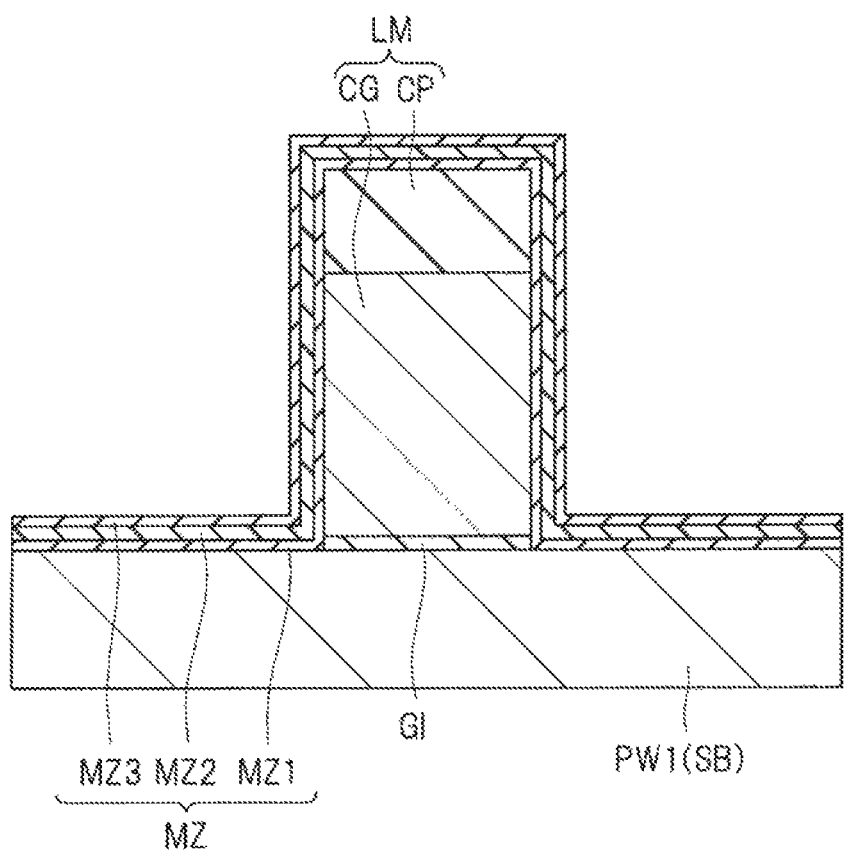
FIG. 10 is a partially enlarged cross-sectional view of FIG. 9.

Note that, for improved clarity of illustration, in FIG. 9, the insulating film MZ including the silicon oxide film MZ1, the silicon nitride film MZ2, and the silicon oxide film MZ3 is simply shown as the insulating film MZ. Actually, as shown in FIG. 10 which is a partially enlarged cross-sectional view of the memory cell region 1A in FIG. 9, the insulating film MZ includes the silicon oxide film MZ1, the silicon nitride film MZ2, and the silicon oxide film MZ3.

Of the insulating film MZ, the silicon oxide films MZ1 and MZ3 can be formed by, e.g., oxidation treatment (thermal oxidation treatment), a CVD method, or a combination thereof. At this time, as the oxidation treatment, ISSG (In Situ Steam Generation) oxidation can also be used. Of the insulating film MZ, the silicon nitride film MZ2 can be formed by, e.g., a CVD method.

In the present embodiment, as an insulating film (charge storage layer) having a trap level, the silicon nitride film MZ2 is formed. In terms of reliability or the like, a silicon nitride film is preferred, but the insulating film having a trap level is not limited to the silicon nitride film. For example, a high-dielectric-constant film having a dielectric constant higher than that of the silicon nitride film such as an aluminum oxide film (alumina), a hafnium oxide film, or a tantalum oxide film can also be used as the charge storage layer or charge storage portion. Alternatively, the charge storage layer or charge storage portion can also be formed of silicon nano-dots.

To form the insulating film MZ, for example, the silicon oxide film MZ1 is formed first by a thermal oxidation method (preferably by ISSG oxidation), and then the silicon nitride film MZ2 is deposited over the silicon oxide film MZ1 by a CVD method. Subsequently, over the silicon nitride film MZ2, the silicon oxide film MZ3 is further formed by a CVD method, thermal oxidation, or both thereof. In this manner, the insulating film MZ made of the laminated film of the silicon oxide film MZ1, the silicon nitride film MZ2, and the silicon oxide film MZ3 can be formed.

The thickness of the silicon oxide film MZ1 can be adjusted to, e.g., about 2 to 10 nm. The thickness of the silicon nitride film MZ2 can be adjusted to, e.g., about 5 to 15 nm. The thickness of the silicon oxide film MZ3 can be adjusted to, e.g., about 2 to 10 nm. The final oxide film, i.e., the silicon oxide film MZ3 in the uppermost layer of the insulating film MZ can also be formed as a high-breakdown-voltage film by, e.g., oxidizing the upper-layer portion of the nitride film (silicon nitride film MZ2 in the middle layer of the insulating film MZ).

The insulating film MZ functions as the gate insulating film of a memory gate electrode MG formed later and has a charge holding (charge storing) function. Accordingly, the insulating film MZ has a laminated structure of at least three layers so as to be able to function as the gate insulating film of the memory transistor having the charge holding function. The inner layer (which is the silicon nitride film MZ2 herein) of the insulating film MZ which functions as a charge storage portion has a potential barrier height lower than that of each of the outer layers (which are the silicon oxide films MZ1 and MZ3) thereof which functions as a charge blocking layer. This can be achieved by forming the insulating film MZ as the laminated film including the silicon oxide film MZ1, the silicon nitride film MZ2 over the silicon oxide film MZ1, and the silicon oxide film MZ3 over the silicon nitride film MZ2, as in the present embodiment.

Figure 11:
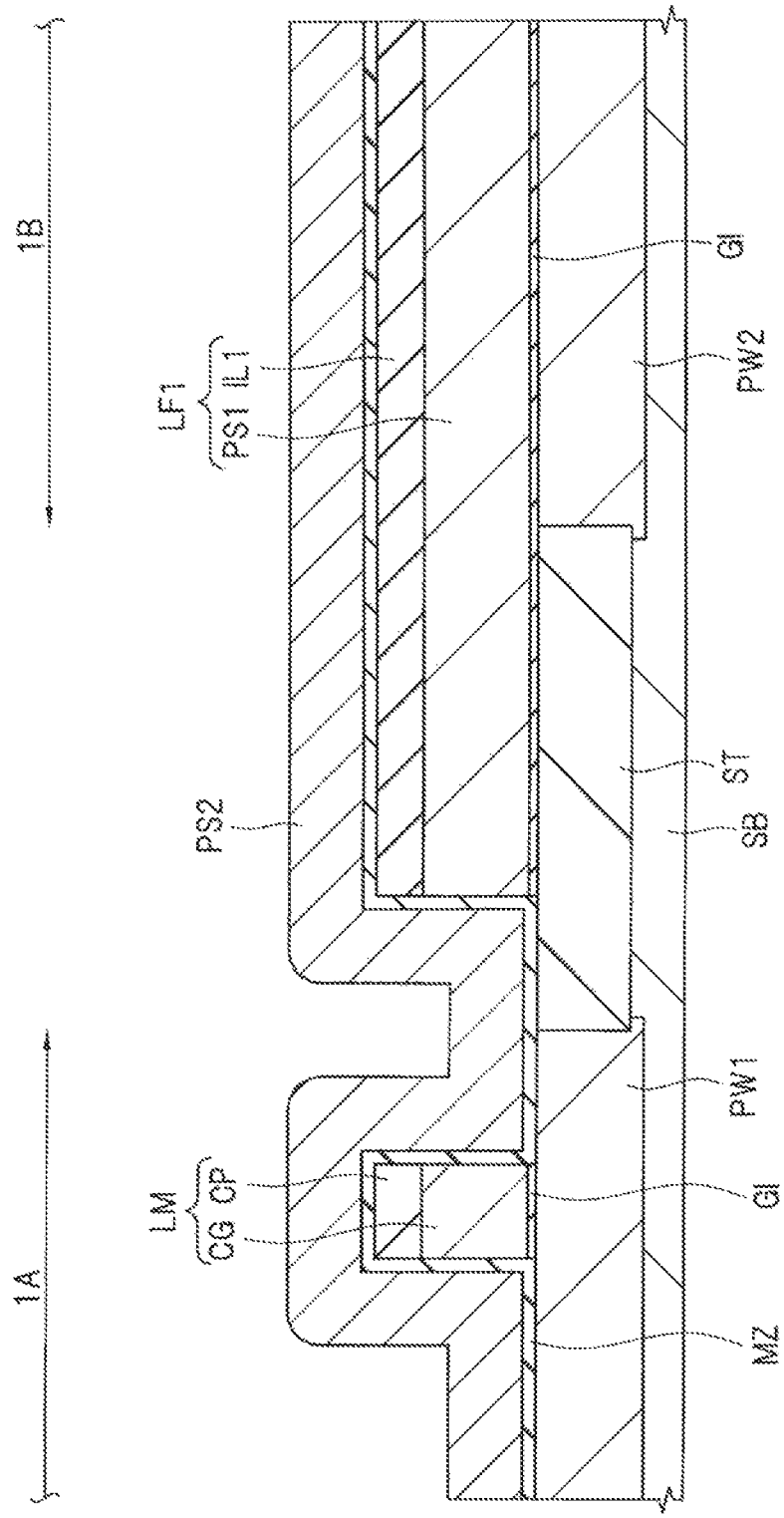
FIG. 11 is a main-portion cross-sectional view of the semiconductor device during the manufacturing process thereof, which is subsequent to FIG. 9.

Next, as shown in FIG. 11, over the main surface (entire main surface) of the semiconductor substrate SB, i.e., over the insulating film MZ, a silicon film PS2 is formed (deposited) as a conductive film for forming the memory gate electrode MG so as to cover the laminated body LM in the memory cell region 1A and cover the laminated film LF1 in the peripheral circuit region 1B (Step S9 in FIG. 1).

The silicon film PS2 is a conductive film for the gate electrode of the memory transistor, i.e., a conductive film for forming the memory gate electrode MG described later. The silicon film PS2 is made of a polycrystalline silicon film and can be formed using a CVD method or the like. The silicon film PS2 can be deposited to a thickness of, e.g., about 30 to 150 nm. It is also possible to form the silicon film PS2 as an amorphous silicon film during the deposition thereof and then change the amorphous silicon film to a polycrystalline silicon film by the subsequent heat treatment.

The silicon film PS2 has been changed to a low-resistance semiconductor film (doped polysilicon film) by introducing therein an impurity through impurity introduction during the deposition thereof, impurity ion implantation after the deposition thereof, or the like. Preferably, the silicon film PS2 is an n-type silicon film into which an n-type impurity such as phosphorus (P) or arsenic (As) has been introduced. When an n-type impurity is introduced into the silicon film PS2 during the deposition thereof, by causing a gas for depositing the silicon film PS2 to contain a doping gas (gas for adding an n-type impurity), the silicon film PS2 into which the n-type impurity has been introduced can be deposited. Preferably, an n-type impurity has been introduced into the silicon film PS2 located in the memory cell region 1A. However, the silicon film PS2 located in the peripheral circuit region 1B is removed later so that an n-type impurity may be or may not be introduced therein.

Next, using an anisotropic etching technique, the silicon film PS2 is etched back (etched, dry-etched, or anisotropically etched) (Step S10 in FIG. 1).

Figure 12:
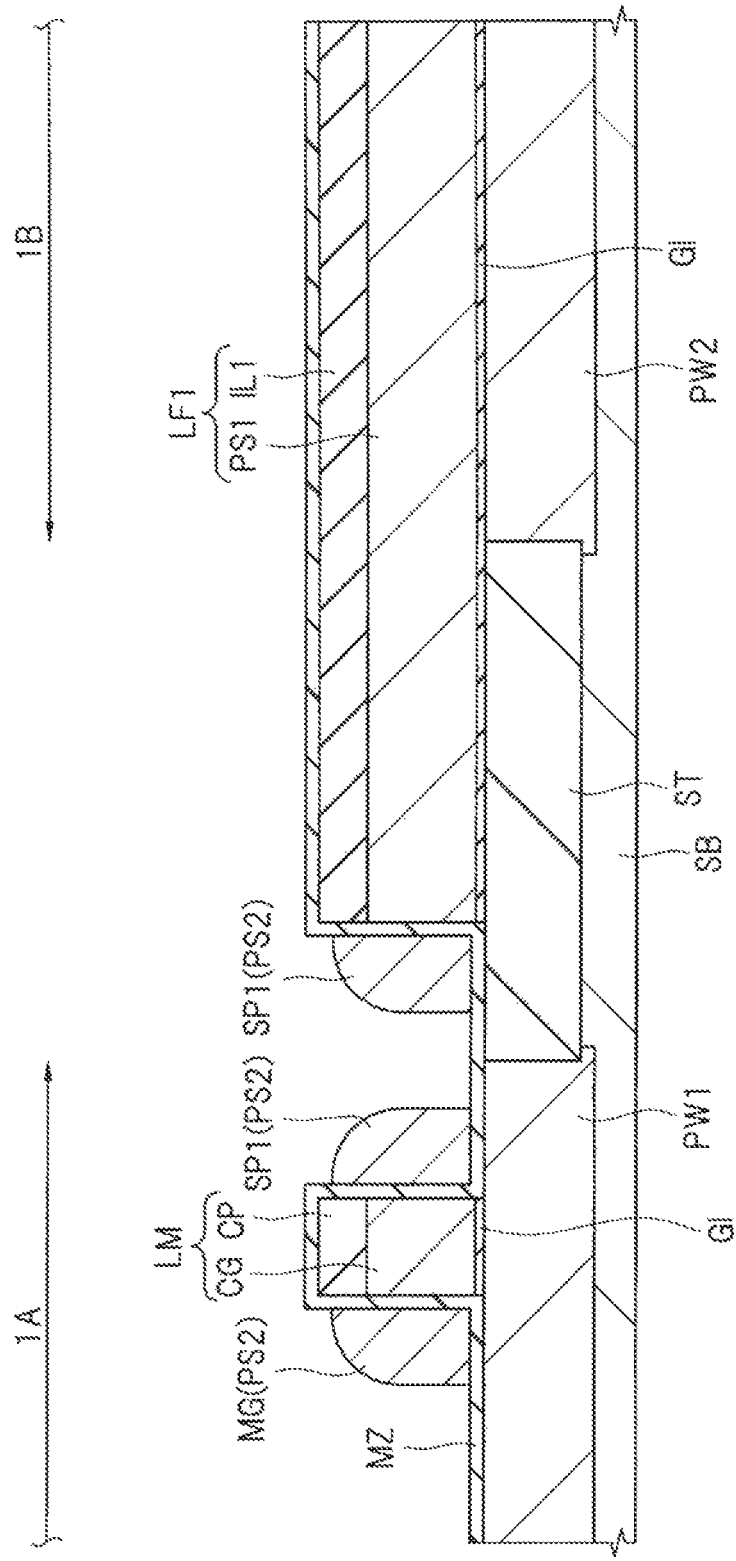
FIG. 12 is a main-portion cross-sectional view of the semiconductor device during the manufacturing process thereof, which is subsequent to FIG. 11.

In the etch-back step in Step S10, the silicon film PS2 is anisotropically etched (etched back) by the thickness to which the silicon film PS2 is deposited to leave the silicon film PS2 into the form of sidewall spacers over the both side walls of the laminated body LM via the insulating film MZ and remove the silicon film PS2 from the other region. As a result, as shown in FIG. 12, in the memory cell region 1A, the silicon film PS2 remaining in the form of the sidewall spacer over one of the both side walls of the laminated body LM via the insulating film MZ forms the memory gate electrode MG and the silicon film PS2 remaining in the form of the sidewall spacer over the other side wall via the insulating film MZ forms a silicon spacer SP1. The memory gate electrode MG is formed over the insulating film MZ so as to be adjacent to the laminated body LM via the insulating film MZ. Since the laminated body LM includes the control gate electrode CG and the cap insulating film CP over the control gate electrode CG, the memory gate electrode MG is consequently formed over the insulating film MZ via the insulating film MZ so as to be adjacent to the control gate electrode CG.

The silicon spacer SP1 can also be regarded as the sidewall spacer made of a conductor, i.e., a conductor spacer. The memory gate electrode MG and the silicon spacer SP1 are formed over the side walls of the laminated body LM opposite to each other and have substantially symmetrical configurations with the laminated body LM interposed therebetween. In addition, over the sidewall of the laminated film LF1 left in the peripheral circuit region 1B also, the silicon spacer SP1 may be formed via the insulating film MZ.

At the stage at which the etch-back step in Step S10 is performed, the memory gate electrode MG and the insulating film MZ located in the region uncovered with the spacer SP1 are exposed. Between the memory gate electrode MG formed in Step S10 and the semiconductor substrate SB (p-type well PW1) and between the memory gate electrode MG and the laminated body LM, the insulating film MZ is interposed. The insulating film MZ under the memory gate electrode MG in the memory cell region 1A serves as the gate insulating film of the memory transistor. By adjusting the thickness to which the silicon film PS2 is deposited in Step S9 described above, a memory gate length, i.e., the gate length of the memory gate electrode MG can be adjusted.

Figure 13:
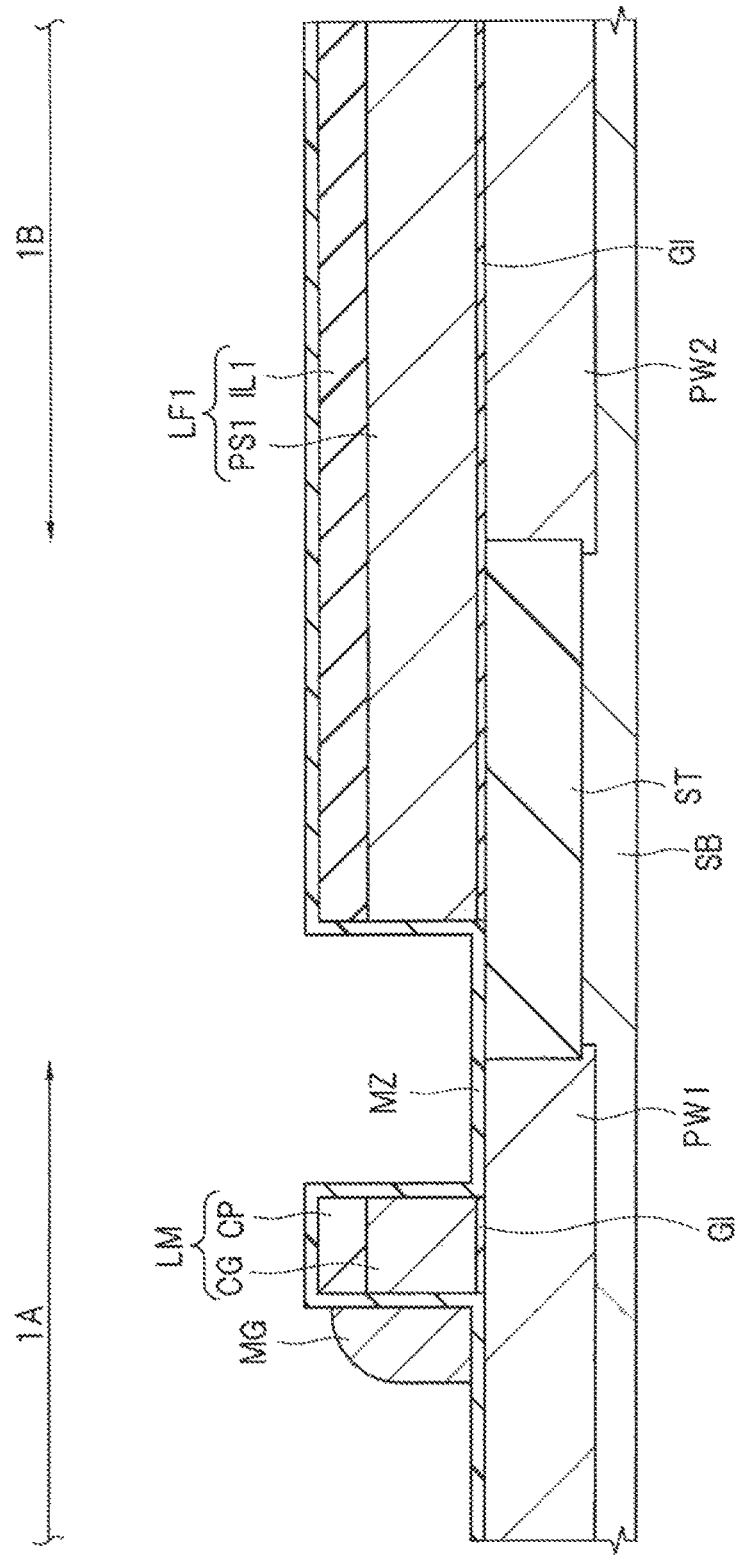
FIG. 13 is a main-portion cross-sectional view of the semiconductor device during the manufacturing process thereof, which is subsequent to FIG. 12.

Next, using a photolithographic technique, such a photoresist pattern (not shown) as to cover the memory gate electrode MG and expose the silicon spacers SP1 is formed over the semiconductor substrate SB. Then, by dry etching using the photoresist pattern as an etching mask, the silicon spacer SP1 is removed (Step S11 in FIG. 2). Thereafter, the photoresist pattern is removed. By the etching step in Step S11, as shown in FIG. 13, the silicon spacer SP1 is removed, while the memory gate electrode MG that has been covered with the photoresist pattern remains without being etched.

Figure 2:
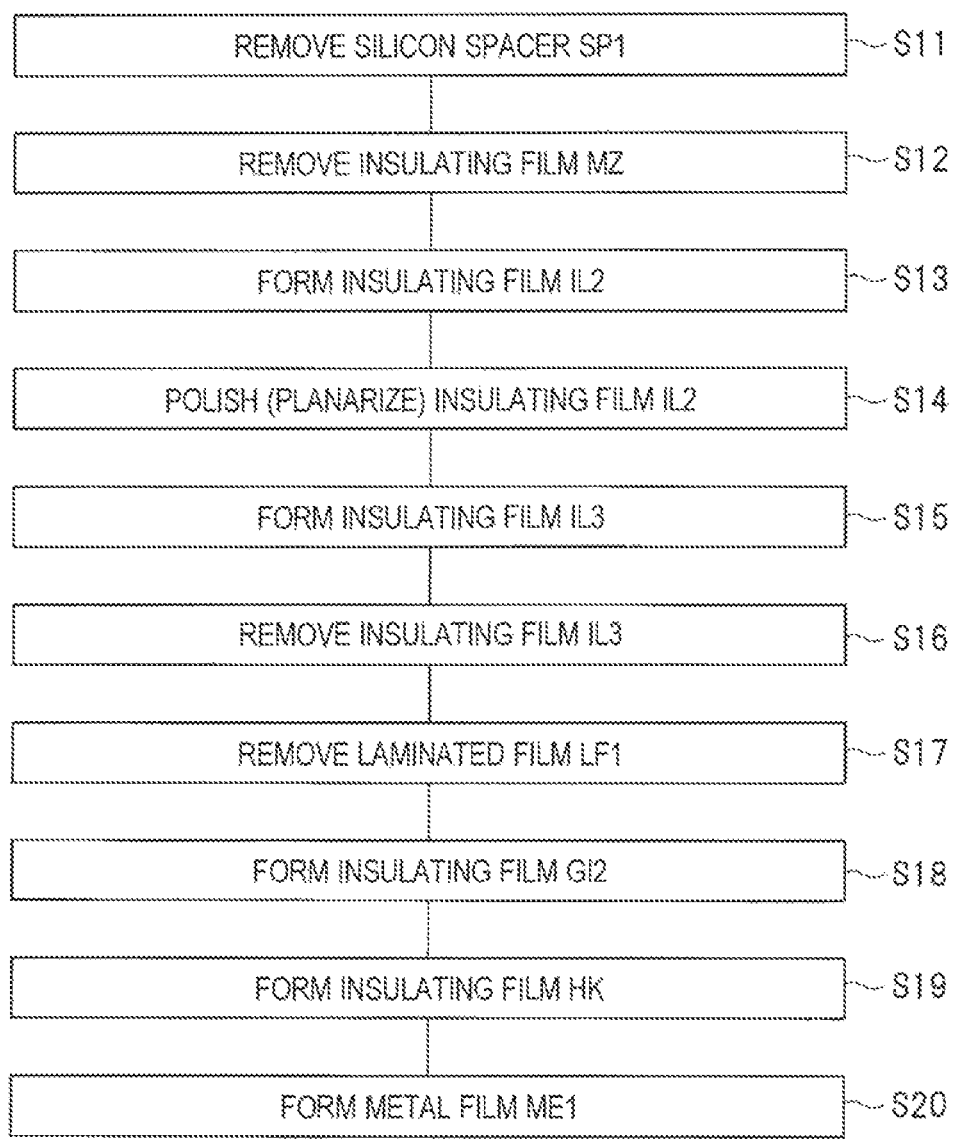
FIG. 2 is a process flow chart showing a part of the manufacturing process of the semiconductor device as the embodiment.
Figure 14:
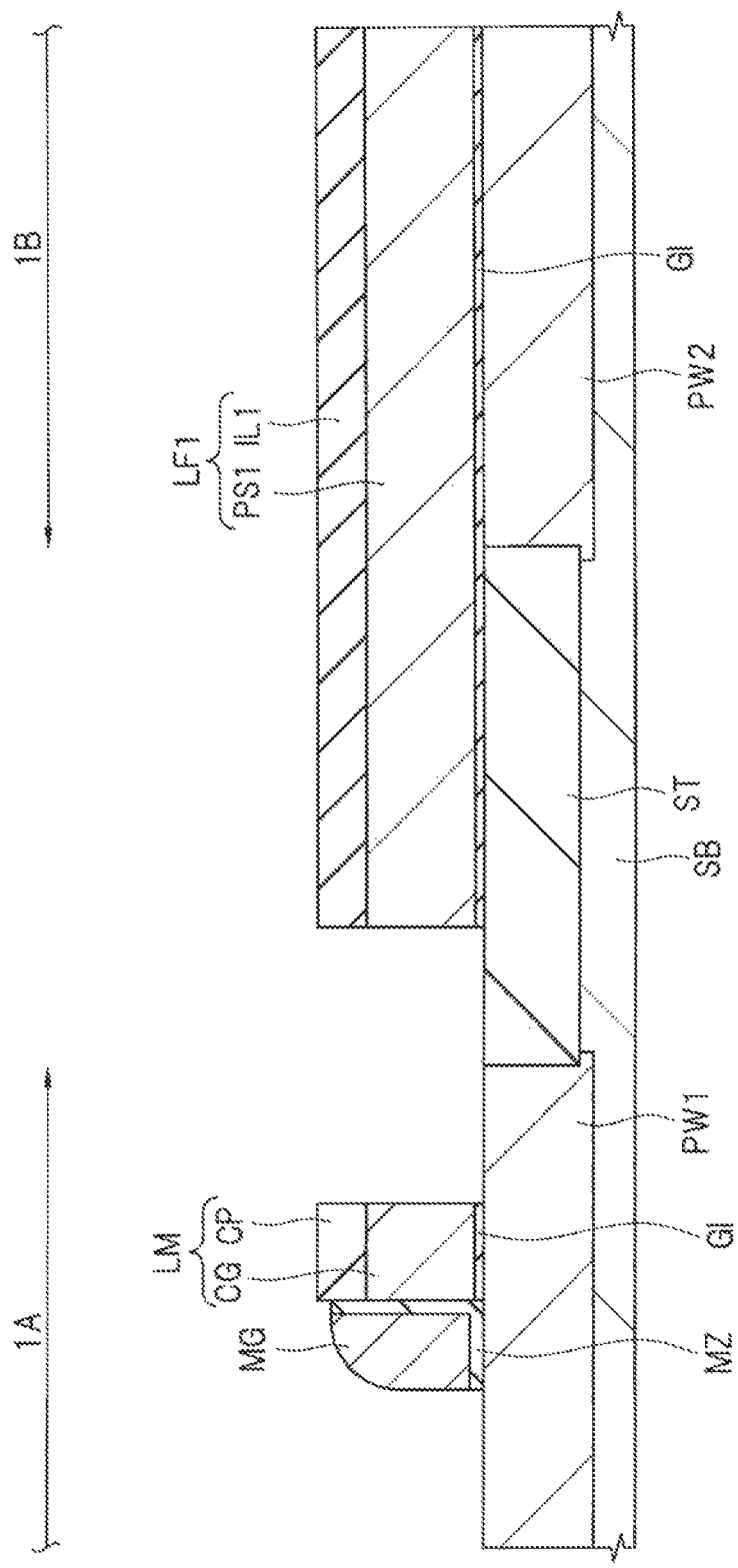
FIG. 14 is a main-portion cross-sectional view of the semiconductor device during the manufacturing process thereof, which is subsequent to FIG. 13.

Next, as shown in FIG. 14, of the insulating film MZ, the portion uncovered with the memory gate electrode MG and exposed is removed by etching (e.g., wet etching (Step S12 in FIG. 2). At this time, in the memory cell region 1A, the insulating film MZ located under the memory gate electrode MG and between the memory gate electrode MG and the laminated body LM remains without being removed, while the insulating film MZ located in the other region is removed. As can be also seen from FIG. 14, in the memory cell region 1A, the insulating film MZ extends continuously over the two areas which are the area between the memory gate electrode MG and the semiconductor substrate SB (p-type well PW1) and the area between the memory gate electrode MG and the laminated body LM.

Figure 15:
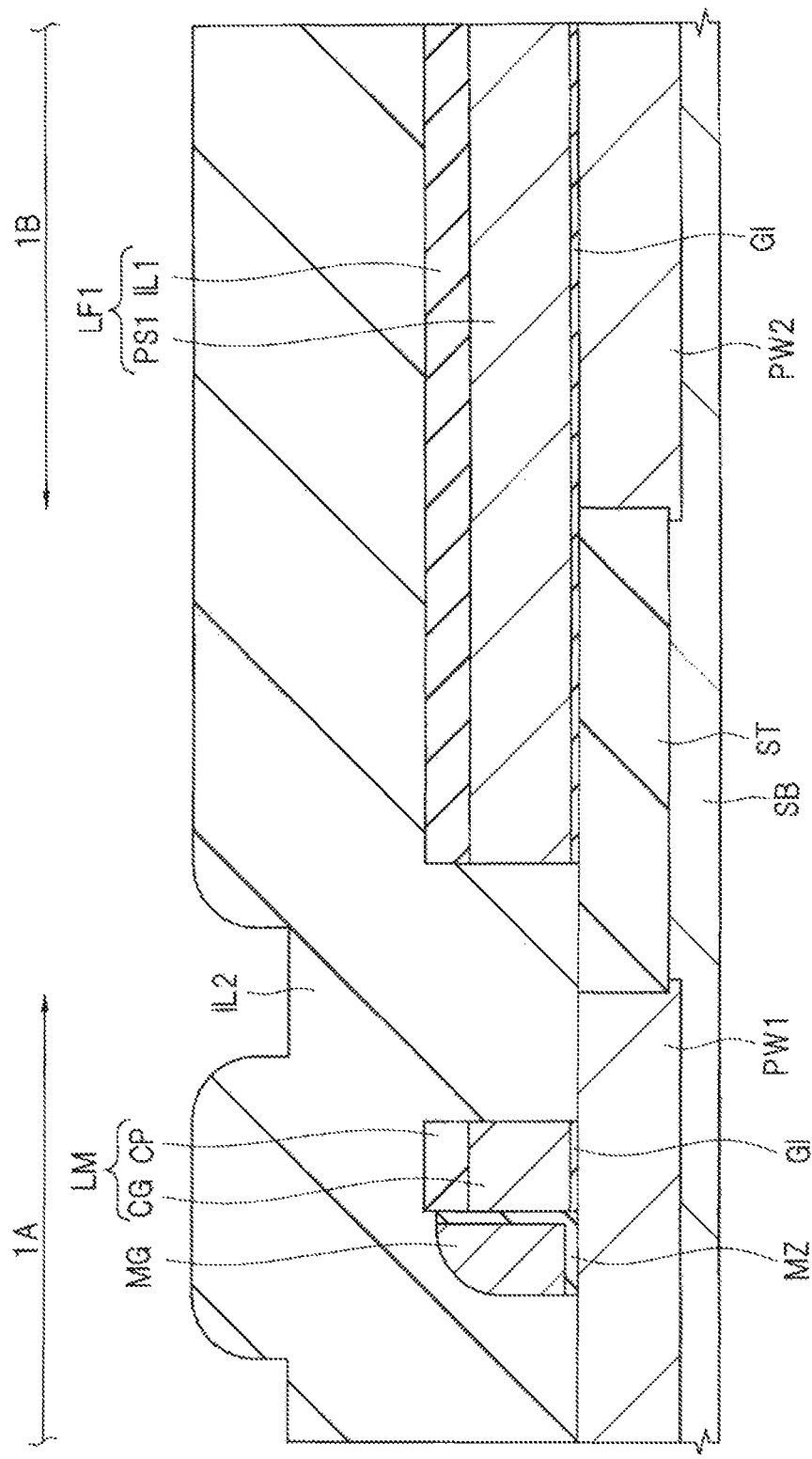
FIG. 15 is a main-portion cross-sectional view of the semiconductor device during the manufacturing process thereof, which is subsequent to FIG. 14.

Next, as shown in FIG. 15, over the entire main surface of the semiconductor substrate SB, an insulating film IL2 is formed (deposited) so as to cover the memory gate electrode MG, the laminated body LM, and the laminated film LF1 (Step S13 in FIG. 2)

In Step S13, in the memory cell region 1A, the thickness to which the insulating film IL2 is deposited is preferably set such that the upper surface of the insulating film IL2 over the portion of the semiconductor substrate SB uncovered with the laminated body LM is at a position higher than that of the upper surface of the laminated body LM. That is, when the insulating film IL2 is formed in Step S13, the upper surface of the insulating film IL2 is preferably set higher than the upper surface of the laminated body LM at any location in the memory cell region 1A. This can be achieved by, e.g., setting the thickness to which the insulating film IL2 is deposited such that it is larger than the height (thickness) of the laminated body LM. Note that, when the height is mentioned, it is assumed to refer to a height in a direction generally perpendicular to the main surface of the semiconductor substrate SB.

In the memory cell region 1A, the memory gate electrode MG and the laminated body LM have been formed so that the insulating film IL2 is formed over the semiconductor substrate SB so as to cover the memory gate electrode MG and the laminated body LM. In the peripheral circuit region 1B, the laminated film LF1 has been formed so that the insulating film IL2 is formed over the laminated body LM. At the stage at which the insulating film IL2 is deposited in Step S13, the upper surface of the insulating film IL2 is formed with roughness or stepped portions reflecting the memory gate electrode MG, the laminated body LM, and the laminated film LF1.

Preferably, the insulating film IL2 is made of an insulating material different from that of the insulating film IL1, and is therefore made of a material different from that of the cap insulating film CP. The insulating film IL2 is made of, e.g., a silicon oxide film or the like and can be formed using a CVD method or the like. Since substantially the entire insulating film IL2 is finally removed and specifically removed in Step S27 described later, the insulating film IL2 is preferably made of an insulating material which is easily removed later. From this viewpoint also, the insulating film IL2 is preferably made of a silicon oxide film.

Figure 16:
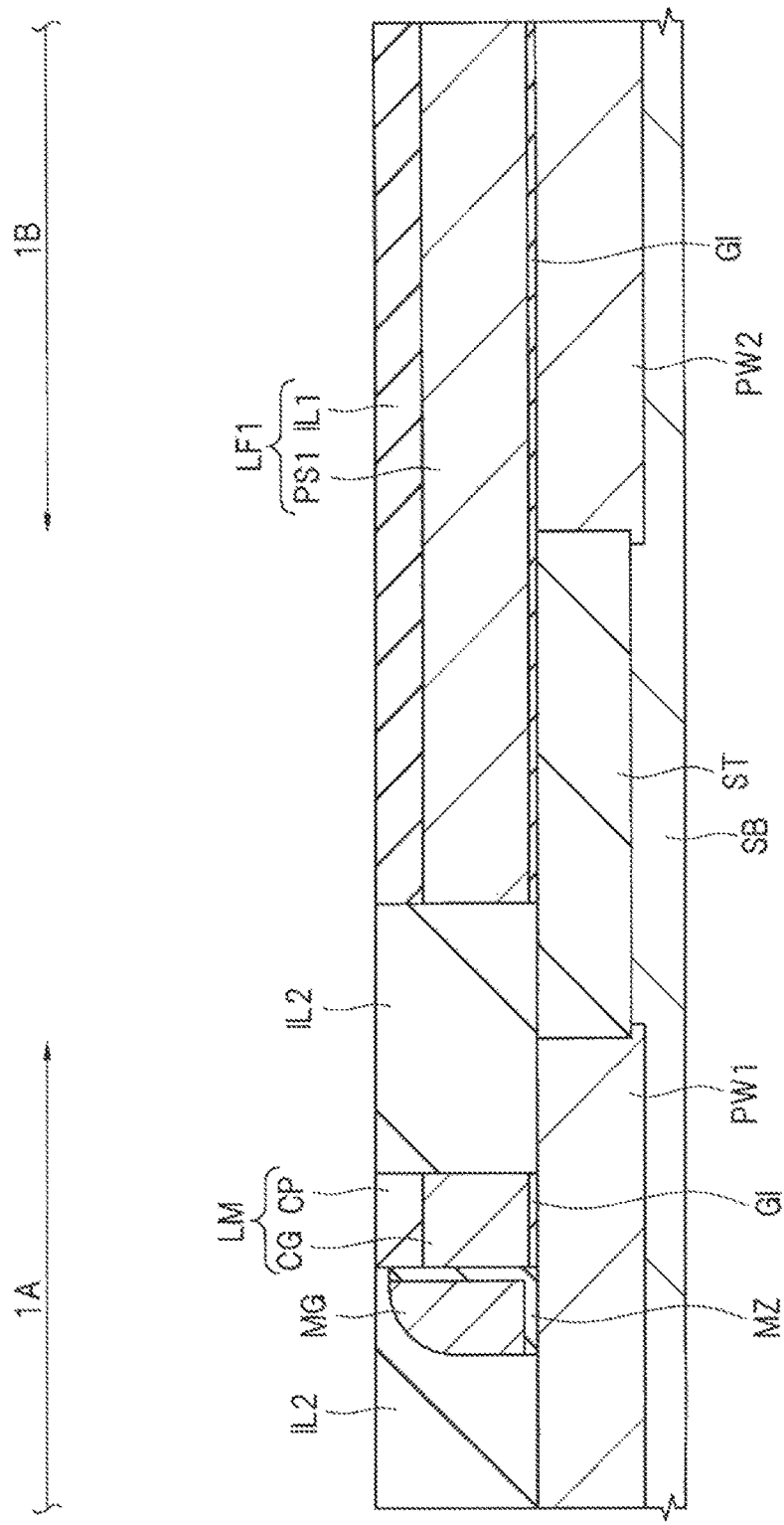
FIG. 16 is a main-portion cross-sectional view of the semiconductor device during the manufacturing process thereof, which is subsequent to FIG. 15.

Next, the upper surface of the insulating film IL2 is polished using a CMP (Chemical Mechanical Polishing) method or the like (Step S14 in FIG. 2). As a result, as shown in FIG. 16, the upper surface of the insulating film IL2 is planarized.

At the stage at which the insulating film IL2 is deposited in Step S13, the upper surface of the insulating film IL2 is formed with the roughness or stepped portions reflecting the memory gate electrode MG, the laminated body LM, and the laminated film LF1. However, by polishing the upper surface of the insulating film IL2 in Step 14, the upper surface of the insulating film IL2 is planarized. That is, the polishing step in Step S14 is treatment for planarizing the upper surface of the insulating film IL2.

In Step S14, the cap insulating film CP of the laminated body LM and the insulating film IL1 of the laminated film LF1 are allowed to function as stopper films (stopping films) for the polishing treatment (which is CMP treatment herein). That is, when the insulating film IL2 is polished, the upper surface of the insulating film IL2 is planarized and, at the stage at which the upper surface of the cap insulating film CP of the laminated body LM and the upper surface of the insulating film IL1 of the laminated film LF are exposed, the polishing of the insulating film IL2 is ended.

In Step S14 (step of polishing the insulating film IL2), the polishing treatment is preferably performed under such a condition that the insulating film IL1 and the cap insulating film CP are less likely to be polished than the insulating film IL2. That is, in Step S14, the polishing treatment is preferably performed under such a condition that the speed of polishing (the rate of polishing) the insulating film IL1 and the cap insulating film CP is lower than the speed of polishing (the rate of polishing) the insulating film IL2. This allows the cap insulating film CP of the laminated body LM and the insulating film IL1 of the laminated film LF1 to properly function as the stopper films for the polishing treatment in Step S14.

The cap insulating film CP of the laminated body LM is made of the insulating film in the same layer as that of the insulating film IL1 of the laminated film LF1. Specifically, the cap insulating film CP is formed of the insulating film IL1 patterned in Step S7 described above. Accordingly, if a polishing condition is set in Step S14 such that the insulating film IL1 is less likely to be polished than the insulating film IL2, the cap insulating film CP is also less likely to be polished than the insulating film IL2.

In Step S14 (step of polishing the insulating film IL2), the insulating films IL2 and IL1 are polished at different speeds (rates). This can be achieved by forming the insulating films IL2 and IL1 of insulating materials different from each other. From this viewpoint, it is preferable to form the insulating film IL1 of a silicon nitride film and form the insulating film IL2 of a silicon oxide film.

The laminated body LM is formed of the film in the same layer as that of the laminated film LF1. Specifically, by patterning the laminated film LF in Step S7 described above, the laminated body LM and the laminated film LF1 are formed. Accordingly, the height of the laminated body LM is substantially the same as the height of the laminated film LF1. Consequently, in Step S14, the upper surface of the cap insulating film CP of the laminated body LM in the memory cell region 1A and the upper surface of the insulating film IL1 of the laminated film LF1 in the peripheral circuit region 1B are exposed. As a result, a state is reached where, from over the laminated film LF1 in the peripheral circuit region 1B, the insulating film IL2 has been removed.

By performing Step S14, a state is achieved where, in the area of the main surface of the semiconductor substrate SB where none of the memory gate electrode MG and the laminated body LM which are adjacent to each other via the insulating film MZ and the laminated film LF1 is formed, an insulating film IL3 is formed (embedded). The upper surface of the insulating film IL3 is planarized to be at substantially the same height position as that of each of the upper surfaces of the laminated body LM and the laminated film LF1.

Figure 17:
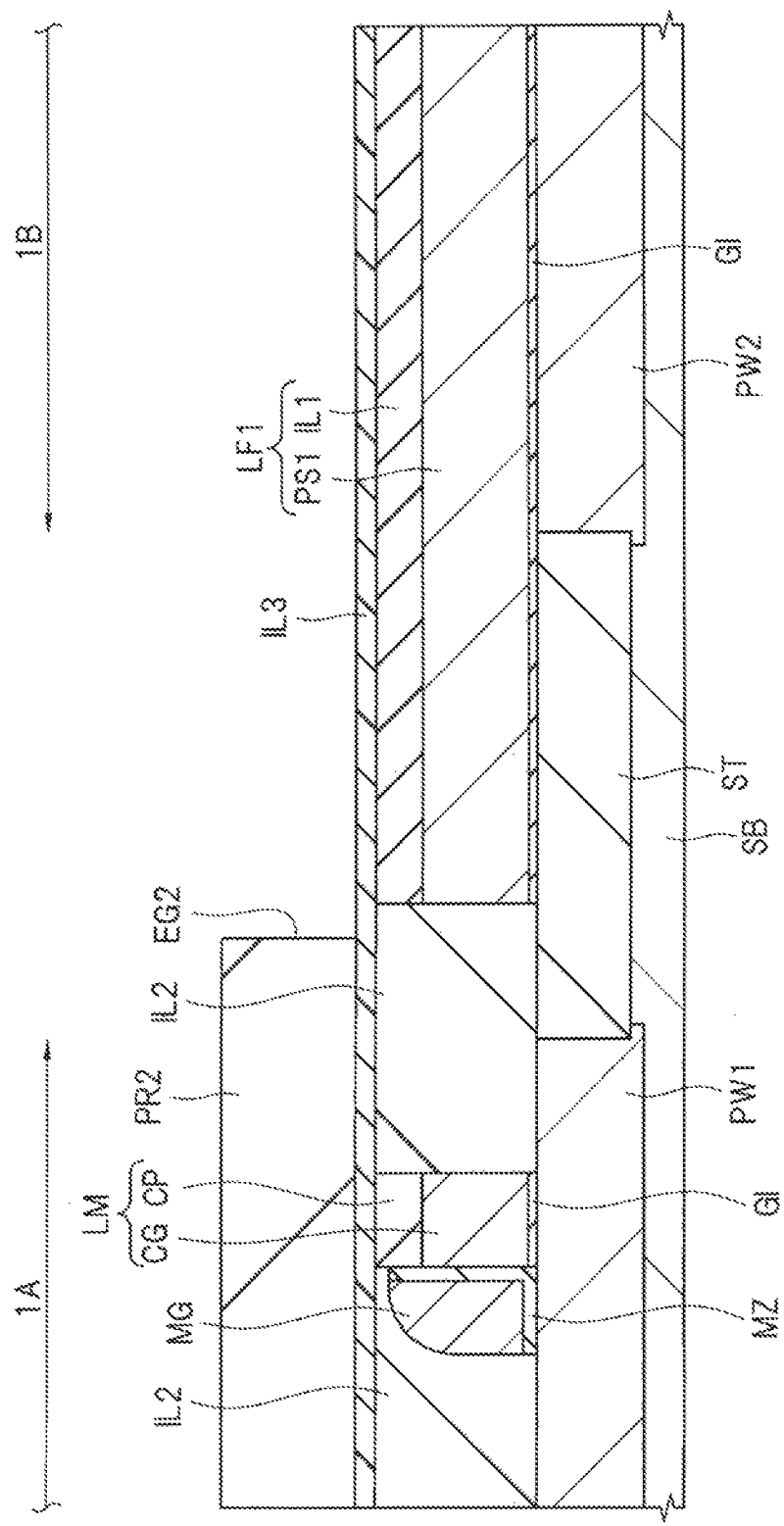
FIG. 17 is a main-portion cross-sectional view of the semiconductor device during the manufacturing process thereof, which is subsequent to FIG. 16.

Next, as shown in FIG. 17, over the entire main surface of the semiconductor substrate SB, the insulating film IL3 is formed (deposited) so as to cover the memory gate electrode MG, the laminated body LM, the insulating film IL2, and the laminated film LF (Step S15 in FIG. 2).

In the memory cell region 1A, the insulating film IL3 is formed over the insulating film IL at which the upper surface of the laminated body LM is exposed. In the peripheral circuit region 1B, the insulating film IL3 is formed over the laminated film LF1. As a result, the insulating film IL3 is formed over the laminated body LM, the insulating film IL2, and the laminated film LF1.

The insulating film IL3 is preferably made of an insulating material different from that of the insulating film IL1, and therefore is preferably made of a material different from that of the cap insulating film CP. The insulating film IL3 can also be formed of an insulating material of the same type as that of the insulating material of the insulating film IL2. The insulating film IL3 is made of, e.g., a silicon oxide film or the like and can be formed using a CVD method or the like.

After the upper surface of the insulating film IL2 is planarized in Step S14, the insulating film IL3 is formed in Step S15. Consequently, in Step S15, the insulating film IL3 is formed over the planarized surface. Accordingly, the insulating film IL3 formed in Step S15 has a substantially planarized upper surface.

Next, over the insulating film IL3, a photoresist pattern PR2 is formed as a resist pattern using a photolithographic method. The photoresist pattern PR2 is not formed over the laminated film LF1, but is formed over the memory gate electrode MG, the laminated body LM, and the insulating film IL2. That is, the photoresist pattern PR2 is not formed in the peripheral circuit region 1B, but is formed in the entire memory cell region 1A. In addition, since the photoresist pattern PR2 is not formed over the laminated film LF1, the photoresist pattern PR2 is not formed also over the portion of the laminated film LF1 located over the isolation region ST. However, a side surface (edge portion) EG2 of the photoresist pattern PR2 is preferably located over the portion of the insulating film IL2 located over the isolation region ST.

Figure 18:
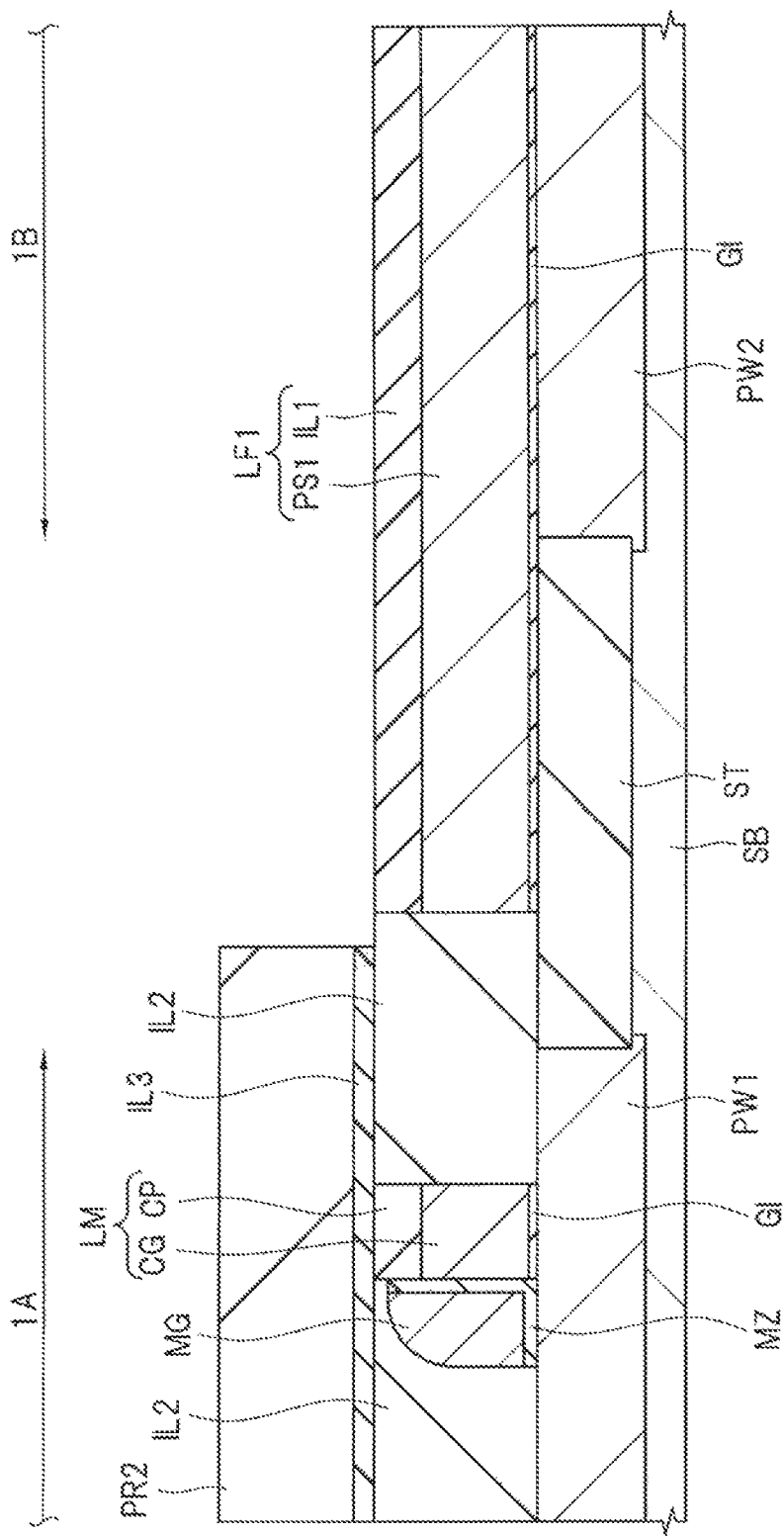
FIG. 18 is a main-portion cross-sectional view of the semiconductor device during the manufacturing process thereof, which is subsequent to FIG. 17.

Next, as shown in FIG. 18, using the photoresist pattern PR2 as an etching mask, the insulating film IL3 is etched (preferably dry-etched) to be removed (Step S16 in FIG. 2).

Figure 19:
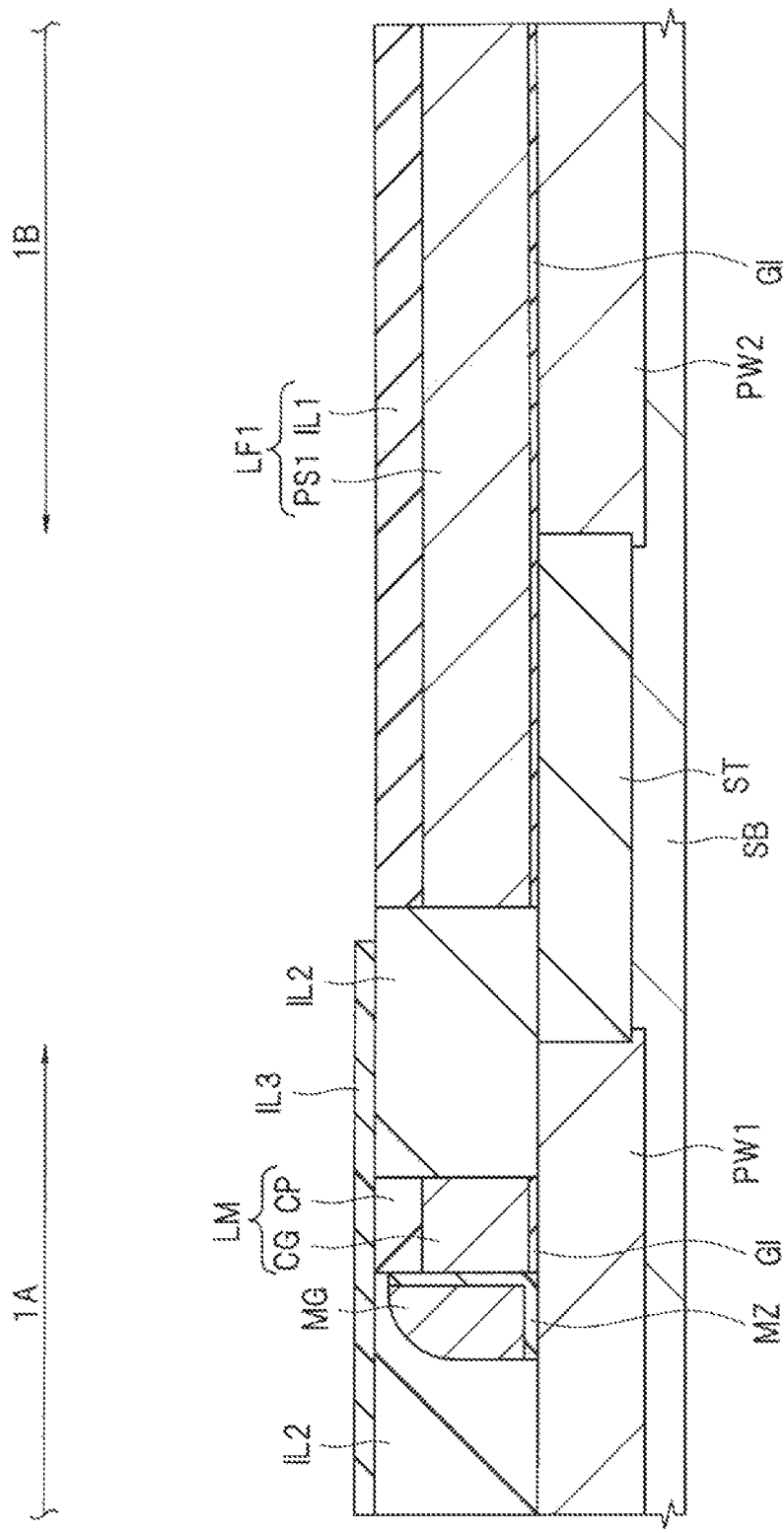
FIG. 19 is a main-portion cross-sectional view of the semiconductor device during the manufacturing process thereof, which is subsequent to FIG. 18.

In Step S16, the insulating film IL3 located in the region uncovered with the photoresist pattern PR2 is removed by etching, but the insulating film IL3 located in the region covered with the photoresist pattern PR2 remains without being etched. Since the photoresist pattern PR2 has not been formed over the laminated film LF2, when the etching step in Step S16 is performed, the insulating film IL3 over the laminated film LF1 is removed to expose the upper surface of the laminated film LF1. That is, when Step S16 is performed, the insulating film IL3 is removed from over the entire laminated film LF1 to expose the upper surface of the entire laminated film LF1. On the other hand, in the memory cell region 1A, the insulating film IL3 is covered with the photoresist pattern PR2 to remain without being etched. After the etching in Step S16, as shown in FIG. 19, the photoresist pattern PR2 is removed.

Figure 20:
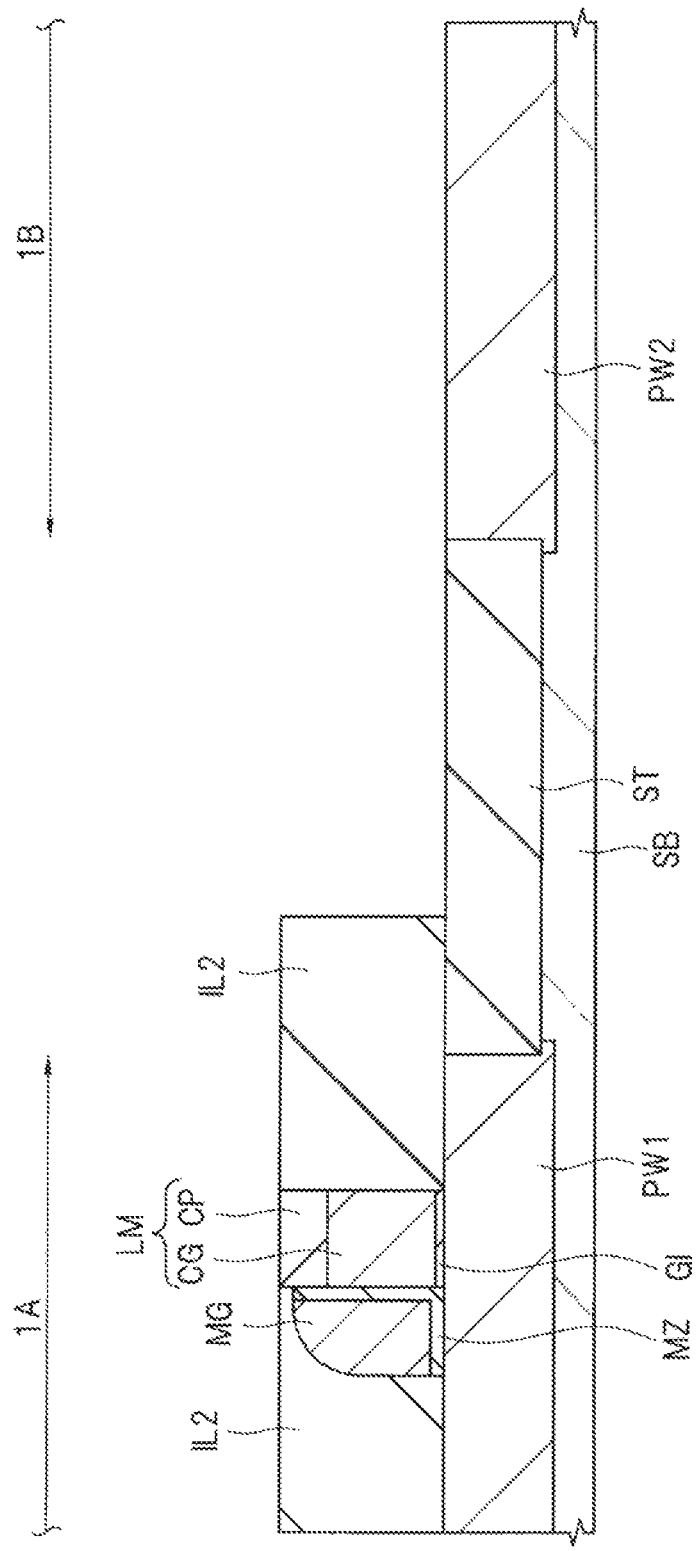
FIG. 20 is a main-portion cross-sectional view of the semiconductor device during the manufacturing process thereof, which is subsequent to FIG. 19.

Next, as shown in FIG. 20, the laminated film LF1 is removed by etching (Step S17 in FIG. 2).

In Step S17, the laminated film LF1 including the silicon film PS1 and the insulating film IL1 over the silicon film PS1 is removed. Accordingly, the step of removing the laminated film LF1 in Step S17 includes the step of etching the insulating film IL1 and the step of etching the silicon film PS1. After the step of etching the insulating film IL1, the step of etching the silicon film PS1 is performed.

In the step of etching the insulating film IL1 included in the step of removing the laminated film LF1 in Step S17, etching is preferably performed under such a condition that the silicon film PS1 and the insulating films IL2 and IL3 are less likely to be etched than the insulating film IL1. That is, in the step of etching the insulating film IL1 included in the step of removing the laminated film LF1 in Step S17, the etching is preferably performed under such a condition that the speeds of etching the silicon film PS1 and the insulating films IL2 and IL3 are lower than the speed of etching the insulating film IL1. This allows the insulating film IL1 to be selectively etched, while inhibiting the insulating films IL2 and IL3 and the silicon film PS1 from being etched. The etching of the insulating film IL1 of the laminated film LF1 is preferably isotropic dry etching, wet etching, or a combination thereof.

Also, in the step of etching the silicon film PS1 included in the step of removing the laminated film LF1 in Step S17, etching is preferably performed under such a condition that the insulating films IL2 and IL3 are less likely to be etched than the silicon film PS1. That is, in the step of etching the silicon film PS1 included in the step of removing the laminated film LF1 in Step S17, the etching is preferably performed under such a condition that the speeds of etching the insulating films IL2 and IL3 are lower than the speed of etching the silicon film PS1. This allows the silicon film PS1 to be selectively etched, while inhibiting the insulating films IL2 and IL3 from being etched. As the etching of the silicon film PS1 of the laminated film LF1, isotropic dry etching, wet etching, or a combination thereof can be used.

Since the etching in Step S17 is performed in a state where the upper surface of the laminated film LF1 is exposed, in Step S17, the entire laminated film LF1 is removed. In addition, when the laminated film LF1 is removed in Step S17, the insulating film GI present under the laminated film LF1 is exposed, which is also removed by etching (preferably wet etching). As a result, a state is reached where, from the semiconductor substrate SB located in the peripheral circuit region 1B, the insulating film GI and the laminated film LF1 have been removed. However, since the insulating film GI located in the memory cell region 1A, i.e., the insulating film GI under the control gate electrode CG has not been exposed, it remains without being removed.

The etching of the insulating film GI performed after the step of etching the silicon film PS1 in Step S17 is preferably performed under such a condition that the semiconductor substrate SB is less likely to be etched than the insulating film GI. That is, in the step of etching the insulating film GI performed after the step of etching the silicon film PS1 in Step S17, the etching is preferably performed under such a condition that the speed of etching the semiconductor substrate SB is lower than the speed of etching the insulating film GI. Thus, it is possible to inhibit or prevent the semiconductor substrate SB located in the peripheral circuit region 1B from being etched.

The insulating film IL3 may also be etched in the step of removing the laminated film LF1 in Step S17 or in the subsequent step of removing the insulating film GI. Accordingly, it may also be possible that, after the step of removing the laminated film LF1 is performed in Step S17 or after the subsequent step of removing the insulating film GI is performed, the insulating film IL3 is etched to disappear and the upper surface of the insulating film IL2 is exposed. In such a case also, it is preferable that the insulating film IL3 remains in the form of a layer and the upper surface (i.e., the upper surface of the cap insulating film CP) of the laminated body LM is not exposed until the step of etching the insulating film IL1 included in the step of removing the laminated film LF1 in Step S17 is ended (i.e., until the insulating film IL1 of the laminated film LF1 is removed and the upper surface of the silicon film PS1 is exposed). Thus, in the step of etching the insulating film IL1 of the laminated film LF1, it is possible to prevent the cap insulating film CP of the laminated body LM from being etched. Accordingly, in the step of etching the silicon film PS1 of the laminated film LF1, it is possible to properly prevent the control gate electrode CG of the laminated body LM from being etched.

It is preferable that, at the stage at which the step of removing the laminated film LF1 in Step S17 or the subsequent step of removing the insulating film GI is ended, the memory gate electrode MG and the control gate electrode CG are not exposed. In particular, it is preferable to prevent the memory gate electrode MG and the control gate electrode CG from being exposed until the step of etching the silicon film PS1 in Step S17 is ended. Accordingly, it is preferable that, at the stage at which the step of removing the laminated film LF1 in Step S17 or the subsequent step of removing the insulating film GI is ended, the memory gate electrode MG is covered with one or both of the insulating films IL2 and IL3. Thus, it is possible to prevent the memory gate electrode MG and the control gate electrode CG from being etched.

In this manner, the laminated film LF1 and the insulating film GI (insulating film GI located in the peripheral circuit region 1B) under the laminated film LF1 are removed.

Figure 21:
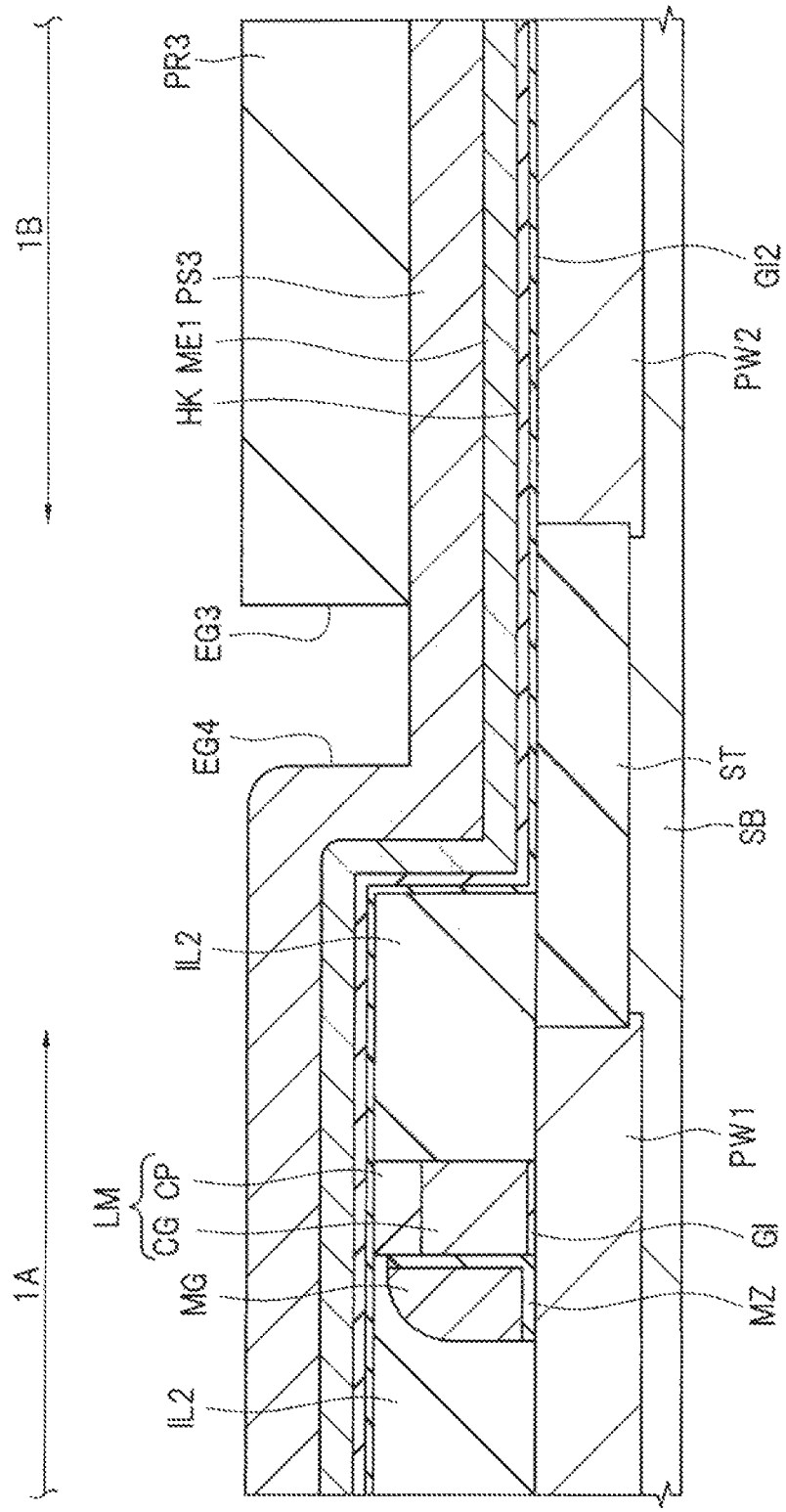
FIG. 21 is a main-portion cross-sectional view of the semiconductor device during the manufacturing process thereof, which is subsequent to FIG. 20.

Next, as shown in FIG. 21, an insulating film GI2 is formed over the semiconductor substrate SB (Step S18 in FIG. 2). Then, over the semiconductor substrate SB, i.e., over the insulating film GI, an insulating film HK is formed (Step S19 in FIG. 2). Then, over the semiconductor substrate SB, i.e., over the insulating film HK, a metal film ME1 is formed as a conductive film (Step S20 in FIG. 2). Then, over the semiconductor substrate SB, i.e., over the metal film ME1, a silicon film PS3 is formed (Step S21 in FIG. 3).

That is, in Steps S18, S19, S20, and S21, the insulating film GI2, the insulating film HK, the metal film ME1, and the silicon film PS3 are successively formed. As a result, over the semiconductor substrate SB, a laminated film of the insulating film GI2, the insulating film HK, the metal film ME1, and the silicon film PS3 is formed. By performing Steps S18, S19, S20, and S21, a state is achieved where the laminated film of the insulating film GI2, the insulating film HK over the insulating film GI2, the metal film ME1 over the insulating film HK, and the silicon film PS3 over the metal film ME1 is formed over the main surface of the semiconductor substrate SB so as to cover the laminated body LM, the memory gate electrode MG, and the insulating film IL2.

The insulating film GI2 and the insulating film HK are insulating films for the gate insulating film, and the metal film ME1 and the silicon film PS3 are conductive films for a gate electrode. Specifically, the insulating film GI2 and the insulating film HK are insulating films for the gate insulating film of the MISFET formed in the peripheral circuit region 1B, and the metal film ME1 and the silicon film PS3 are conductive films for the gate electrode of the MISFET formed in the peripheral circuit region 1B.

The insulating film GI2 is formed over the surface (i.e., the surface of the p-type well PW2) of the semiconductor substrate SB located in the peripheral circuit region 1B, and is preferably made of a silicon oxide film or a silicon oxynitride film. Since the insulating film GI2 is formed between a high-dielectric-constant gate insulating film (which is the insulating film HK herein) and the semiconductor substrate SB, the insulating film GI2 can also be regarded as an interfacial layer.

The physical thickness of the insulating film GI2 is smaller than the physical thickness of the insulating film HK and can be adjusted preferably to 0.5 to 2 nm, e.g., about 1 nm. In Step S18, the insulating film GI2 can be formed using, e.g., a thermal oxidation method or the like. When the insulating film GI2 is made of a silicon oxynitride film, the insulating film GI2 can be formed by, e.g., a rapid thermal oxidation method using $N_2O$, $O_2$, and $H_2$, a method which forms a silicon oxide film and then performs nitridation treatment (plasma nitridation) thereon in a plasma, or the like.

Note that, in FIG. 21, the case is shown where the insulating film GI2 is formed not only over the substrate region (Si substrate region) of the semiconductor substrate SB, but also over the isolation region ST and the surface of the insulating film IL2. However, when the insulating film GI2 is formed by a thermal oxidation method, the insulating film GI2 is formed over the substrate region (Si substrate region) of the semiconductor substrate SB located in the peripheral circuit region 1B, but is not formed over the isolation region ST and the surface of the insulating film IL2. On the other hand, the insulating film HK, the metal film ME1, and the silicon film PS3 are each formed over the entire main surface of the semiconductor substrate SB. As a result, when the process is performed up to Step S21, a state is achieved where the insulating film GI2, the insulating film HK, the metal film ME1, and the silicon film PS3 are successively formed in ascending order over the substrate region (Si substrate region) of the semiconductor substrate SB located in the peripheral circuit region 1B. On the other hand, even when Step S18 is performed, the insulating film GI2 may not be formed over the isolation region ST or over the insulating film IL2 located in the memory cell region 1A. However, even in a region where the insulating film GI2 is not formed, when the process is performed up to S21, a state is reached where the insulating film HK, the metal film ME1, and the silicon film PS3 are successively formed in ascending order.

The insulating film HK is an insulating material film having a dielectric constant (relative dielectric constant) higher than that of a silicon nitride, i.e., a so-called a High-k film (high-dielectric-constant film). Note that, when a High-k film, a high-dielectric-constant film, or a high-dielectric-constant gate insulating film is mentioned in the present application, it indicates a film having a dielectric constant (relative dielectric constant) higher than that of a silicon nitride.

As the insulating film HK, a metal oxide film such as a hafnium oxide film, a zirconium oxide film, an aluminum oxide film, a tantalum oxide film, or a lanthanum oxide film can be used. Such a metal oxide film can also further contain one or both of nitrogen (N) and silicon (Si). The insulating film HK can be formed by, e.g., an ALD (Atomic layer Deposition) method or a CVD method. When a high-dielectric-constant film (which is the insulating film HK herein) is used as the gate insulating film, the physical thickness of the gate insulating film can be increased compared with the case of using a silicon oxide film. This can provide the advantage of allowing a reduction in leakage current.

It may also be possible to omit the formation of the insulating film GI2 (i.e., Step S18) and form the insulating film HK which is the high-dielectric-constant film directly over the surface (silicon surface) of the semiconductor substrate SB located in the peripheral circuit region 1B. However, it is more preferable to provide the insulating film (interfacial layer) GI2 made of a thin silicon oxide film or a silicon oxynitride film at the interface between the insulating film HK and the semiconductor substrate SB (p-type well PW2) located in the peripheral circuit region 1B without omitting the formation of the insulating film GI2. That is, it is more preferable to form the insulating film GI2 in Step S18 and then form the insulating film HK in Step S19. This can provide the interface between the gate insulating film and the semiconductor substrate (the silicon surface thereof) with a $SiO_2/Si$ (or SiON/Si) structure in the MISFET formed later in the peripheral circuit region 1B, reduce the number of defects such as a trap level, and improve the driving ability and reliability thereof.

As the metal film ME1, a metal film such as, e.g., a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, or a titanium aluminum (TiAl) film can be used. Note that the metal films mentioned herein indicate conductive films each showing metal conduction and include not only a single-element metal film (pure metal film) and an alloy film, but also a metal compound film (such as a metal nitride film or a metal carbide film) showing metal conduction. The metal film ME1 can be formed using, e.g., a sputtering method or the like.

Since the gate electrode (gate electrode of the MISFET formed in the peripheral circuit region 1B) is formed later using the metal film ME1, the gate electrode thereof can be formed as a metal gate electrode. By forming the metal gate electrode, the advantage of being able to inhibit the phenomenon of depletion of the gate electrode and eliminate a parasitic capacitance can be obtained. In addition, the advantage of allowing a reduction in the size of a MISFET element (a reduction in the thickness of the gate insulating film) can also be obtained.

The silicon film PS3 is made of a polycrystalline silicon film (polysilicon film) and can be formed using a CVD method or the like. It may also be possible to form the silicon film PS3 as an amorphous silicon film during the deposition thereof and then change the amorphous silicon film to a polycrystalline silicon film by the subsequent heat treatment. The silicon film PS3 can also be changed to a low-resistance semiconductor film (doped polysilicon film) through introduction of an impurity therein during the deposition thereof, ion implantation of an impurity therein after the deposition thereof, or the like. The silicon film PS3 located in the memory cell region 1A is removed later so that an impurity for a conductivity type may be or may not be introduced therein.

The metal film ME1 and the silicon film PS3 are conductive films for the gate electrode of the MISFET formed in the peripheral circuit region 1B. It is also possible to omit the step of forming the silicon film PS3 in Step S21 by increasing the thickness of the metal film ME1 formed in Step S20. In that case, the gate electrode of the MISFET formed in the peripheral circuit region 1B is consequently formed of the metal film ME1 without the silicon film PS3. However, it is more preferable to form the silicon film PS3 over the metal film ME1 without omitting Step S21. That is, the gate electrode of the MISFET in the peripheral circuit region 1B is more preferably formed of a laminated film of the metal film ME1 and the silicon film PS3 thereover. The reason for this is that, when the thickness of the metal film ME1 is excessively large, the problem that the metal film ME1 is likely to be delaminated or the problem of substrate damage resulting from overetching when the metal film ME1 is patterned may occur. When the silicon film PS3 is formed over the metal film ME1 without omitting Step S21, the gate electrode is formed of the laminated film of the metal film ME1 and the silicon film PS3. This can achieve a larger reduction in the thickness of the metal film ME1 than in the case where the gate electrode is formed only of the metal film ME1 and improve the foregoing problem. Also, when the silicon film PS3 is formed over the metal film ME1 without omitting Step S21, it is possible to follow a conventional method of processing a polysilicon gate electrode (gate electrode made of polysilicon) and a conventional process, which is also advantageous in terms of a microfabrication property, manufacturing cost, and manufacturing yield.

Figure 3:
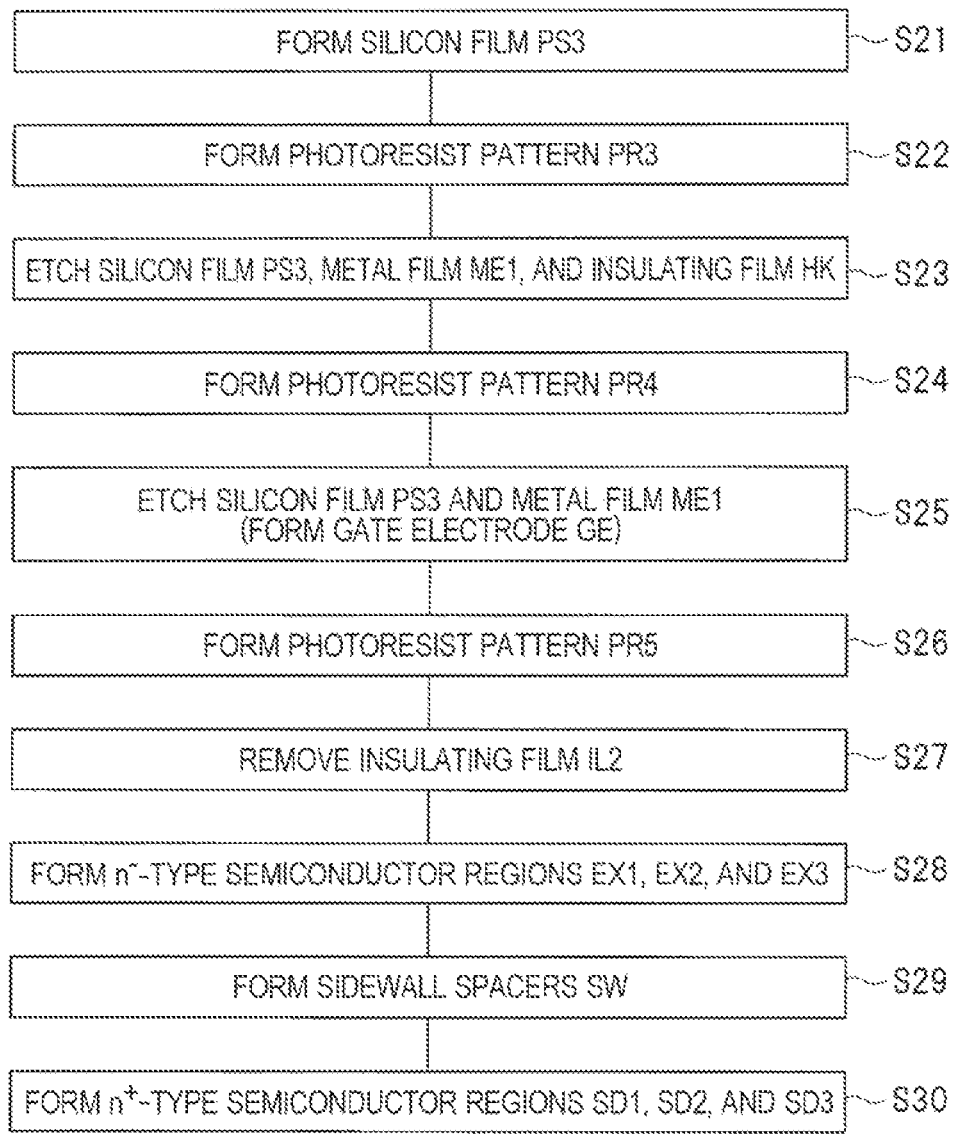
FIG. 3 is a process flow chart showing a part of the manufacturing process of the semiconductor device as the embodiment.

Next, over the semiconductor substrate SB, i.e., over the silicon film PS3, a photoresist pattern PR3 is formed as a resist pattern using a photolithographic method (Step S22 in FIG. 3).

The photoresist pattern PR3 is formed so as to cover the entire peripheral circuit region 1B. Preferably, a side surface (edge portion) EG3 of the photoresist pattern PR3 is located over the isolation region ST. That is, the isolation region ST is located immediately under the side surface (end portion) EG3 of the photoresist pattern PR3. In addition, the photoresist pattern PR3 is not formed in the memory cell region 1A to expose the silicon film PS3 in the memory cell region 1A. That is, the photoresist pattern PR3 is formed so as not to be present over the insulating film IL2 such that the portion of the silicon film PS3 located over the insulating film IL2 is not covered with the photoresist pattern PR3 to be exposed. The photoresist pattern PR3 is also not formed over the insulating film IL2. Preferably, the photoresist pattern PR3 does not lie over a step EG4 in the silicon film PS3 resulting from the side surface of the insulating film IL2.

Figure 22:
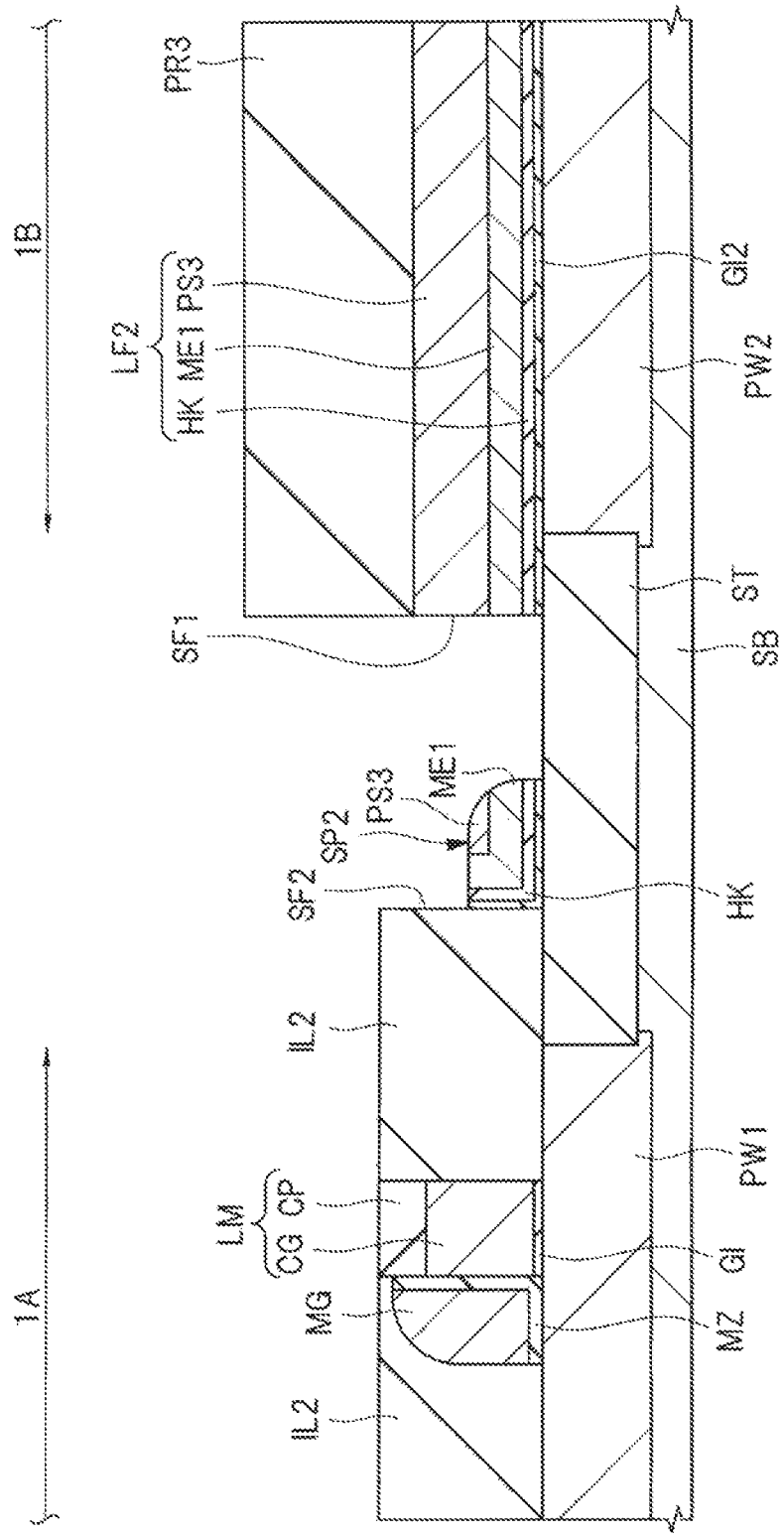
FIG. 22 is a main-portion cross-sectional view of the semiconductor device during the manufacturing process thereof, which is subsequent to FIG. 21.

Next, as shown in FIG. 22, using the photoresist pattern PR3 as an etching mask, the silicon film PS3, the metal film ME1, and the insulating film HK are etched (Step S23 in FIG. 3). Thereafter, the photoresist pattern PR3 is removed.

By the etching in Step S23, of the laminated film of the silicon film PS3, the metal film ME1, and the insulating film HK, the portion uncovered with the photoresist pattern PR3 and exposed is etched to be removed, while the laminated film of the silicon film PS3, the metal film ME1, and the insulating film HK remains under the photoresist pattern PR3. The laminated film of the silicon film PS3, the metal film ME1, and the insulating film HK remaining under the photoresist pattern PR3 will be denoted by a reference numeral LF2 and referred to as a laminated film LF2. The laminated film LF2 is made of a laminated film of the insulating film HK, the metal film ME1 over the insulating film HK, and the silicon film PS3 over the metal film ME1.

The laminated film LF2 is formed in the entire peripheral circuit region 1B, and a side surface (edge portion) SF1 of the laminated film LF2 is preferably located over the isolation region ST. Thus, the active region (active region defined by the isolation region ST) in the peripheral circuit region 1B is covered with the laminated film LF2 to be able to prevent the substrate region (Si substrate region) of the semiconductor substrate SB located in the peripheral circuit region 1B from being subjected to unneeded etching. That is, if the side surface (edge portion) SF1 of the laminated film LF2 is located not over the isolation region ST, but over the active region in the peripheral circuit region 1B, the active region in the peripheral circuit region 1B may be etched in the etching step in Step S23. However, if the side surface SF1 of the laminated film LF2 is located over the isolation region ST, the active region in the peripheral circuit region 1B is covered with the laminated film LF2. This can reliably prevent the active region in the peripheral circuit region 1B from being etched in the etching step in Step S23. Note that, between the insulating film HK of the laminated film LF2 and the semiconductor substrate SB located in the peripheral circuit region 1B, the insulating film GI2 is interposed.

Since the photoresist pattern PR3 has not been formed over the insulating film IL2, the silicon film PS3, the metal film ME1, and the insulating film HK are etched to be removed from over the insulating film IL2.

Steps S22 and S23 can also be omitted, but it is more preferable to perform Steps S22 and S23. When Steps S22 and S23 are omitted, it follows that a photolithographic step for forming a photoresist pattern PR4 described later is performed in a state where the conductive films (which are the silicon film PS3 and the metal film ME1) for the gate electrode are present also over the insulating film IL2. As a result, the photolithographic step is less easily performed. However, by performing Steps S22 and S23 and thus removing the conductive films (which are the silicon film PS2 and the metal film ME1) for the gate electrode from over the insulating film IL2, the photolithographic step for forming the photoresist pattern PR4 described later is easily performed to allow the photoresist pattern PR4 described later to be reliably formed.

By performing Steps S22 and S23, the silicon film PS3, the metal film ME1, and the insulating film HK located in the memory cell region 1A are etched to be removed, while the silicon film PS3, the metal film ME1, and the insulating film HK are removed from over the insulating film IL2. The laminated film LF2 remains over the semiconductor substrate SB located in the peripheral circuit region 1B, and the side surface SF1 of the laminated film LF2 is located over the isolation region ST.

On the other hand, the side surface SF2 of the insulating film IL2 forming the edge portion of the insulating film IL2 is located over the isolation region ST. When the etching in Step S23 is performed, over the side surfaces SF2 of the insulating film IL2 located over the isolation region ST, a part of the laminated film of the silicon film PS2, the metal film ME1, and the insulating film HK may remain in the form of a sidewall spacer to form a residual portion (residual or residue) SP2. The remaining portion SP2 is made of the part of the laminated film of the silicon film PS3, the metal film ME1, and the insulating film HK and formed over the side surface SF2 of the insulating film IL2 located over the isolation region ST into a sidewall spacer shape. This results in a state where the remaining portion SP2 is formed over the isolation region ST so as to be adjacent to the insulating film IL2. As long as the side surface SF2 of the insulating film IL2 is formed over the isolation region ST, the remaining portion SP2 is located over the isolation region ST and therefore it is possible to inhibit or prevent the remaining portion SP2 from causing a problem.

Figure 23:
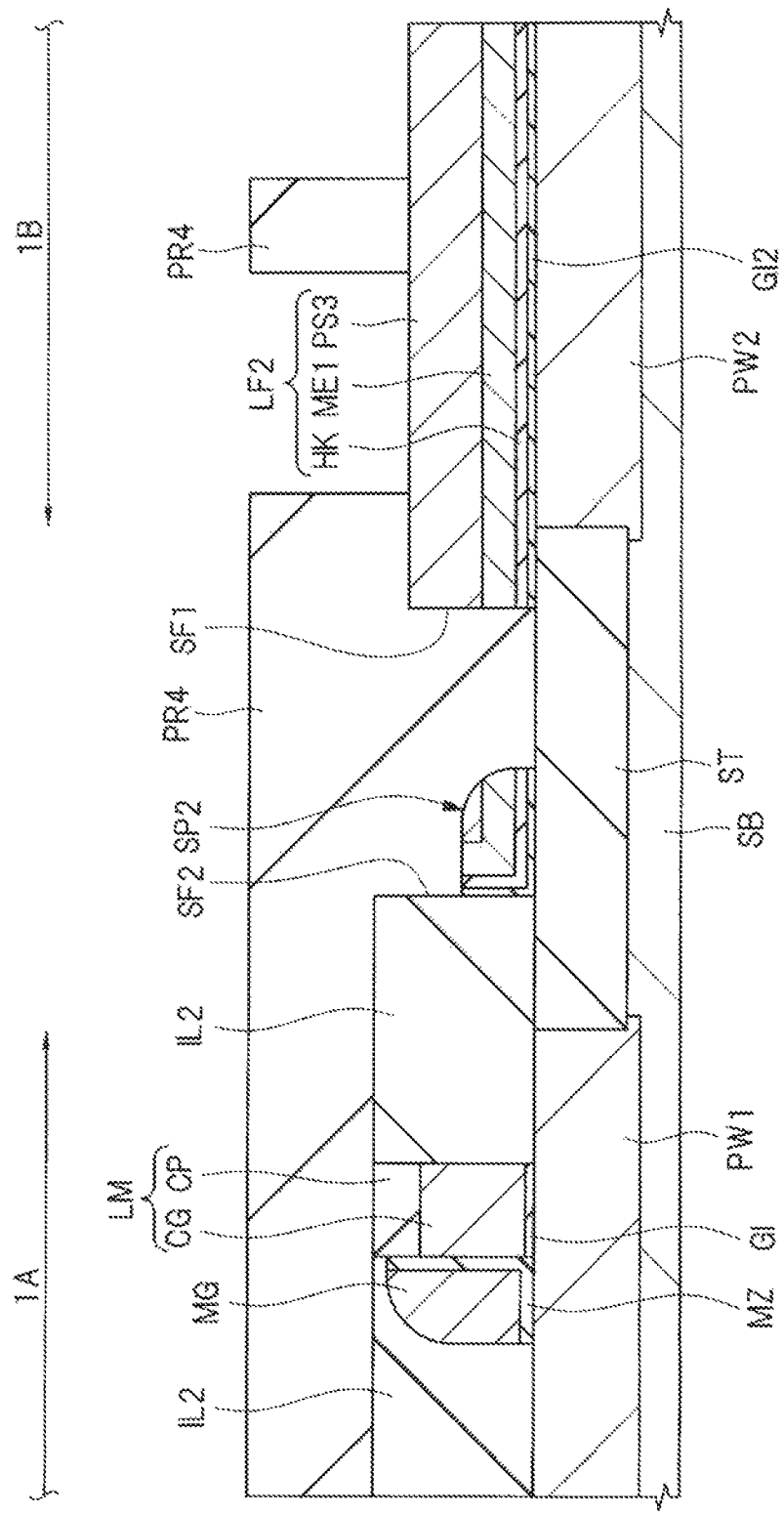
FIG. 23 is a main-portion cross-sectional view of the semiconductor device during the manufacturing process thereof, which is subsequent to FIG. 22.

Next, as shown in FIG. 23, over the semiconductor substrate SB, the photoresist pattern PR4 is formed as a resist pattern using a photolithographic method (Step S24 in FIG. 3).

The photoresist pattern PR4 is formed in the entire memory cell region 1A and in the area of the peripheral circuit region 1B where the gate electrode GE is to be formed. Consequently, the memory gate electrode MG, the laminated body LM, and the insulating film IL2 are covered with the photoresist pattern PR4. The side surface SF1 of the laminated film LF2 is preferably covered with the photoresist pattern PR4. When etching in Step S25 described later is performed in the state where the side surface SF1 of the laminated film LF2 is exposed without being covered with the photoresist pattern PR4, unneeded residues are likely to be left after etching. Therefore, the side surface SF1 of the laminated film LF2 is preferably covered with the photoresist pattern PR4. Thus, in the etching step in Step S25 described later, unneeded residues are less likely to be left after etching.

Accordingly, the photoresist pattern PR4 is preferably formed to cover the insulating film IL2, fill the space between the insulating film IL2 and the laminated film LF2, and cover the vicinity of the outer periphery of the laminated film LF2. Since the side surface SF2 of the insulating film IL2 is also covered with the photoresist pattern PR4, when the foregoing remaining portion SP2 has been formed over the side surface SF2 of the insulating film IL2, the remaining portion SP2 is also covered with the photoresist pattern PR4.

Figure 24:
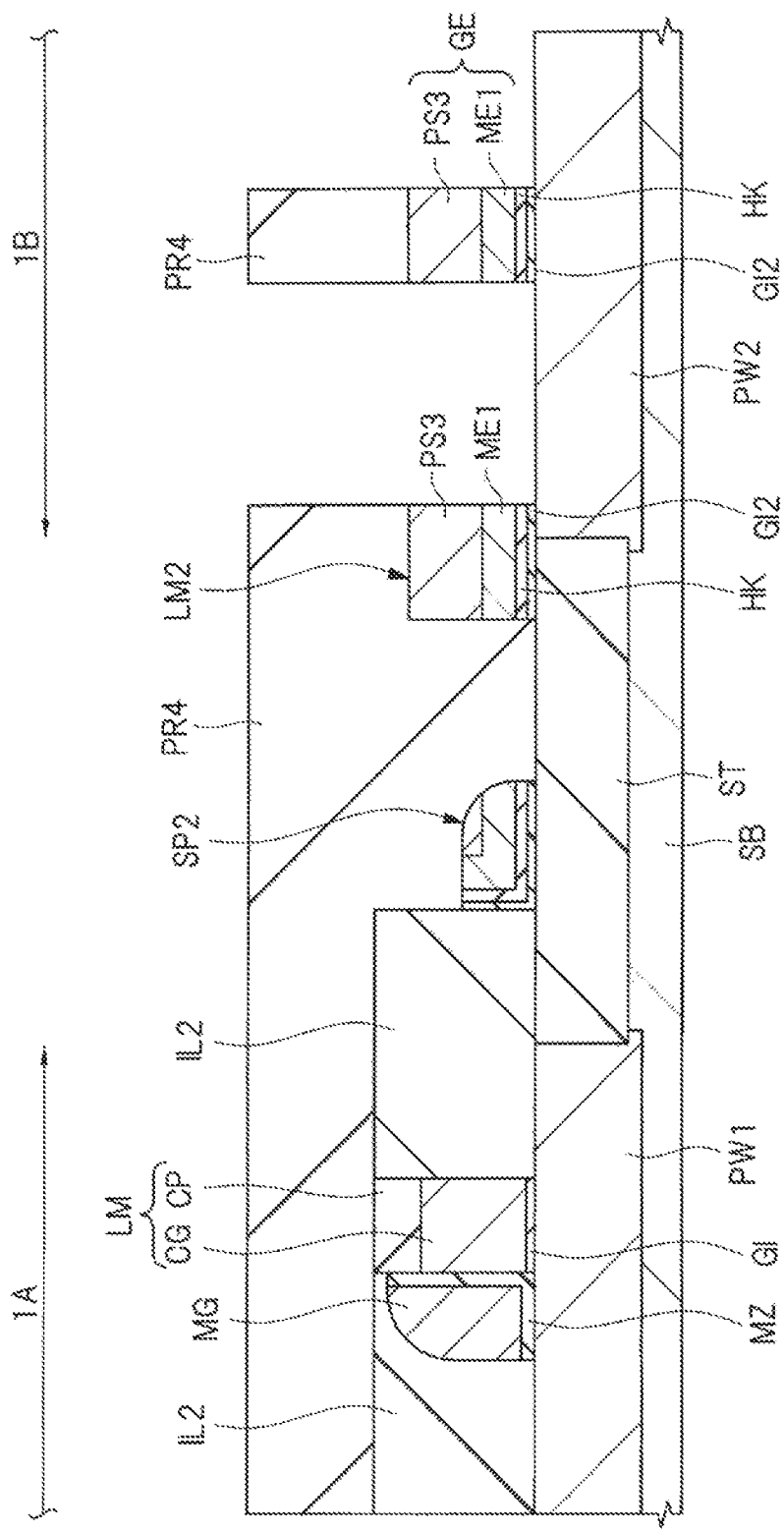
FIG. 24 is a main-portion cross-sectional view of the semiconductor device during the manufacturing process thereof, which is subsequent to FIG. 23.

Next, as shown in FIG. 24, using the photoresist pattern PR4 as an etching mask, the laminated film of the silicon film PS3 and the metal film ME1 is etched (preferably dry-etched) to be patterned to form the gate electrode GE in the peripheral circuit region 1B (Step S25 in FIG. 3). Thereafter, the photoresist pattern PR4 is removed.

The gate electrode GE includes the metal film ME1, and the silicon film PS3 over the metal film ME1 and is formed over the insulating film HK. That is, the gate electrode GE including the metal film ME1, and the silicon film PS3 over the metal film ME1 is formed over the semiconductor substrate SB (p-type well PW2) located in the peripheral circuit region 1B via the insulating film GI2 and the insulating film HK. The gate electrode GE is the gate electrode of the MISFET forming the peripheral circuit.

After the dry etching step performed in Step S25 to pattern the silicon film PS3 and the metal film ME1, wet etching is more preferably performed to remove the portion of the insulating film HK uncovered with the gate electrode GE. The insulating film HK located under the gate electrode GE remains without being removed by the dry etching in Step S25 and the subsequent wet etching to serve as the high-dielectric-constant gate insulating film. On the other hand, the portion of the insulating film HK uncovered with the gate electrode GE is removed by the dry etching when the silicon film PS3 and the metal film ME1 are patterned in Step S25 and by the subsequent wet etching.

The insulating film HK remaining under the gate electrode GE functions as the gate insulating film of the MISFET. However, between the insulating film HK and the semiconductor substrate SB, the insulating film GI2 is interposed, and the insulating film GI2 and the insulating film HK function as the gate insulating film of the MISFET. That is, between the gate electrode GE and the semiconductor substrate SB (p-type well PW2), the insulating film GI2 and the insulating film HK are interposed to function as the gate insulating film of the MISFET. The insulating film HK has a dielectric constant (relative dielectric constant) higher than that of a silicon nitride to be able to function as a high-dielectric-constant gate insulating film. The gate electrode GE has the metal film ME1 located on the gate insulating film (which is the insulating films GI2 and HK) and is therefore a so-called metal gate electrode (metal gate electrode). This can inhibit the phenomenon of depletion of the gate electrode and eliminate a parasitic capacitance, thus also allowing a reduction in the size of the MISFET element (a reduction in the thickness of the gate insulating film).

In addition, since the photoresist pattern PR4 has been formed so as to cover the vicinity of the outer periphery of the laminated film LF2 as described above, the vicinity of the outer periphery of the laminated film LF2 is covered with the photoresist pattern PR4 to remain as a laminated body LM2 without being etched in Step S25.

The laminated body LM2 does not function as the gate electrode of the MISFET, but is made of the laminated film of the insulating film HK, the metal film ME1, and the silicon film PS3 to have at least one part thereof located over the isolation region ST. When a part of the laminated body LM2 is located over the active region in the peripheral circuit region 1B, between the insulating film HK of the laminated body LM2 and the substrate region (Si substrate region) forming the active region, the insulating film GI2 is interposed.

On the other hand, the memory cell region 1A has been covered with the photoresist pattern PR4, and is therefore not etched in Step S25.

Figure 25:
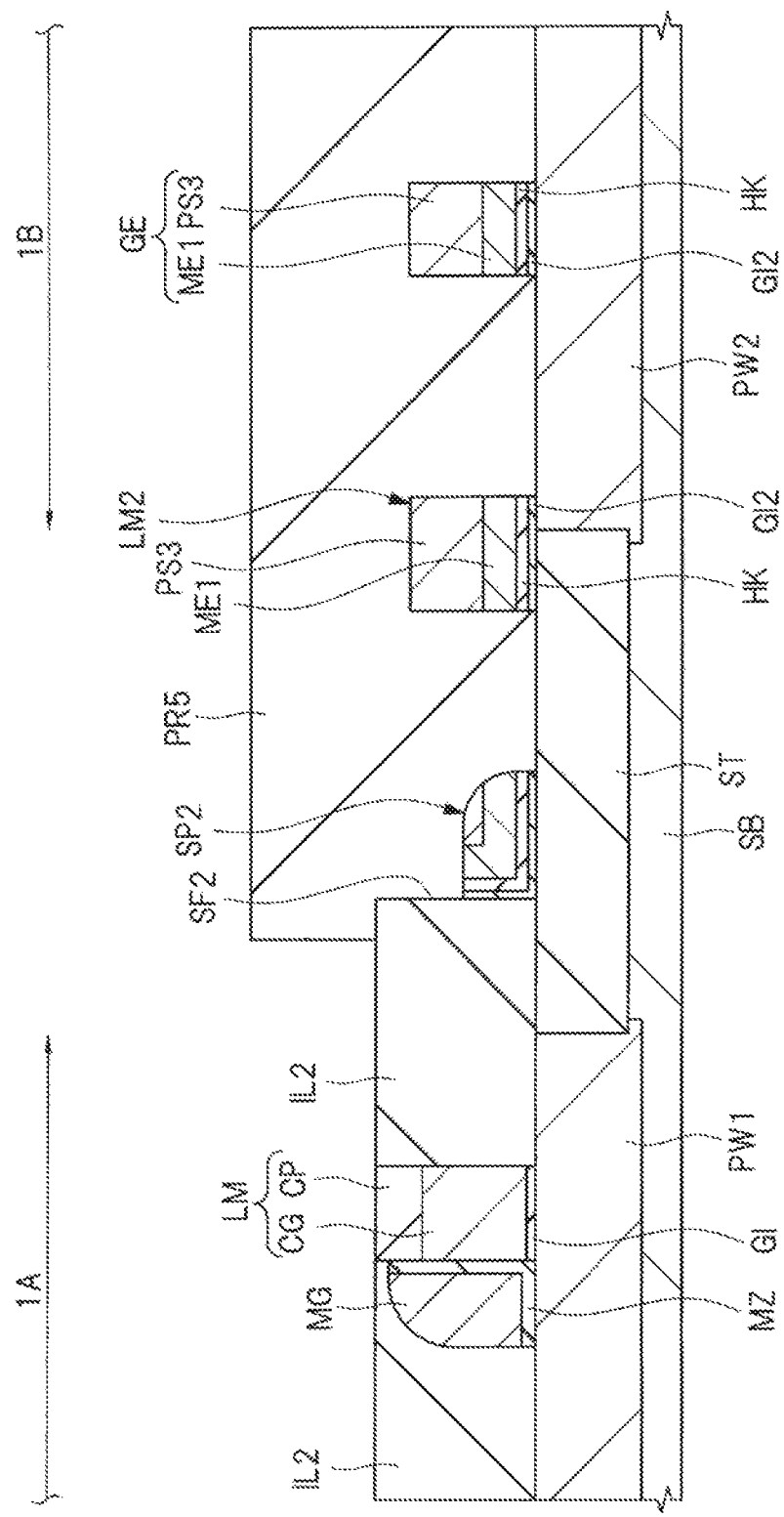
FIG. 25 is a main-portion cross-sectional view of the semiconductor device during the manufacturing process thereof, which is subsequent to FIG. 24.

Next, as shown in FIG. 25, over the semiconductor substrate SB, a photoresist pattern PR5 is formed as a resist pattern using a photolithographic method (Step S26 in FIG. 3).

The photoresist pattern PR5 is not formed in the memory cell region 1A, but is formed in the entire peripheral circuit region 1B so as to cover the gate electrode GE and the laminated body LM2. By performing an etching step in Step S27 described later in a state where the entire peripheral circuit region 1B is covered with the photoresist pattern PR5 and the active region and the gate electrode GE in the peripheral circuit region 1B are covered with the photoresist pattern PR5 and not exposed, it is possible to prevent the substrate region (Si substrate region) and the gate electrode GE in the peripheral circuit region 1B from being etched in the etching step in Step S27 described later. Preferably, the photoresist pattern PR5 covers the side surface SF2 of the insulating film IL2. Thus, in the etching step in Step S27 described above, unneeded residues are less likely to be left after etching. However, it is preferable that the insulating film IL2 located in the memory cell region 1A is not covered with the photoresist pattern PR5. Thus, in Step S27 described later, the insulating film IL2 can be reliably removed. Therefore, it is preferable to form the photoresist pattern PR5 such that the side surface SF2 of the insulating film IL2 and the area in the vicinity thereof are covered with the photoresist pattern PR5 and the other area of the insulating film IL2 is exposed without being covered with the photoresist pattern PR5. When the foregoing remaining portion SP2 is formed over the side surface SF2 of the insulating film IL2, the remaining portion SP2 is also covered with the photoresist pattern PR5.

Figure 26:
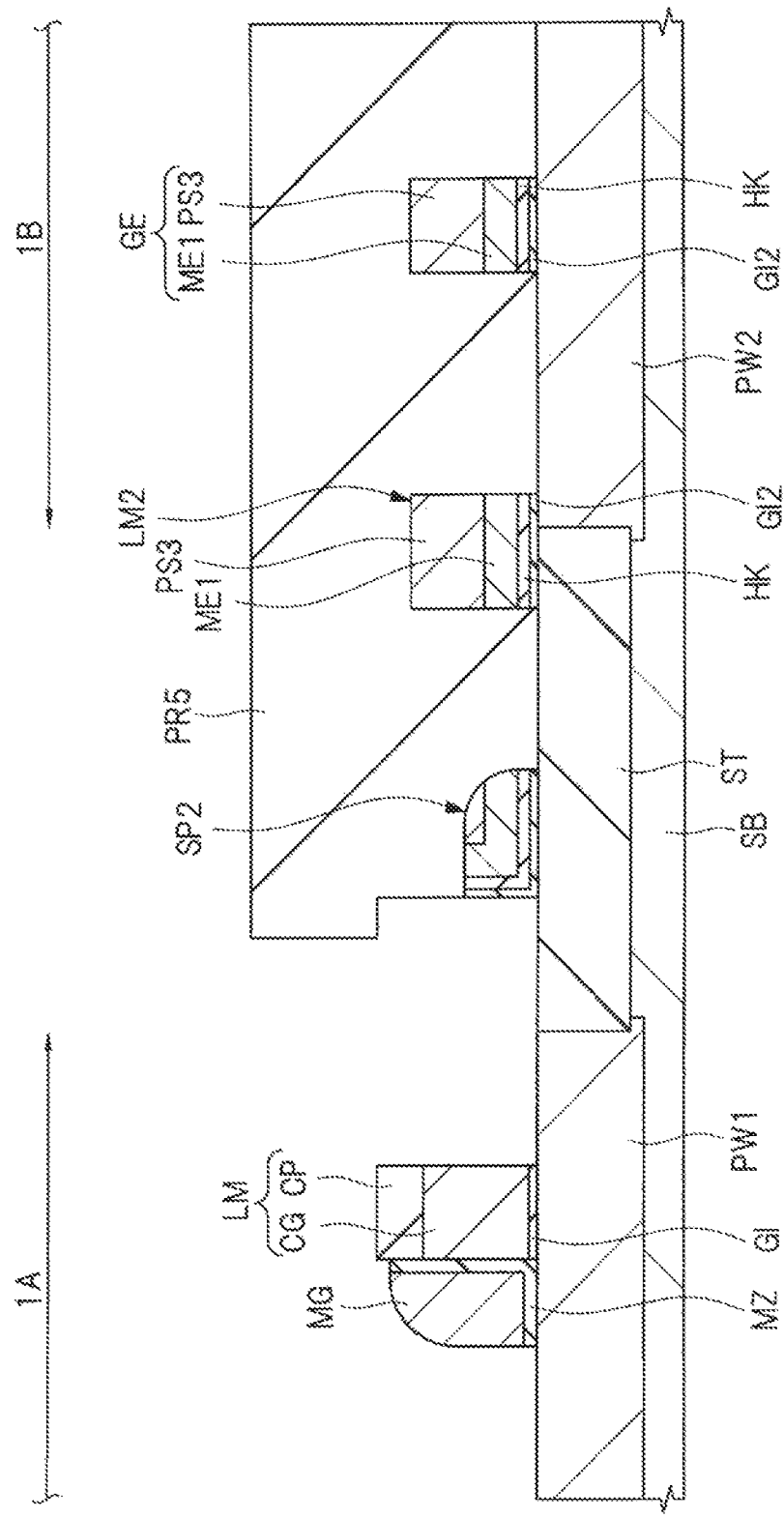
FIG. 26 is a main-portion cross-sectional view of the semiconductor device during the manufacturing process thereof, which is subsequent to FIG. 25.
Figure 27:
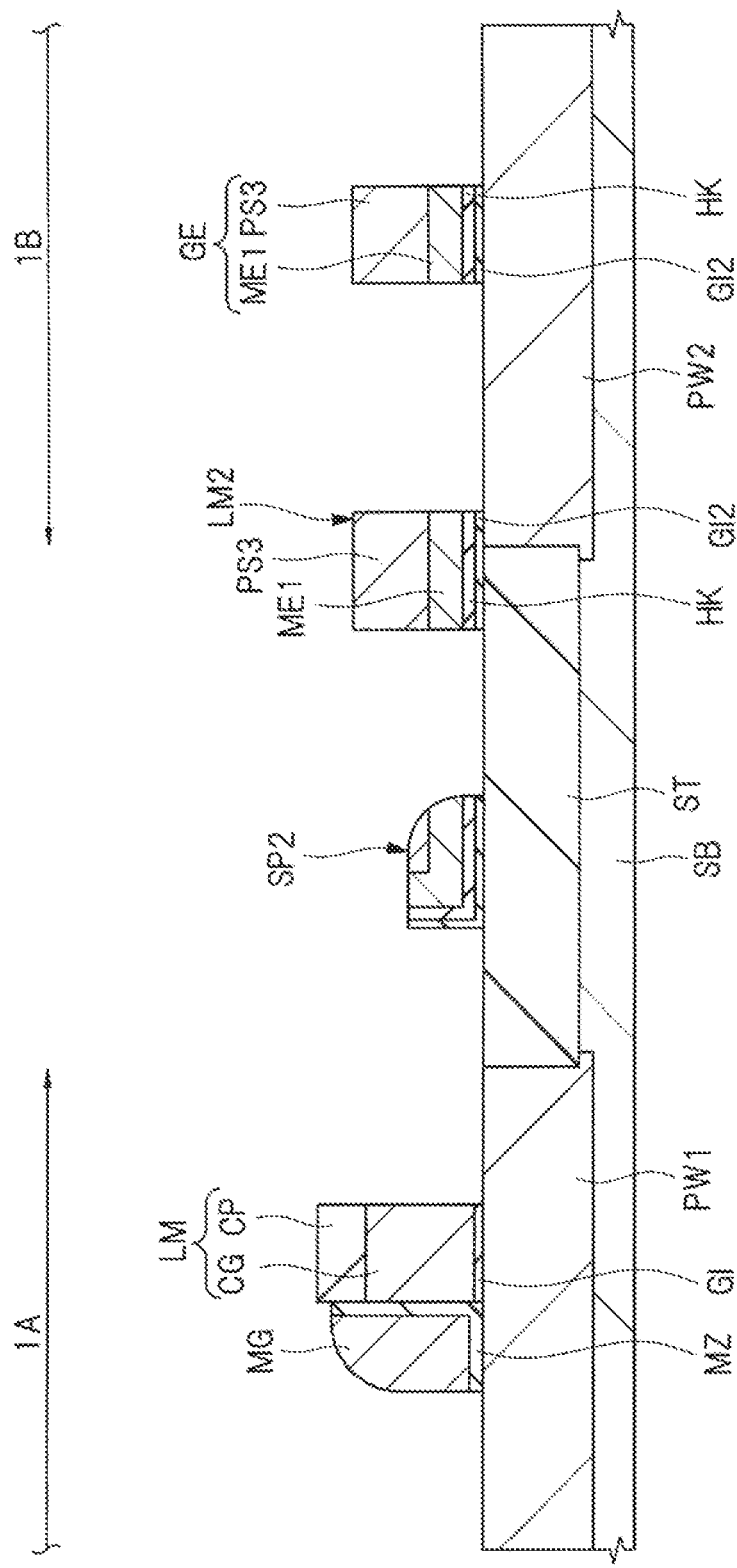
FIG. 27 is a main-portion cross-sectional view of the semiconductor device during the manufacturing process thereof, which is subsequent to FIG. 26.

Next, as shown in FIG. 26, using the photoresist pattern PR5 as an etching mask, the insulating film IL2 is etched to be removed (Step S27 in FIG. 3). Thereafter, as shown in FIG. 27, the photoresist pattern PR5 is removed. When the insulating film IL3 remains over the insulating film IL2, the insulating film IL3 is also removed in Step S27.

In Step S27, the etching is preferably performed under such a condition that the semiconductor substrate SB, the memory gate electrode MG, and the control gate electrode CG are less likely to be etched than the insulating film IL2. That is, the etching is preferably performed under such a condition that the speeds of etching the semiconductor substrate SB, the memory gate electrode MG, and the control gate electrode CG are lower than the speed of etching the insulating film IL2. As a result, it is possible to selectively etch the insulating film IL2, while inhibiting the semiconductor substrate SB, the memory gate electrode MG, and the control gate electrode CG from being etched. The etching of the insulating film IL2 in Step S27 is preferably wet etching.

On the other hand, the peripheral circuit region 1B has been covered with the photoresist pattern PR5, and is therefore not etched in Step S27.

Thus, as shown in FIG. 27, a state is obtained where, in the memory cell region 1A, the control gate electrode CG is formed over the semiconductor substrate SB via the insulating film GI and the memory gate electrode MG is formed over the semiconductor substrate SB via the insulating film MZ while, in the peripheral circuit region 1B, the gate electrode GE is formed over the semiconductor substrate SB via the insulating films GI2 and HK.

Figure 28:
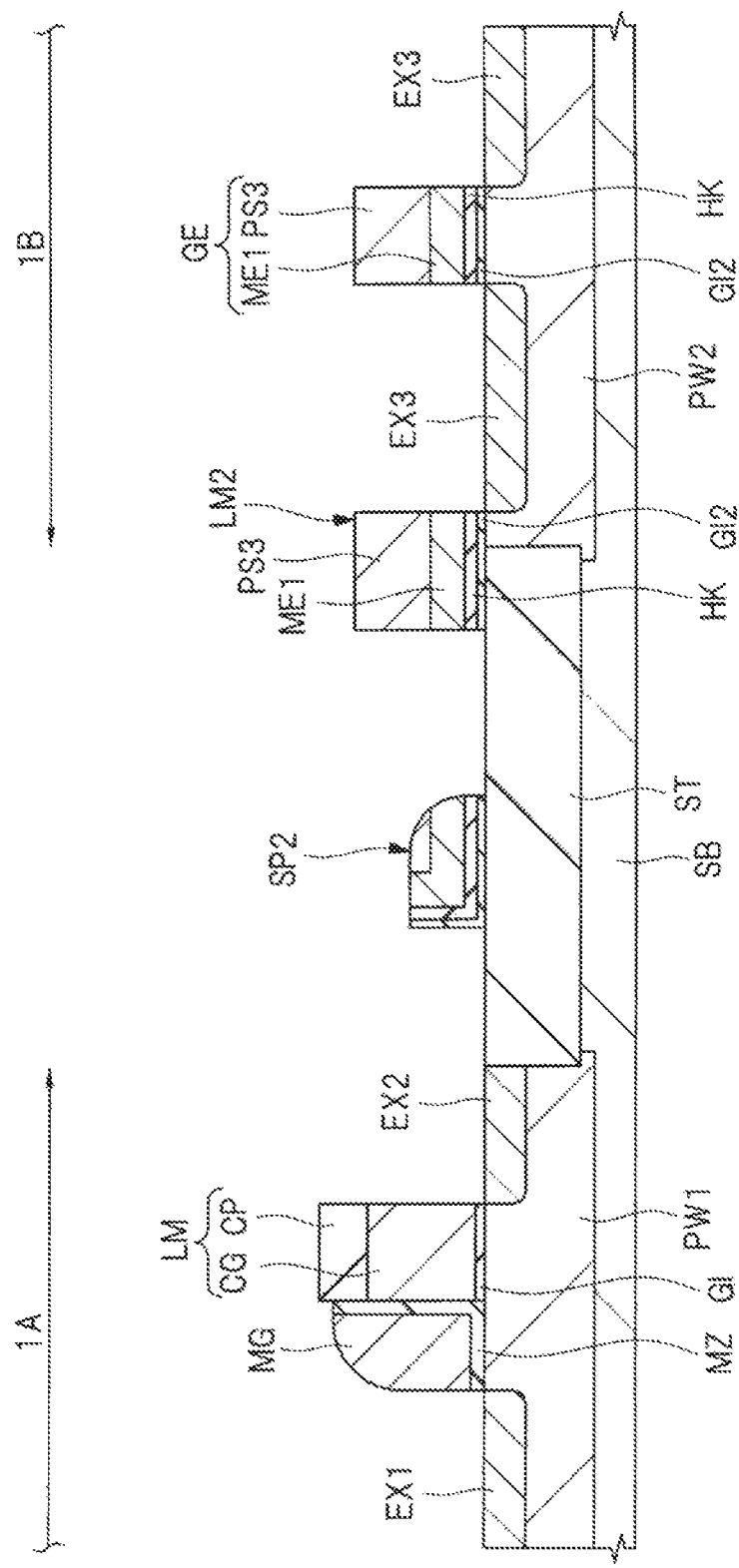
FIG. 28 is a main-portion cross-sectional view of the semiconductor device during the manufacturing process thereof, which is subsequent to FIG. 27.

Next, as shown in FIG. 28, n⁻-type semiconductor regions (impurity diffusion layers) EX1, EX2, and EX3 are formed using an ion implantation method or the like (Step S28 in FIG. 3).

In Step S28, by introducing an n-type impurity such as, e.g., arsenic (As) or phosphorus (P) into the semiconductor substrate SB (p-type wells PW1 and PW2) by an ion implantation method using the control gate electrode CG, the memory gate electrode MG, and the gate electrode GE as a mask (ion implantation blocking mask), the n⁻-type semiconductor regions EX1, EX2, and EX3 can be formed. At this time, the n⁻-type semiconductor region EX1 is formed by self-alignment with the side wall (side wall opposite to the side wall adjacent to the control gate electrode CG via the insulating film MZ) of the memory gate electrode MG since the memory gate electrode MG functions as a mask (ion implantation blocking mask) in the memory cell region 1A. Also, the n⁻-type semiconductor region EX2 is formed by self-alignment with the side wall (side wall opposite to the side wall adjacent to the memory gate electrode MG via the insulating film MZ) of the control gate electrode CG since the cap insulating film CP and the control gate electrode CG function as a mask (ion implantation blocking mask) in the memory cell region 1A. Also, the n⁻-type semiconductor regions EX3 are formed by self-alignment with the both side walls of the gate electrode GE since the gate electrode GE functions as a mask (ion implantation blocking mask) in the peripheral circuit region 1B. Each of the n⁻-type semiconductor regions EX1 and EX2 functions as a part of the source/drain region (source or drain region) of the memory cell formed in the memory cell region 1A, while each of the n⁻-type semiconductor regions EX3 can function as a part of the source/drain region (source or drain region) of the MISFET formed in the peripheral circuit region 1B. The n⁻-type semiconductor regions EX1, EX2, and EX3 can be formed in the same ion implantation step, but can also be formed in different ion implantation steps.

Figure 29:
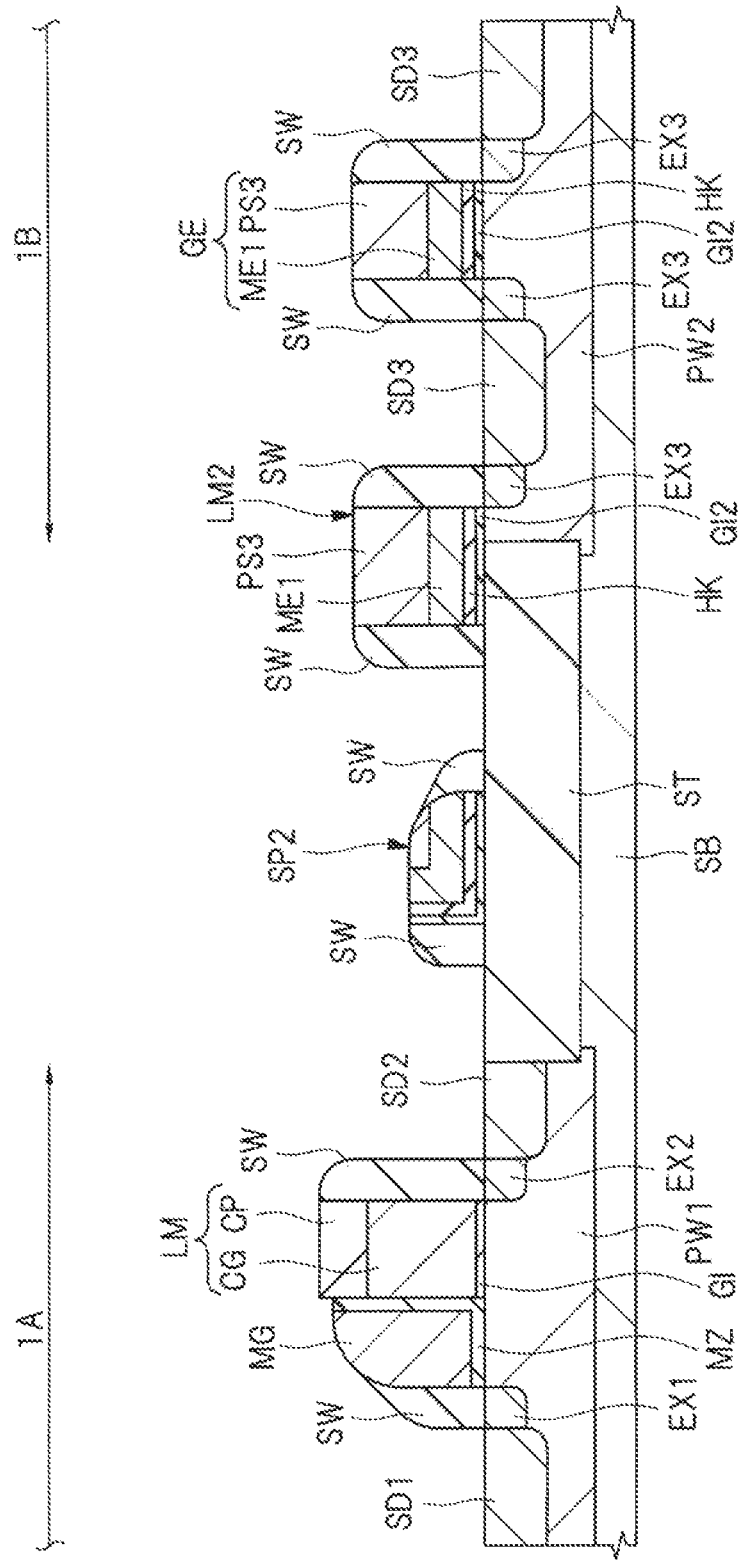
FIG. 29 is a main-portion cross-sectional view of the semiconductor device during the manufacturing process thereof, which is subsequent to FIG. 28.

Next, as shown in FIG. 29, over the side walls (side walls opposite to the side walls adjacent to each other via the insulating film MZ) of the control gate electrode CG and the memory gate electrode MG and over the side walls of the gate electrode GE, sidewall spacers (sidewalls or side wall insulating films) SW each made of an insulating film are formed (Step S29 in FIG. 3).

For example, the step of forming the sidewall spacers SW in Step S29 can be performed as follows. That is, over the entire main surface of the semiconductor substrate SB, an insulating film (e.g., a silicon oxide film, a silicon nitride film, or a laminated film thereof) is deposited using a CVD method or the like and then anisotropically etched (etched back). As a result, the insulating film selectively remains over the side walls (side walls opposite to the side walls adjacent to each other via the insulating film MZ) of the control gate electrode CG and the memory gate electrode MG and over the side walls of the gate electrode GE to form the sidewall spacers SW. The sidewall spacers SW are formed over the both side walls of the gate electrode GE, over the side wall of the control gate electrode CG opposite to the side wall thereof adjacent to the memory gate electrode MG via the insulating film MZ, and over the side wall of the memory gate electrode MG opposite to the side wall thereof adjacent to the control gate electrode CG via the insulating film MZ.

Next, n⁺-type semiconductor regions (impurity diffusion layers) SD1, SD2, and SD3 are formed using an ion implantation method or the like (Step S30 in FIG. 3).

In Step S30, by introducing an n-type impurity such as, e.g., arsenic (As) or phosphorus (P) into the semiconductor substrate SB (p-type wells PW1 and PW2) by an ion implantation method using the control gate electrode CD, the memory gate electrode MG, the gate electrode GE, and the sidewall spacers SW over the side walls thereof as a mask (ion implantation blocking mask), the n⁺-type semiconductor regions SD1, SD2, and SD3 can be formed. At this time, the n+-type semiconductor region SD1 is formed by self-alignment with the sidewall spacer SW over the side wall of the memory gate electrode MG since the memory gate electrode MG and the sidewall spacer SW over the side wall thereof function as a mask (ion implantation blocking mask) in the memory cell region 1A. Also, the n+-type semiconductor region SD2 is formed by self-alignment with the sidewall spacer SW over the side wall of the laminated body LM since the laminated body LM and the sidewall spacer SW over the side wall thereof function as a mask (ion implantation blocking mask) in the memory cell region 1A. Also, the n+-type semiconductor regions SD3 are formed by self-alignment with the sidewall spacers SW over the both side walls of the gate electrode GE since the gate electrode GE and the sidewall spacers SW over the side walls thereof function as a mask (ion implantation blocking mask) in the peripheral circuit region 1B. As a result, an LDD (Lightly doped Drain) structure is formed. The n+-type semiconductor regions SD1, SD2, and SD3 can be formed in the same ion implantation step, but can also be formed in different ion implantation steps.

In this manner, the n−-type semiconductor region EX1 and the n+-type semiconductor region SD1 having an impurity concentration higher than that of the n−-type semiconductor region EX1 form an n-type semiconductor region which functions as the source region of the memory transistor, and the n−-type semiconductor region EX2 and the n+-type semiconductor region SD2 having an impurity concentration higher than that of the n−-type semiconductor region EX2 form an n-type semiconductor region which functions as the drain region of the control transistor. Also, the n−-type semiconductor regions EX3 and the n+-type semiconductor regions SD3 each having an impurity concentration higher than that of each of the n−-type semiconductor regions EX3 form n-type semiconductor regions which function as the source/drain regions of the MISFET in the peripheral circuit region 1B. The n+-type semiconductor region SD1 has an impurity concentration higher than that of the n−-type semiconductor region EX1 and a junction depth larger than that thereof. The n+-type semiconductor region SD2 has an impurity concentration higher than that of the n−-type semiconductor region EX2 and a junction depth larger than that thereof. Each of the n+-type semiconductor regions SD3 has an impurity concentration higher than that of each of the n−-type semiconductor regions EX3 and a junction depth larger than that thereof.

Figure 4:
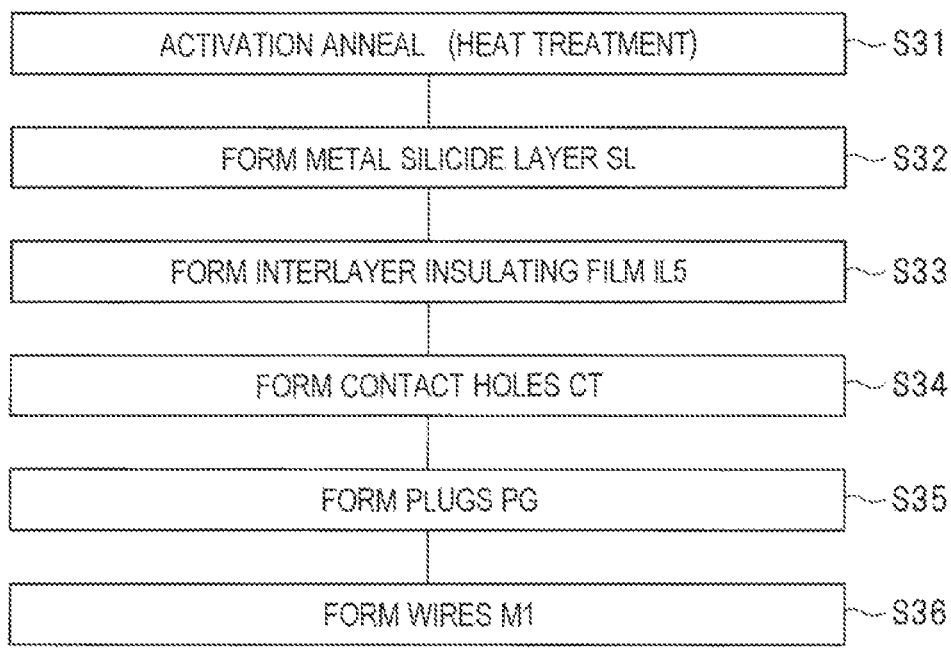
FIG. 4 is a process flow chart showing a part of the manufacturing process of the semiconductor device as the embodiment.

Next, activation anneal which is heat treatment for activating the impurities introduced in the semiconductor regions (n−-type semiconductor regions EX1, EX2, and EX3 and n+-type semiconductor regions SD1, SD2, and SD3) each for the source or drain and the like is performed (Step S31 in FIG. 4).

In this manner, the memory cell of the nonvolatile memory is formed in the memory cell region 1A, while the MISFET is formed in the peripheral circuit region 1B.

Figure 30:
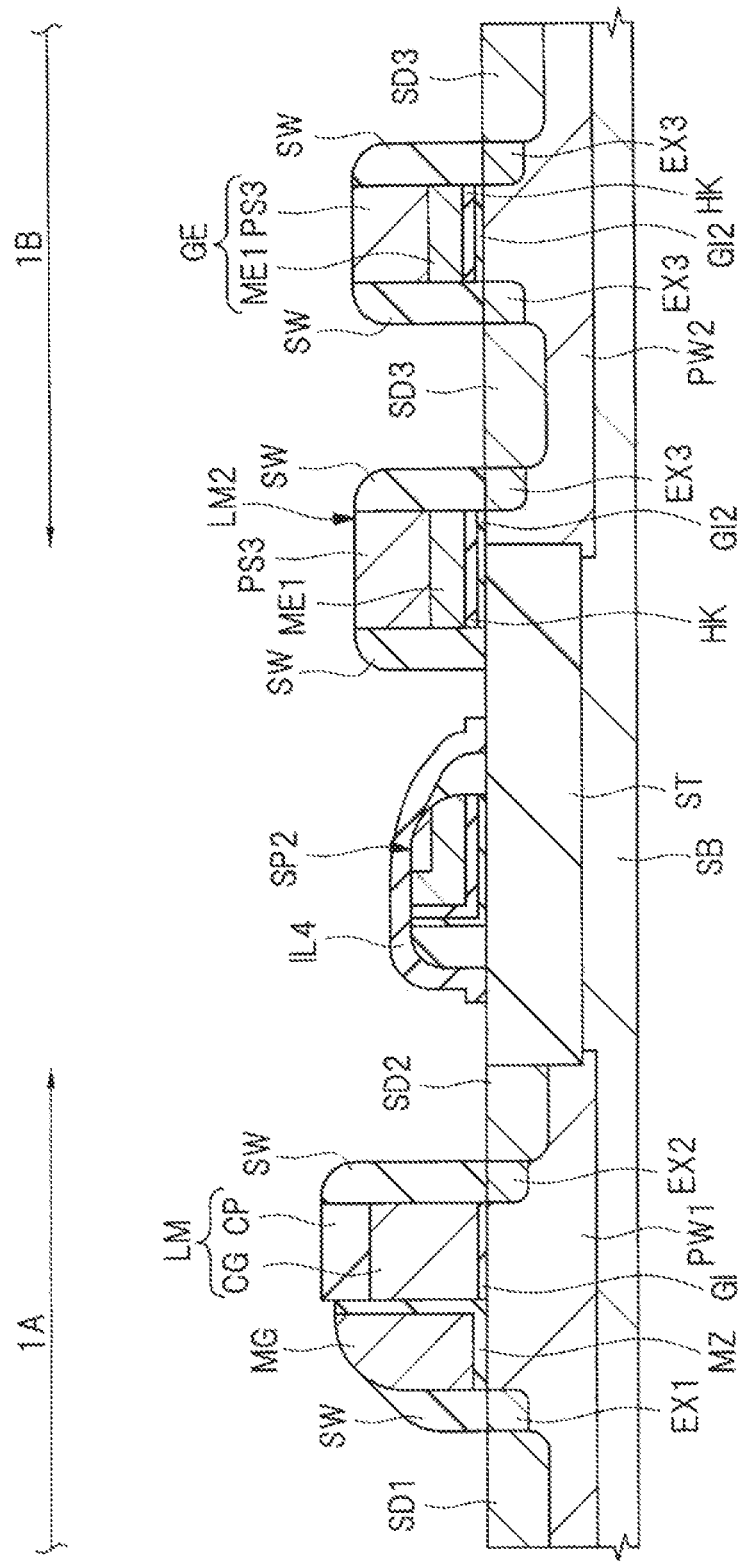
FIG. 30 is a main-portion cross-sectional view of the semiconductor device during the manufacturing process thereof, which is subsequent to FIG. 29.

Next, over the entire main surface of the semiconductor substrate SB, an insulating film IL4 formed of a silicon oxide film or the like is formed using a CVD method or the like and then patterned using a photolithographic method and an etching method to be selectively left in an area where a metal silicide layer SL described later is not to be formed. Since the insulating film IL4 is removed from the area where the metal silicide layer SL described later is to be formed, the silicon surfaces (silicon regions or silicon films) of the upper surfaces (top surfaces) of the n+-type semiconductor regions SD1, SD2, and SD3, the upper surface of the control gate electrode CG, and the upper surface of the gate electrode GE are exposed. By way of example, FIG. 30 shows the state where the insulating film IL4 is left over the remaining portion SP2, but the remaining portion SP2 may also be exposed without leaving the insulating film IL4 over the remaining portion SP2.

Next, the metal silicide layer SL is formed (Step S32 in FIG. 4). The metal silicide layer SL can be formed as follows.

Figure 31:
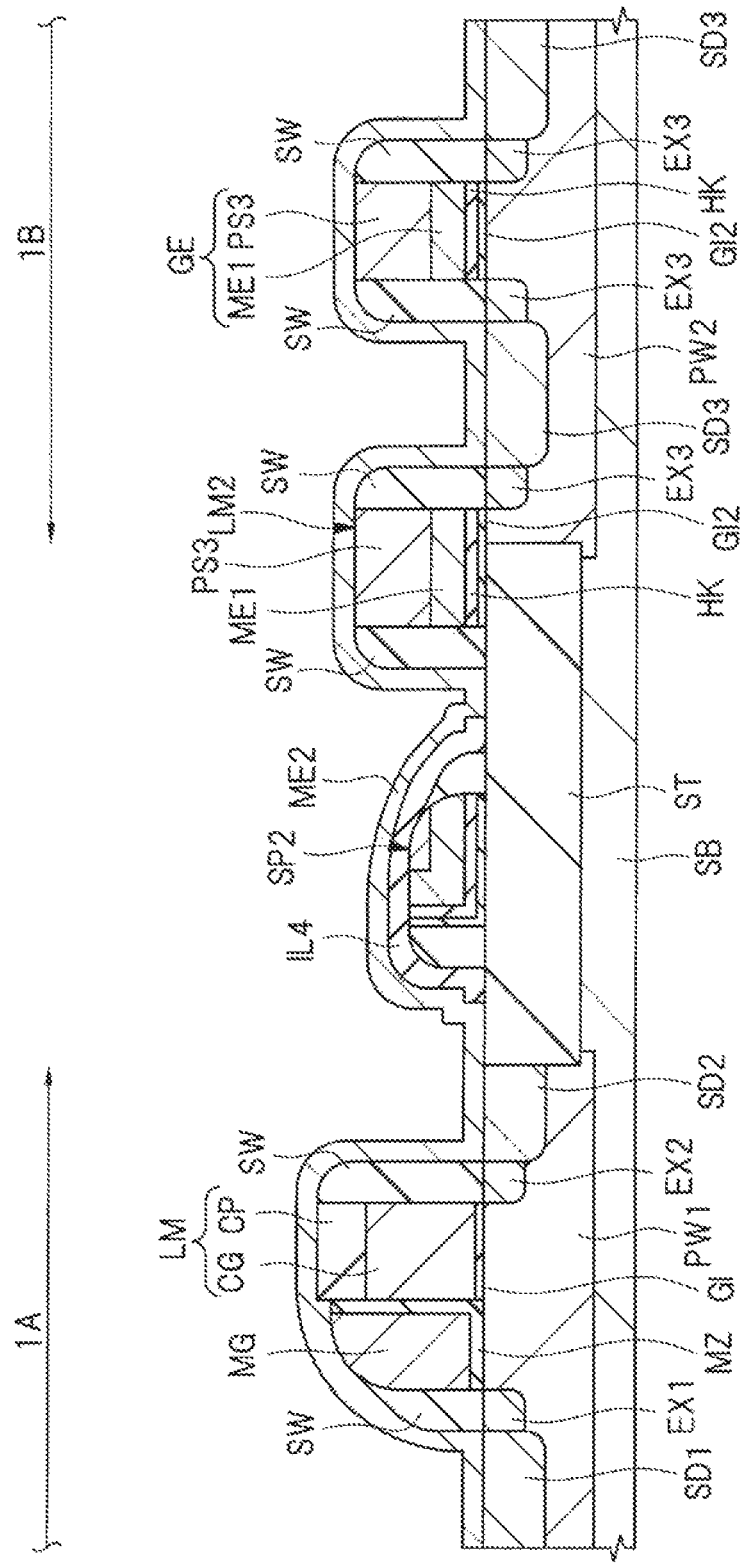
FIG. 31 is a main-portion cross-sectional view of the semiconductor device during the manufacturing process thereof, which is subsequent to FIG. 30.

First, as shown in FIG. 31, over the entire main surface of the semiconductor substrate SB including the upper surfaces (top surfaces) of the n+-type semiconductor regions SD1, SD2, and SD3, the upper surface of the memory gate electrode MG, and the upper surface of the gate electrode GE, a metal film ME2 is formed (deposited) so as to cover the control gate electrode CG, the memory gate electrode MG, the gate electrode GE, and the sidewall spacers SW. The metal film ME2 can be a single-element metal film (pure metal film) or an alloy film and made of, e.g., a cobalt (Co) film, a nickel (Ni) film, a nickel-platinum alloy film, or the like. The metal film ME2 can be formed using a sputtering method or the like.

Figure 32:
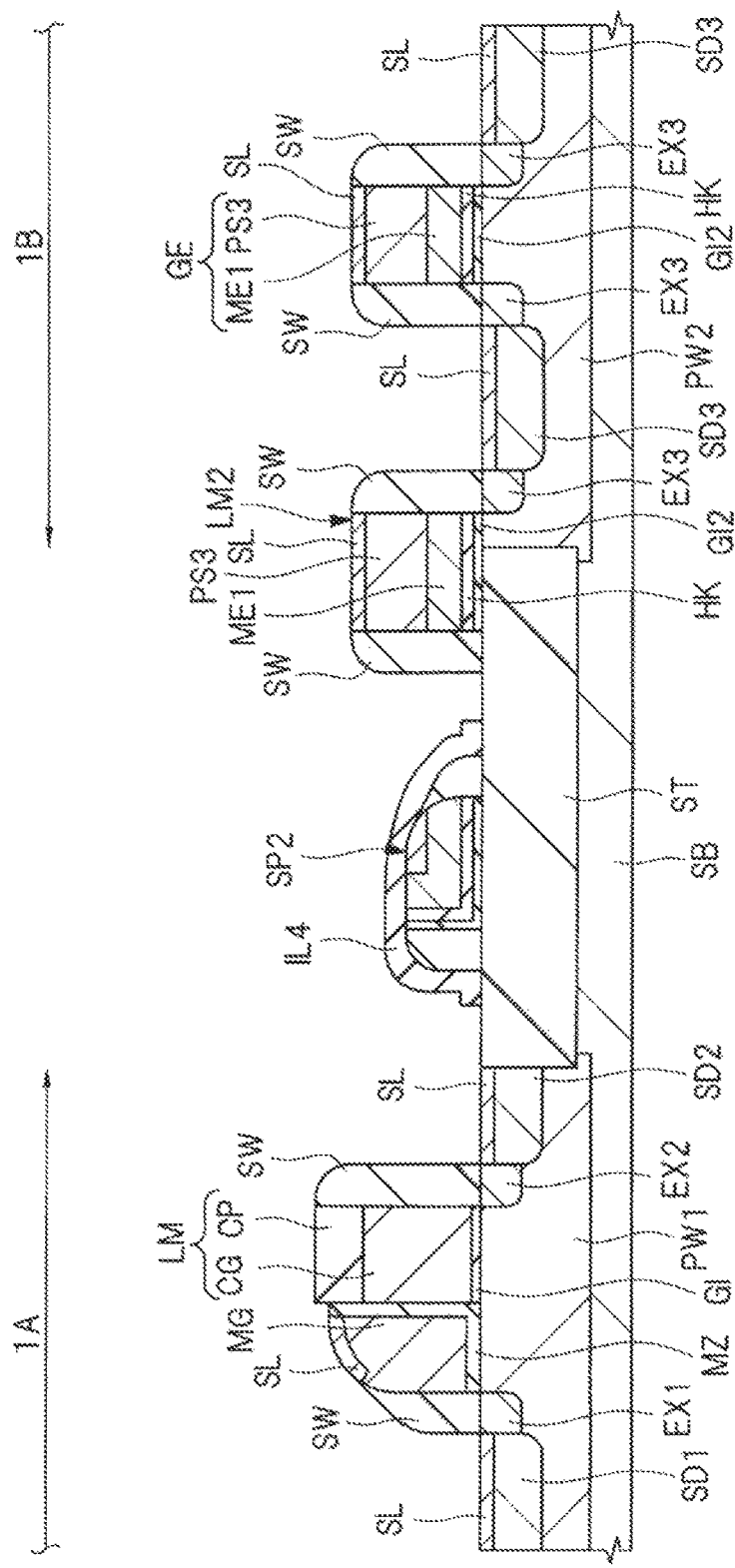
FIG. 32 is a main-portion cross-sectional view of the semiconductor device during the manufacturing process thereof, which is subsequent to FIG. 31.

Next, by performing heat treatment on the semiconductor substrate SB, the upper layer portion (top layer portion) of each of the n+-type semiconductor regions SD1, SD2, and SD3, the memory gate electrode MG (the foregoing silicon film PS2), and the gate electrode GE (the foregoing silicon film PS3 thereof) is caused to react with the metal film ME2. In this manner, as shown in FIG. 32, the metal silicide layer SL is formed in the upper layer portion (upper surface, top surface, or upper layer portion) of each of the n+-type semiconductor regions SD1, SD2, and SD3, the memory gate electrode MG, and the gate electrode GE. The metal silicide layer SL can be, e.g., a cobalt silicide layer (when the metal film ME2 is a cobalt film), a nickel silicide layer (when the metal film ME2 is a nickel film), or a platinum-added nickel silicide layer (when the metal film ME2 is a nickel-platinum alloy film). Thereafter, the unreacted metal film ME2 is removed. FIG. 32 shows a cross-sectional view at this stage. In the upper portion of the silicon film PS3 included in the laminated body LM2 also, the metal silicide layer SL may be formed.

By thus performing a so-called salicide (Self Aligned Silicide) process, the metal silicide layer SL is formed in the upper portion of each of the n+-type semiconductor regions SD1, SD2, and SD3, the memory gate electrode MG, and the gate electrode GE to allow a reduction in the resistance of each of the source, the drain, and the gate electrodes (MG and GE).

Note that, over the control gate electrode CG, the cap insulating film CP has been formed and, between the control gate electrode CG and the metal film ME2, the cap insulating film CP has been interposed. Accordingly, the control gate electrode CG is not in contact with the metal film ME2. Therefore, even when heat treatment is performed, the control gate electrode CG does not react with the metal film ME2 so that the metal silicide layer SL is not formed over the control gate electrode CG.

Figure 33:
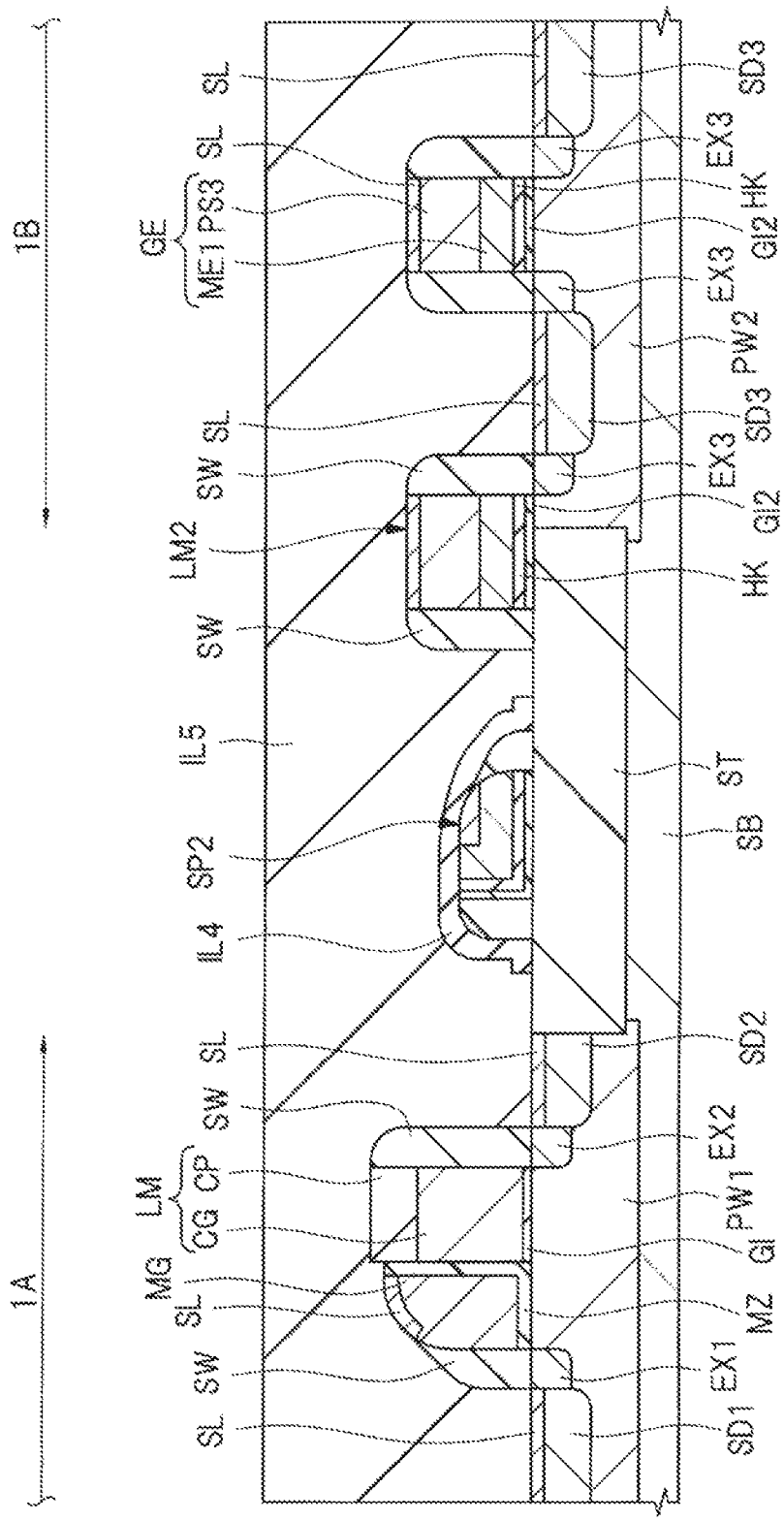
FIG. 33 is a main-portion cross-sectional view of the semiconductor device during the manufacturing process thereof, which is subsequent to FIG. 32.

Next, as shown in FIG. 33, over the entire main surface of the semiconductor substrate SB, an insulating film IL5 is formed (deposited) as an interlayer insulating film so as to cover the control gate electrode CG, the metal gate electrode MG, the gate electrode GE, and the sidewall spacers SW (Step S33 in FIG. 4).

The insulating film IL5 is made of a single-layer film of a silicon oxide film, a laminated film of a silicon nitride film and a silicon oxide film formed over the silicon nitride film to be thicker than the silicon nitride film, or the like. The insulating film IL5 can be formed using, e.g., a CVD method or the like. After the formation of the insulating film IL5, the upper surface of the insulating film IL5 is planarized as necessary using a CMP method or the like.

Figure 34:
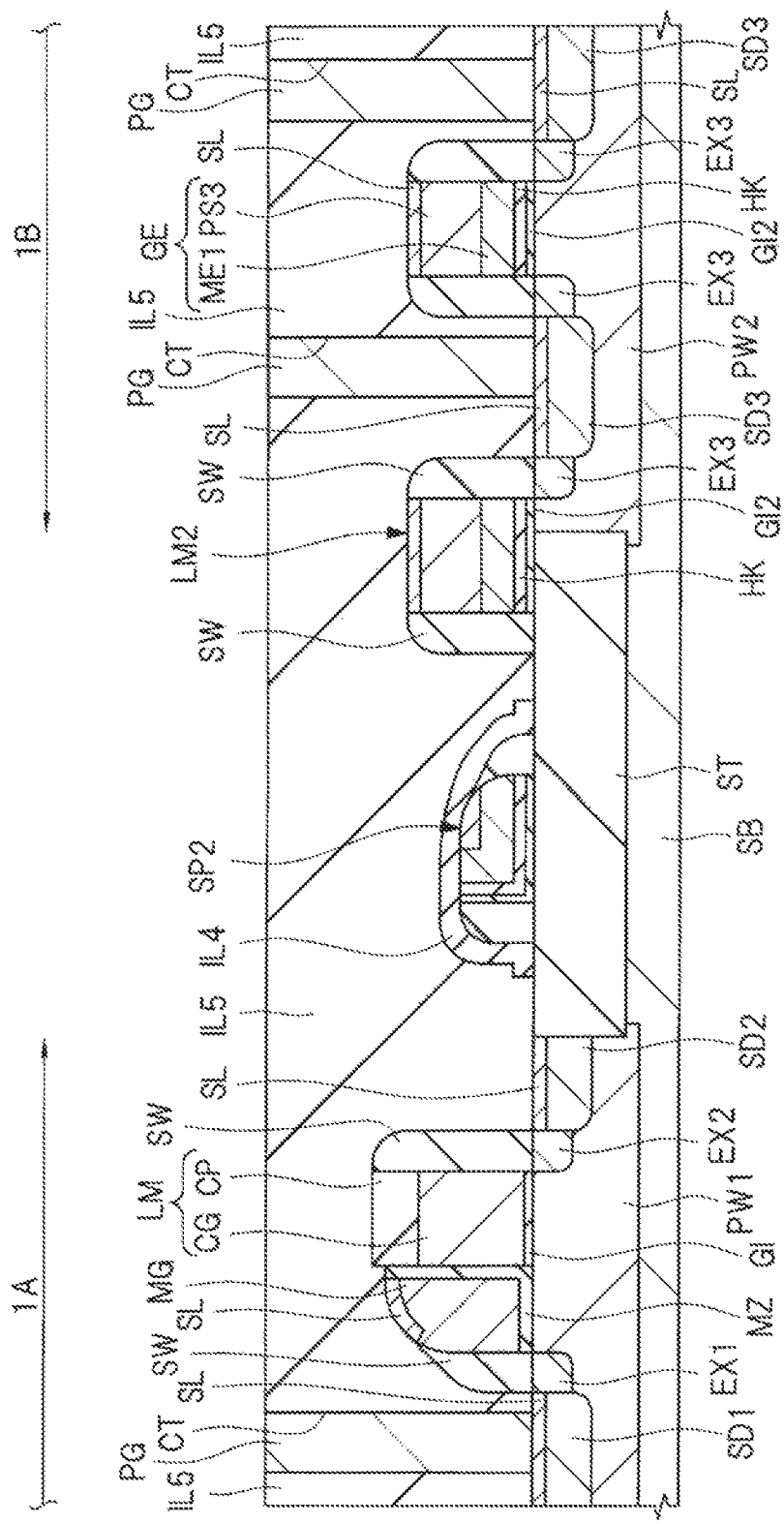
FIG. 34 is a main-portion cross-sectional view of the semiconductor device during the manufacturing process thereof, which is subsequent to FIG. 33.

Next, using a photoresist pattern (not shown) formed over the insulating film IL5 using a photolithographic method as an etching mask, the insulating film IL5 is dry-etched to be formed with contact holes (openings or through holes) CT, as shown in FIG. 34 (Step S34 in FIG. 4).

Next, in the contact holes CT, conductive plugs PG made of tungsten (W) or the like are formed as conductor portions (connecting conductor portions) (Step S35 in FIG. 4).

To form the plugs PG, for example, over the insulating film IL5 including the insides of the contact holes CT (over the bottom portions and side walls thereof), a barrier conductor film (e.g., a titanium film, a titanium nitride film, or a laminated film thereof) is formed. Then, over the barrier conductor film, a main conductor film made of a tungsten film or the like is formed so as to fill the contact holes CT. By removing the unneeded main conductor film and barrier conductor film from over the insulating film IL5 by a CMP method, an etch-back method, or the like, the plugs PG can be formed. Note that, for simpler illustration, in FIG. 34, the barrier conductor film and the main conductor film (tungsten film) each forming the plugs PG are integrally shown.

The contact holes CT and the plugs PG embedded therein are formed over the n$^+$-type semiconductor regions SD1, SD2, and SD3, the control gate electrode CG, the memory gate electrode MG, the gate electrode GE, and the like. At the bottom portion of each of the contact holes CT, a part of the main surface of the semiconductor substrate SB, e.g., a part of the n$^+$-type semiconductor regions SD1, SD2, and SD3 (metal silicide layers SL over the surfaces thereof), a part of the control gate electrode CG (metal silicide layer SL over the surface thereof), a part of the memory gate electrode MG (metal silicide layer SL over the surface thereof), a part of the gate electrode GE (metal silicide layer SL over the surface thereof), or the like is exposed. In the cross-sectional view of FIG. 34, a cross section is shown in which parts of the n$^+$-type semiconductor regions SD1 and SD3 (metal silicide layers SL over the surfaces thereof) are exposed at the bottom portions of the contact holes CT and electrically coupled to the plugs PG filling the contact holes CT.

Next, over the insulating film IL5 in which the plugs PG are embedded, wires (wiring layer) M1 as wires in a first layer are formed (Step S36 in FIG. 4). A description will be given of the case where the wires M1 are formed using a damascene technique (which is a single-damascene technique herein).

Figure 35:
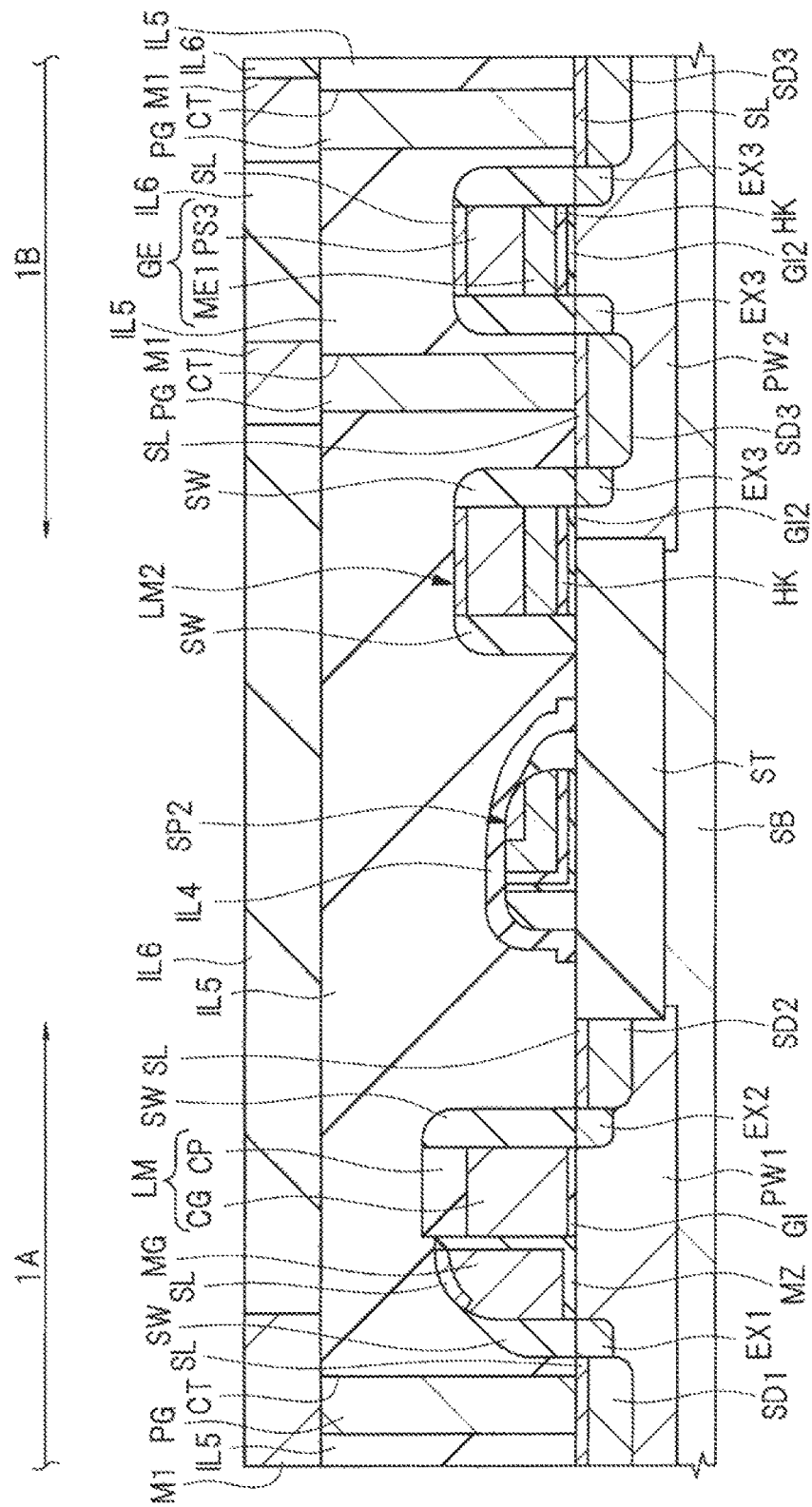
FIG. 35 is a main-portion cross-sectional view of the semiconductor device during the manufacturing process thereof, which is subsequent to FIG. 34.

First, as shown in FIG. 35, over the insulating film IL5 in which the plugs PG are embedded, an insulating film IL6 is formed. The insulating film IL6 can also be formed of a laminated film of a plurality of insulating films. Then, by dry etching using a photoresist pattern (not shown) as an etching mask, wire trenches (trenches for wires) are formed in the predetermined regions of the insulating film IL6. Then, over the insulating film IL6 including the bottom portions and side walls of the wire trenches, a barrier conductor film (such as, e.g., a titanium nitride film, a tantalum film, or a tantalum nitride film) is formed. Subsequently, by a CVD method, a sputtering method, or the like, a copper seed layer is formed over the barrier conductor film. Then, using an electrolytic plating method or the like, a copper plating film is further formed over the seed layer to be embedded in the wire trenches. Then, by removing the main conductor film (copper plating film and seed layer) and the barrier conductor film which are located in the region other than the wire trenches by a CMP method, the first-layer wires M1 containing copper embedded in the wire trenches as a main conductive material are formed. In FIG. 35, for simpler illustration, the barrier conductor film, the seed layer, and the copper plating film are integrally shown as each of the wires M1.

The wires M1 are electrically coupled to the source region (n$^+$-type semiconductor region SD1) of the memory transistor, the drain region (n$^+$-type semiconductor region SD2) of the control transistor, the source/drain regions (n$^+$-type semiconductor regions SD3) of the MISFET in the peripheral circuit region 1B, the control gate electrode CG, the memory gate electrode MG, the gate electrode GE, and the like via the plugs PG. Thereafter, wires in the second and subsequent layers are formed by a dual-damascene method or the like, but the illustration and description thereof is omitted. The wires M1 and the wires in the upper layers are not limited to damascene wires and can also be formed by patterning conductor films for wires. For example, tungsten wires, aluminum wires, or the like can also be used.

In this manner, the semiconductor device of the present embodiment is manufactured.

Next, referring to FIGS. 36 to 40, a description will be given of the manufacturing process of a semiconductor device in a modification of the present embodiment. FIGS. 36 to 40 are main-portion cross-sectional views of the semiconductor device in the modification during the manufacturing process thereof.

The structure of FIG. 15 described above is obtained by performing the manufacturing process up to Step S13 (step of forming the insulating film IL2) described above. Then, in the case of FIGS. 16 and 17 described above, in Step S14 (step of polishing the insulating film IL2), the polishing treatment of the insulating film IIL2 is performed until the cap insulating film CP of the laminated body LM and the insulating film IL1 of the laminated film LF1 are exposed as shown in FIG. 16 described above, and then the insulating film IL3 is formed in Step S15, as shown in FIG. 17.

Figure 36:
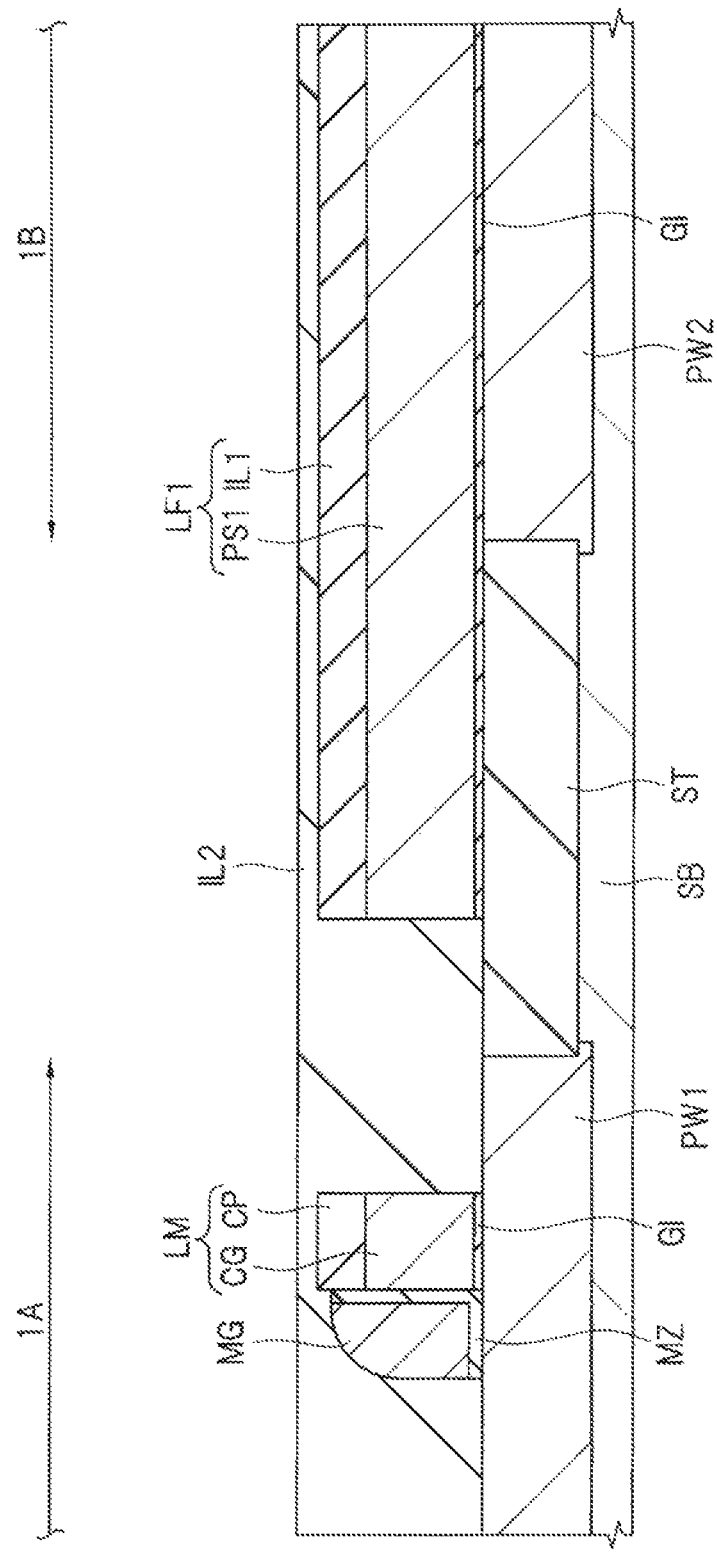
FIG. 36 is a main-portion cross-sectional view of a semiconductor device in a modification of the embodiment.

In the modification, the polishing of the insulating film IL2 in Step S14 (step of polishing the insulating film IL2) can also be ended at a stage before the cap insulating film CP of the laminated body LM and the insulating film IL1 of the laminated film LF1 are exposed, i.e., at the stage in FIG. 36. However, even when the polishing of the insulating film IL2 is ended at the stage before the cap insulating film CP of the laminated body LM and the insulating film IL1 of the laminated film LF1 are exposed in Step S14 (step of polishing the insulating film IL2), the polishing treatment of the insulating film IL2 is performed until the upper surface of the insulating film IL2 located in the memory cell region 1A is planarized. That is, in either of the case of FIG. 16 described above and the case of FIG. 36, the polishing step in Step S14 is performed for the purpose of planarizing the upper surface of the insulating film IL2 located in the memory cell region 1A.

Figure 37:
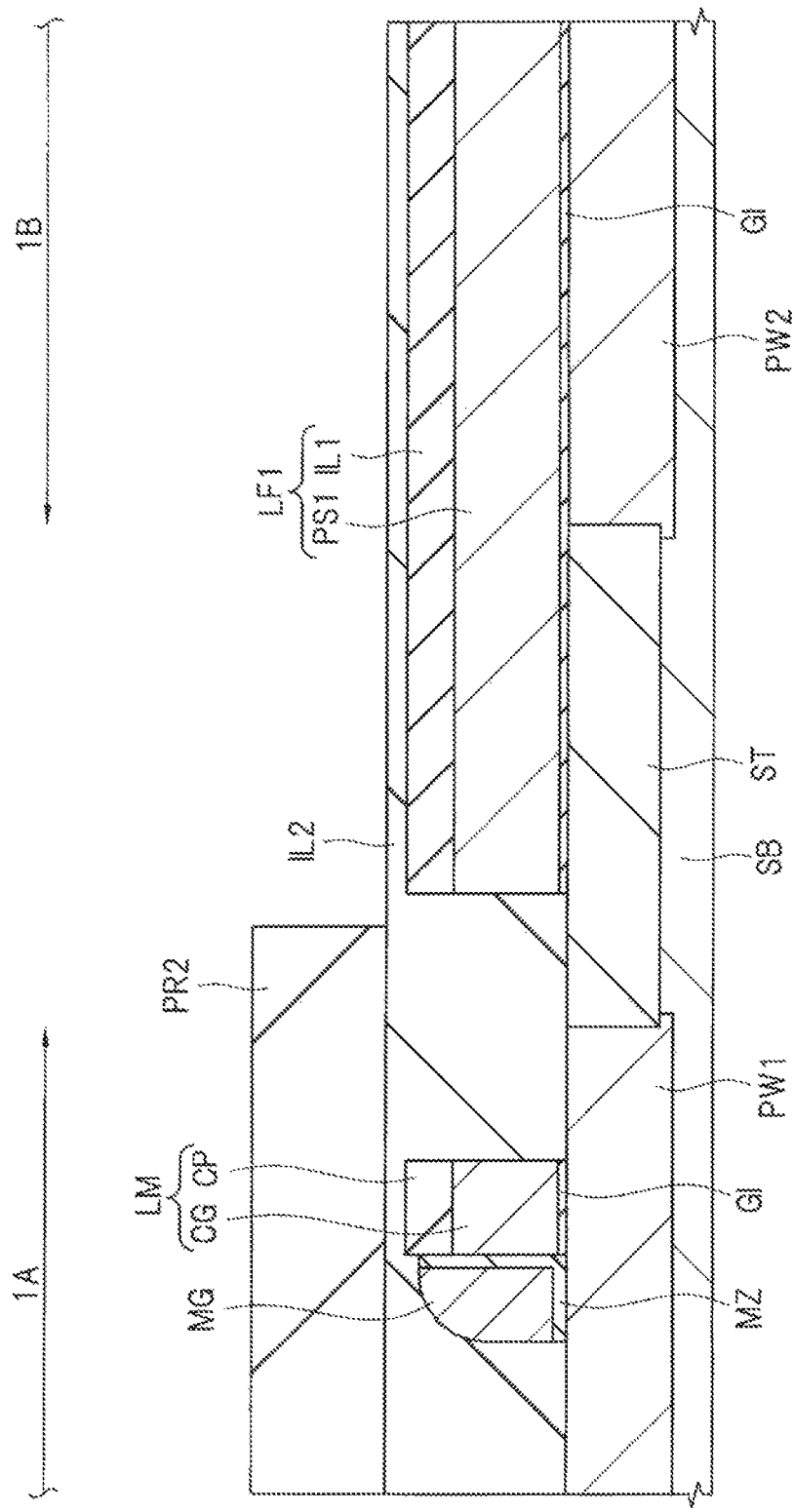
FIG. 37 is a main-portion cross-sectional view of the semiconductor device during the manufacturing process thereof, which is subsequent to FIG. 36.

Thus, as shown in FIG. 36, a state is obtained where the upper surface of the insulating film IL2 located in the memory cell region 1A is planarized and the upper surface of the cap insulating film CP of the laminated body LM1 is covered with the insulating film IL2. In this case, at the stage at which Step S14 (step of polishing the insulating film IL2) is ended, a state is reached where the upper surface of the cap insulating film CP of the laminated body LM is covered with the insulating film IL2. Accordingly, Step S15 (step of forming the insulating film IL3) can also be omitted. That is, after the structure of FIG. 36 is obtained, it is possible to omit Step S15 (step of forming the insulating film IL3) and form the foregoing photoresist pattern PR2 over the insulating film IL2, as shown in FIG. 37. In the case of FIG. 37 also, the photoresist pattern PR2 is the same as in the case of FIG. 17 described above except that the photoresist pattern PR2 is formed not over the insulating film IL3, but over the insulating film IL2 so that the repeated description thereof is omitted here.

Figure 38:
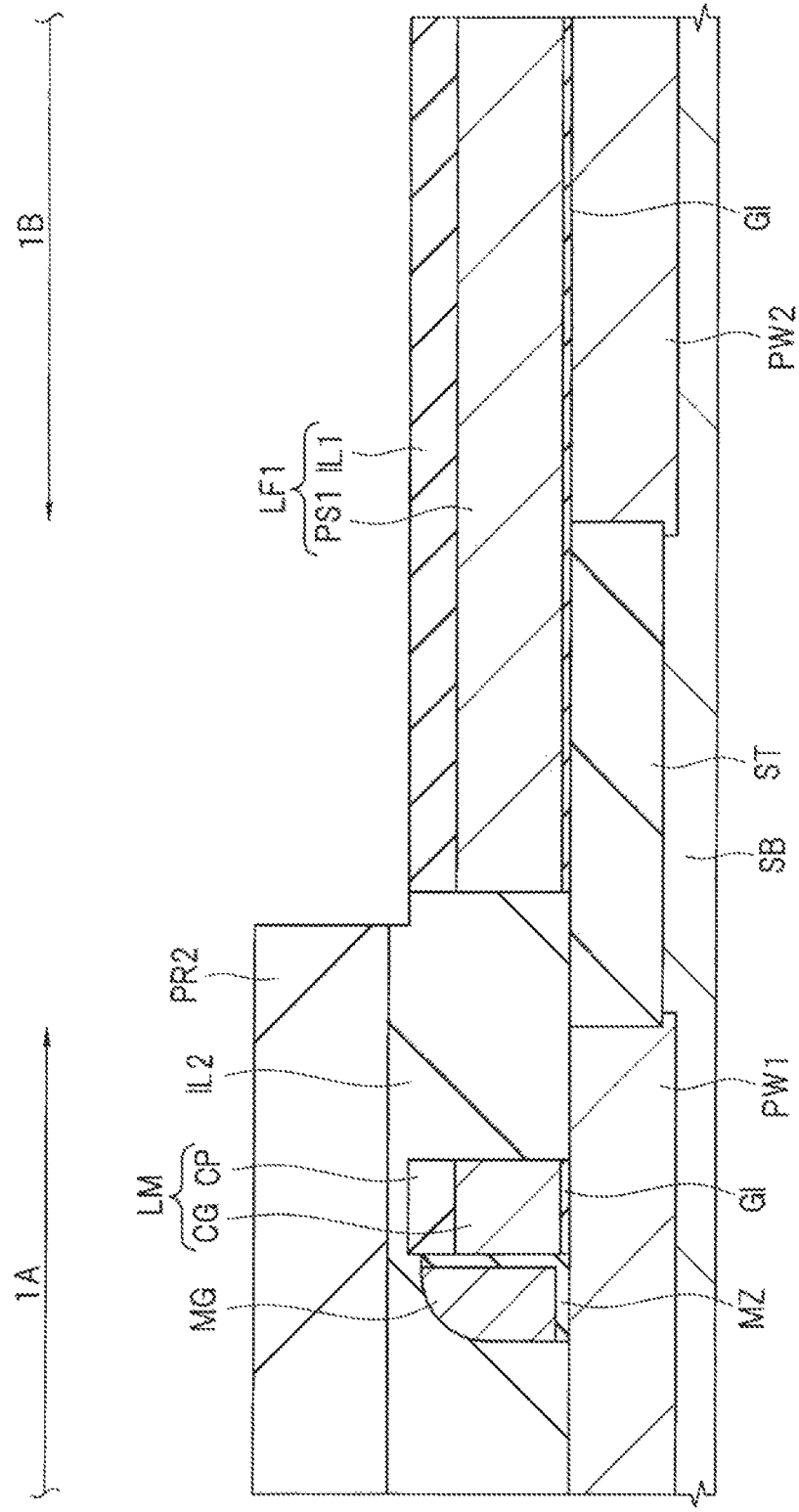
FIG. 38 is a main-portion cross-sectional view of the semiconductor device during the manufacturing process thereof, which is subsequent to FIG. 37.
Figure 39:
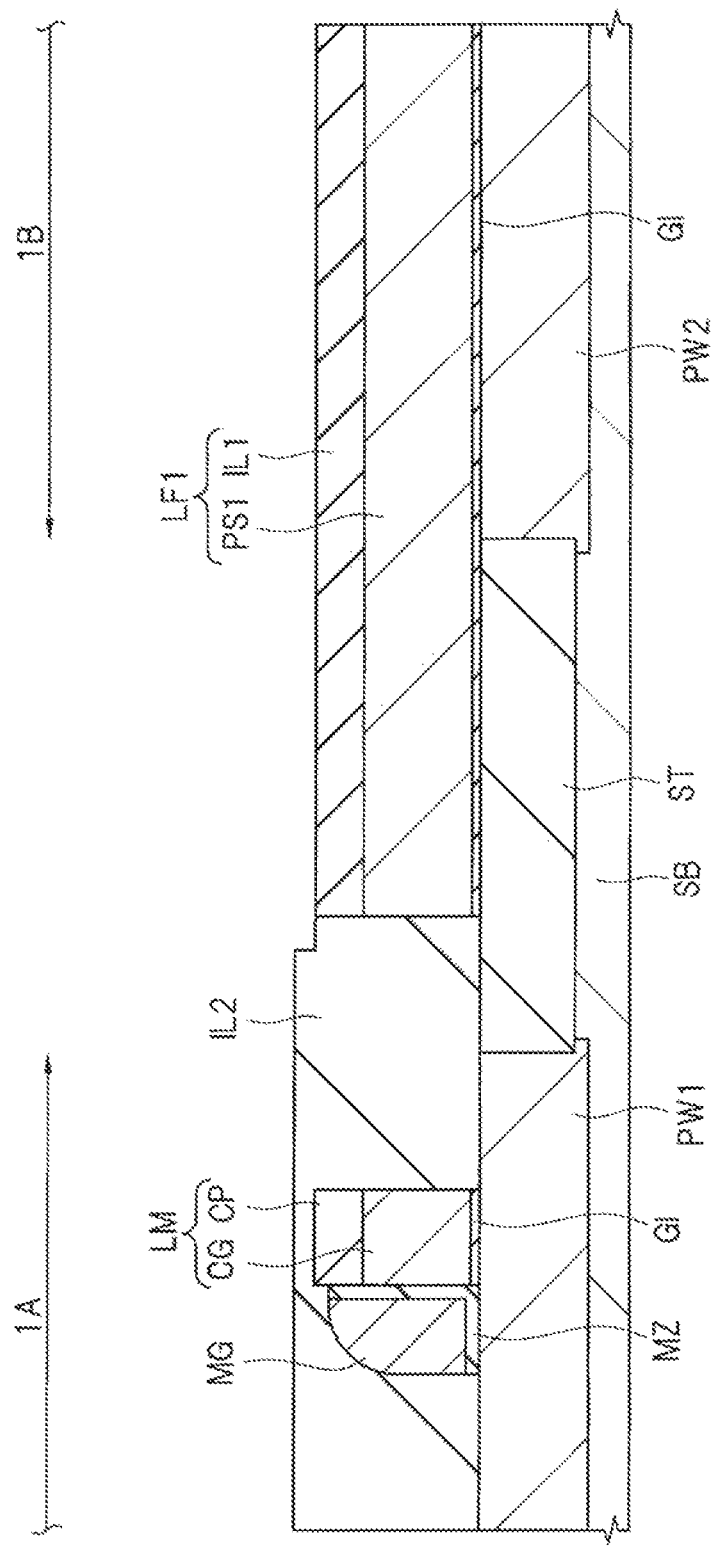
FIG. 39 is a main-portion cross-sectional view of the semiconductor device during the manufacturing process thereof, which is subsequent to FIG. 38.

Then, in Step S16 described above, as shown in FIG. 38, using the photoresist pattern PR2 as an etching mask, the insulating film IL2 is etched to be removed. In the case of FIG. 38 also, the etching step in Step S16 is the same as in the case of FIG. 18 described above except that an object to be etched is not the insulating film IL3, but the insulating film IL2 so that the repeated description thereof is omitted here. In the case of the modification, at the stage at which the polishing step in Step S14 is ended, the insulating film IL2 remains in the form of a layer over the laminated film LF1 so that the laminated film LF1 is not exposed. However, when the etching step in Step S16 is performed, the insulating film IL2 over the laminated film LF1 is removed to expose the upper surface of the laminated film LF1. On the other hand, in the memory cell region 1A, the insulating film IL2 is covered with the photoresist pattern PR2 to remain without being etched even when the etching step in Step S16 is performed. As a result, the upper surface of the laminated film LF1 is exposed, but the state where the upper surface of the memory gate electrode MG and the upper surface of the cap insulating film CP are covered with the insulating film IL2 without being exposed is maintained even when the etching step in Step S16 is performed. After the etching in Step S16, as shown in FIG. 39, the photoresist pattern PR2 is removed.

Figure 40:
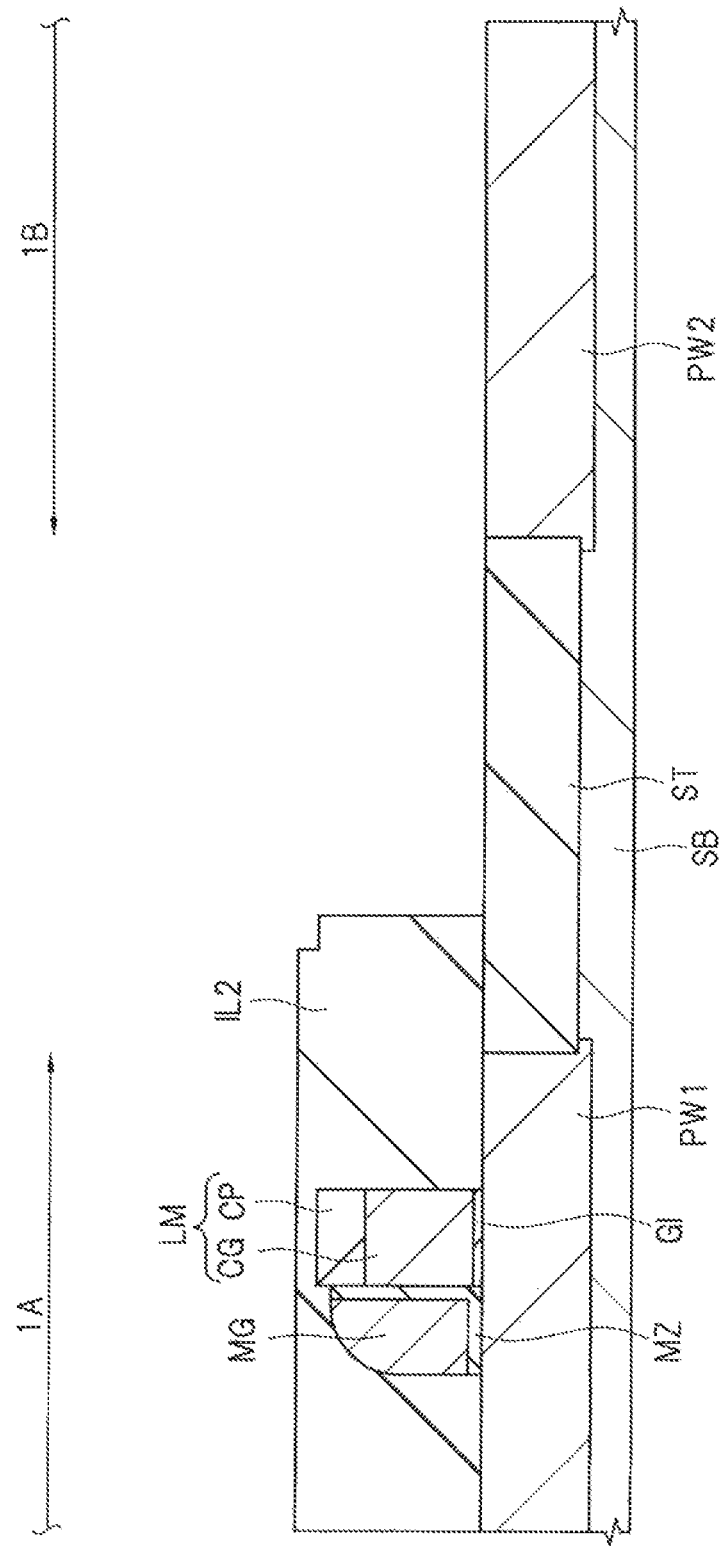
FIG. 40 is a main-portion cross-sectional view of the semiconductor device during the manufacturing process thereof, which is subsequent to FIG. 39.

Then, in Step S17 described above, as shown in FIG. 40, the laminated film LF1 is removed by etching. In the case of FIG. 40 also, the etching step in Step S17 is basically the same as in the case of FIG. 20 described above. However, in the case of FIG. 40, the insulating film IL3 has not been formed so that there is no etching of the insulating film IL3.

In the same manner as in the case of FIG. 20 described above, in the case of FIG. 40 also, in the step of etching the insulating film IL1 included in the step of removing the laminated film LF1 in Step S17, etching is preferably performed under such a condition that the silicon film PS1 and the insulating film IL2 are less likely to be etched than the insulating film IL1. Also, in the step of etching the silicon film PS1 included in the step of removing the laminated film LF1 in Step S17, the etching is preferably performed under such a condition that the insulating film IL2 is less likely to be etched than the silicon film PS1. When the laminated film LF1 is removed in Step S17, the insulating film GI present under the laminated film LF1 is exposed, which is also etched to be removed. The etching of the insulating film GI is preferably performed under such a condition that the semiconductor substrate SB is less likely to be etched than the insulating film GI. As a result, a state is reached where, from over the semiconductor substrate SB located in the peripheral circuit region 1B, the insulating film GI and the laminated film LF1 are removed.

In the case of FIG. 40, the insulating film IL2 may also be etched in the step of removing the laminated film LF1 in Step S17 or the subsequent step of removing the insulating film GI. In such a case also, it is preferable that the insulating film IL2 remains over the laminated body LM (i.e., over the cap insulating film CP) to prevent the upper surface (i.e., the upper surface of the cap insulating film CP) of the laminated body LM from being exposed until the step of etching the insulating film IL1 included in the step of removing the laminated film LF1 in Step S17 is ended (i.e., until the insulating film IL1 of the laminated film LF1 is removed to expose the upper surface of the silicon film PS1). Thus, it is possible to prevent the cap insulating film CP of the laminated body LM from being etched in the step of etching the insulating film IL1 of the laminated film LF1 and therefore prevent the control gate electrode CG of the laminated body LM from being etched in the step of etching the silicon film PS1 of the laminated film LF1.

In the case of FIG. 40 also, at the stage at which the step of removing the laminated film LF1 in Step S17 or the subsequent step of removing the insulating film GI is ended, the memory gate electrode MG and the control gate electrode CG are preferably not exposed. In particular, it is preferable to keep the memory gate electrode MG and the control gate electrode CG from being exposed until the step of etching the silicon film PS1 in Step S17 is ended. Accordingly, at the stage at which the step of removing the laminated film LF1 in Step S17 or the subsequent step of removing the insulating film GI is ended, the memory gate electrode MG is preferably covered with the insulating film IL2. Thus, it is possible to prevent the memory gate electrode MG and the control gate electrode CG from being etched.

In this manner, the laminated film LF1 and the insulating film GI (insulating film GI located in the peripheral circuit region 1B) under the laminated film LF1 are removed.

The steps shown in FIG. 40 and the subsequent drawings are the same as the steps shown in FIG. 20 and the subsequent drawings so that the repeated description thereof is omitted here. That is, Steps S18, S19, S20, and S21 described above and the steps subsequent thereto are performed appropriately. The modification shown in FIGS. 36 to 40 is also applicable to Embodiments 2 and 3 described later.

However, in the case of performing the polishing treatment of the insulating film IL2 in Step S14 described above until the cap insulating film CP of the laminated body LM and the insulating film IL1 of the laminated film LF1 are exposed as shown in FIG. 16 described above, the cap insulating film CP and the insulating film IL1 of the laminated film LF1 can be used as polishing stopper films to allow easier control of the polishing step (especially the amount of polishing) in Step S14. This allows the polishing step in Step S14 to be easily managed and the manufacturing process of the semiconductor device to be easily performed. On the other hand, in the case of not exposing the cap insulating film CP of the laminated body LM and the insulating film IL1 of the laminated film LF1 in Step S14 described above as in FIG. 37 (modification), the step of forming the insulating film IL3 in Step S15 described above can be omitted to allow a reduction in the number of steps in the manufacturing process of the semiconductor device.

Next, referring to FIGS. 41 and 42, a description will be given of an example of a configuration of the memory cell of the nonvolatile memory in the semiconductor device of the present embodiment.

Figure 41:
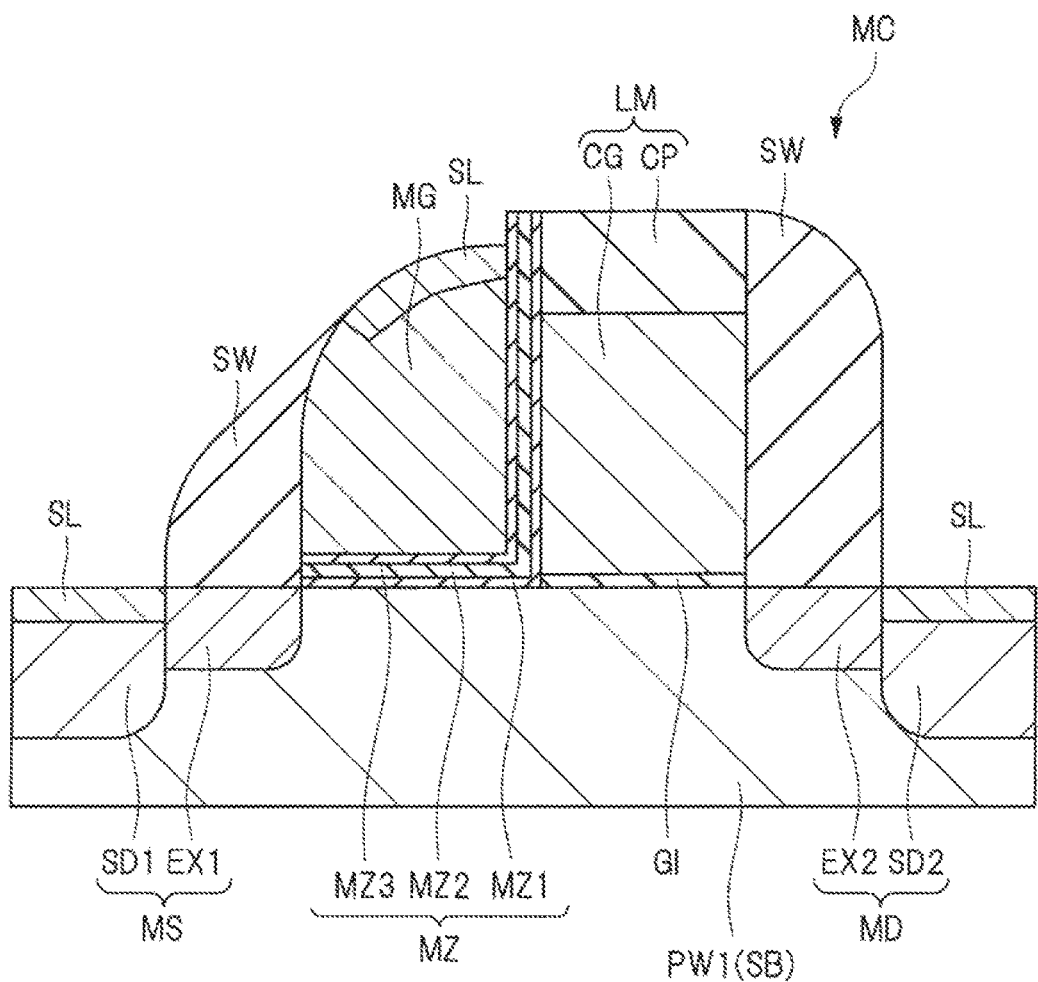
FIG. 41 is a main-portion cross-sectional view of the semiconductor device as the embodiment.

FIG. 41 is a main-portion cross-sectional view of the semiconductor device in the present embodiment which shows a main-portion cross-sectional view of the memory cell region of the nonvolatile memory. FIG. 42 is an equivalent circuit diagram of the memory cell. In FIG. 41, for simpler illustration, the illustration of the insulating film IL5, the contact holes CT, the plugs PG, the insulating film IL6, and the wires M1 each included in the structure of FIG. 35 is omitted.

As shown in FIG. 41, in the semiconductor substrate SB, the memory cell MC of the nonvolatile memory including the memory transistor, and the control transistor is formed. In an actual situation, in the semiconductor substrate SB, a plurality of the memory cells MC are formed in the form of an array. Each of the memory cell regions is electrically isolated from the other region by the isolation region (which is not shown in FIG. 41).

Figures 42, 43:
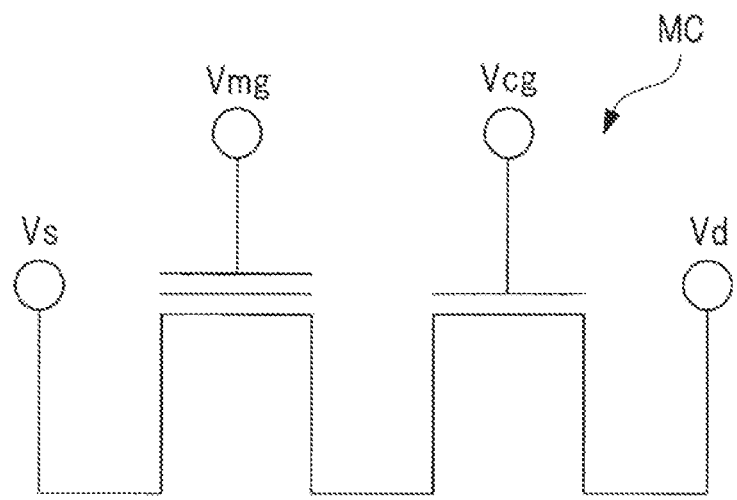
FIG. 42 is an equivalent circuit diagram of a memory cell.
FIG. 43 is a table showing an example of conditions for the application of voltages to the individual parts of a selected memory cell during "write", "erase", and "read" operations.

As shown in FIGS. 41 and 42, the memory cell MC of the nonvolatile memory in the semiconductor device in the present embodiment is a split-gate memory cell including two MISFETs coupled to each other, which are the control transistor having the control gate electrode CG and the memory transistor having the memory gate electrode MG.

Here, the MISFET including the gate insulating film including the charge storage portion (charge storage layer) and the memory gate electrode MG is referred to as the memory transistor, and the MISFET including the gate insulating film and the control gate electrode CG is referred to as the control transistor. Accordingly, the memory gate electrode MG is the gate electrode of the memory transistor, the control gate electrode CG is the gate electrode of the control transistor, and the control gate electrode CG and the memory gate electrode MG are the gate electrodes forming the memory cell of the nonvolatile memory.

Note that the control transistor, which is a transistor for selecting a memory cell, can also be regarded as a selection transistor. Accordingly, the control gate electrode CG can also be regarded as a selection gate electrode. The memory transistor is a transistor for storage.

Hereinbelow, a specific description will be given of the configuration of the memory cell MC.

As shown in FIG. 41, the memory cell MC of the nonvolatile memory has n-type semiconductor regions MS and MD for the source and drain thereof formed in the p-type well PW1 of the semiconductor substrate SB, the control gate electrode CG formed over the semiconductor substrate SB (p-type well PW1), and the memory gate electrode MG formed over the semiconductor substrate SB (p-type well PW1) to be adjacent to the control gate electrode CG. The memory cell MC of the nonvolatile memory further has the insulating film (gate insulating film) GI formed between the control gate electrode CG and the semiconductor substrate SB (p-type well PW1), and the insulating film MZ formed between the memory gate electrode MG and the semiconductor substrate SB (p-type well PW1).

The control gate electrode CG and the memory gate electrode MG extend along the main surface of the semiconductor substrate SB with the insulating film MZ being interposed between the opposing side surfaces thereof and are arranged side by side. The extending directions of the control gate electrode CG and the memory gate electrode MG are perpendicular to the paper face with FIG. 41. The control gate electrode CG and the memory gate electrode MG are formed over the semiconductor substrate SB (p-type well PW1) located between the semiconductor regions MD and MS via the insulating film GI or the insulating film MZ. The memory gate electrode MG is located closer to the semiconductor region MS, while the control gate electrode CG is located closer to the semiconductor region MD. However, the control gate electrode CG is formed over the semiconductor substrate SB via the insulating film GI, while the memory gate electrode MG is formed over the semiconductor substrate SB via the insulating film MZ.

The control gate electrode CG and the memory gate electrode MG are adjacent to each other with the insulating film MZ being interposed therebetween. The insulating film MZ extends over both of the region between the memory gate electrode MG and the semiconductor substrate SB (p-type well PW1) and the region between the memory gate electrode MG and the control gate electrode CG.

The insulating film GI formed between the control gate electrode CG and the semiconductor substrate SB (p-type well PW1), i.e., the insulating film GI under the control gate electrode CD functions as the gate insulating film of the control transistor. On the other hand, the insulating film MZ between the memory gate electrode MG and the semiconductor substrate SB (p-type well PW1), i.e., the insulating film MZ under the memory gate electrode MG functions as the gate insulating film (gate insulating film having a charge storage portion therein) of the memory transistor. Note that the insulating film MZ between the memory gate electrode MG and the semiconductor substrate SB (p-type well PW1) functions as the gate insulating film of the memory transistor, but the insulating film MZ between the memory gate electrode MG and the control gate electrode CG functions as an insulating film for providing insulation (electrical isolation) between the memory gate electrode MG and the control gate electrode CG.

Of the insulating film MZ, the silicon nitride film MZ2 is an insulating film for storing charges and functions as a charge storage layer (charge storage portion). That is, the silicon nitride film MZ2 is a trapping insulating film formed in the insulating film MZ. Accordingly, the insulating film MZ can be regarded as an insulating film having a charge storage portion (which is the silicon nitride film MZ2) therein.

The silicon oxide films MZ3 and MZ1 located over and under the silicon nitride film MZ2 can function as charge block layers or charge confinement layers. By providing the insulating film MZ between the memory gate electrode MG and the semiconductor substrate SB with a structure in which the silicon nitride film MZ2 is interposed between the silicon oxide films MZ3 and MZ1, it is possible to store charges in the silicon nitride film MZ2.

Each of the semiconductor regions MS and MD is a semiconductor region for the source or drain. That is, the semiconductor region MS functions as one of the source region and the drain region, and the semiconductor region MD functions as the other of the source region and the drain region. Here, the semiconductor region MS functions as the source region, while the semiconductor region MD functions as the drain region. Each of the semiconductor regions MS and MD is formed of a semiconductor region into which an n-type impurity has been introduced to have an LDD structure. That is, the semiconductor region MS for the source has the $n^-$-type semiconductor region EX1 (extension region), and the $n^+$-type semiconductor region SD1 (source region) having an impurity concentration higher than that of the $n^-$-type semiconductor region EX1. The semiconductor region MD for the drain has the $n^-$-type semiconductor region EX2 (extension region), and the $n^+$-type semiconductor region SD2 (drain region) having an impurity concentration higher than that of the $n^-$-type semiconductor region EX2.

The semiconductor region MS is a semiconductor region for the source or drain which is formed at a position in the semiconductor substrate SB adjacent to the memory gate electrode MG in a gate length direction (gate length direction of the memory gate electrode MG). The semiconductor region MD is a semiconductor region for the source or drain which is formed at a position in the semiconductor substrate SB adjacent to the control gate electrode CG in a gate length direction (gate length direction of the control gate electrode MG).

Over the respective side walls of the memory gate electrode MG and the control gate electrode CG which are not adjacent to each other, the sidewall spacers SW each made of an insulator (insulating film) are formed.

When the cap insulating film CP is formed over the control gate electrode CG, the metal silicide layer SL is not formed over the control gate electrode CG, resulting in a state where the upper surface of the control gate electrode CG is covered with the cap insulating film CP. The sidewall spacer SW over the side wall of the control gate electrode CG is formed over the side wall of the laminated body LM of the control gate electrode CG and the cap insulating film CP.

In the source portion, the n$^-$-type semiconductor region EX1 is formed by self-alignment with the memory gate electrode MG, and the n$^+$-type semiconductor region SD1 is formed by self-alignment with the sidewall spacer SW over the side wall of the memory gate electrode MG. As a result, in the manufactured semiconductor device, the low-concentration n$^-$-type semiconductor region EX1 is formed under the sidewall spacer SW over the side wall of the memory gate electrode MG, while the high-concentration n$^+$-type semiconductor region SD1 is formed outside the low-concentration n$^-$-type semiconductor region EX1. Accordingly, the low-concentration n$^-$-type semiconductor region EX1 is formed to be adjacent to the channel region of the memory transistor, while the high-concentration n$^+$-type semiconductor region SD1 is formed to be adjacent to the low-concentration n$^-$-type semiconductor region EX1 and spaced apart from the channel region of the memory transistor by the distance corresponding to the n$^-$-type semiconductor region EX1.

In the drain portion, the n$^-$-type semiconductor region EX2 is formed by self-alignment with the control gate electrode CG, and the n$^+$-type semiconductor region SD2 is formed by self-alignment with the sidewall spacer SW over the side wall of the control gate electrode CG. As a result, in the manufactured semiconductor device, the low-concentration n$^-$-type semiconductor region EX2 is formed under the sidewall spacer SW over the side wall of the control gate electrode CG, while the high-concentration n$^+$-type semiconductor region SD2 is formed outside the low-concentration n$^-$-type semiconductor region EX2. Accordingly, the low-concentration n$^-$-type semiconductor region EX2 is formed to be adjacent to the channel region of the control transistor, while the high-concentration n$^+$-type semiconductor region SD2 is formed to be adjacent to the low-concentration n$^-$-type semiconductor region EX2 and spaced apart from the channel region of the control transistor by the distance corresponding to the n$^-$-type semiconductor region EX2.

Under the insulating film MZ under the memory gate electrode MG, the channel region of the memory transistor is formed while, under the insulating film GI under the control gate electrode CG, the channel region of the control transistor is formed.

In the upper portion of each of the memory gate electrode MG and the n$^+$-type semiconductor regions SD1 and SD2, the metal silicide layer SL is formed using a salicide technique or the like.

Next, an example of an operation of the nonvolatile memory will be described with reference to FIG. 43.

FIG. 43 is a table showing an example of conditions for the application of voltages to the individual parts of a selected memory cell during "write", "erase", and "read" operations. In the table of FIG. 43, there are shown a voltage Vmg applied to the memory gate electrode MG of a memory cell (selected memory cell) as shown in FIGS. 41 and 42, a voltage Vs applied to the source region (semiconductor region MS) thereof, a voltage Vcg applied to the control gate electrode CG thereof, a voltage Vd applied to the drain region (semiconductor region MD) thereof, and a voltage Vb applied to the p-type well PW1 thereof during each of the "Write", "Erase", and "Read" operations. Note that the example shown in the table of FIG. 43 is a preferred example of the conditions for the voltage application. The conditions for the voltage application are not limited thereto and can be variously changed as necessary. Also, in the present embodiment, the injection of electrons into the silicon nitride film MZ2 as the charge storage layer (charge storage portion) in the insulating film MZ of the memory transistor is defined as the "write" operation and the injection of holes into the silicon nitride film MZ2 is defined as the "erase" operation.

As a write method, a write method (hot-electron-injection write method) referred to as a so-called SSI (Source Side Injection) method which performs a write operation by injecting hot electrons using source-side injection can be used. For example, voltages as shown in the "Write" row in FIG. 43 are applied to the individual parts of the selected memory cell to which a write operation is performed to inject electrons in the silicon nitride film MZ2 in the insulating film MZ of the selected memory cell and thereby perform the write operation. At this time, hot electrons are generated in the channel region (between the source and drain) under the area between the two gate electrodes (memory gate electrode MG and control gate electrode CG) to be injected into the silicon nitride film MZ2 serving as the charge storage layer (charge storage portion) in the insulating film MZ under the memory gate electrode MG. The injected hot electrons are trapped by a trap level in the silicon nitride film MZ2 in the insulating film MZ to consequently increase the threshold voltage of the memory transistor. That is, the memory transistor is brought into a write state.

As an erase method, an erase method (hot-hole-injection erase method) referred to as a so-called BTBT method which performs an erase operation by injecting hot holes using BTBT (Band-To-Band Tunneling phenomenon) can be used. That is, the holes generated by the BTBT (band-to-band tunneling phenomenon) are injected into the charge storage portion (silicon nitride film MZ2 in the insulating film MZ) to perform an erase operation. For example, voltages as shown in the "Erase" row in FIG. 43 are applied to the individual parts of the selected memory cell to which an erase operation is performed to generate holes using the BTBT phenomenon. The holes are subjected to field acceleration to be injected into the silicon nitride film MZ2 in the insulating film MZ of the selected memory cell to thus reduce the threshold voltage of the memory transistor. That is, the memory transistor is brought into an erase state.

During the read operation, voltages as shown in, e.g., the "read" row in FIG. 43 are applied to the individual parts of the selected memory cell to which a read operation is performed. By setting the voltage Vmg applied to the memory gate electrode MG during the read operation to a value between the threshold voltage of the memory transistor in a write state and the threshold voltage of the memory transistor in the erase state, the write state and the erase state can be distinguished from each other.

Next, a description will be given of the main characteristic feature and effect of the present embodiment.

In the present embodiment, in the same semiconductor substrate SB, the memory cell of the nonvolatile memory is formed in the memory cell region 1A, and the MISFET of the peripheral circuit is formed in the peripheral circuit region 1B.

When the memory cell of the nonvolatile memory and the MISFET of the peripheral circuit are embedded in mixed relation in the same semiconductor substrate, it may be desired to form the gate electrode forming the MISFET of the peripheral circuit using a conductive film other than the conductive film for forming the gate electrode forming the memory cell, such as when, e.g., the gate electrode forming the MISFET of the peripheral circuit is formed of a metal gate electrode. In this case, when the gate electrode of the memory cell is formed of a silicon film, it is necessary for the gate electrode of the MISFET of the peripheral circuit to have a metal film. Therefore, the gate electrode of the MISFET of the peripheral circuit needs to be formed using a conductive film different from the conductive film for forming the gate electrode of the memory cell.

In the present embodiment, the conductive films (which are the metal film ME1 and the silicon film PS3) for forming the gate electrode GE of the MISFET in the peripheral circuit region 1B are formed separately from the conductive film (which is the silicon film PS1) for forming the control gate electrode CG, and are also formed separately from the conductive film (which is the silicon film PS2) for forming the memory gate electrode MG. This allows the gate electrode GE of the MISFET in the peripheral circuit region 1B to be formed of the conductive films other than those of the control gate electrode CG and the memory gate electrode MG of the memory cell. Accordingly, it is possible to provide the gate electrode GE of the MISFET in the peripheral circuit region 1B with a film configuration different from that of each of the control gate electrode CG and the memory gate electrode MG of the memory cell. For example, as in the present embodiment, the gate electrode GE of the MISFET in the peripheral circuit region 1B can be formed as a metal gate electrode, and the control gate electrode CG and the memory gate electrode MG of the memory cell can be formed as silicon gate electrodes. By forming the metal gate electrode in the MISFET for the peripheral circuit, the performance of the semiconductor device can be improved.

However, in the case where the memory cell of the nonvolatile memory and the MISFET of the peripheral circuit are embedded in mixed relation in the same semiconductor substrate, when the conductive film for the gate electrode of the MISFET of the peripheral circuit is formed after the gate electrode of the memory cell is formed and the gate electrode of the MISFET is to be formed by processing the conductive film, unneeded residues of the conductive film may be left in the memory cell region. That is, when the conductive film for the gate electrode of the MISFET of the peripheral circuit is formed in a state where roughness resulting from the gate electrode of the memory cell is formed in the memory cell region and the formed conductive film is to be processed, the residues of the conductive film may be left so as to be adjacent to the roughness resulting from the gate electrode of the memory cell. Since the residues are the residues of the conductive film, if left in the memory cell region, the residues may degrade the reliability of the manufactured semiconductor device and degrade the performance thereof. The residues may also degrade the manufacturing yield of the semiconductor device. Therefore, it is desired to maximally prevent such residues from being left in the memory cell region.

In the present embodiment, over the semiconductor substrate SB located in the memory cell region 1A, the control gate electrode CG (first gate electrode) is formed via the insulating film GI (first gate insulating film) and the memory gate electrode MG (second gate electrode) is formed via the insulating film MZ (second gate insulating film). Then, in Step S13, over the semiconductor substrate SB, the insulating film IL2 (first insulating film) is formed so as to cover the control gate electrode CG and the memory gate electrode MG. Then, in Step S14, the upper surface of the insulating film IL2 is polished to be planarized. Then, over the semiconductor substrate SB, the conductor films (which are the metal film ME1 and the silicon film PS3) for the gate electrode GE are formed so as to cover the control gate electrode CG, the memory gate electrode MG, and the insulating film IL2 and then patterned to form the gate electrode GE (third gate electrode) in the peripheral circuit region 1B (second region). Thereafter, the insulating film IL2 is removed.

In the present embodiment, after the control gate electrode CG and the memory gate electrode MG are formed, in Step S13, the insulating film IL2 is formed over the semiconductor substrate SB so as to cover the control gate electrode CG and the memory gate electrode MG. Then, in Step S14, the upper surface of the insulating film IL2 is polished to be planarized. Accordingly, at the stage before the insulating film IL2 is formed, roughness resulting from the control gate electrode CG and the memory gate electrode MG is observed in the memory cell region 1A. However, by forming the insulating film IL2 and polishing the upper surface of the insulating film IL2 for the planarization thereof, a state is obtained in which, in the memory cell region 1A, the roughness resulting from the control gate electrode CG and the memory gate electrode MG is inhibited or prevented. As a result, when the gate electrode GE is formed by forming the conductive films (which are the metal film ME1 and the silicon film PS3 herein) for forming the gate electrode GE and processing the conductive films, it is possible to prevent the residues of the conductive films for forming the gate electrode GE from being left so as to be adjacent to the roughness resulting from the control gate electrode CG and the memory gate electrode MG. Therefore, the reliability of the manufactured semiconductor device can be improved. This allows an improvement in the performance of the semiconductor device. In addition, the manufacturing yield of the semiconductor device can be improved.

Also, in the present embodiment, after the insulating film IL2 is formed and planarized by polishing, the conductive films (which are the metal film ME1 and the silicon film PS3 herein) for forming the gate electrode GE are formed and processed. As a result, when the conductive films for forming the gate electrode GE are formed and processed, the control gate electrode CG and the memory gate electrode MG are protected with the insulating film IL2. Consequently, it is possible to prevent the occurrence of a problem for the control gate electrode CG and the memory gate electrode MG. Therefore, the reliability of the semiconductor device can be improved. This allows an improvement in the performance of the semiconductor device. In addition, the manufacturing yield of the semiconductor device can be improved.

Also, in the present embodiment, the control gate electrode CG is formed first in the memory cell region 1A via the insulating film GI (first gate insulating film), the memory gate electrode MG is formed via the insulating film MZ (second gate insulating film), and then the conductive films (which are the metal film ME1 and the silicon film PS3) for the gate electrode GE are formed. Accordingly, a heat load resulting from heat treatment performed before the control gate electrode CG is formed via the insulating film GI and the memory gate electrode MG is formed via the insulating film MZ in the memory cell region 1A is kept appropriately from being applied to the conductive films for the gate electrode GE, especially the metal film ME1 for allowing the gate electrode GE to be formed as the metal gate electrode. As a result, it is possible to inhibit or prevent the conductive films for the gate electrode GE, especially the metal film ME1 for allowing the gate electrode GE to be formed as the metal gate electrode from being altered by the heat load. Therefore, the reliability of the manufactured semiconductor device can be improved. This allows an improvement in the performance of the semiconductor device.

Also, in the present embodiment, when the memory cell of the nonvolatile memory and the MISFET of the peripheral circuit are mounted in mixed relation over the same semiconductor substrate, the gate electrode (GE) forming the MISFET of the peripheral circuit can be formed using the conductive films other than the conductive film for forming the gate electrodes (which are the control gate electrode CG and the memory gate electrode MG) forming the memory cell. This allows appropriate conductive films to be used for the gate electrodes (which are the control gate electrode CG and the memory gate electrode MG) forming the memory cell and for the gate electrode (GE) of the MISFET of the peripheral circuit. Therefore, the performance of the semiconductor device can be improved.

Also, in the present embodiment, the conductive films for forming the gate electrode GE can be formed as the conductive films including the metal film (which is the metal film ME1). This allows the gate electrode GE in the peripheral circuit region 1B to be formed as the metal gate electrode. Therefore, the reliability of the MISFET formed in the peripheral circuit region 1B can be improved. This allows an improvement in the performance of the semiconductor device.

Also, in the present embodiment, as each of the conductive film for forming the control gate electrode CG and the conductive film for forming the memory gate electrode MG, a silicon film can be used. Therefore, the reliability of the memory cell of the nonvolatile memory can be improved. This allows an improvement in the performance of the semiconductor device.

Also, in the present embodiment, after the conductive films (which are the metal film ME1 and the silicon film PS3) for forming the gate electrode GE are formed, in Step S23, the portions of the foregoing conductive films (conductive films for forming the gate electrode GE) covering the control gate electrode CG, the memory gate electrode MG, and the insulating film IL2 are removed to leave the foregoing conductive films (conductive films for forming the gate electrode GE) in the peripheral circuit region 1B. As a result, the resist pattern (the foregoing photoresist pattern PR4) used to form the gate electrode GE by patterning the foregoing conductive films (conductive films for forming the gate electrode GE) is easily formed.

Also, in the present embodiment, when the silicon film PS1 as the conductive film for forming the control gate electrode CG is patterned in Step S7 to form the control gate electrode CG, the silicon film PS1 is left in the peripheral circuit region 1B. Then, in a state where the silicon film PS1 is left in the peripheral circuit region 1B, the insulating film IL2 is formed in Step S13 and polished in Step S14 to be planarized. Thereafter, the silicon film PS1 remaining in the peripheral circuit region 1B is removed. Since Step S13 (step of forming the insulating film IL2) and Step S14 (step of polishing the insulating film IL2) are performed in the state where the silicon film PS1 as the conductive film for forming the control gate electrode CG is left in the peripheral circuit region 1B, in the polishing step in Step S14, the silicon film PS1 remaining in the peripheral circuit region 1B is allowed to function as a polishing stopper. In the case where the insulating film IL1 is formed over the silicon film PS1, the insulating film IL1 is allowed to function as the polishing stopper. As a result, in Step S14, it is possible to prevent the insulating film IL2 from being excessively polished and prevent the memory gate electrode MG and the control gate electrode CG from being polished.

Embodiment 2

Referring to the drawings, a method of manufacturing a semiconductor device in Embodiment 2 will be described.

FIGS. 44 to 61 are main-portion cross-sectional views of the semiconductor device in Embodiment 2 during the manufacturing process thereof, in which substantially the same cross-sectional regions as shown in FIGS. 5 to 9 and FIGS. 11 to 40 are shown.

The manufacturing process in Embodiment 2 is substantially the same as the manufacturing process in Embodiment 1 described above until Step S17 (step of removing the laminated film LF2) described above is performed to obtain the structure shown in FIG. 20 described above so that the repeated description thereof is omitted here. It is also possible to apply the modification shown in FIGS. 36 to 40 to Embodiment 2.

In Embodiment 2 also, the manufacturing process including and prior to Step S17 (step of removing the laminated film LF1) described above is performed in the same manner as in Embodiment 1 described above to obtain the structure shown in FIG. 20 described above (or the structure shown in FIG. 40 described above).

Figure 44:
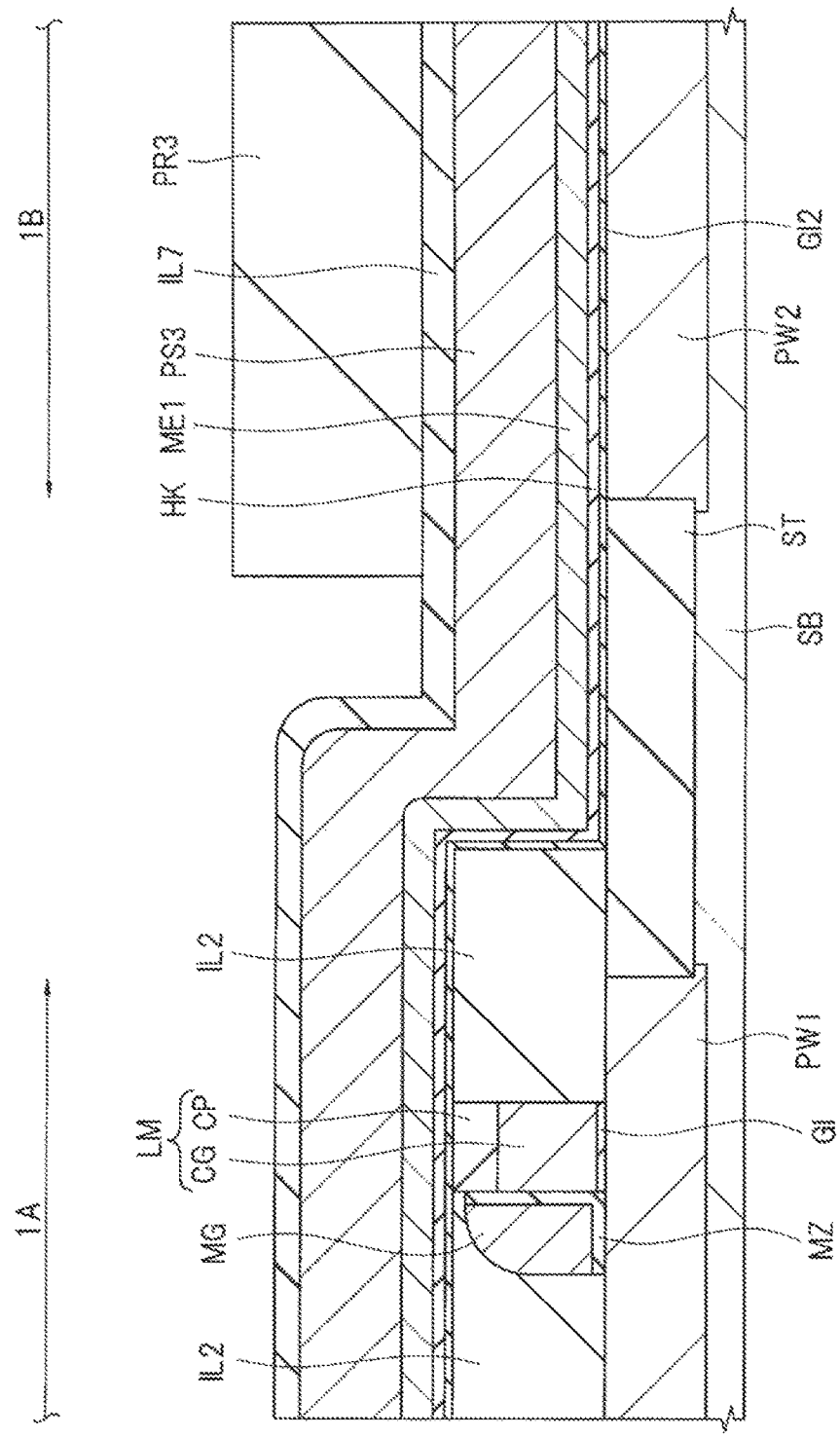
FIG. 44 is a main-portion cross-sectional view of a semiconductor device in another embodiment during the manufacturing process thereof.

Then, in Embodiment 2, as shown in FIG. 44, the insulating film GI2 is formed over the semiconductor substrate SB in Step S18 described above in the same manner as in Embodiment 1 described above. Then, in the same manner as in Embodiment 1 described above, in Step S19 described above, the insulating film HK is formed over the semiconductor substrate SB, i.e., over the insulating film GI2. Then, in the same manner as in Embodiment 1 described above, in Step S20 described above, the metal film ME1 is formed over the semiconductor substrate SB, i.e., over the insulating film HK. Then, in the same manner as in Embodiment 1 described above, in Step S21 described above, the silicon film PS3 is formed over the semiconductor substrate SB, i.e., over the metal film ME1. After the silicon film PS3 is formed in Step S21, in Embodiment 2, an insulating film IL7 is formed over the semiconductor substrate SB, i.e., over the silicon film PS3.

In the process performed so far, Embodiment 2 is different from Embodiment 1 described above in that the insulating film IL7 is formed over the silicon film PS3 in Embodiment 2, while the insulating film IL7 is not formed over the silicon film PS3 in Embodiment 1 described above. In Embodiment 1 described above, to allow the metal silicide layer SL to be easily formed over the gate electrode GE, the insulating film IL7 is not formed over the silicon film PS3. By contrast, in Embodiment 2, the metal silicide layer SL is not formed over a dummy gate electrode GD described later and therefore the insulating film IL7 is formed over the silicon film PS3.

In Embodiment 2 also, the subsequent process is basically the same as in Embodiment 1 described above until the foregoing insulating film IL5 is formed in Step S33 described above.

That is, in Embodiment 2 also, in the same manner as in Embodiment 1 described above, the foregoing photoresist pattern PR3 is formed over the semiconductor substrate SB, i.e., over the insulating film IL7 in Step S22 described above, as shown in FIG. 44. Then, in the same manner as in Embodiment 1 described above, as shown in FIG. 45, the insulating film IL7, the silicon film PS3, the metal film ME1, and the insulating film HK are etched in Step S23 described above using the photoresist pattern PR3 as an etching mask. Thereafter, the photoresist pattern PR3 is removed.

At this stage, Embodiment 2 is different from Embodiment 1 described above in that, in Embodiment 2, the laminated film LF2 is formed of a laminated film of the insulating film IL7, the silicon film PS3, the metal film ME1, and the insulating film HK while, in Embodiment 1 described above, the laminated film LF2 is formed of the laminated film of the silicon film PS3, the metal film ME1, and the insulating film HK. Embodiment 2 is otherwise the same as Embodiment 1 described above so that the repeated description thereof is omitted.

Then, in Embodiment 2 also, in the same manner as in Embodiment 1 described above, the foregoing photoresist pattern PR4 is formed over the semiconductor substrate SB in Step S24 described above, as shown in FIG. 46. Then, in the same manner as in Embodiment 1 described above, as shown in FIG. 47, the laminated film of the insulating film IL7, the silicon film PS3, and the metal film ME1 is etched (preferably dry-etched) in Step S25 using the photoresist pattern PR4 as an etching mask to be patterned, thus forming the dummy gate electrode GD corresponding to the gate electrode GE in the peripheral circuit region 1B. Thereafter, the photoresist pattern PR4 is removed.

At this stage, Embodiment 2 is different from Embodiment 1 described above in the following point. That is, in Embodiment 1 described above, the gate electrode GE including the metal film ME1 and the silicon film PS3 over the metal film ME1 is formed. By contrast, in Embodiment 2, over the gate electrode GE (which is referred to as the dummy gate electrode GD in Embodiment 2) including the metal film ME1 and the silicon film PS3 over the metal film ME1, a cap insulating film CP2 made of the insulating film IL7 is formed. However, in Embodiment 2, the metal film ME1 and the silicon film PS3 that have been patterned form not the gate electrode GE, but the dummy gate electrode GD. The dummy gate electrode GD is referred to as such, not the gate electrode GE because, since at least one part of the dummy gate electrode GD is removed later, the dummy gate electrode GD does not function as the gate electrode of the MISFET unless modified and is therefore a pseudo gate electrode. In addition, in Embodiment 1 described above, the laminated body LM2 does not include the insulating film IL7 while, in Embodiment 2, the laminated body LM2 also includes the insulating film IL7 over the silicon film PS3. Embodiment 2 is otherwise the same as Embodiment 1 described above so that the repeated description thereof is omitted.

The dummy gate electrode GD includes the metal film ME, and the silicon film PS3 over the metal film ME1 and is formed over the insulating film HK. That is, the dummy gate electrode GD including the metal film ME, and the silicon film PS3 over the metal film ME1 is formed over the semiconductor substrate SB (p-type well PW2) located in the peripheral circuit region 1B via the insulating film GI2 and the insulating film HK. The dummy gate electrode GD and the cap insulating film CP2 have substantially the same two-dimensional shape in planar view and overlap each other in planar view.

Figure 48:
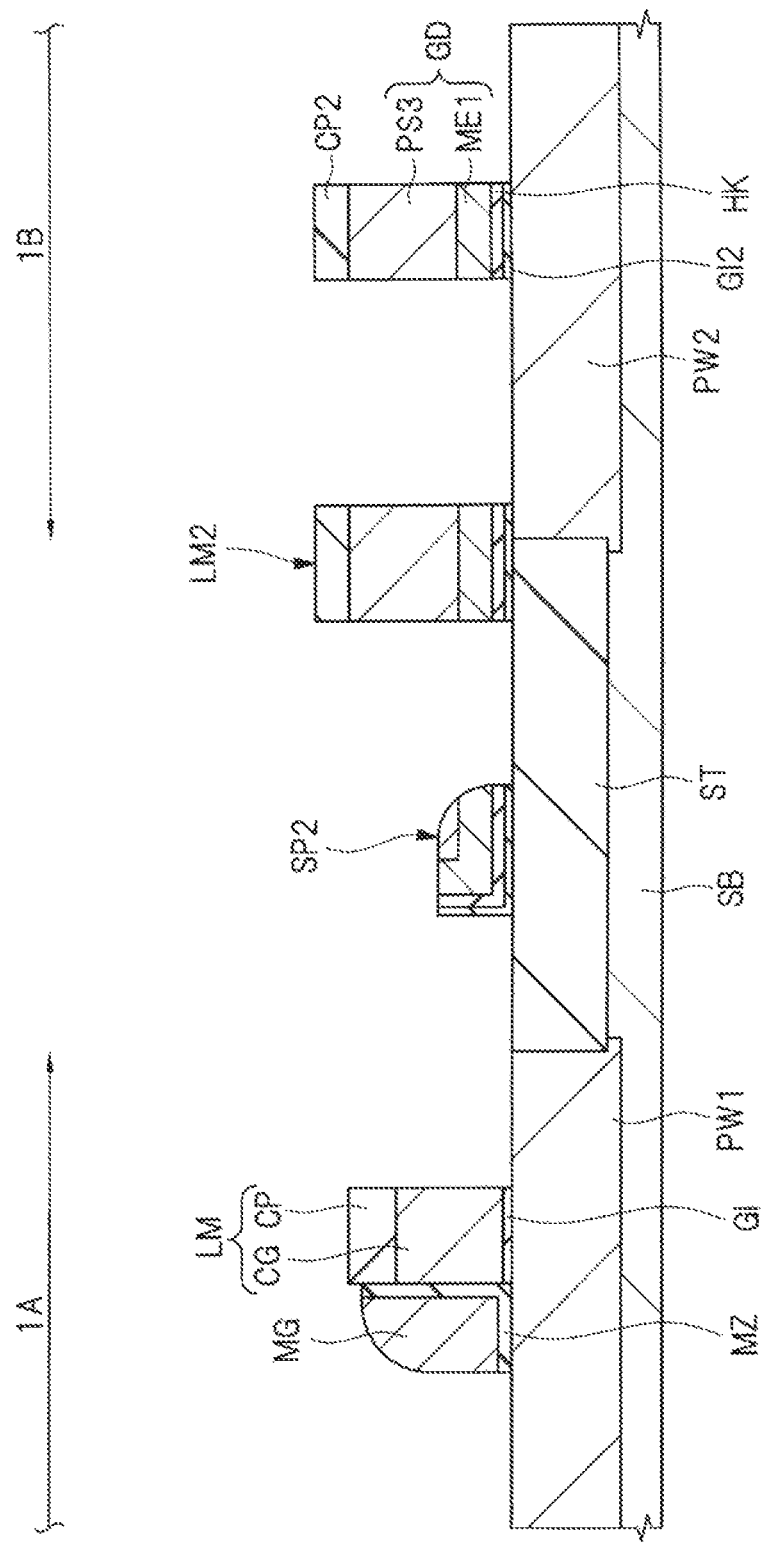
FIG. 48 is a main-portion cross-sectional view of the semiconductor device during the manufacturing process thereof, which is subsequent to FIG. 47.
Figure 49:
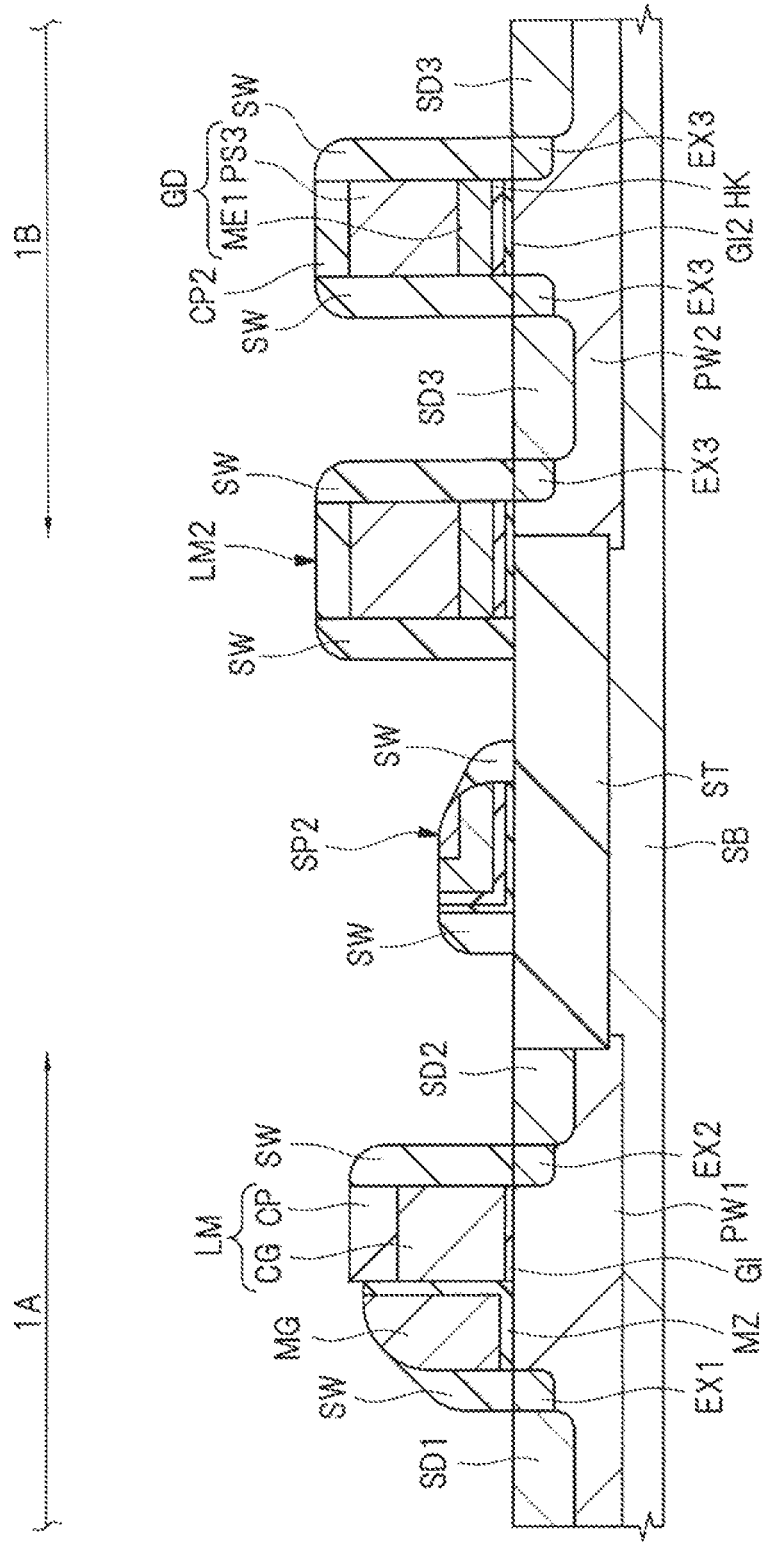
FIG. 49 is a main-portion cross-sectional view of the semiconductor device during the manufacturing process thereof, which is subsequent to FIG. 48.

Then, in Embodiment 2 also, as shown in FIG. 48, the insulating film IL2 is removed in the same manner as in Embodiment 1 described above. The step of removing the insulating film IL2 is the same as in Embodiment 1 described above. In Step S26 described above, the foregoing resist pattern PR5 is formed and, in Step S27 described above, using the foregoing photoresist pattern PR5 as an etching mask, the insulating film IL2 is etched to be removed. Thereafter, the foregoing photoresist pattern PR5 is removed, but the illustration and detailed description thereof is omitted. FIG. 48 corresponds to FIG. 28 described above.

Then, in Embodiment 2 also, in the same manner as in Embodiment 1 described above, as shown in FIG. 49, the n$^-$-type semiconductor regions EX1, EX2, and EX3 are formed in Step S28 described above using an ion implantation method or the like, the sidewall spacers SW are formed in Step S29 described above, and the n$^+$-type semiconductor regions SD1, SD2, and SD3 are formed in Step S30 described above using an ion implantation method or the like. Then, in Step S31 described above, activation anneal is performed as heat treatment. Since Steps S28, S29, S30, and S31 are the same as in Embodiment 1 described above, the repeated description thereof is omitted here.

Then, in Embodiment 2 also, in the same manner as in Embodiment 1 described above, the step of forming the metal silicide layers SL is performed in Step S32 described above. Note that, in the same manner as in Embodiment 1 described above, prior to the step of forming the metal silicide layers SL in Step S32, the step of forming the foregoing insulating film IL4 and the step of removing the foregoing insulating film IL4 can also be performed.

Figure 50:
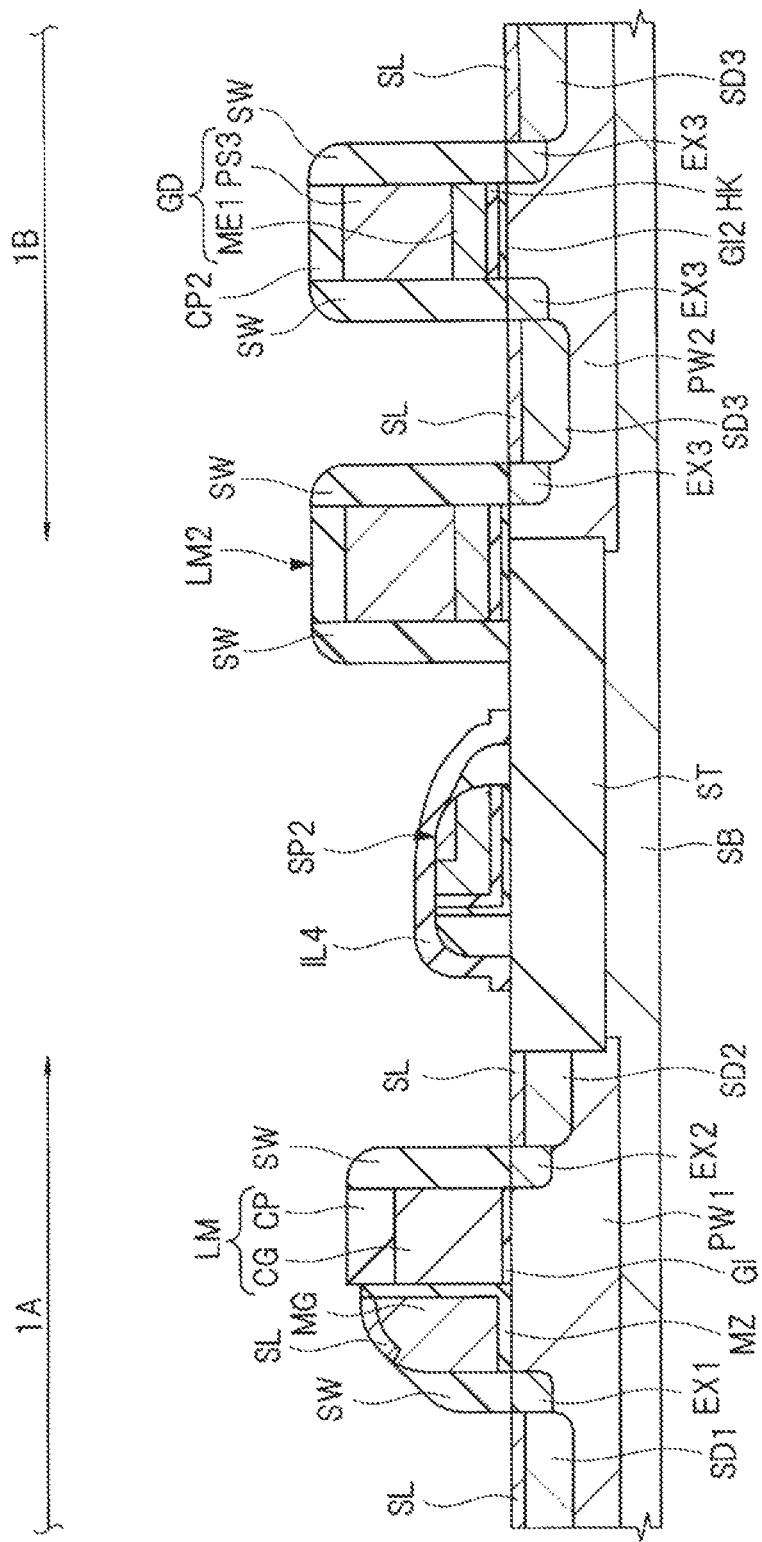
FIG. 50 is a main-portion cross-sectional view of the semiconductor device during the manufacturing process thereof, which is subsequent to FIG. 49.

The step of forming the metal silicide layers SL in Step S32 described above is basically the same as in Embodiment 1 described above. Consequently, as shown in FIG. 50, in the upper portion (upper surface, top surface, or upper layer portion) of each of the n$^+$-type semiconductor regions SD1, SD2, and SD3 and the memory gate MG, the metal silicide layer SL is formed.

Note that, in Embodiment 1 described above, when the foregoing metal film ME2 is formed, the upper surface of the silicon film PS3 forming the foregoing gate electrode GE comes in contact with the foregoing metal film ME2. Accordingly, when heat treatment is performed, the upper layer portion of the silicon film PS3 forming the foregoing gate electrode GE reacts with the foregoing metal film ME2. As a result, in Embodiment 1 described above, the metal silicide layer SL is formed in the upper portion of the silicon film PS3 forming the foregoing gate electrode GE. On the other hand, in Embodiment 2, over the dummy gate electrode GD, the cap insulating film CP2 is formed. When the foregoing metal film ME2 is formed, between the dummy gate electrode GD and the foregoing metal film ME2, the cap insulating film CP2 is interposed so that the dummy gate electrode GD does not come in contact with the foregoing metal film ME2. Accordingly, even when heat treatment is performed, the silicon film PS3 of the dummy gate electrode GD does not react with the foregoing metal film ME2 so that the metal silicide layer SL is not formed over the dummy gate electrode GD.

At this stage, Embodiment 2 is different from Embodiment 1 described above in the following point. That is, the gate electrode GE in Embodiment 1 described above is replaced with the dummy gate electrode GD in Embodiment 2, the cap insulating film CP2 is formed over the dummy gate electrode GD, and the metal silicide layer SL is not formed in the upper portion of the dummy gate electrode GD. The sidewall spacers SW over the side walls of the dummy gate electrode GD are formed over the side walls of the laminated body of the dummy gate electrode GD and the cap insulating film CP2. Embodiment 2 is otherwise the same as Embodiment 1 described above so that the repeated description thereof is omitted here.

Next, in Embodiment 2 also, in the same manner as in Embodiment 1 described above, as shown in FIG. 51, the insulating film IL5 is formed (deposited) as an interlayer insulating film over the entire main surface of the semiconductor substrate SB in Step S33 described above so as to cover the control gate electrode CG, the memory gate electrode MG, the dummy gate electrode GD, and the sidewall spacers SW.

In Embodiment 2, the subsequent process is different from that in Embodiment 1 described above.

Figure 52:
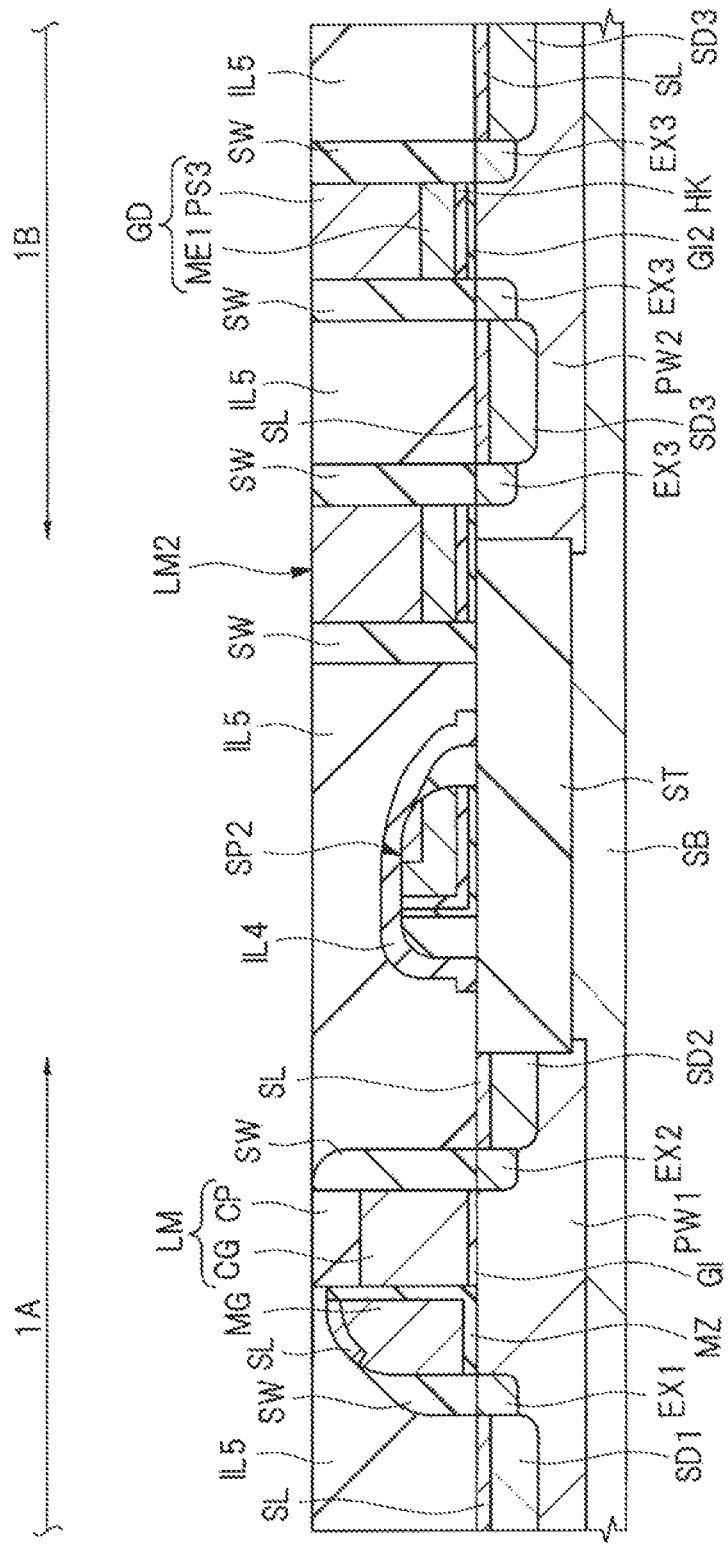
FIG. 52 is a main-portion cross-sectional view of the semiconductor device during the manufacturing process thereof, which is subsequent to FIG. 51.

That is, as shown in FIG. 52, the upper surface of the insulating film IL5 is polished using a CMP method or the like. Thus, as shown in FIG. 52, the upper surface of the dummy gate electrode GD, i.e., the upper surface of the silicon film PS3 included in the dummy gate electrode GD is exposed. That is, the insulating film IL5 is polished until the upper surface of the dummy gate electrode GD is exposed.

Note that, at the stage at which the insulating film IL5 is deposited, in the upper surface of the insulating film IL5, roughness or stepped portions reflecting the control gate electrode CG, the memory gate electrode MG, the dummy gate electrode GD, the laminated body LM2, the sidewall spacers SW, and the like may be formed. However, after the upper surface of the insulating film IL5 is polished, the upper surface of the insulating film IL5 is planarized.

Even in the case where the foregoing remaining portion SP2 is formed, the height of the remaining portion SP2 is smaller than the height of the dummy gate electrode GD. Accordingly, even when the insulating film IL5 is polished to expose the upper surface of the dummy gate electrode GD, the remaining portion SP2 is kept appropriately from being exposed. Also, in each of the subsequent polishing steps, the remaining portion SP2 is preferably not exposed. This can be achieved by setting the height of the remaining portion SP2 lower than the final height of a gate electrode GE1 formed later.

Figure 53:
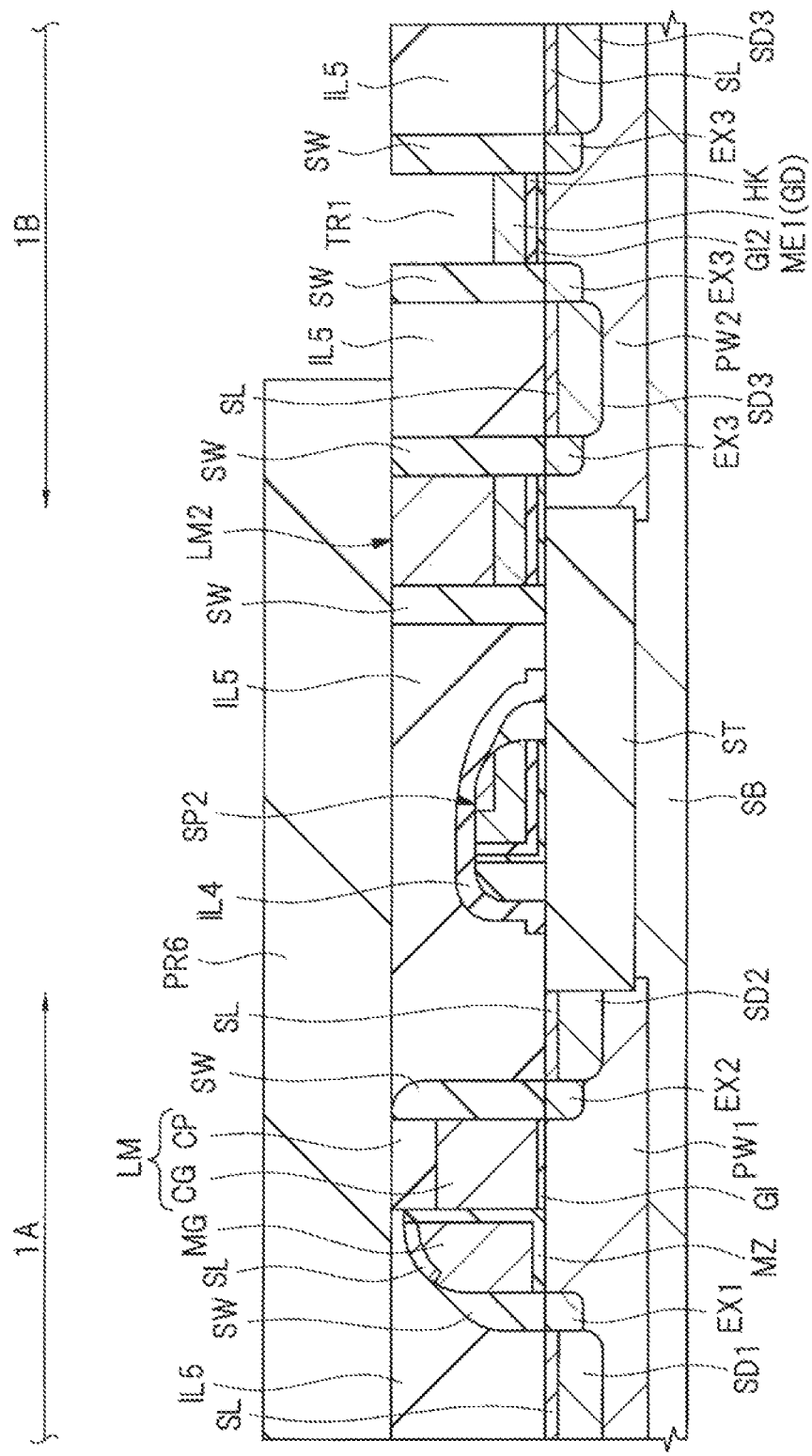
FIG. 53 is a main-portion cross-sectional view of the semiconductor device during the manufacturing process thereof, which is subsequent to FIG. 52.

Next, as shown in FIG. 53, over the semiconductor substrate SB, using a photolithographic method, a photoresist pattern PR6 is formed as a resist pattern. The photoresist pattern PR6 covers the entire memory cell region 1A, while exposing the dummy gate electrode GD in the peripheral circuit region 1B. The laminated body LM2 is preferably covered with the photoresist pattern PR6.

Next, the silicon film PS3 included in the dummy gate electrode GD is etched to be removed. Thereafter, the photoresist pattern PR6 is removed. As a result of removing the silicon film PS3 included in the dummy gate electrode GD, a trench (depressed portion or recessed portion) TR1 is formed. The trench TR1 corresponds to a region from which the silicon film PS3 included in the dummy gate electrode CD has been removed and in which the silicon film PS3 has been present till the removal thereof. The bottom portion (bottom surface) of the trench TR1 is formed of the upper surface of the metal film ME1. The side walls (side surfaces) of the trench TR1 are formed of the side surfaces (side surfaces that have been in contact with the silicon film PS3 before the removal of the silicon film PS3) of the sidewall spacers SW.

In the step of etching the silicon film PS3, etching is preferably performed under such a condition that the insulating film IL5, the sidewall spacers SW, and the metal film ME1 are less likely to be etched than the silicon film PS3. That is, etching is preferably performed under such a condition that the speed of etching the insulating film IL5, the sidewall spacers SW, and the metal film ME1 is lower than the speed of etching the silicon film PS3. This allows the silicon film PS3 included in the dummy gate electrode GD to be selectively etched. Since the photoresist pattern PR6 covers the entire memory cell region 1A and the laminated body LM2, the memory gate electrode MG, the control gate electrode CG, and the laminated body LM2 are not etched.

Figure 54:
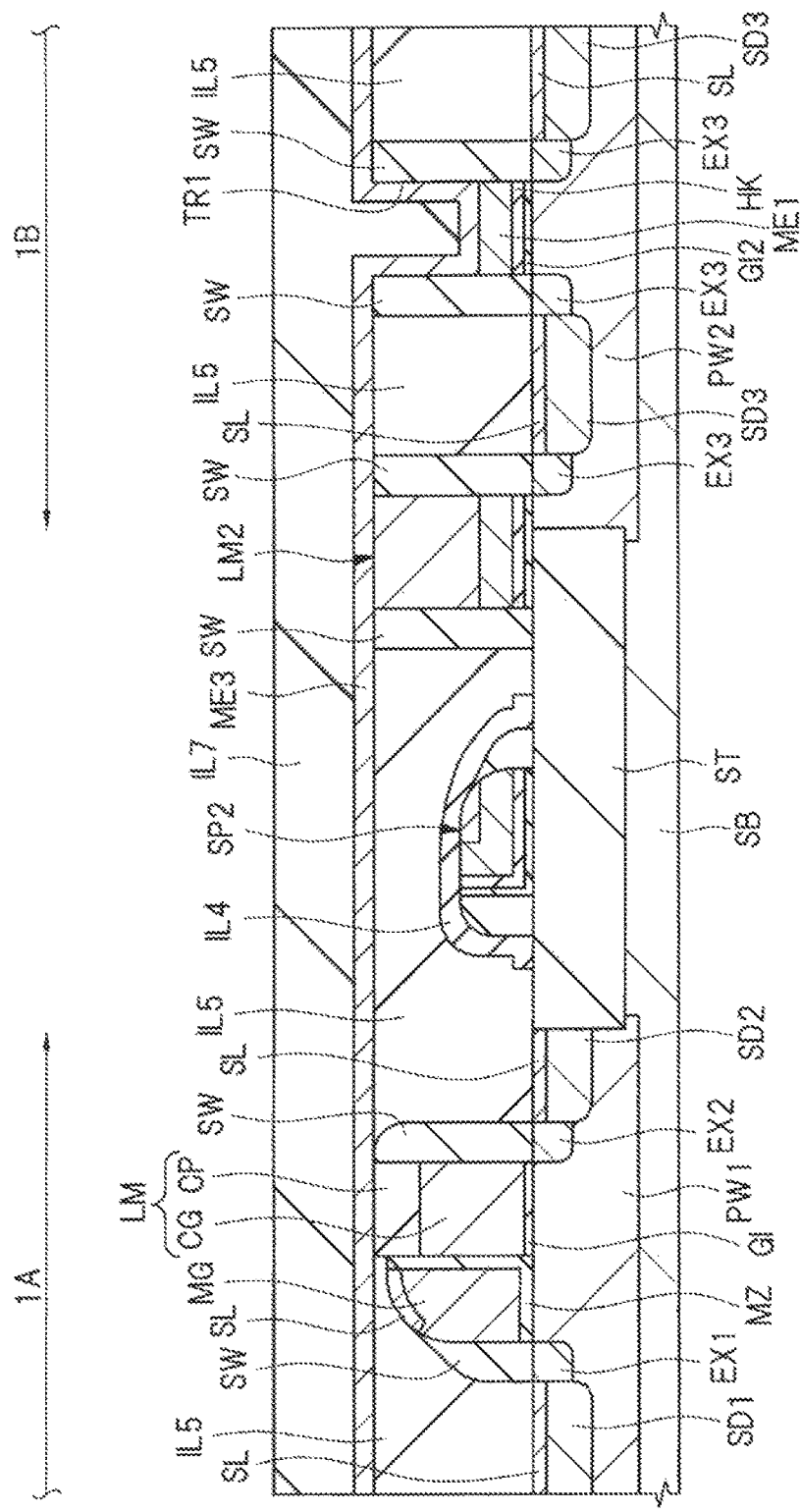
FIG. 54 is a main-portion cross-sectional view of the semiconductor device during the manufacturing process thereof, which is subsequent to FIG. 53.

Next, as shown in FIG. 54, over the semiconductor substrate SB, i.e., over the insulating film IL5 including the inside (bottom portion and side walls) of the trench TR1, a metal film ME3 is formed as a conductive film. Then, over the metal film ME3, the insulating film IL7 is formed so as to fill the trench TR1.

Similarly to the metal film ME1, the metal film ME3 is a conductive film showing metal conduction. The metal film ME3 is not limited to a single-element metal film (pure metal film) and an alloy film and may also be a metal compound film (such as a metal nitride film or a metal carbide film) showing metal conduction. In the case of forming an n-channel MISFET, as the metal film ME3, e.g., a titanium aluminum (TiAl) film or the like can be used appropriately. In the case of forming a p-channel MISFET, as the metal film ME3, e.g., a titanium nitride (TiN) film or the like can be used appropriately. The metal film ME3 can be formed using, e.g., a sputtering method or the like.

As the insulating film IL7, e.g., a SOG (Spin on Glass) film can be used. The SOG film can be deposited without heating the semiconductor substrate SB to a high temperature and is easily removed later so that it is appropriate as the insulating film IL7.

Figure 55:
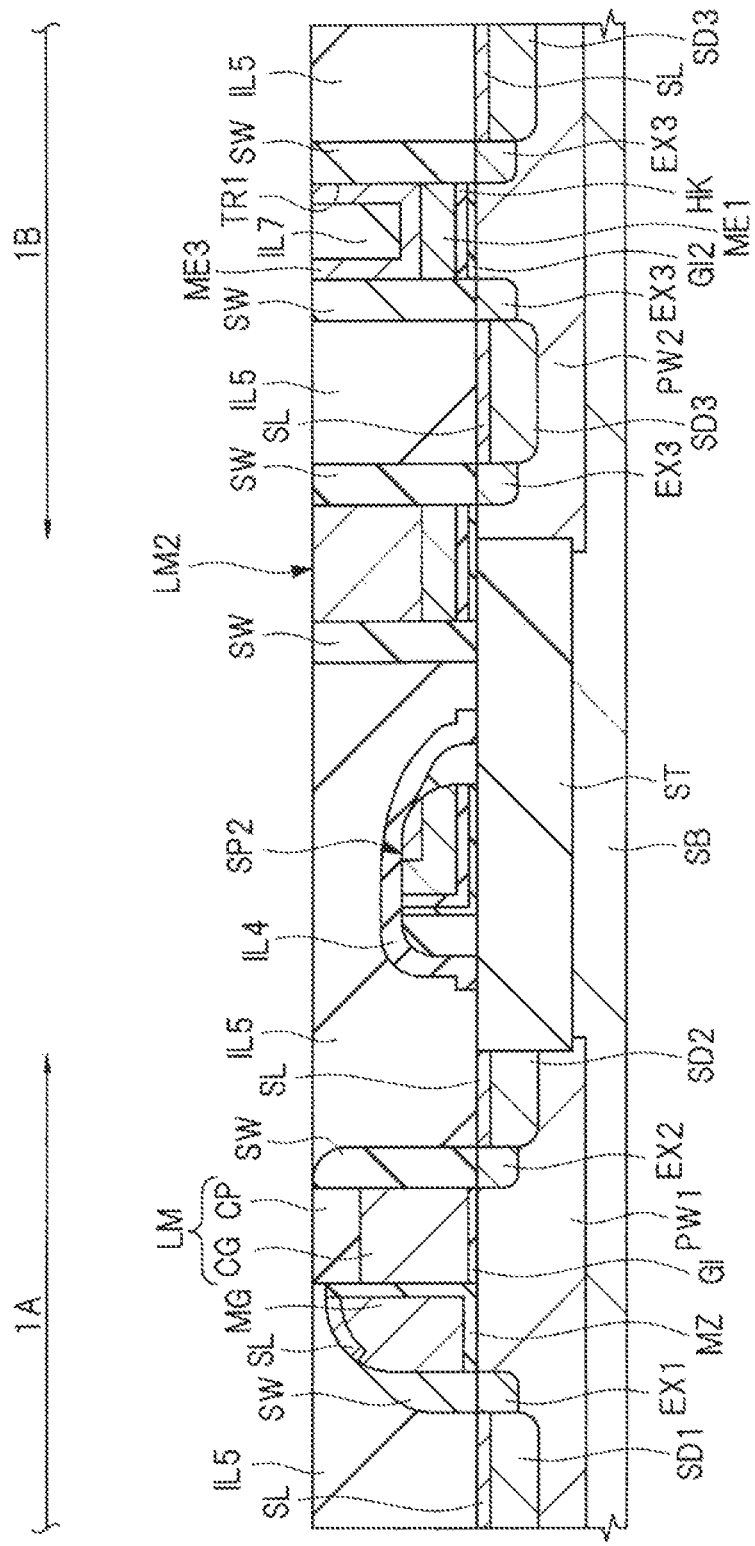
FIG. 55 is a main-portion cross-sectional view of the semiconductor device during the manufacturing process thereof, which is subsequent to FIG. 54.

Next, as shown in FIG. 55, by removing the unneeded insulating film IL7 and the unneeded metal film ME3 which are located outside the trench TR1 by a CMP method or the like, the metal film ME3 and the insulating film IL7 are embedded in the trench TR1.

Figure 56:
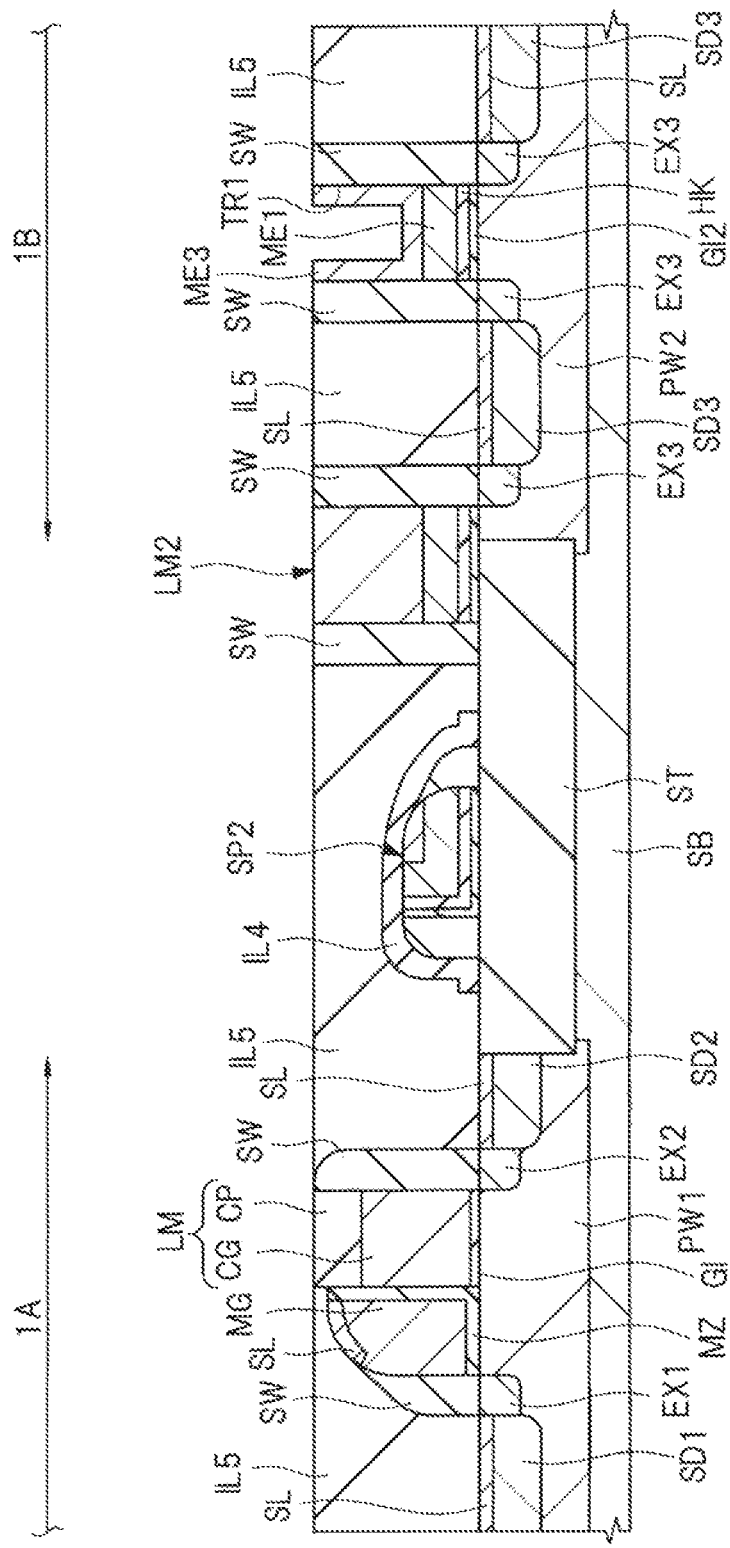
FIG. 56 is a main-portion cross-sectional view of the semiconductor device during the manufacturing process thereof, which is subsequent to FIG. 55.

Next, as shown in FIG. 56, the insulating film IL7 embedded in the trench TR1 is etched to be removed, resulting in a state where the metal film ME3 is formed over the bottom portion and side wall of the trench TR1.

Figure 57:
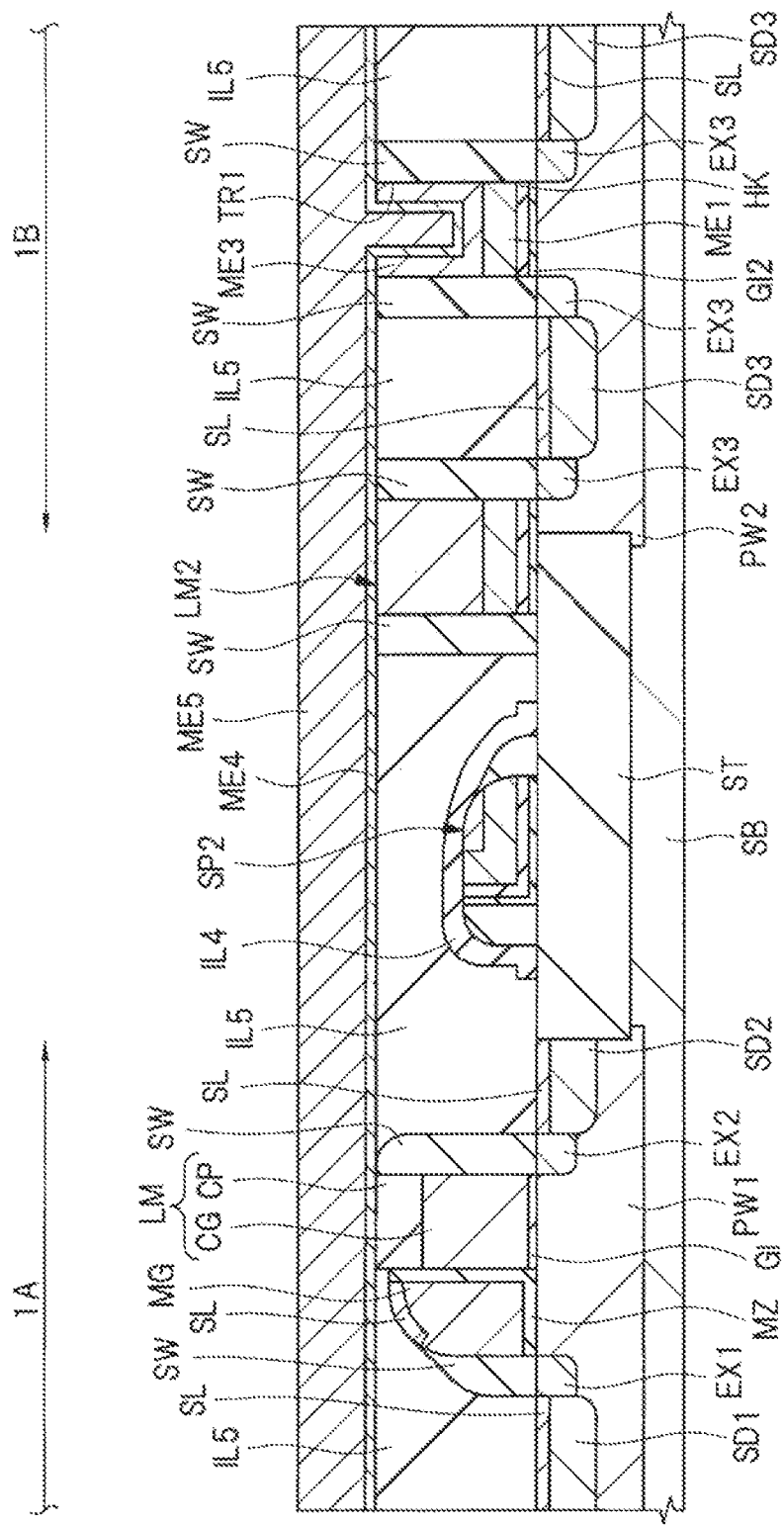
FIG. 57 is a main-portion cross-sectional view of the semiconductor device during the manufacturing process thereof, which is subsequent to FIG. 56.

Next, as shown in FIG. 57, over the semiconductor substrate SB, i.e., over the insulating film IL5 including the inside (bottom portion and side walls) of the trench TR1, a metal film ME4 is formed as a conductive film. Then, over the metal film ME4, a metal film ME5 is formed as a conductive film so as to fill the trench TR1.

Similarly to the metal film ME3, the metal films ME4 and ME5 are conductive films each showing metal conduction. Each of the metal films ME4 and ME5 is not limited to a single-element metal film (pure metal film) and an alloy film and may also be a metal compound film (such as a metal nitride film or a metal carbide film) showing metal conduction. The metal film ME4 is a film which functions as a barrier conductive film and has the effect of improving adhesion. As the metal film ME4, e.g., a titanium (Ti) film or the like can be used. As the metal film ME5, e.g., an aluminum (Al) film or the like can be used.

Figure 58:
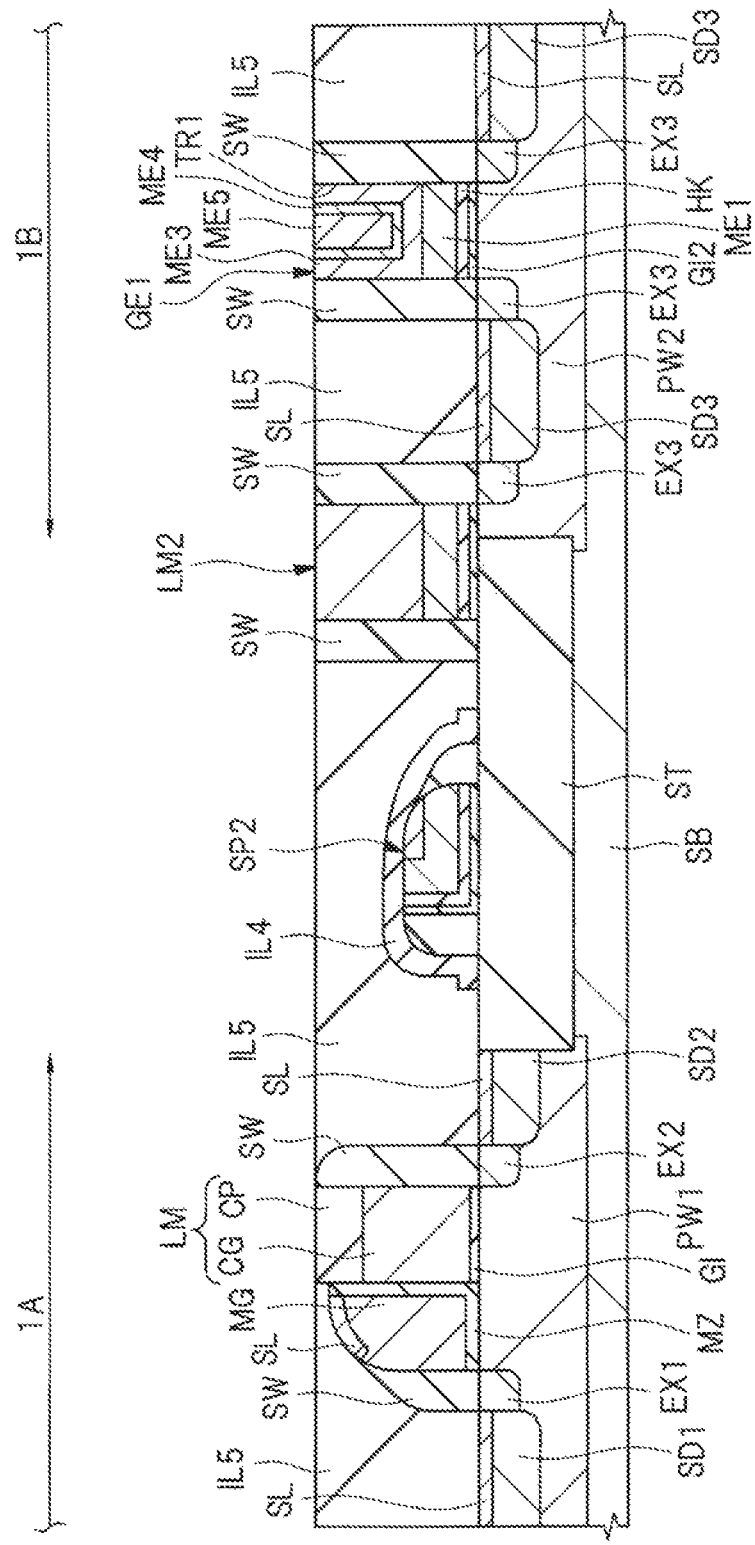
FIG. 58 is a main-portion cross-sectional view of the semiconductor device during the manufacturing process thereof, which is subsequent to FIG. 57.

Next, as shown in FIG. 58, the unneeded metal films ME5 and ME4 located outside the trench TR1 are removed by a CMP method or the like to be embedded in the trench TR1. This results in a state where the metal films ME3, ME4, and ME5 are embedded in the trench TR1.

Thus, in the peripheral circuit region 1B, the gate electrode GE1 of the MISFET is formed. The gate electrode GE1 includes the metal film ME1 included in the dummy gate electrode GD, and the metal films ME3, ME4, and ME5 formed over the metal film ME1. The gate electrode GE1 is a metal gate electrode. Of the gate electrode GE1, the metal films ME3, ME4, and ME5 formed over the metal film ME1 are embedded in the region (i.e., the trench TR1) from which the silicon film PS3 included in the dummy gate electrode GD has been removed. The gate electrode GE1 is formed at a position where the dummy gate electrode GD has been formed. As a result, the source/drain regions of the MISFET having the gate electrode GE1 as the gate electrode are formed of the $n^-$-type semiconductor region EX3 and the $n^+$-type semiconductor region SD3.

Figure 59:
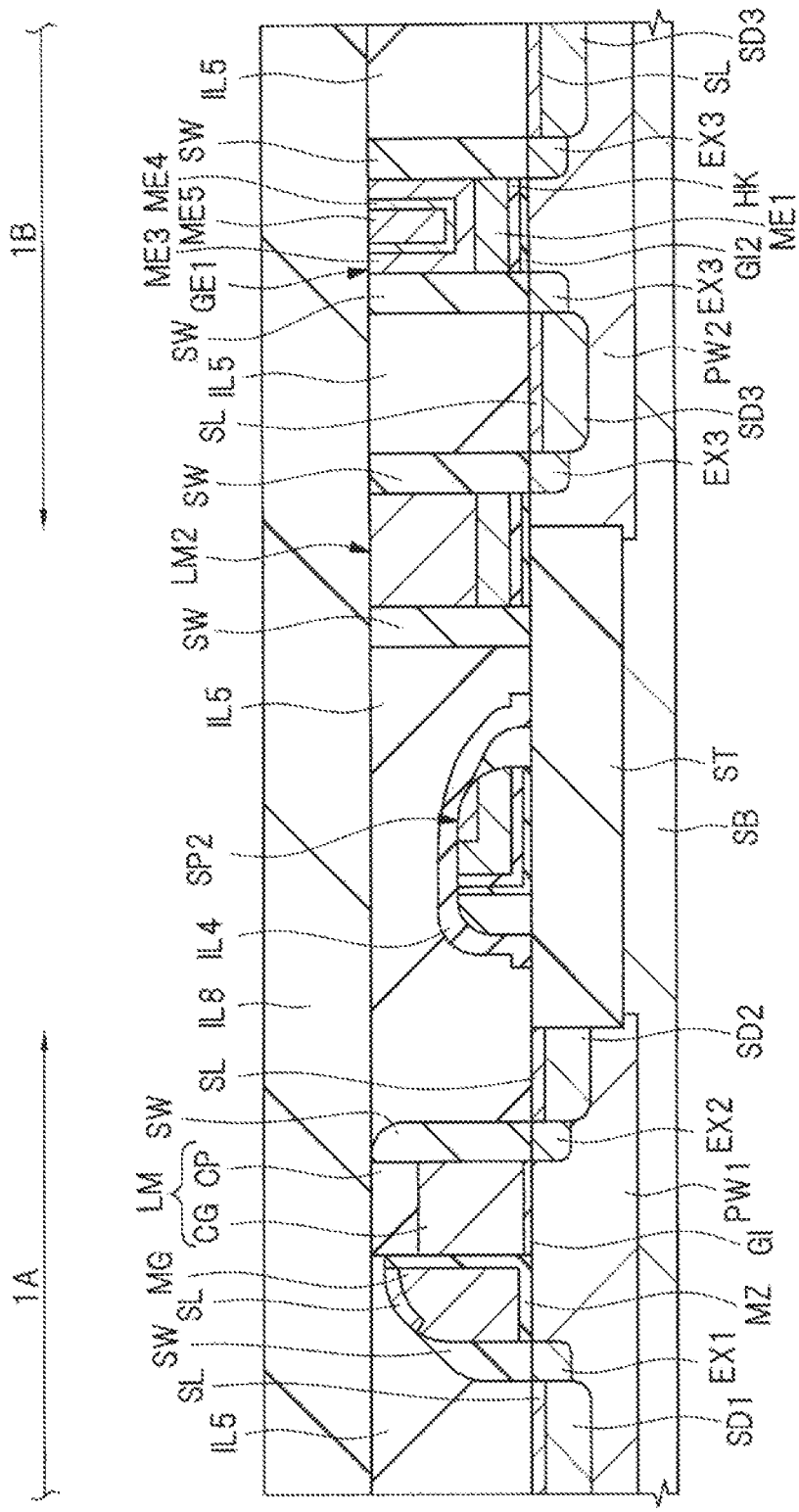
FIG. 59 is a main-portion cross-sectional view of the semiconductor device during the manufacturing process thereof, which is subsequent to FIG. 58.

Next, as shown in FIG. 59, over the entire main surface of the semiconductor substrate SB, an insulating film (interlayer insulating film) IL8 is formed over the insulating film IL5 including the gate electrode GE1. As the insulating film IL8, a silicon-oxide-based insulating film can be used. The insulating film IL8 is formed over the insulating film IL5 so as to cover the upper surface of the gate electrode GE1.

After the insulating film IL8 is formed, it is also possible to increase the planarity of the upper surface of the insulating film IL8 through the polishing of the upper surface of the insulating film IL8 by a CMP method or the like.

The subsequent process is basically the same as in Embodiment 1 described above.

Figure 60:
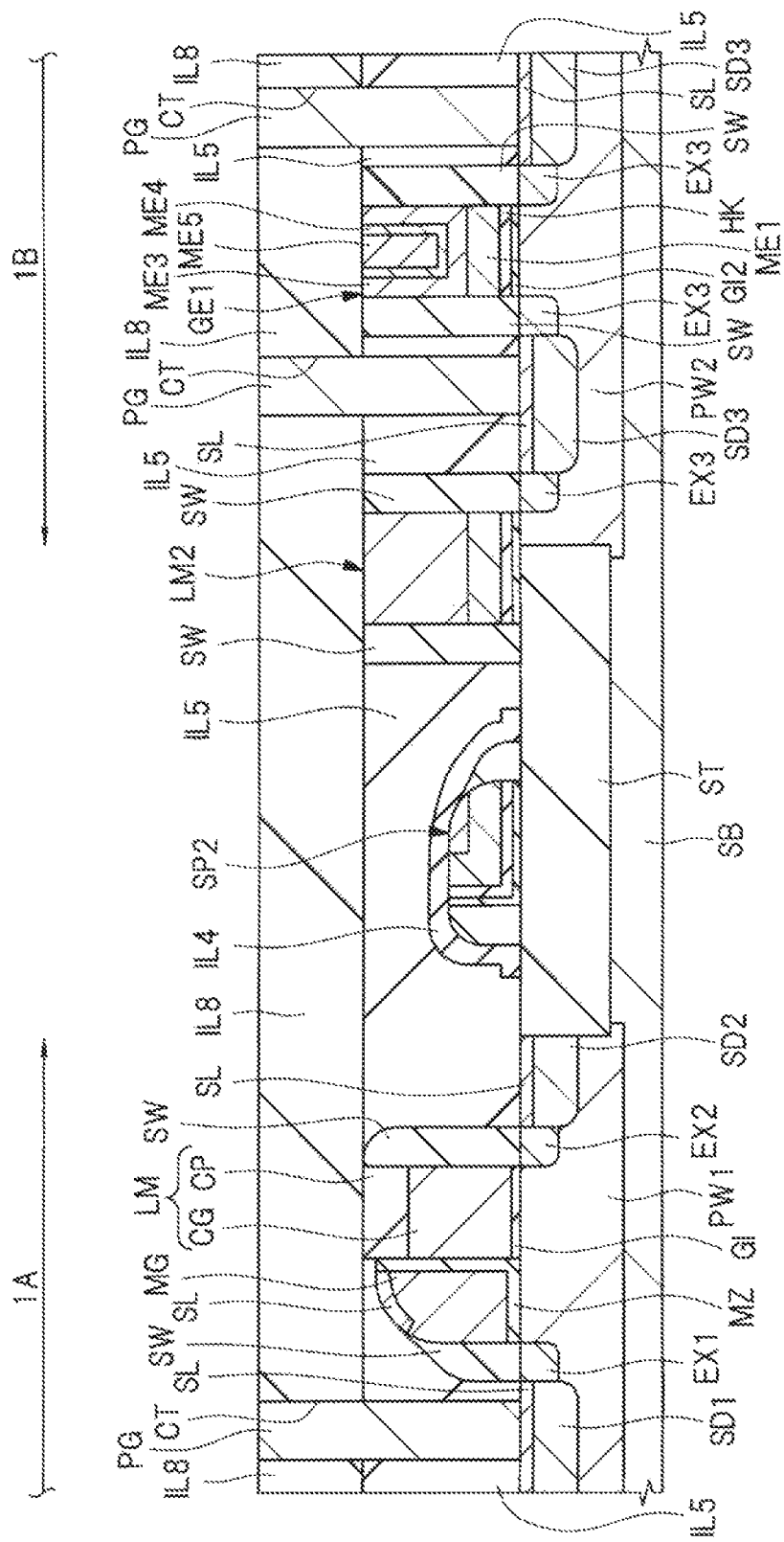
FIG. 60 is a main-portion cross-sectional view of the semiconductor device during the manufacturing process thereof, which is subsequent to FIG. 59.
Figure 61:
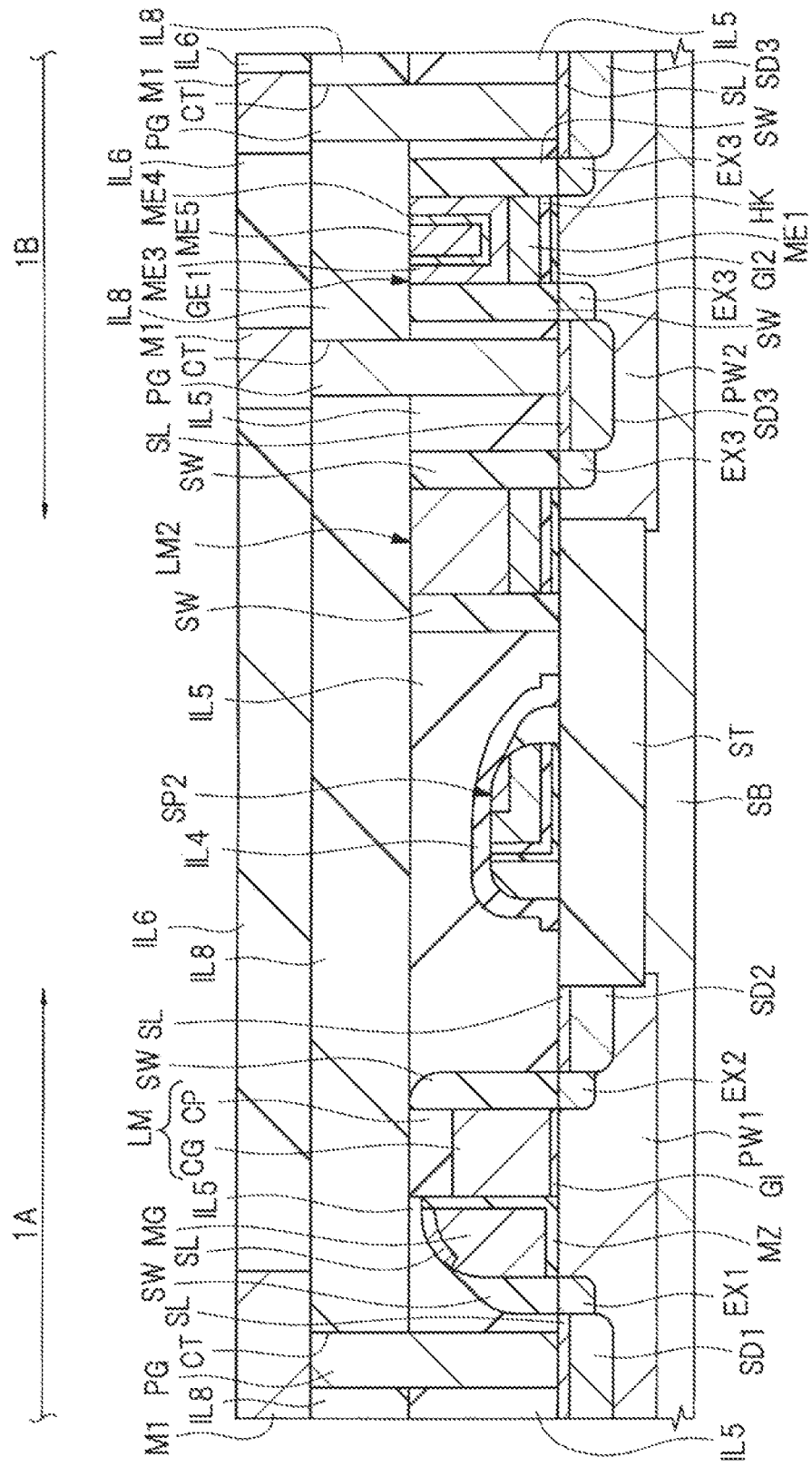
FIG. 61 is a main-portion cross-sectional view of the semiconductor device during the manufacturing process thereof, which is subsequent to FIG. 60.

That is, as shown in FIG. 60, in Step S34 described above, using a photoresist pattern (not shown) formed over the insulating film IL8 as an etching mask, the insulating films IL8 and IL5 are dry-etched to be formed with contact holes CT. With regard to Step S34, Embodiment 2 is different from Embodiment 1 described above in that, since the insulating film IL8 is formed in Embodiment 2, the contact holes CT are formed so as to extend through a laminated film (laminated insulating film) including the insulating films IL8 and IL5 while, in Embodiment 1 described above, the insulating film IL8 is not formed.

Then, in Embodiment 2 also, in the same manner as in Embodiment 1 described above, the conductive plugs PG are formed (embedded) in the contact holes CT in Step S35 described above. Thereafter, in Embodiment 2 also, in the same manner as in Embodiment 1 described above, the insulating film IL6 and the wires M1 are formed in Step S36 described above, as shown in FIG. 61.

In this manner, the manufacturing process of the semiconductor device in Embodiment 2 is performed.

As for the configuration of the memory cell, it is substantially the same as described above in Embodiment 1 with reference to FIGS. 41 and 42 described above so that the repeated description thereof is omitted here. As for the operation of the nonvolatile memory also, it is the same as in Embodiment 1 described above so that the repeated description thereof is omitted here.

The manufacturing process in Embodiment 2 is basically the same as in the manufacturing process in Embodiment 1 described above until the foregoing insulating film IL5 is formed. What is different is that, in Embodiment 2, the foregoing insulating film IL7 is formed over the foregoing silicon film PS3 and accordingly the foregoing cap insulating film CP2 is also formed and, since an equivalent to the foregoing gate electrode GE does not serve as the gate electrode of the MISFET unless modified, the equivalent is the dummy gate electrode GD. Also, as a result of forming the foregoing cap insulating film CP2, the foregoing metal silicide layer SL is not formed over the dummy gate electrode GD.

Since the manufacturing process in Embodiment 2 is also basically the same as the manufacturing process in Embodiment 1 described above until the foregoing insulating film IL5 is formed, substantially the same effect as described in Embodiment 1 described above can also be obtained in Embodiment 2. However, those referred to as the conductive films for the gate electrode GE or those referred to as the conductive films for forming the gate electrode GE in the description of Embodiment 1 given above are referred to as the conductive films for the dummy gate electrode GD or the conductive films for forming the dummy gate electrode GD in the case of Embodiment 2. Each of the conductive films for forming the gate electrode GE in Embodiment 1 described above and the conductive films for forming the dummy gate electrode GD in Embodiment 2 corresponds to the foregoing laminated film of the metal film ME1 and the silicon film PS3.

In Embodiment 2, in addition to the effect obtained in Embodiment 1 described above, the following effect can also be further obtained.

That is, in Embodiment 2, after a part (which is the silicon film PS3) of the dummy gate electrode GD is removed, the conductive film is embedded in the region (corresponding to the foregoing trench TR1) from which the dummy gate electrode GD has been removed to form the gate electrode GE1 of the MISFET. The conductive film corresponds to the foregoing metal film ME3, ME4, or ME5, a metal film ME6 described later, or a metal film ME9 described later. Consequently, of the gate electrode GE1, the portion formed of the conductive film embedded in the region from which the dummy gate electrode GD has been removed is kept appropriately from receiving a heat load resulting from various heating steps before the conductive film is formed. For example, the portion of the gate electrode GE1 is kept appropriately from receiving a heat load during the activation anneal in Step S31 described above. As a result, it is possible to inhibit or prevent the reliability of the MISFET in the peripheral circuit region 1B, as well as the performance thereof, from being degraded by the reception of the heat load by the gate electrode of the MISFET. Therefore, it is possible to further improve the performance of the semiconductor device.

On the other hand, in the case of Embodiment 1 described above, the number of steps in the manufacturing process of the semiconductor device can be reduced.

In Embodiment 2, when the memory cell of the nonvolatile memory and the MISFET of the peripheral circuit are mounted in mixed relation over the same semiconductor substrate, the dummy gate electrode (GD) used to form the gate electrode of the MISFET of the peripheral circuit can be formed using another conductive film other than the conductive film for forming the gate electrodes (which are the control gate electrode CG and the memory gate electrode MG) forming the memory cell. This allows appropriate conductive films to be used for the gate electrodes (which are the control gate electrode CG and the memory gate electrode MG) forming the memory cell and for the dummy gate electrode (GD) used to form the gate electrode of the MISFET of the peripheral circuit. As a result, the semiconductor device is easily manufactured. In addition, the performance of the semiconductor device can be improved.

Next, a description will be given of modifications of the manufacturing process of the semiconductor device in Embodiment 2.

Figure 62:
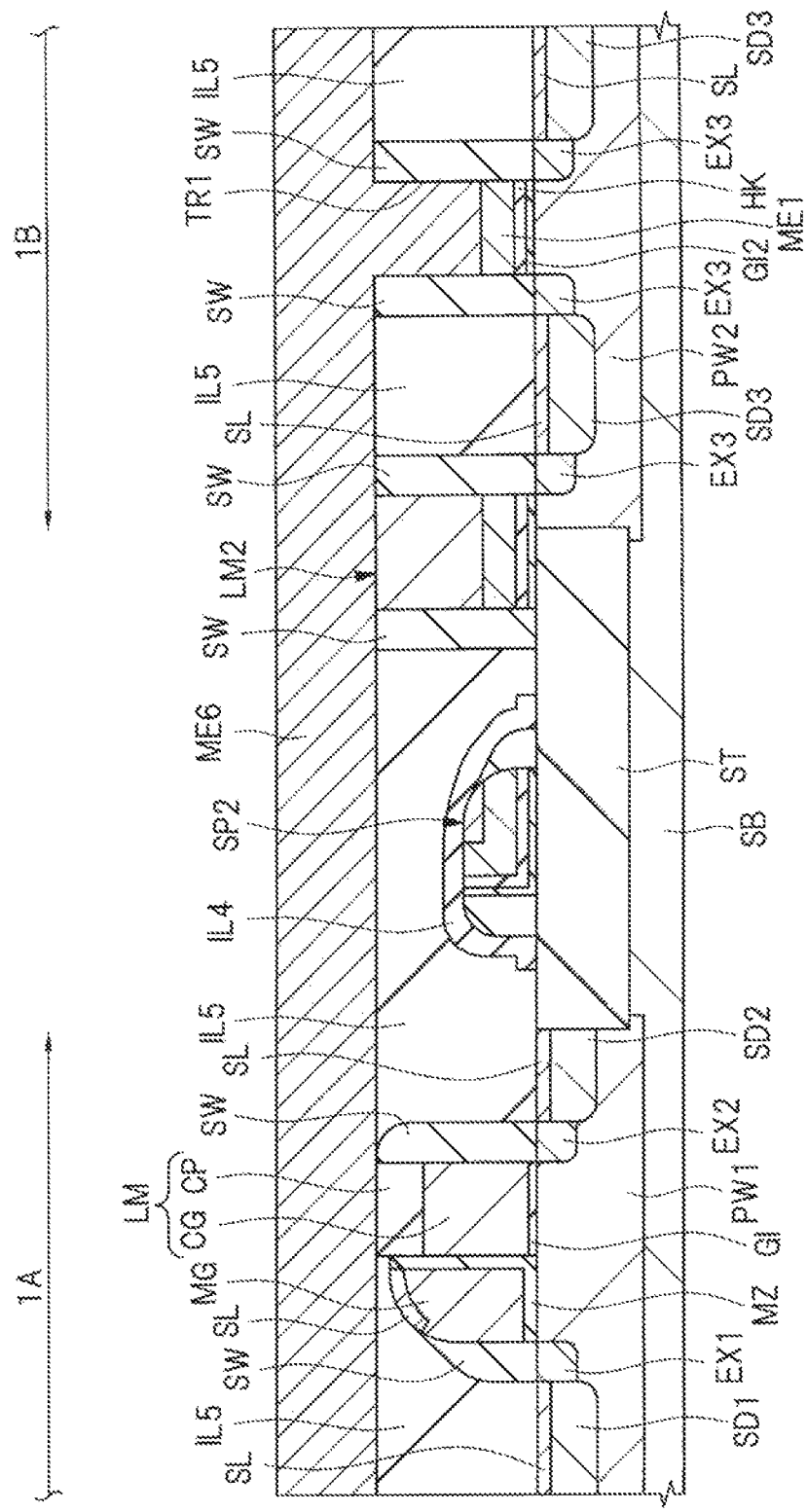
FIG. 62 is a main-portion cross-sectional view of a semiconductor device in a modification of the another embodiment during the manufacturing process thereof.
Figure 63:
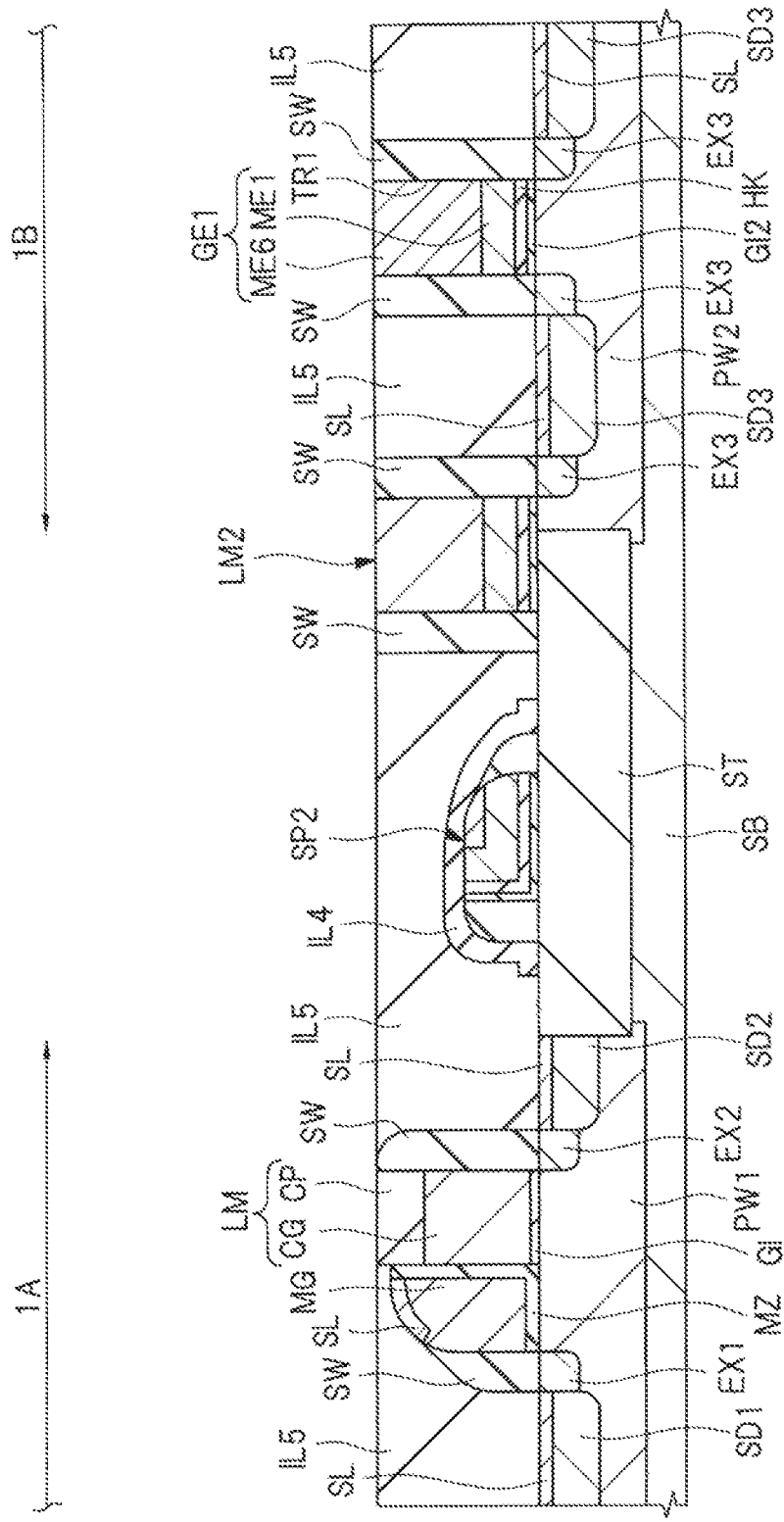
FIG. 63 is a main-portion cross-sectional view of the semiconductor device during the manufacturing process thereof, which is subsequent to FIG. 62.

First, referring to FIGS. 62 and 63, a description will be given of the first modification of the manufacturing process of the semiconductor device in Embodiment 2 (hereinafter referred to as the first modification). FIGS. 62 and 63 are main-portion cross-sectional views of the semiconductor device in the first modification of Embodiment 2 during the manufacturing process thereof.

In the first modification also, as shown in FIG. 53 described above, the manufacturing process is the same as the manufacturing process in Embodiment 2 described above until the step of forming the photoresist pattern PR6 and the step of etching away the silicon film PS3 included in the dummy gate electrode GD are performed. Then, the photoresist pattern PR6 is removed and, in the case of the first modification, as shown in FIG. 62, the metal film ME6 is formed as the conductive film over the semiconductor substrate SB, i.e., over the insulating film IL5 including the inside (bottom portion and side walls) of the trench TR1 so as to fill the trench TR1.

Similarly to the foregoing metal film ME3, the metal film ME6 is a conductive film showing metal conduction. The metal film ME6 is not limited to a single-element metal film (pure metal film) and an alloy film and may also be a metal compound film (such as a metal nitride film or a metal carbide film) showing metal conduction. The metal film ME6 can also be formed as a single-layer film but, in another form, the metal film ME6 can also be formed as a laminated film including a plurality of films.

Then, as shown in FIG. 63, the unneeded metal film ME6 located outside the trench TR1 is removed by a CMP method or the like to embed the metal film ME6 in the trench TR1. This results in a state where the metal film ME6 is embedded in the trench TR1.

In this manner, the gate electrode GE1 of the MISFET is formed in the peripheral circuit region 1B. In the case of the first modification, the gate electrode GE1 includes the metal film ME1 that has formed the dummy gate electrode CG and the metal film ME6 formed over the metal film ME1. Of the gate electrode GE1, the metal film ME6 formed over the metal film ME1 is embedded in the region from which the silicon film PS3 included in the dummy gate electrode GD has been removed. In the case of FIGS. 53 to 58 described above, the metal film is embedded twice in the trench TR1 to form the gate electrode GE1. In the case of the first modification in FIGS. 62 and 63, the metal film is embedded once in the trench TR1 to form the gate electrode GE1. In the case of the first modification in FIGS. 62 and 63, the number of times that the metal film is embedded in the trench TR1 is only once so that the number of steps in the manufacturing process can be reduced.

Next, referring to FIGS. 64 to 67, a description will be given of the second modification of the manufacturing process of the semiconductor device in Embodiment 2 (hereinafter referred to as the second modification). FIGS. 64 to 67 are main-portion cross-sectional views of the semiconductor device in the second modification of Embodiment 2 during the manufacturing process thereof.

In the second modification also, as shown in FIG. 57 described above, the manufacturing process is the same as the manufacturing process in Embodiment 2 described above until the metal film ME4 is formed over the semiconductor substrate SB, i.e., over the insulating film IL5 including the inside (bottom portion and side walls) of the trench TR1, and then the metal film ME5 is formed over the metal film ME4 so as to fill the trench TR1.

Figure 64:
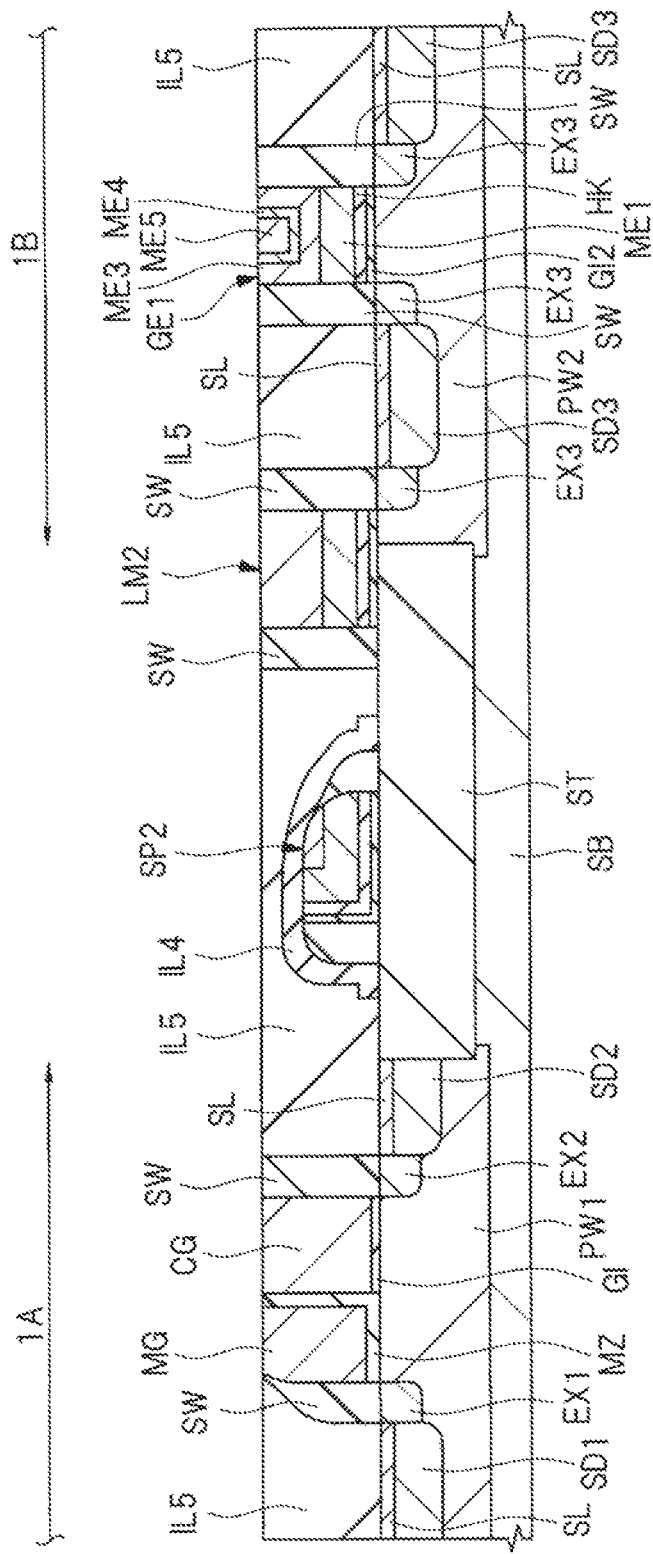
FIG. 64 is a main-portion cross-sectional view of the semiconductor device in another modification of the another embodiment during the manufacturing process thereof.

Then, as shown in FIG. 64, the unneeded metal films ME5 and ME4 located outside the trench TR1 are removed by polishing treatment such as a CMP method to embed the metal films ME4 and ME5 in the trench TR1. This achieves a state where the metal films ME3, ME4, and ME5 are embedded in the trench TR1 to form the gate electrode GE1 of the MISFET in the peripheral circuit region 1B. The gate electrode GE1 includes the metal film ME1 that has formed the dummy gate electrode GD, and the metal films ME3, ME4, and ME5 formed over the metal film ME1.

However, in the case of the second modification, at the stage at which the CMP is ended, the memory gate electrode MG and the control gate electrode CG are exposed. That is, the polishing step for removing the unneeded metal films ME5 and ME4 located outside the trench TR1 is performed until the metal films ME5 and ME4 located outside the trench TR1 are removed and the upper portion of each of the memory gate electrode MG and the control gate electrode CG is exposed.

Figure 65:
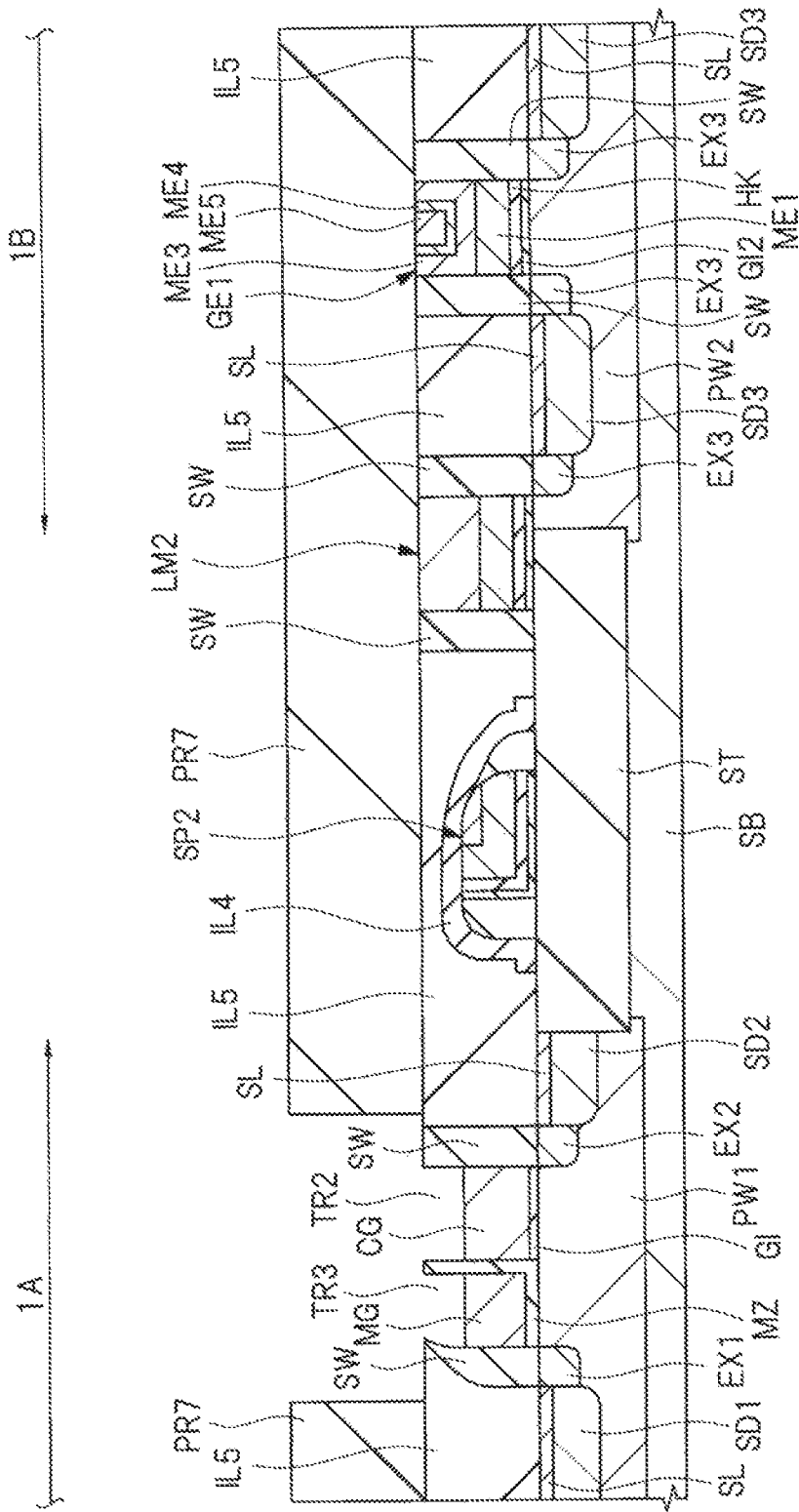
FIG. 65 is a main-portion cross-sectional view of the semiconductor device during the manufacturing process thereof, which is subsequent to FIG. 64.

Next, as shown in FIG. 65, over the semiconductor substrate SB, a photoresist pattern PR7 is formed as a resist pattern using a photolithographic method. The photoresist pattern PR7 covers the entire peripheral circuit region 1B and exposes the memory gate electrode MG and the control gate electrode CG in the memory cell region 1A. The laminated body LM2 and the remaining portion SP2 are preferably covered with the photoresist pattern PR7.

Next, the upper layer portion of each of the memory gate electrode MG and the control gate electrode CG is etched to be removed. Thereafter, the photoresist pattern PR7 is removed. The memory gate electrode MG is not entirely removed, but the upper portion thereof is partially removed. Also, the control gate electrode CG is not entirely removed, but the upper portion thereof is partially removed. This can be achieved by controlling an etching time or the like to provide such an etching amount as to allow only a part of each of the memory gate electrode MG and the control gate electrode CG corresponding to a given height to be etched.

In the step of etching the memory gate electrode MG and the control gate electrode CG, etching is preferably performed under such a condition that the insulating film IL5, the sidewall spacers SW, and the insulating film MZ are less likely to be etched than the memory gate electrode MG and the control gate electrode CG. That is, the etching is preferably performed under such a condition that the speed of etching the insulating film IL5, the sidewall spacers SW, and the insulating film MZ is lower than the speed of etching the memory gate electrode MG and the control gate electrode CG. This allows the memory gate electrode MG and the control gate electrode CG to be selectively etched. The photoresist pattern PR7 covers the entire peripheral circuit region 1B and the laminated body LM2 so that the gate electrode GE1 and the laminated body LM2 are not etched.

As a result of removing the upper portion of the control gate electrode, a trench (depressed portion or recessed portion) TR2 is formed and, as a result of removing the upper portion of the memory electrode, a trench (depressed portion or recessed portion) TR3 is formed. The trench TR2 corresponds to a region from which the part of the control gate electrode CG has been removed and in which the control gate electrode CG has been present till the removal of the upper portion of the control gate electrode CG. The trench TR3 corresponds to a region from which the part of the memory gate electrode MG has been removed and in which the memory gate electrode MG has been present till the removal of the upper portion of the memory gate electrode MG. The bottom portion (bottom surface) of the trench TR2 is formed of the upper surface of the control gate electrode CG, and the side walls (side surfaces) of the trench TR2 are formed of the side surfaces (side surfaces that have been in contact with the control gate electrode CG up until the removal of the control gate electrode CG) of the sidewall spacers SW and of the insulating film MZ. On the other hand, the bottom portion (bottom surface) of the trench TR3 is formed of the upper surface of the memory gate electrode MG, and the side walls (side surfaces) of the trench TR3 are formed of the side surfaces (side surfaces that have been in contact with the memory gate electrode MG up until the removal of the memory gate electrode MG) of the sidewall spacers SW and of the insulating film MZ.

Figure 66:
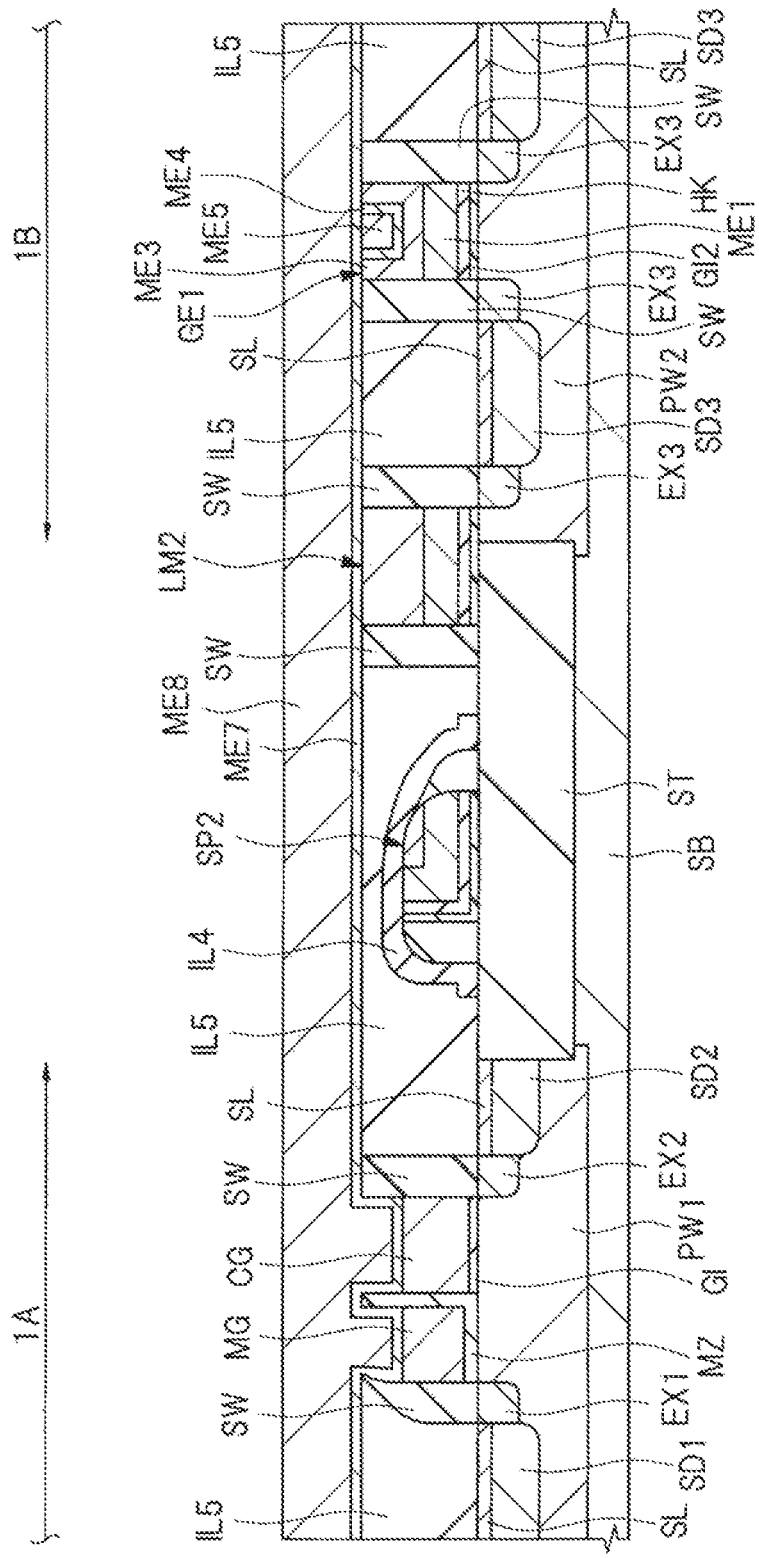
FIG. 66 is a main-portion cross-sectional view of the semiconductor device during the manufacturing process thereof, which is subsequent to FIG. 65.

Next, as shown in FIG. 66, over the semiconductor substrate SB, i.e., over the insulating film IL5 including the inside (bottom portions and side walls) of the trenches TR2 and TR3, a metal film ME7 is formed as a conductive film. Then, over the metal film ME7, a metal film ME8 is formed as a conductive film so as to fill the trenches TR2 and TR3.

Similarly to the metal films ME4 and ME5, the metal films ME7 and ME8 are conductive films each showing metal conduction. Each of the metal films ME7 and ME8 is not limited to a single-element metal film (pure metal film) and an alloy film and may also be a metal compound film (such as a metal nitride film or a metal carbide film) showing metal conduction. The metal film ME7 is a film which functions as a barrier conductor film and has the effect of improving adhesion. As the metal film ME7, e.g., a titanium (Ti) film or the like can be used. As the metal film ME8, e.g., an aluminum (Al) film or the like can be used.

Figure 67:
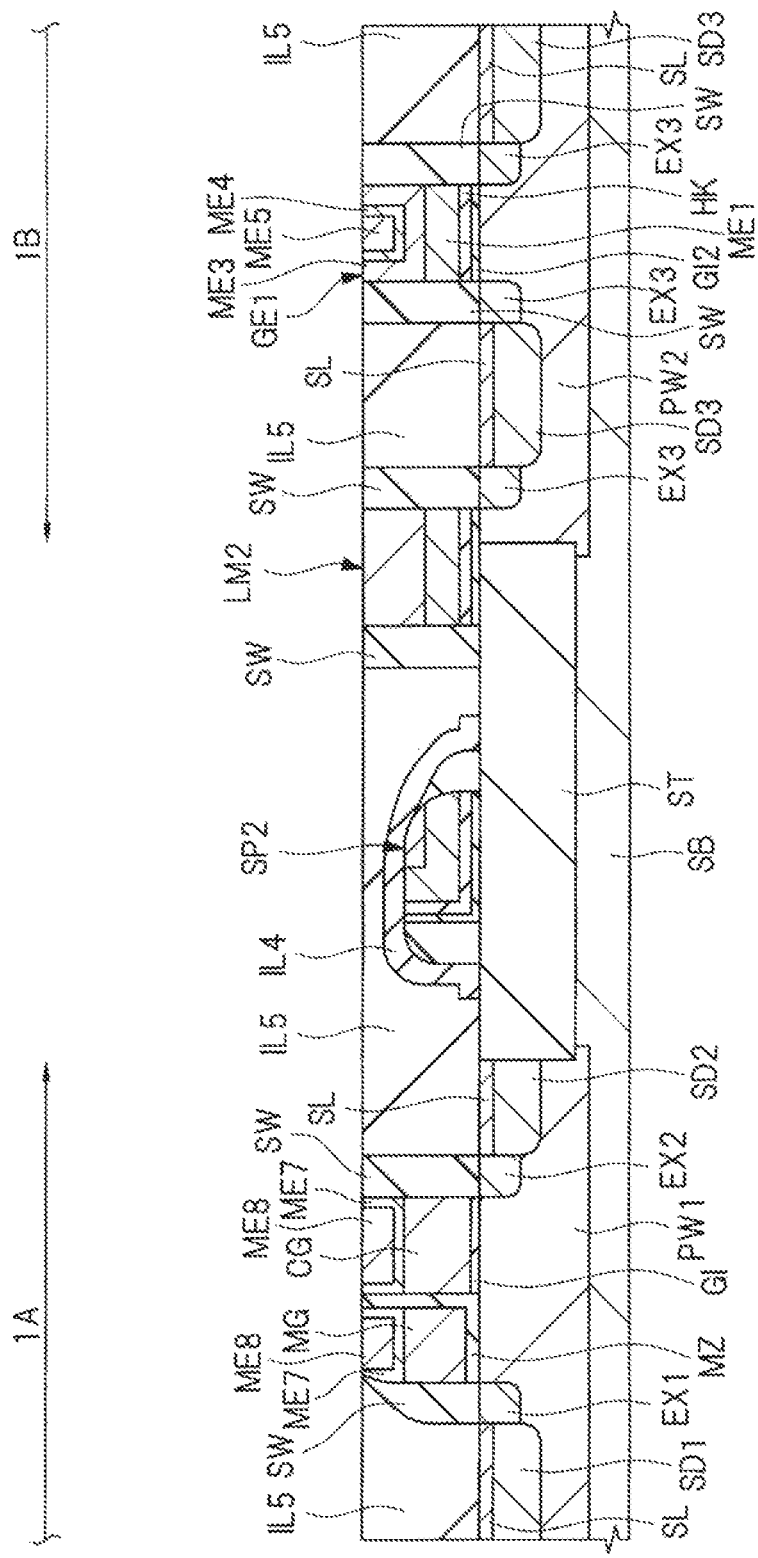
FIG. 67 is a main-portion cross-sectional view of the semiconductor device during the manufacturing process thereof, which is subsequent to FIG. 66.

Next, as shown in FIG. 67, the unneeded metal films ME8 and ME7 located outside the trenches TR2 and TR3 are removed by a CMP method or the like to be embedded in the trenches TR2 and TR3. As a result, a state is obtained where the metal films ME7 and ME8 are formed over the control gate electrode CG and the metal films ME7 and ME8 are formed over the memory gate electrode MG. The metal films ME7 and ME8 over the control gate electrode CG are embedded in the trench TR2, while the metals films ME7 and ME8 over the memory gate electrode MG are embedded in the trench TR3. The metal films ME7 and ME8 over the control gate electrode CG and the metals films ME7 and ME8 over the memory gate electrode MG are insulated from each other since the insulating film MZ is interposed therebetween.

The subsequent process is the same as in Embodiment 2 described above. The step of forming the insulating film IL8 in FIG. 59 described above, the step of forming the contact holes CT and the step of forming the plugs PG in FIG. 60 described above, and the step of forming the insulating film IL6 and the step of forming the wires M1 in FIG. 61 described above are performed, but the illustration thereof is omitted here.

In the case of the second modification, over each of the control gate electrode CG and the memory gate electrode MG, the metal layers (which are the metal films ME7 and ME8) can be formed. Since the metal layers (which are the metal films ME7 and ME8) can be formed over each of the control gate electrode CG and the metal gate electrode MG not by a salicide process, but by deposition and embodiment, the resistance of the metal layers is easily reduced. This allows a further improvement in the performance of the semiconductor device, such as an improved operating speed.

It is also possible to combine the foregoing first modification and the second modification. In this case, when the unneeded metal film ME6 located outside the trench TR1 is removed by polishing such as a CMP method, as shown in FIG. 63 described above, at the stage at which the CMP is ended, the memory gate electrode MG and the control gate electrode CG are exposed, as shown in FIG. 64 described above. Thereafter, the steps in FIGS. 65 and 67 may be performed appropriately.

In still another modification, it may also be possible to expose the upper portion of each of the memory gate electrode MG and the control gate electrode CG at the stage in FIG. 52 described above, perform the steps in FIGS. 53 to 55 described above, and then perform the step of forming the photoresist pattern PR7 and the step of etching away the upper-layer portion of each of the memory gate electrode MG and the control gate electrode CG, as shown in FIG. 65 described above. Thereafter, when the step in FIG. 56 described above (step of removing the insulating film IL7), the step in FIG. 57 described above (step of forming the metal films ME4 and ME5), and the step in FIG. 58 (step of polishing the metal films ME4 and ME5) are performed, the metal films ME4 and ME5 are embedded not only in the trench TR1, but also in the trenches TR2 and TR3. As a result, a state is obtained where the gate electrode GE1 is formed of the metal film ME1 and the metal films ME3, ME4, and ME5 thereover, the metal films ME4 and ME5 are formed over the control gate electrode CG, and the metal films ME4 and ME5 are formed over the metal gate electrode MG.

Next, referring to FIGS. 68 to 77, a description will be given of the third modification of the manufacturing process of the semiconductor device in Embodiment 2 (hereinafter referred to as the third modification). FIGS. 68 to 77 are main-portion cross-sectional views (FIGS. 68, 69, 71 to 73, and 75 to 77) and main-portion plan views (FIGS. 70 and 74) of the semiconductor device in the third modification of Embodiment 2 during the manufacturing process thereof.

Figure 45:
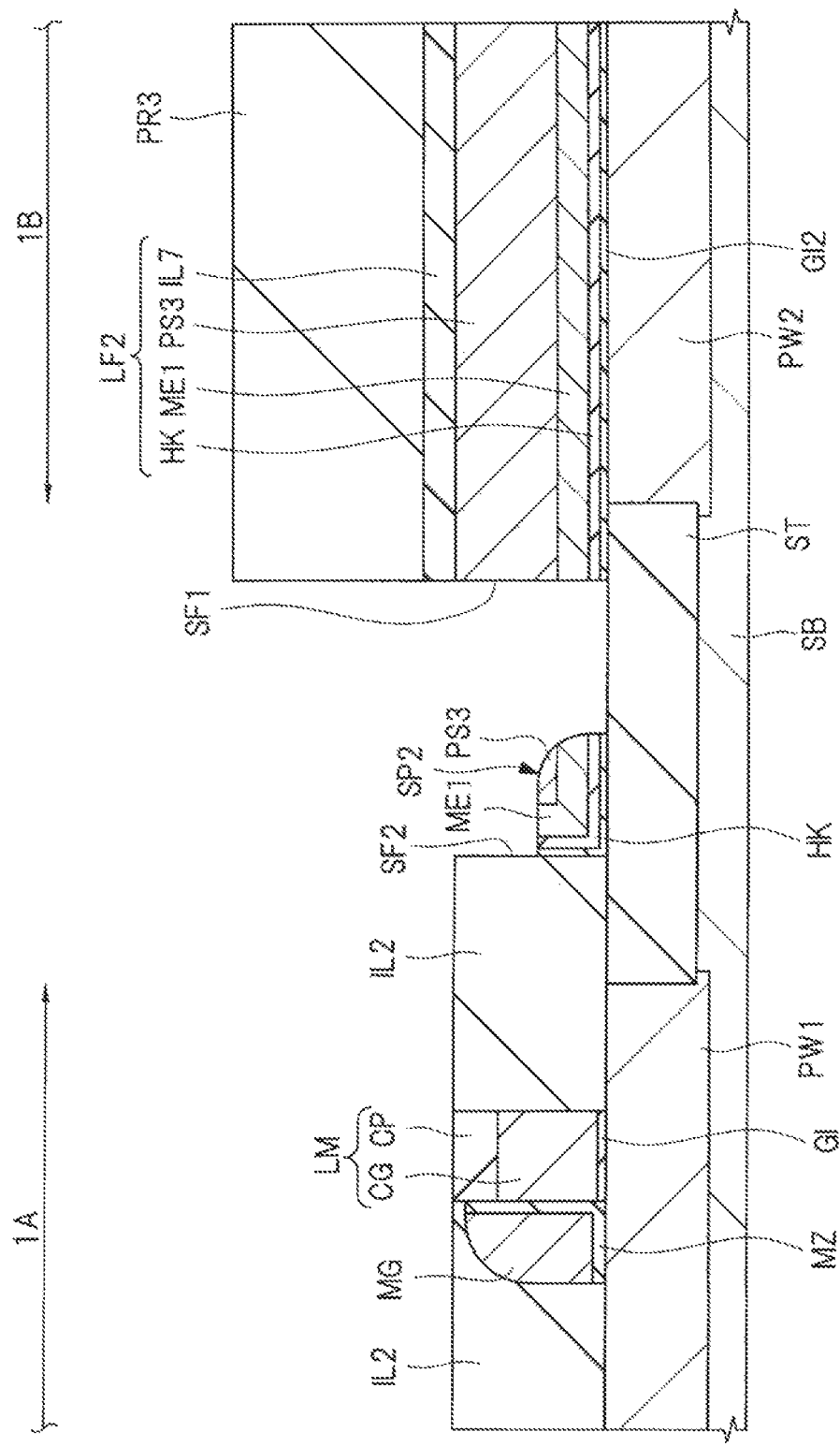
FIG. 45 is a main-portion cross-sectional view of the semiconductor device during the manufacturing process thereof, which is subsequent to FIG. 44.
Figure 46:
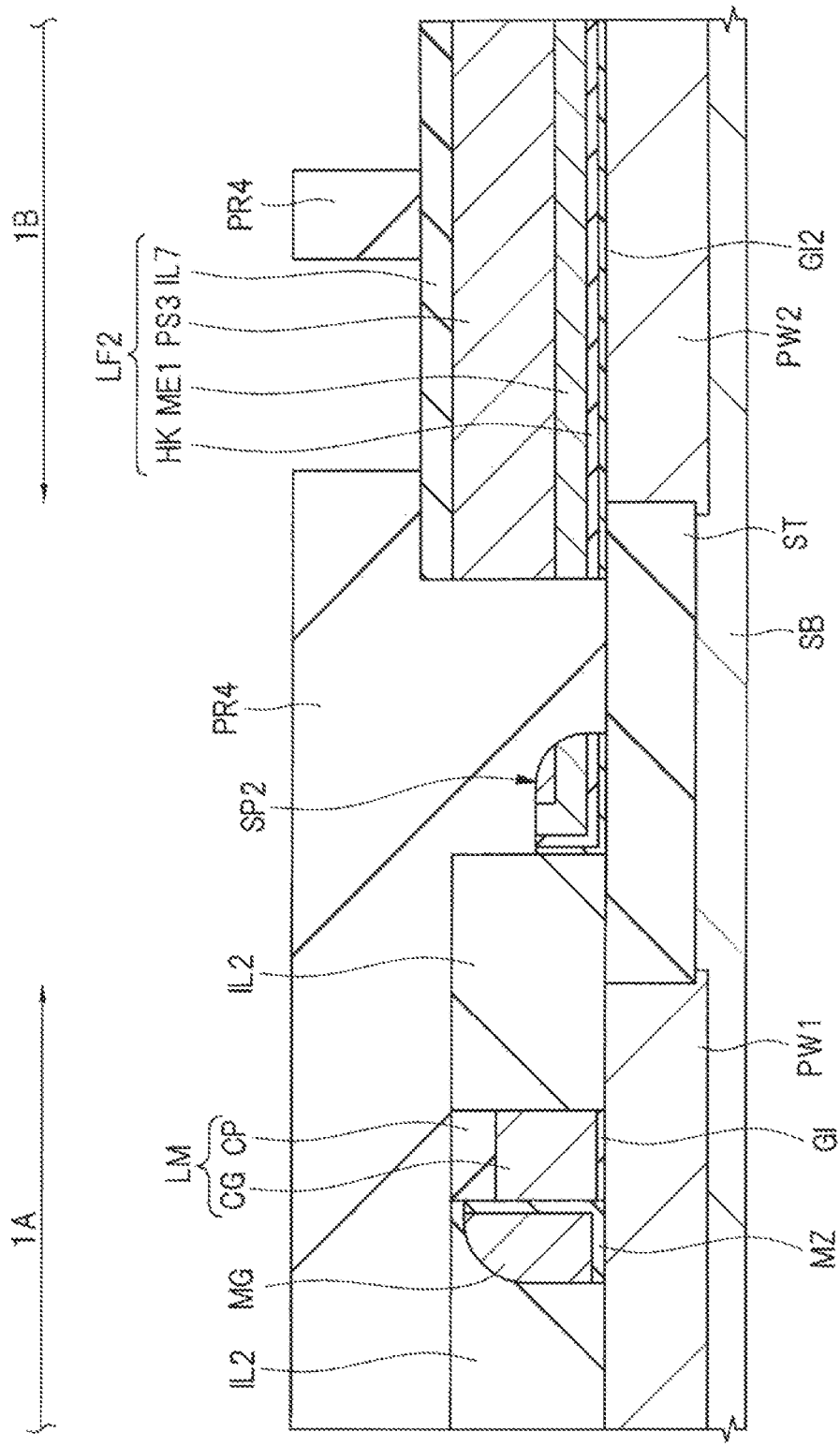
FIG. 46 is a main-portion cross-sectional view of the semiconductor device during the manufacturing process thereof, which is subsequent to FIG. 45.
Figure 47:
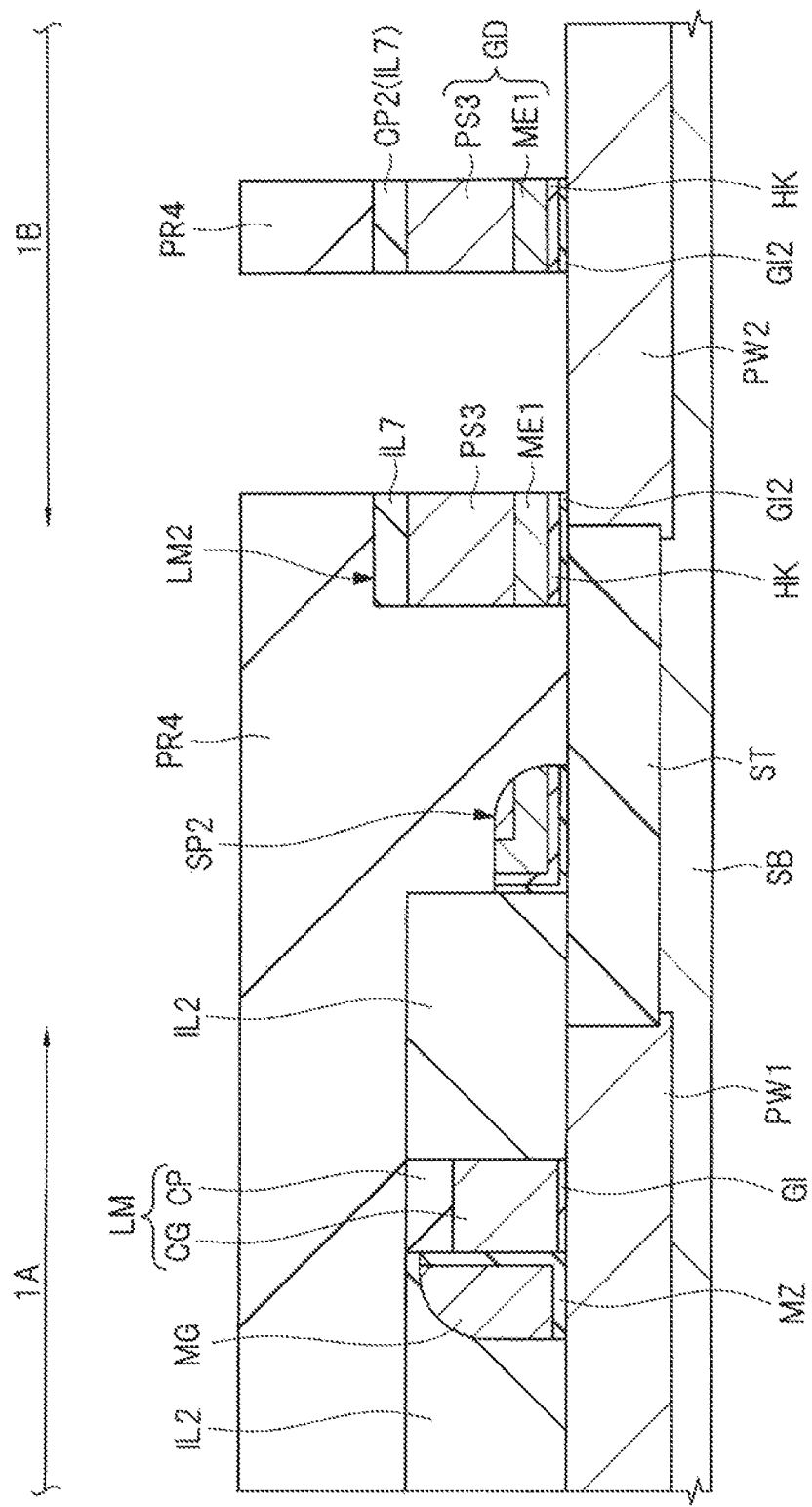
FIG. 47 is a main-portion cross-sectional view of the semiconductor device during the manufacturing process thereof, which is subsequent to FIG. 46.

In the third modification also, as shown in FIG. 45 described above, the manufacturing process is the same as the manufacturing process in Embodiment 2 described above until the insulating film IL7, the silicon film PS3, the metal film ME1, and the insulating film HK are etched using the photoresist pattern PR3 as an etching mask. Thereafter, the photoresist pattern PR3 is removed.

Figure 68:
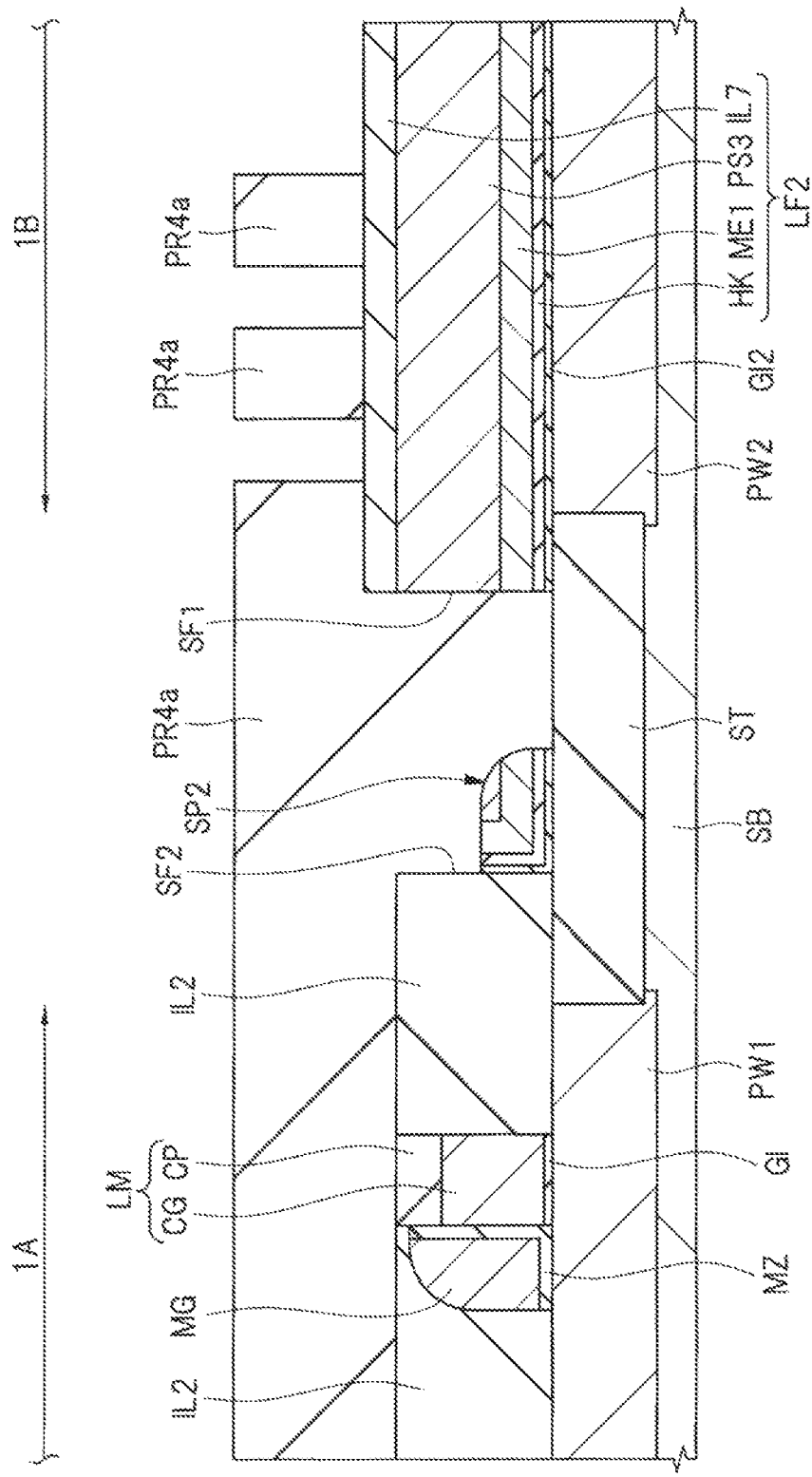
FIG. 68 is a main-portion cross-sectional view of a semiconductor device in still another modification of the another embodiment during the manufacturing process thereof.

In the case of the third modification, next, as shown in FIG. 68, a photoresist pattern PR4a is formed as a resist pattern using a photolithographic method. The photoresist pattern PR4a is formed in the entire memory cell region 1A and in the area of the peripheral circuit region 1B where the dummy gate electrode GD is to be formed. Consequently, the insulating film IL2 is covered with the photoresist pattern PR4a. Preferably, the side surface SF1 of the laminated film LF2 is covered with the photoresist pattern PR4a. In the case where the foregoing remaining portion SP2 is formed over the side surface SF2 of the insulating film IL2, the remaining portion SP2 is also covered with the photoresist pattern PR4a.

Figure 69:
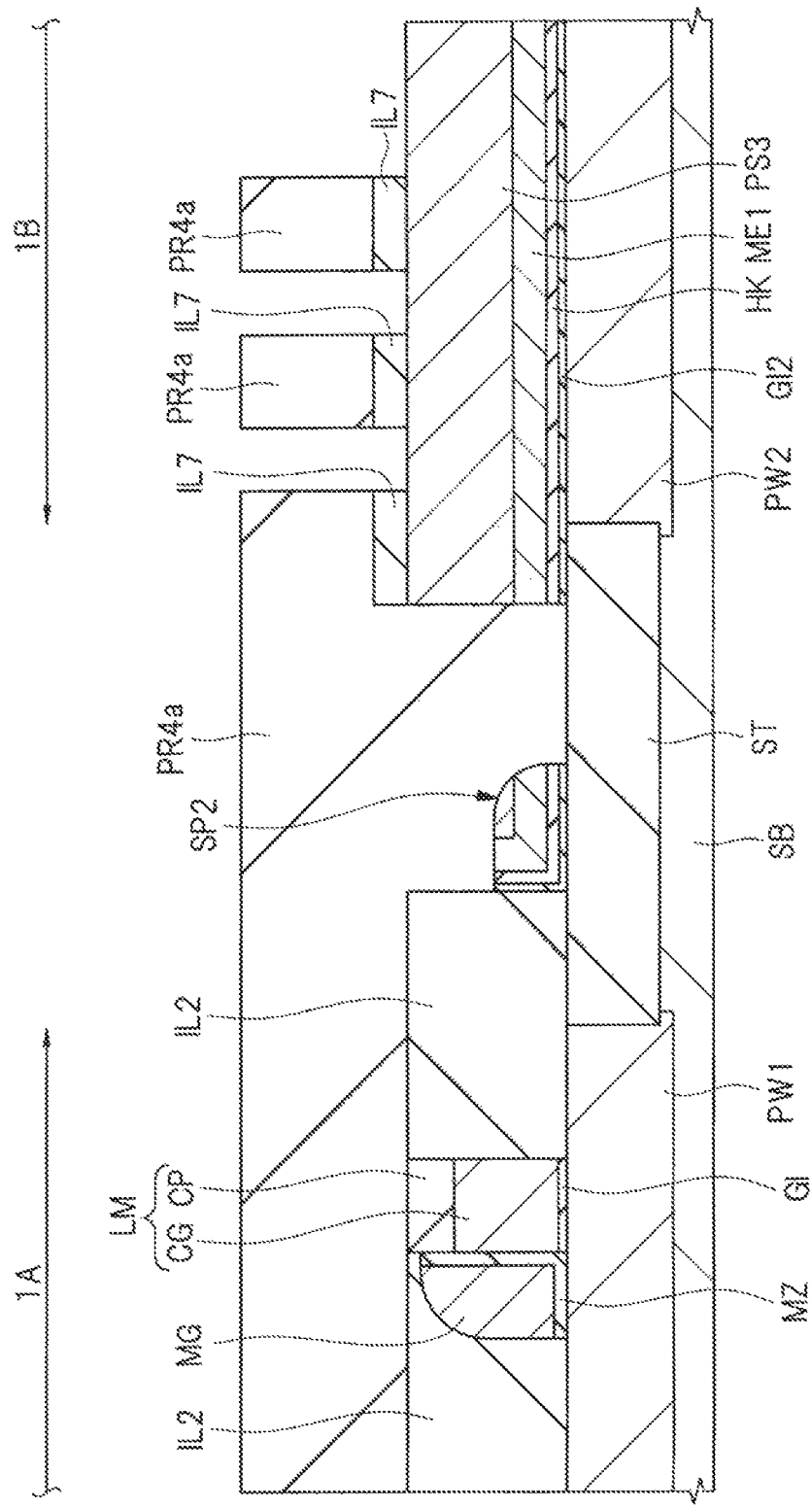
FIG. 69 is a main-portion cross-sectional view of the semiconductor device during the manufacturing process thereof, which is subsequent to FIG. 68.

Next, as shown in FIG. 69, using the photoresist pattern PR4a as an etching mask, the portion of the insulating film IL7 exposed from the photoresist pattern PR4a is etched (preferably dry-etched) to be removed, thus patterning the insulating film IL7 included in the laminated film LF2. Thereafter, the photoresist pattern PR4a is removed.

Figure 70:
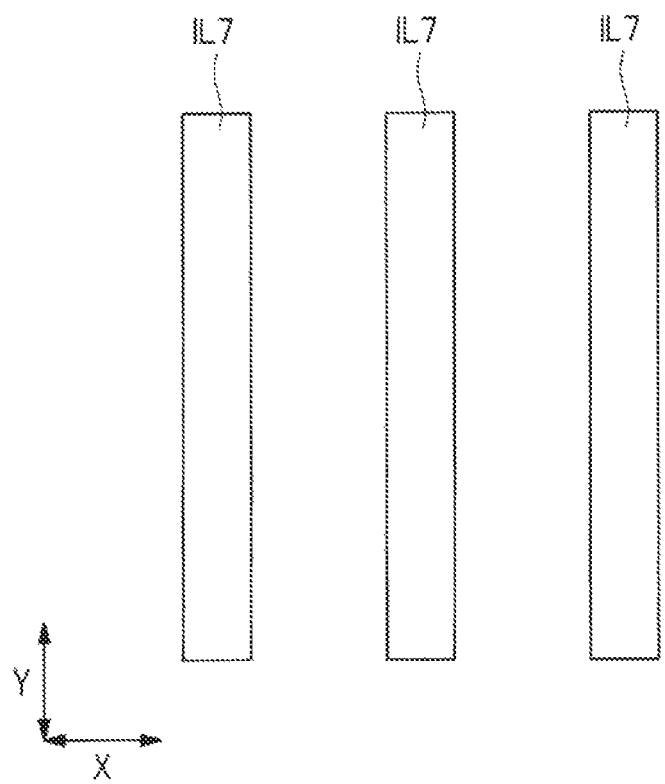
FIG. 70 is a main-portion plan view of the same semiconductor device as in FIG. 69 during the manufacturing process thereof.

FIG. 70 is a plan view showing an example of the pattern of the patterned insulating film IL7 in the peripheral circuit region 1B. As shown in FIG. 70, the patterned insulating film IL7 is in a state where a plurality of linear patterns each extending in a Y-direction are arranged in an X-direction.

Here, the X-direction and the Y-direction are parallel with the main surface of the semiconductor substrate SB, crossing each other, and preferably orthogonal to each other.

Figure 71:
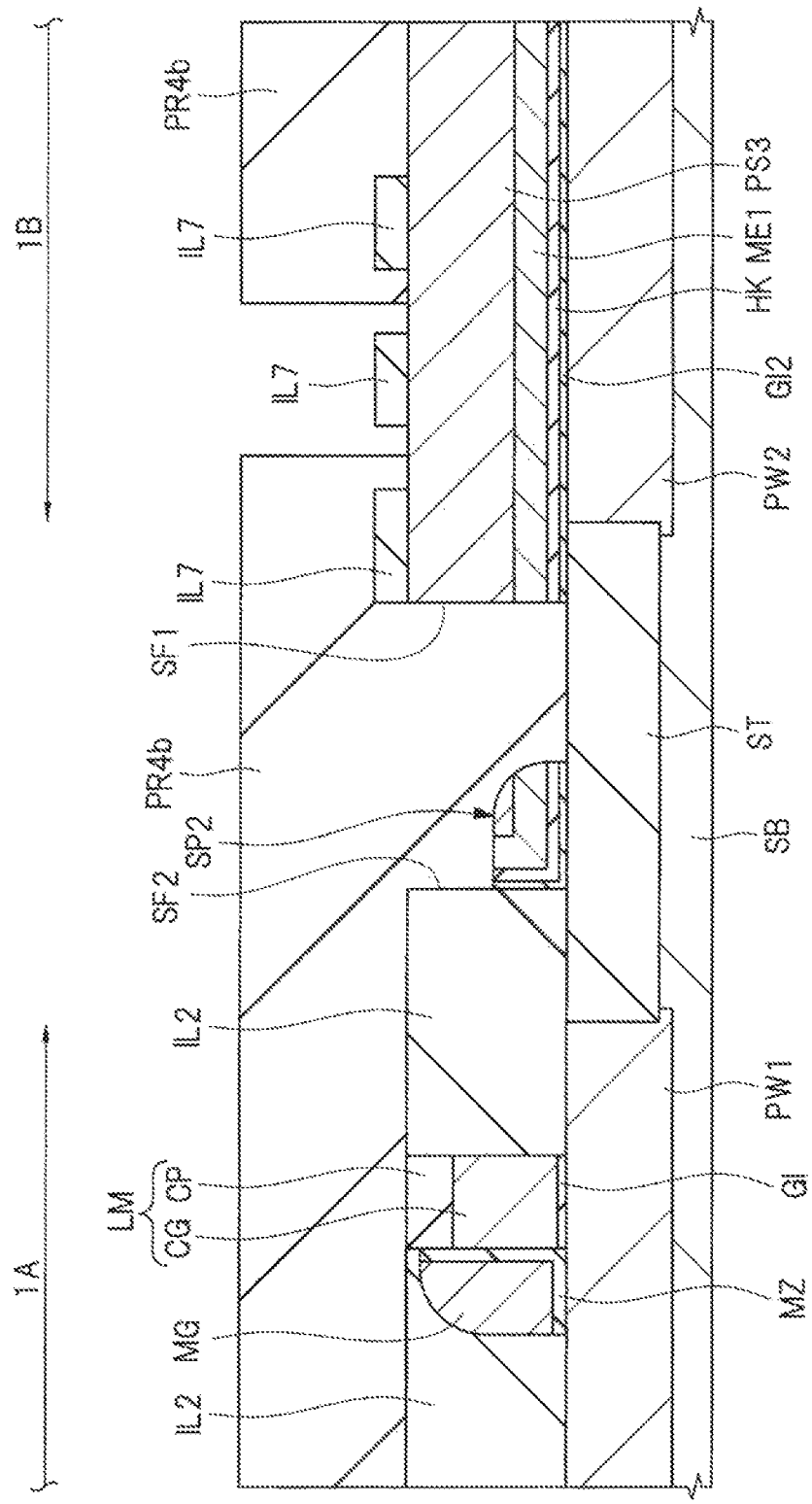
FIG. 71 is a main-portion cross-sectional view of the semiconductor device during the manufacturing process thereof, which is subsequent to FIG. 69.

Next, as shown in FIG. 71, over the semiconductor substrate SB, a photoresist pattern PR4b is formed as a resist pattern using a photolithographic method. The photoresist pattern PR4b is formed in the entire memory cell region 1A and in the area of the peripheral circuit region 1B where the dummy gate electrode GD is to be formed. Consequently, the insulating film IL2 is covered with the photoresist pattern PR4b. Preferably, the side surface SF1 of the laminated film LF2 is covered with the photoresist pattern PR4b. In the case where the foregoing remaining portion SP2 is formed over the side surface SF2 of the insulating film IL2, the remaining portion SP2 is also covered with the photoresist pattern PR4b.

Figure 72:
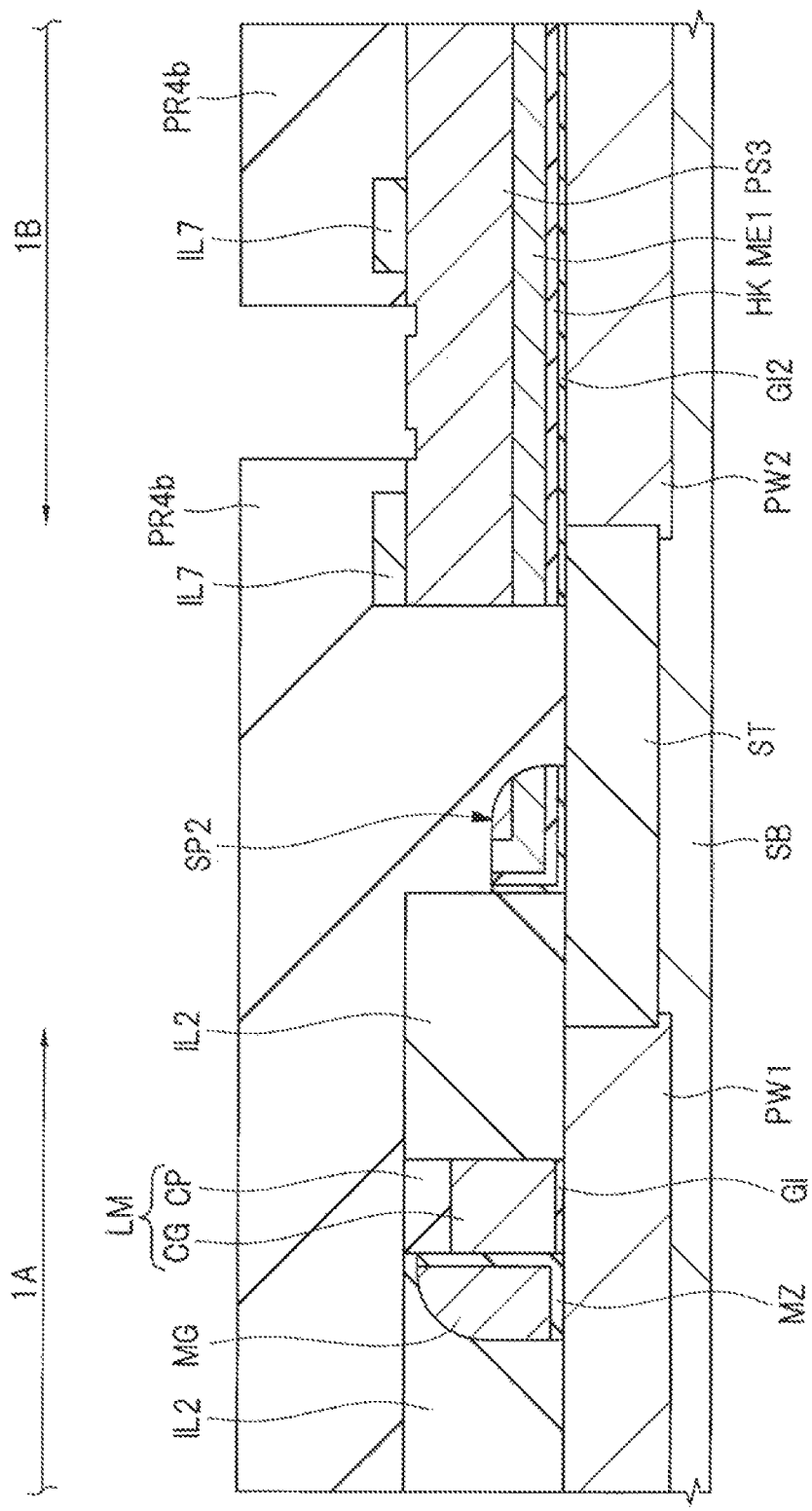
FIG. 72 is a main-portion cross-sectional view of the semiconductor device during the manufacturing process thereof, which is subsequent to FIG. 71.
Figure 73:
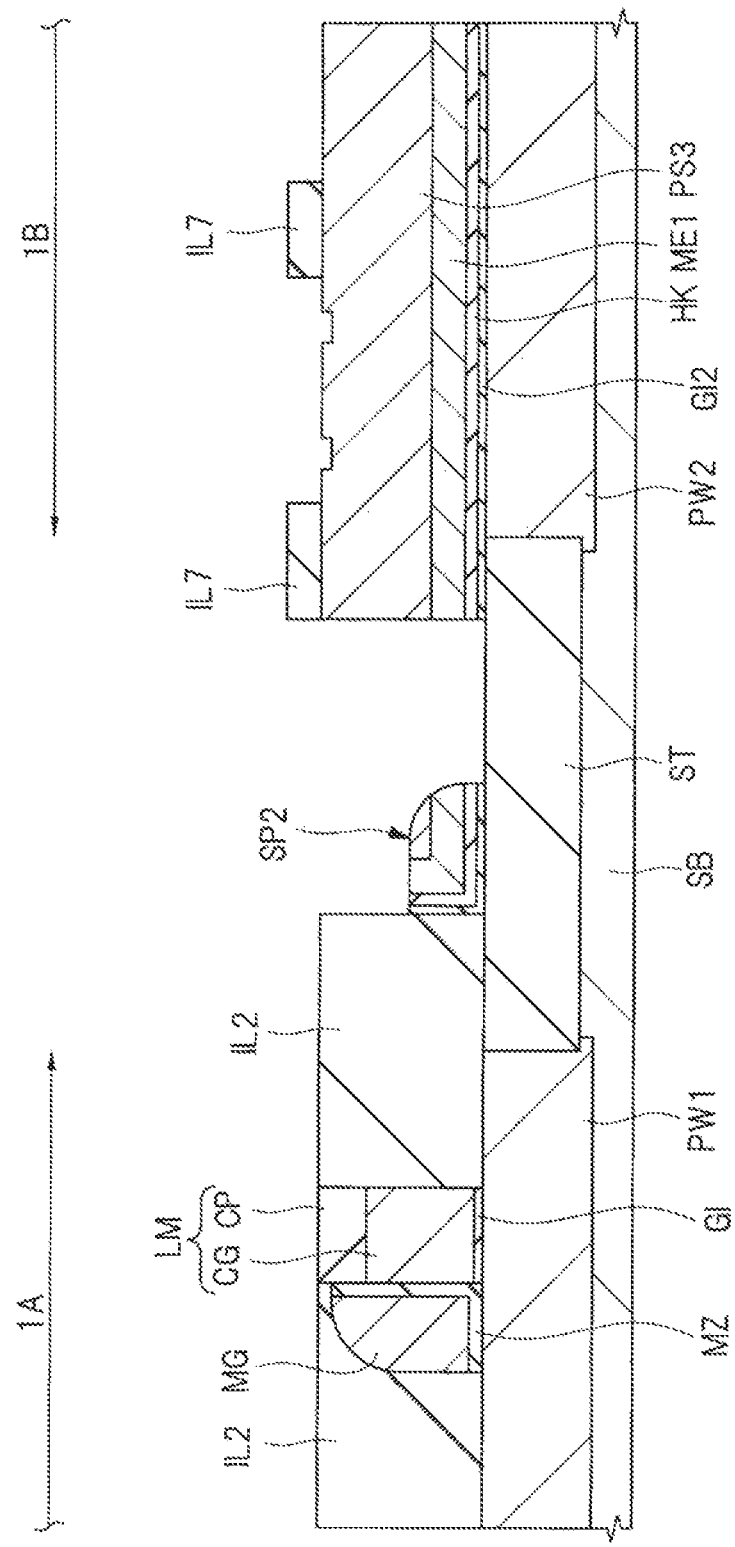
FIG. 73 is a main-portion cross-sectional view of the semiconductor device during the manufacturing process thereof, which is subsequent to FIG. 72.

Next, as shown in FIG. 72, using the photoresist pattern PR4b as an etching mask, the portion of the insulating film IL7 exposed from the photoresist pattern PR4b is etched (preferably dry-etched) to be patterned, thus patterning the insulating film IL7. Thereafter, as shown in FIG. 73, the photoresist pattern PR4b is removed.

Figure 74:
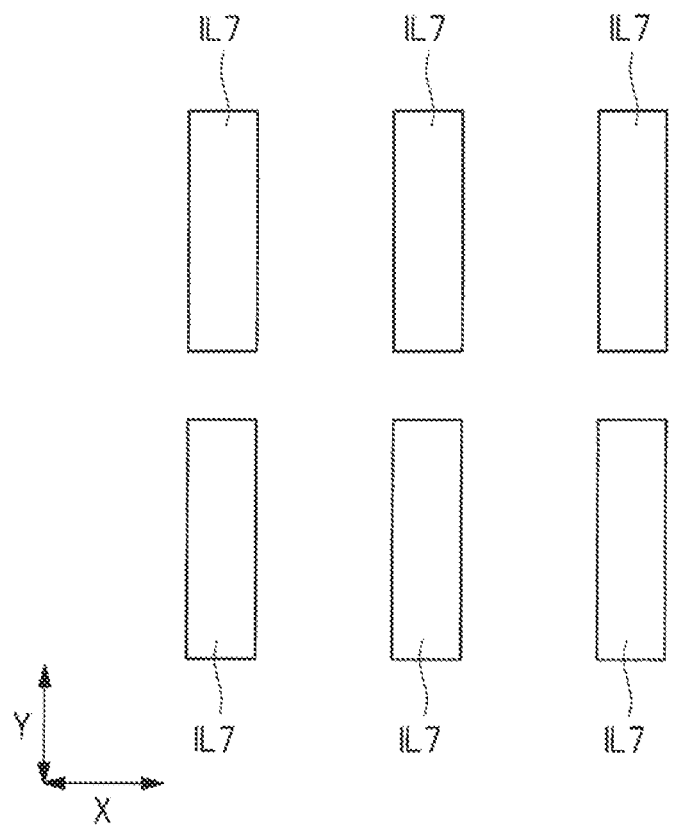
FIG. 74 is a main-portion plan view of the same semiconductor device as in FIG. 73 during the manufacturing process thereof.

FIG. 74 is a plan view showing an example of the pattern of the patterned insulating film IL7 in the peripheral circuit region 1B at this stage. The insulating film IL7 that has been in the linear patterns each extending in the Y-direction as shown in FIG. 70 are changed into patterns divided midway in the Y-direction by the etching using the photoresist pattern PR4b as shown in FIG. 74. That is, the individual patterns of the insulating film IL7 in FIG. 70 are further divided to result in the patterns of the insulating film IL7 in FIG. 74.

That is, in the case of the third modification, the patterning of the insulating film IL7 included in the laminated film LF2 is not performed by the single etching step using the foregoing photoresist pattern PR4. In the case of the third modification, the insulating film IL7 included in the laminated film LF2 is patterned by the total of two etching steps which are the etching step using the photoresist pattern PR4a and the etching step using the photoresist pattern PR4b. Note that the patterns in FIGS. 70 and 74 show an example of the patterning of the insulating film IL7.

Figure 75:
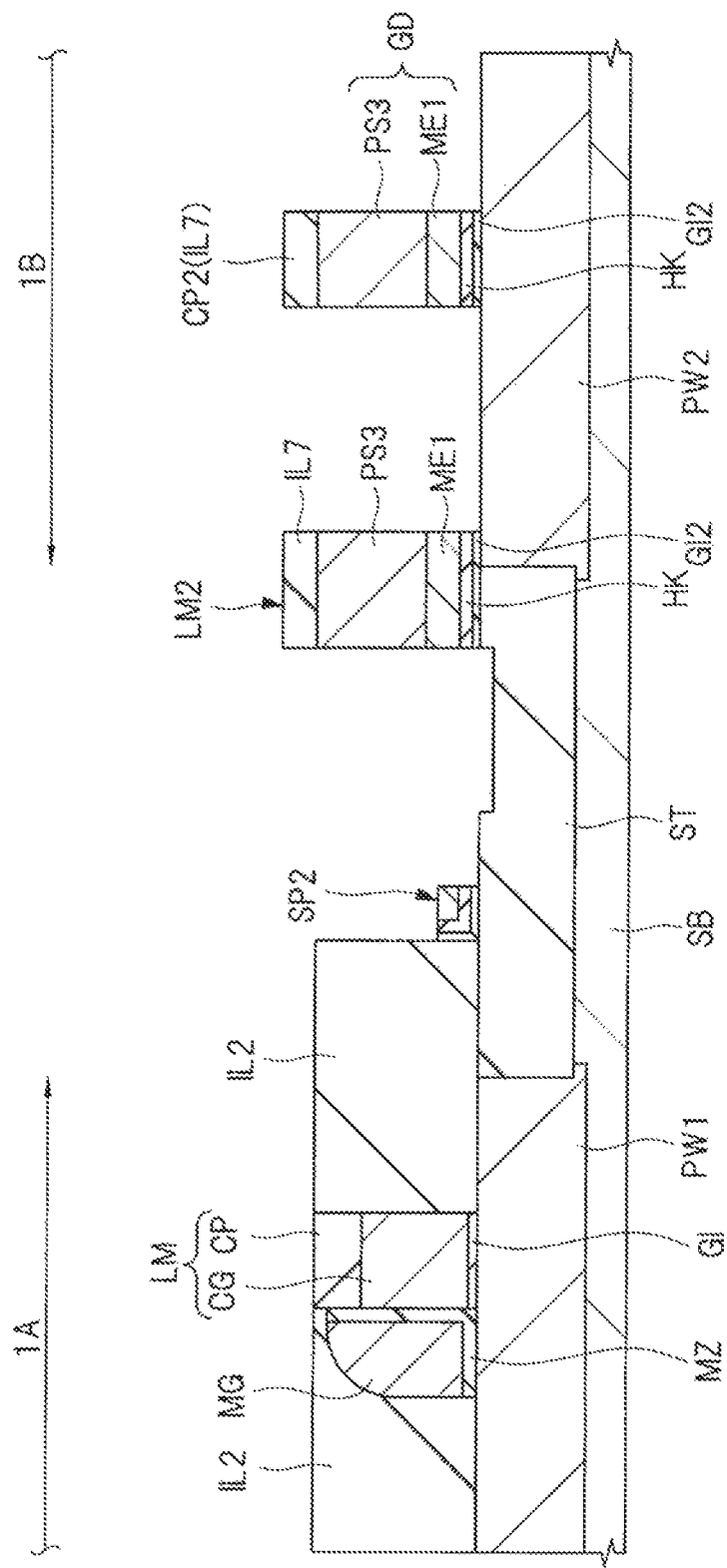
FIG. 75 is a main-portion cross-sectional view of the semiconductor device during the manufacturing process thereof, which is subsequent to FIG. 73.

Next, as shown in FIG. 75, the laminated film of the silicon film PS3 and the metal film M41 is etched (preferably dry-etched) to be patterned using the insulating film IL7 as an etching mask (hard mask), thus forming the dummy gate electrode GD in the peripheral circuit region 1B.

The dummy gate electrode GD includes the metal film ME1 and the silicon film PS3 over the metal film ME1 and is formed over the insulating film HK. That is, the dummy gate electrode GD including the metal film ME1, and the silicon film PS3 over the metal film ME1 is formed over the semiconductor substrate SB (p-type well PW2) located in the peripheral circuit region 1B via the insulating film GI2 and the insulating film HK. The insulating film IL7 used as the etching mask remains over the dummy gate electrode GD to serve as the cap insulating film CP2.

At this stage, the third modification (FIG. 75) is different from Embodiment 2 (FIG. 47) described above in the following point. That is, in the case of Embodiment 2 (FIG. 47) described above, the foregoing remaining portion SP2 is covered with the photoresist pattern PR4 and is therefore not etched in the etching step for forming the dummy gate GD. By contrast, in the case of the third modification (FIG. 75), the patterned insulating film IL7 is used as an etching mask, and therefore the foregoing remaining portion SP2 may also be etched in the etching step for forming the dummy gate electrode GD. As a result, when a comparison is made between the foregoing remaining portion PS2 in Embodiment 2 described above and that in the third modification at the stage at which the dummy gate electrode GD has been formed, the foregoing remaining portion PS2 in the case of the third modification (FIG. 75) is smaller than that in the case of Embodiment 2 (FIG. 47) described above. In the case of the third modification (FIG. 75), the foregoing remaining portion SP2 may even disappear. Also, in the case of the third modification (FIG. 75), the area of the isolation region ST which is covered with the insulating film IL2, the remaining portion SP2, and the laminated body LM2 is not etched in the etching step for forming the dummy gate electrode GD. However, the area of the isolation region ST which is exposed without being covered therewith may be slightly etched in the etching step for forming the dummy gate electrode GD. The case of the third modification is otherwise the same as the case of Embodiment 2 (FIG. 47) described above so that the repeated description thereof is omitted.

Figure 76:
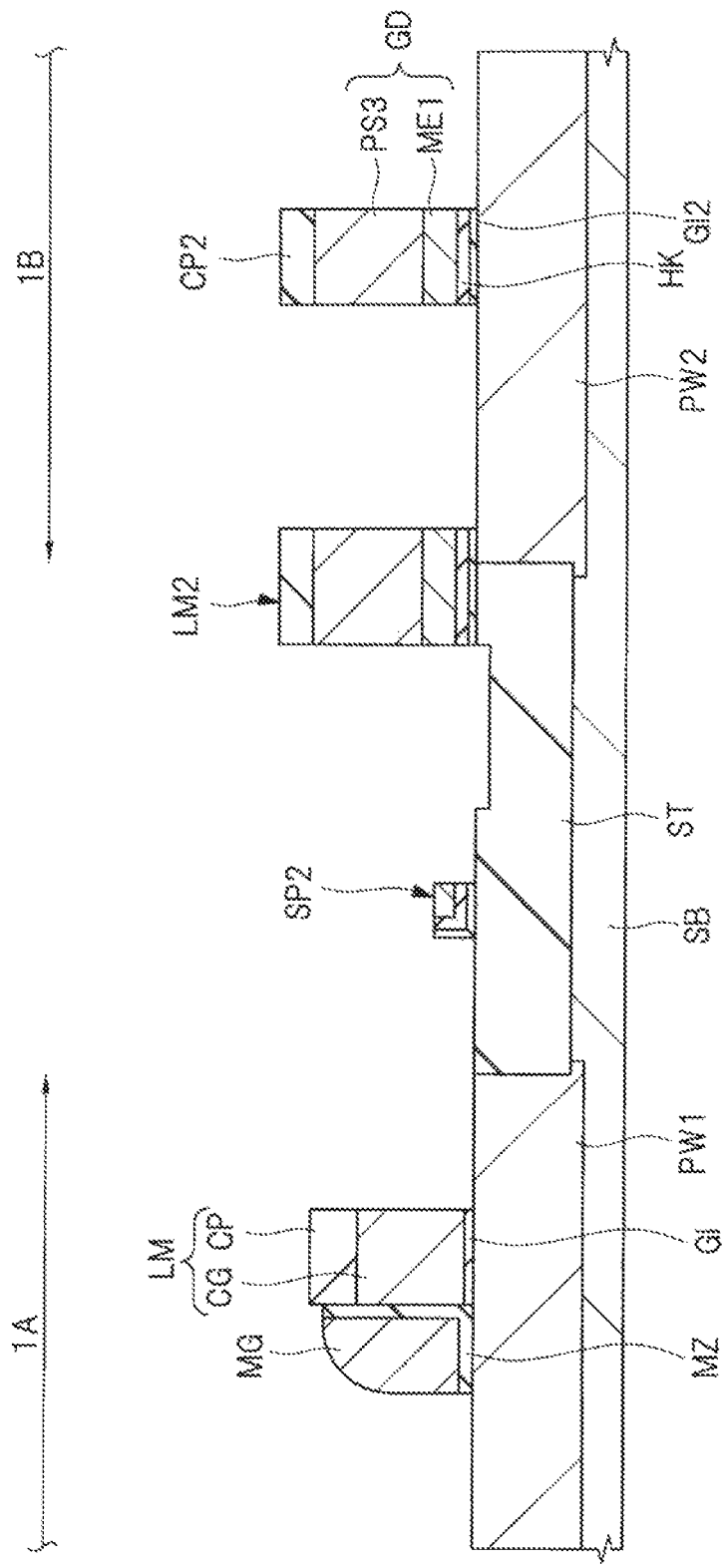
FIG. 76 is a main-portion cross-sectional view of the semiconductor device during the manufacturing process thereof, which is subsequent to FIG. 75.

In the third modification also, as shown in FIG. 76, the insulating film IL2 is removed in the same manner as in Embodiments 1 and 2 described above. The subsequent process (i.e., the process including and subsequent to the step of forming the n⁻-type semiconductor regions EX1, EX2, and EX3 in Step S28) is the same as in Embodiment 2 described above so that the illustration and description thereof is omitted here. To the case of the third modification, the foregoing first modification, the foregoing second modification, a combination of the first and second modifications, or the like can also be applied.

Figure 77:
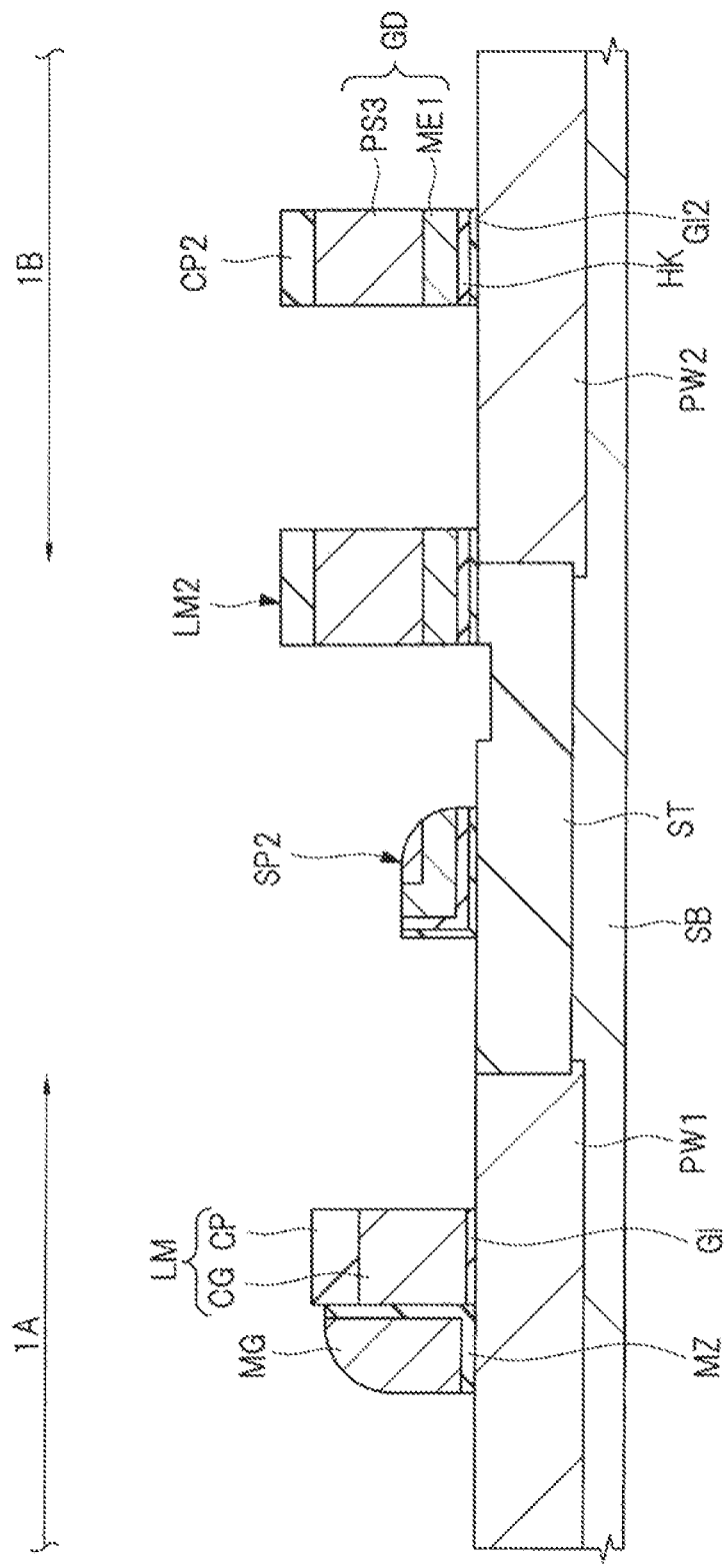
FIG. 77 is a main-portion cross-sectional view of the semiconductor device during the manufacturing process thereof, which corresponds to FIG. 76.

FIG. 77 is a cross-sectional view showing the same process stage as shown in FIG. 76. However, the case where the remaining portion SP2 is covered with a photoresist pattern (not shown), and then the etching step (step in FIG. 75) for forming the dummy gate electrode GD is performed using the insulating film IL7 as the etching mask corresponds to FIG. 77. In the case of FIG. 77, in the etching step for forming the dummy gate electrode GD, the remaining portion SP2 is covered with the photoresist pattern and is therefore not etched. Accordingly, the size of the remaining portion SP2 in the case of FIG. 77 is larger than that of the remaining portion SP2 in the case of FIG. 76 and substantially the same as that of the remaining portion SP2 in the case of FIG. 48 described above.

In the case of the third modification, the insulating film IL7 included in the laminated film LF2 is patterned by the two etching steps which are the etching step using the photoresist pattern PR4a and the etching step using the photoresist pattern PR4b and, then, using the patterned insulating film IL7 as an etching mask (hard mask), the dummy gate electrode GD is formed. This facilitates the formation of the dummy gate electrode GD in a minute pattern and thus allows the MISFET formed in the peripheral circuit region 1B to be further miniaturized.

Next, referring to FIGS. 78 to 82, a description will be given of the advantage provided by forming the dummy gate electrode GD not of a single-layer silicon film, but of the laminated film of the metal film ME1 and the silicon film PS3 over the metal film ME1 in Embodiment 2.

FIGS. 78 to 82 are main-portion cross-sectional views of the semiconductor device in Embodiment 2 during the manufacturing process thereof, which show partially enlarged cross-sectional views of the peripheral circuit region 1B.

Figure 51:
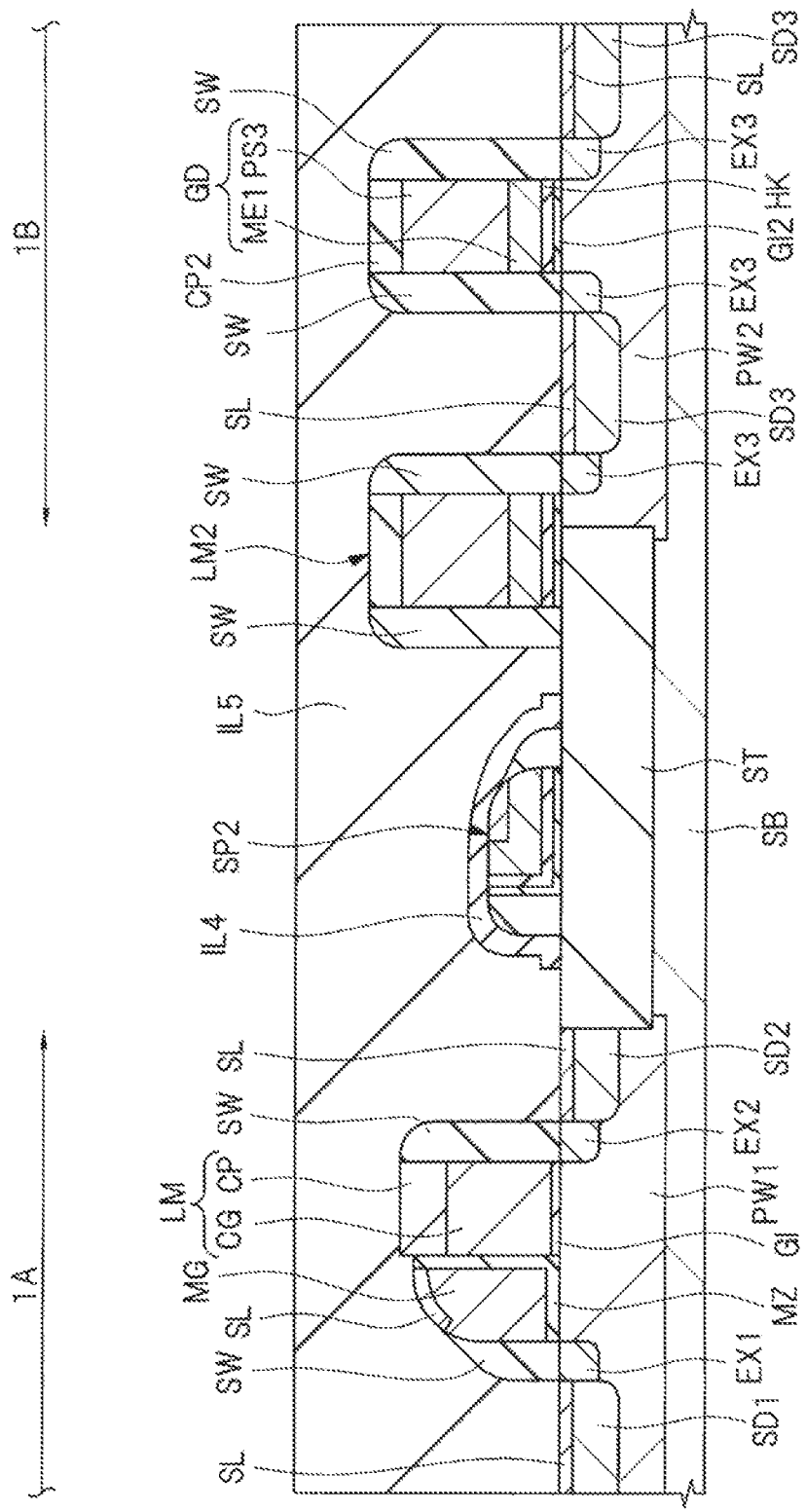
FIG. 51 is a main-portion cross-sectional view of the semiconductor device during the manufacturing process thereof, which is subsequent to FIG. 50.
Figure 78:
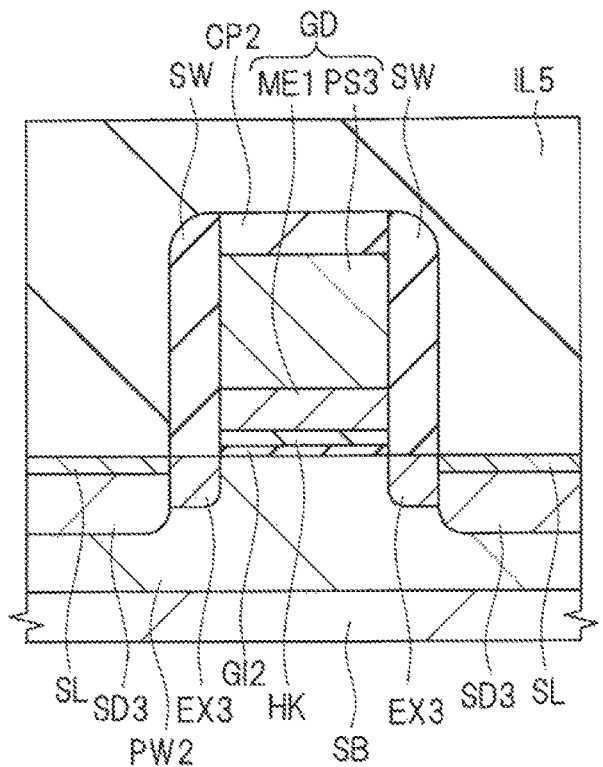
FIG. 78 is a main-portion cross-sectional view of the semiconductor device in the another embodiment during the manufacturing process thereof.

FIG. 78 shows the partially enlarged cross-sectional view of the peripheral circuit region 1B at the same process stage as shown in FIG. 51 described above. As shown in FIG. 51 described above and FIG. 78, in the peripheral circuit region 1B, over the semiconductor substrate SB (p-type well PW2), the dummy gate electrode GD is formed via the laminated film of the insulating films GI2 and HK and, in the semiconductor substrate (p-type well PW2), the n⁻-type semiconductor region EX3 and the n⁺-type semiconductor region SD3 which serve as the source/drain regions of the MISFET are formed. Over the dummy gate electrode GD, the cap insulating film CP2 is formed and, over the side walls of the laminated body including the dummy gate electrode GD and the cap insulating film CP2, the sidewall spacers SW are formed. In addition, over the semiconductor substrate SB, the insulating film IL5 is formed so as to cover the dummy gate electrode GD, the cap insulating film CP2, and the sidewall spacers SW.

Figure 79:
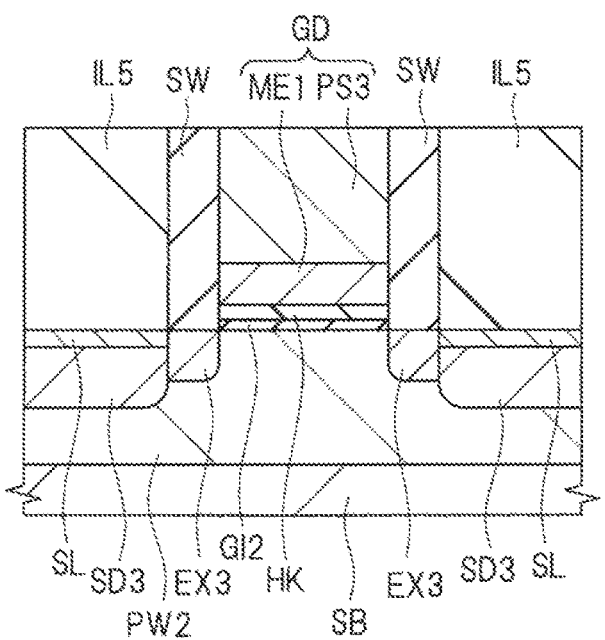
FIG. 79 is a main-portion cross-sectional view of the semiconductor device during the manufacturing process thereof, which is subsequent to FIG. 78.

FIG. 79 shows the same process stage as shown in FIG. 52 described above. After the insulating film IL5 is formed, as shown in FIG. 52 described above and FIG. 79, the upper surface of the insulating film IL5 is polished using a CMP method or the like to expose the upper surface of the dummy gate electrode GD, i.e., the upper surface of the silicon film PS3 included in the dummy gate electrode GD. In the polishing step, the upper surface of the dummy gate electrode GD is exposed so that the cap insulating film CP2 and parts (upper portions) of the sidewall spacers SW are also polished.

Figure 80:
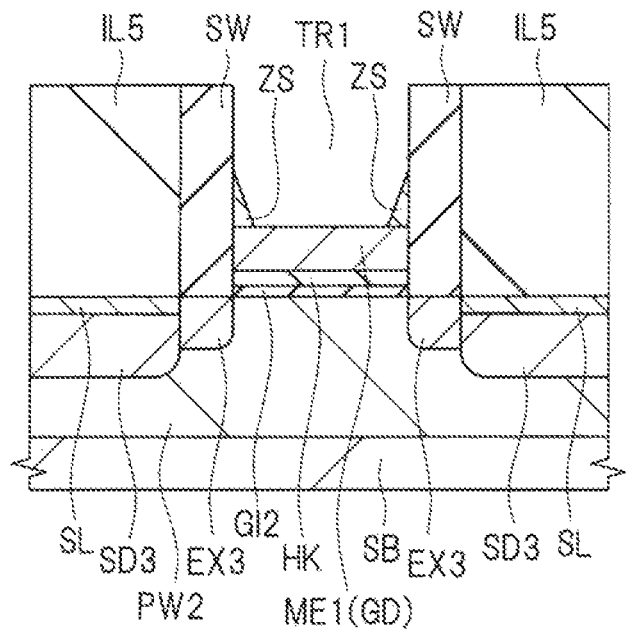
FIG. 80 is a main-portion cross-sectional view of the semiconductor device during the manufacturing process thereof, which is subsequent to FIG. 79.
Figure 81:
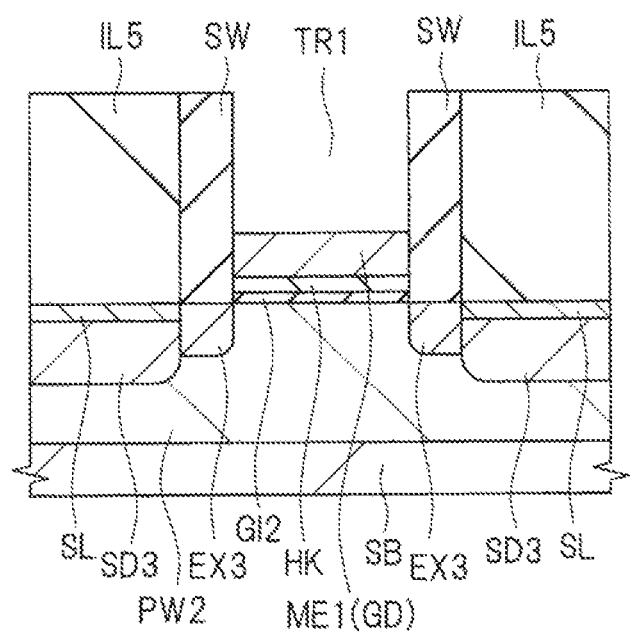
FIG. 81 is a main-portion cross-sectional view of the semiconductor device during the manufacturing process thereof, which is subsequent to FIG. 80.

FIGS. 80 and 81 show the process stage corresponding to FIG. 53 described above. As shown in FIG. 53 described above and FIG. 80, after the photoresist pattern PR6 is formed, the silicon film PS3 included in the dummy gate electrode GD is etched to be removed. At this time, dry etching is preferably used, and anisotropic dry etching is particularly preferred. Thereafter, the photoresist pattern PR6 is removed. The removal of the photoresist pattern PR6 needs to be performed without oxidizing the metal film ME1, and reductive ashing or the like can be used. Note that the reductive ashing is a method which reduces and removes a resist material using reducing radicals of hydrogen or the like.

However, when the silicon film PS3 included in the dummy gate electrode GD is dry-etched, as shown in FIG. 80, residues ZS of the silicon film PS3 resulting from the etching thereof may remain over the metal film ME1 included in the dummy gate electrode GD. Since the metal film is embedded in the trench TR1, the resides ZS of the silicon film PS3 resulting from the etching thereof are preferably removed. Therefore, the residues ZS are removed by wet treatment (wet etching), and FIG. 81 shows the state where the residues ZS have been removed by the wet treatment. For the wet treatment (wet etching), e.g., ammonia, potassium hydroxide, or the like can be used appropriately.

However, after the silicon film PS3 included in the dummy gate electrode GD is dry-etched and before the residues ZS of the silicon film PS3 resulting from the etching thereof are removed by wet treatment using ammonia or potassium hydroxide, treatment for removing an oxide film using a hydrofluoric acid (aqueous solution of a hydrofluoric acid) or the like is preferably performed as pre-treatment. The oxide film is formed through the oxidization of the surfaces of the residues ZS of the silicon film PS3 resulting from the etching thereof. The oxide films in the surfaces of the residues ZS are hard to remove by wet treatment using ammonia, potassium hydroxide, or the like. Therefore, it is preferable to remove the oxide films in the surfaces of the residues ZS first by wet treatment (wet etching) using a hydrofluoric acid or the like as pre-treatment and then remove the entire residues ZS by wet treatment using ammonia, potassium hydroxide, or the like. This allows the residues ZS to be reliably removed.

However, in the case where the metal film ME1 is not formed and the entire dummy gate electrode GD is formed of a silicon film unlike in Embodiment 2, it follows that the insulating film HK is exposed to dry etching for removing the silicon film, to the wet treatment subsequently performed using a hydrofluoric acid or the like, and further to the wet treatment subsequently performed using ammonia, potassium hydroxide, or the like. This may give damage to the insulating film HK functioning as the high-dielectric-constant gate insulating film. In terms of maximally improving the reliability of the semiconductor device, it is desired to minimize the damage given to the insulating film HK functioning as the high-dielectric-constant gate insulating film.

By contrast, in Embodiment 2, in the dummy gate electrode GD, the metal film ME1 is present under the silicon film PS3 and can function as a protective film for the insulating film HK. Since the metal film ME1 is present over the insulating film HK, when the silicon film PS3 of the dummy gate electrode GD is removed, it is possible to prevent the insulating film HK from being damaged. For example, in the dry etching for removing the silicon film PS3 of the dummy gate electrode GD, in the wet treatment subsequently performed using a hydrofluoric acid or the like, and in the wet treatment subsequently performed using ammonia, potassium hydroxide, or the like, the insulating film HK is not exposed. As a result, it is possible to prevent the insulating film HK from being damaged. This can improve the reliability of the MISFET having the insulating film HK as the gate insulating film and improve the reliability of the manufactured semiconductor device. Therefore, it is possible to improve the performance of the semiconductor device.

Figure 82:
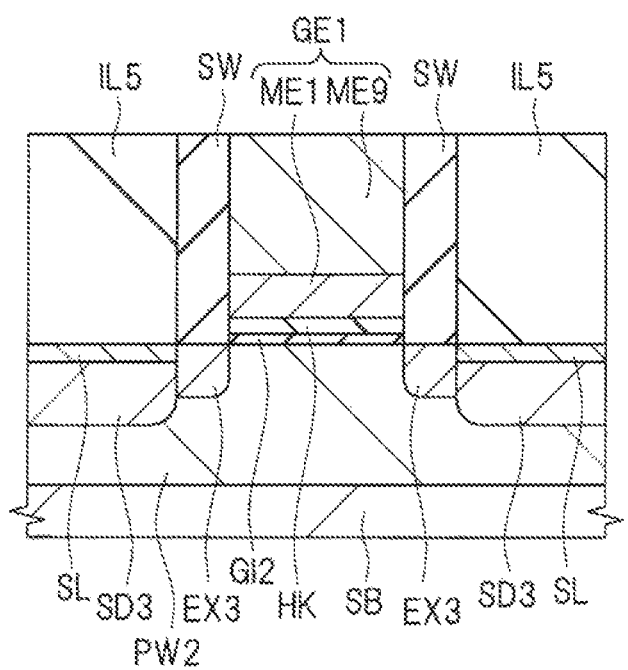
FIG. 82 is a main-portion cross-sectional view of the semiconductor device during the manufacturing process thereof, which is subsequent to FIG. 81.

Then, as shown in FIG. 82, the metal film ME9 is embedded as a conductive film in the trench TR1. The metal film ME9 embedded in the trench TR1 is formed over the metal film ME1 that has formed the dummy gate electrode GD. The metal film ME2 that has formed the dummy gate electrode GD and the metal film ME9 embedded in the trench TR1 form the gate electrode GE1 which functions as the gate electrode of the MISFET. In the case of FIG. 58 described above, the metal film ME9 corresponds to the foregoing metal films ME3, ME4, and ME5. In the case of FIG. 63 described above, the metal film ME9 corresponds to the metal film ME6.

When the silicon film PS3 of the dummy gate electrode GD is removed, the metal film ME1 of the dummy gate electrode GD can function as a protective film for the insulating film HK. The metal film ME1 of the dummy gate electrode GD also serves as the metal film in the first layer (lowermost layer) of the gate electrode GE1 which is the metal gate electrode. Accordingly, in Embodiment 2 described above, by forming the dummy gate electrode GD not of a single-layer silicon film, by of the laminated film of the metal film ME1 and the silicon film PS3 over the metal film ME1, it is possible to inhibit or prevent the insulating film HK from being damaged and reliably form the metal electrode (which is the gate electrode GE1 herein) using the dummy gate electrode GD.

Therefore, in Embodiment 2, a material for the metal film ME1 is selected preferably from the viewpoint of forming the metal film ME1 of a material appropriate for the metal film for the metal gate electrode and from the viewpoint of unlikeliness to cause a problem (such as e.g., the etching of the metal film ME1 or the alteration thereof) when the silicon film PS3 of the dummy gate electrode GD is removed. From these viewpoints, in Embodiment 2, as the metal film ME1, a titanium nitride (TiN) film, a titanium (Ti) film, a tantalum nitride (TaN) film, a tantalum (Ta) film, or a titanium aluminum (TiAl) film can be used appropriately.

Embodiment 3

Referring to the drawings, a method of manufacturing a semiconductor device in Embodiment 3 will be described.

FIGS. 83 to 87 are main-portion cross-sectional views of the semiconductor device in Embodiment 3 during the manufacturing process thereof, in which substantially the same cross-sectional regions as shown in FIGS. 5 to 9, 11 to 40, 44 to 69, 71 to 73, and 75 to 77 described above are shown.

In Embodiment 2 described above, in Step S19 described above, the insulating film HK which is the high-dielectric-constant film is formed and used as the high-dielectric-constant gate insulating film of the MISFET. On the other hand, in Embodiment 3, after the dummy gate electrode GD is removed, an insulating film (corresponding to an insulating film HK2 described later) for the high-dielectric-constant gate insulating film of the MISFET is formed. A specific description will be given below.

In Embodiment 3, in Step S19 described above, the insulating film HK which is the high-dielectric constant film is not formed. By performing otherwise the same manufacturing process as in Embodiment 2 described above to obtain a structure corresponding to FIG. 52 described above and then forming the same photoresist pattern PR6 as in Embodiment 2 described above, the structure shown in FIG. 83 is obtained.

At the stage at which the photoresist pattern PR6 is formed, Embodiment 3 is different from Embodiment 2 described above in the following point. That is, in Embodiment 2 described above, the laminated film of the insulating film GI2 and the insulating film HK is interposed between the dummy gate electrode GD and the semiconductor substrate SB (p-type well PW2). By contrast, in Embodiment 3, the insulating film GI2 is interposed between the dummy gate electrode GD and the semiconductor substrate SB (p-type well PW2), but the insulating film HK is not interposed therebetween. Embodiment 3 is otherwise same as Embodiment 2 described above so that the repeated description thereof is omitted. In Embodiment 3 also, in the same manner as in Embodiment 2 described above, the dummy gate electrode GD is exposed without being covered with the photoresist pattern PR6.

Figure 84:
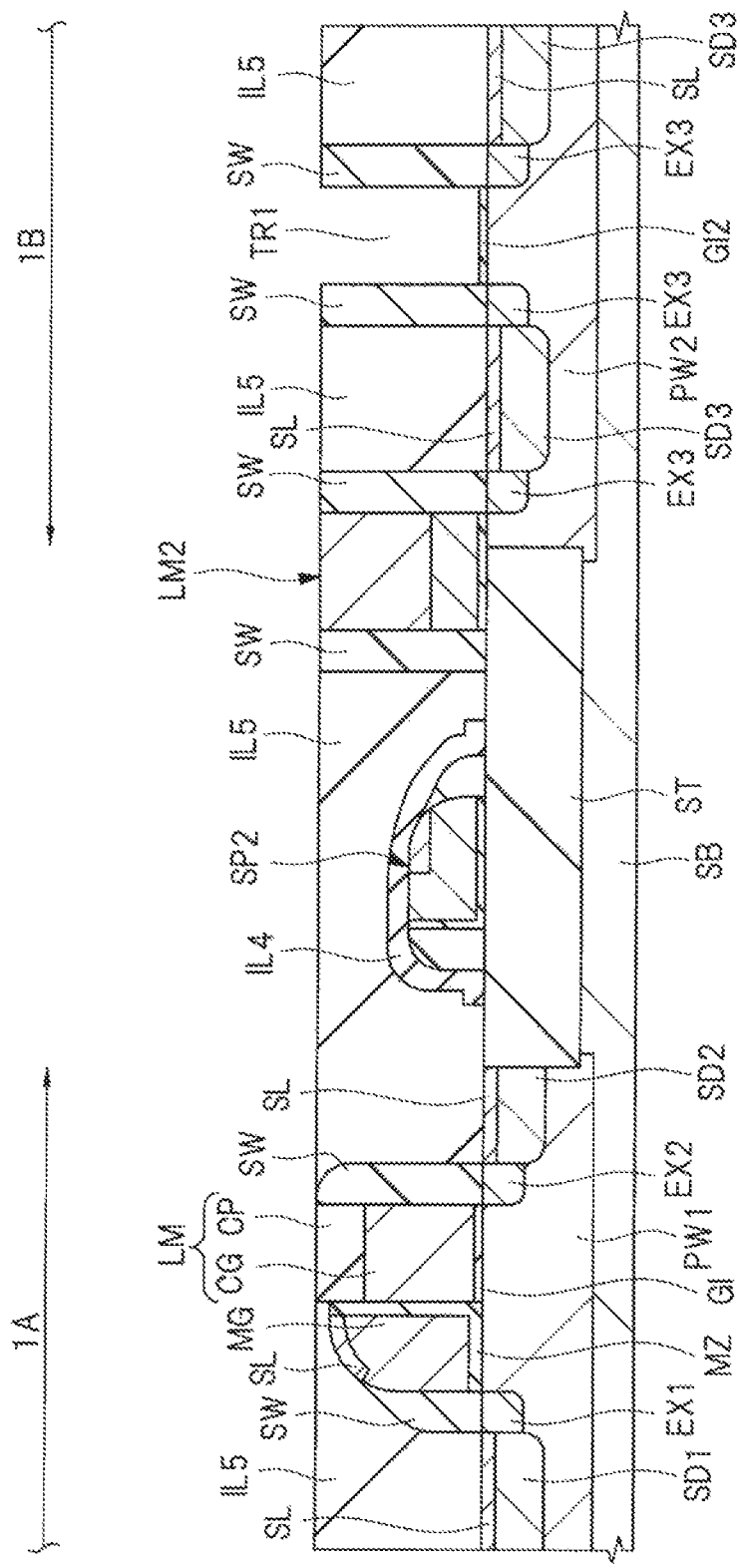
FIG. 84 is a main-portion cross-sectional view of the semiconductor device during the manufacturing process thereof, which is subsequent to FIG. 83.

Next, in Embodiment 3, the silicon film PS3 included in the dummy gate electrode GD is etched to be removed. Thereafter, the photoresist pattern PR6 is removed. Then, the metal film ME1 included in the dummy gate electrode GD is etched to be removed. As a result, the structure shown in FIG. 84 is obtained.

That is, in Embodiment 2 described above, the dummy gate electrode GD is not entirely removed, but the silicon film PS3 included in the dummy gate electrode GD is removed, while the metal film ME1 included in the dummy gate electrode GD is left. By contrast, in Embodiment 3, the dummy gate electrode GD is entirely removed. That is, both of the silicon film PS3 and the metal film ME1 each included in the dummy gate electrode GD are removed.

As a result of removing the dummy gate electrode GD, the trench (depressed portion or recessed portion) TR1 is formed. In the case of Embodiment 2 described above, the trench TR1 is a region from which the silicon film PS3 included in the dummy gate electrode GD has been removed and corresponds to the region where the silicon film PS3 has been present till the removal thereof. By contrast, in the case of Embodiment 3, the trench TR1 is a region from which the dummy gate electrode GD has been removed and corresponds to the region where the dummy gate electrode GD has been present till the removal thereof. In Embodiment 3, the bottom portion (bottom surface) of the trench TR1 is formed of the upper surface of the insulating film GI2, while the side walls (side surfaces) of the trench TR1 are formed of the side surfaces (side surfaces that have been in contact with the dummy gate electrode GD till the removal thereof) of the sidewall spacers SW.

The step of etching the silicon film PS3 included in the dummy gate electrode GD is preferably performed under such a condition that the insulating film IL5, the sidewall spacers SW, and the metal film ME1 are less likely to be etched than the silicon film PS3. Also, the step of etching the metal film ME1 included in the dummy gate electrode GD is preferably performed under such a condition that the insulating film IL5, the sidewall spacers SW, the insulating film GI2, and the semiconductor substrate SB are less likely to be etched than the metal film ME1. This allows the silicon film PS3 and the metal film ME1 each included in the dummy gate electrode GD to be selectively etched in succession. Since the photoresist pattern PR6 covers the entire memory cell region 1A and the laminated body LM2, the memory gate electrode MG, the control gate electrode CG, and the laminated body LM2 are not etched.

Figure 85:
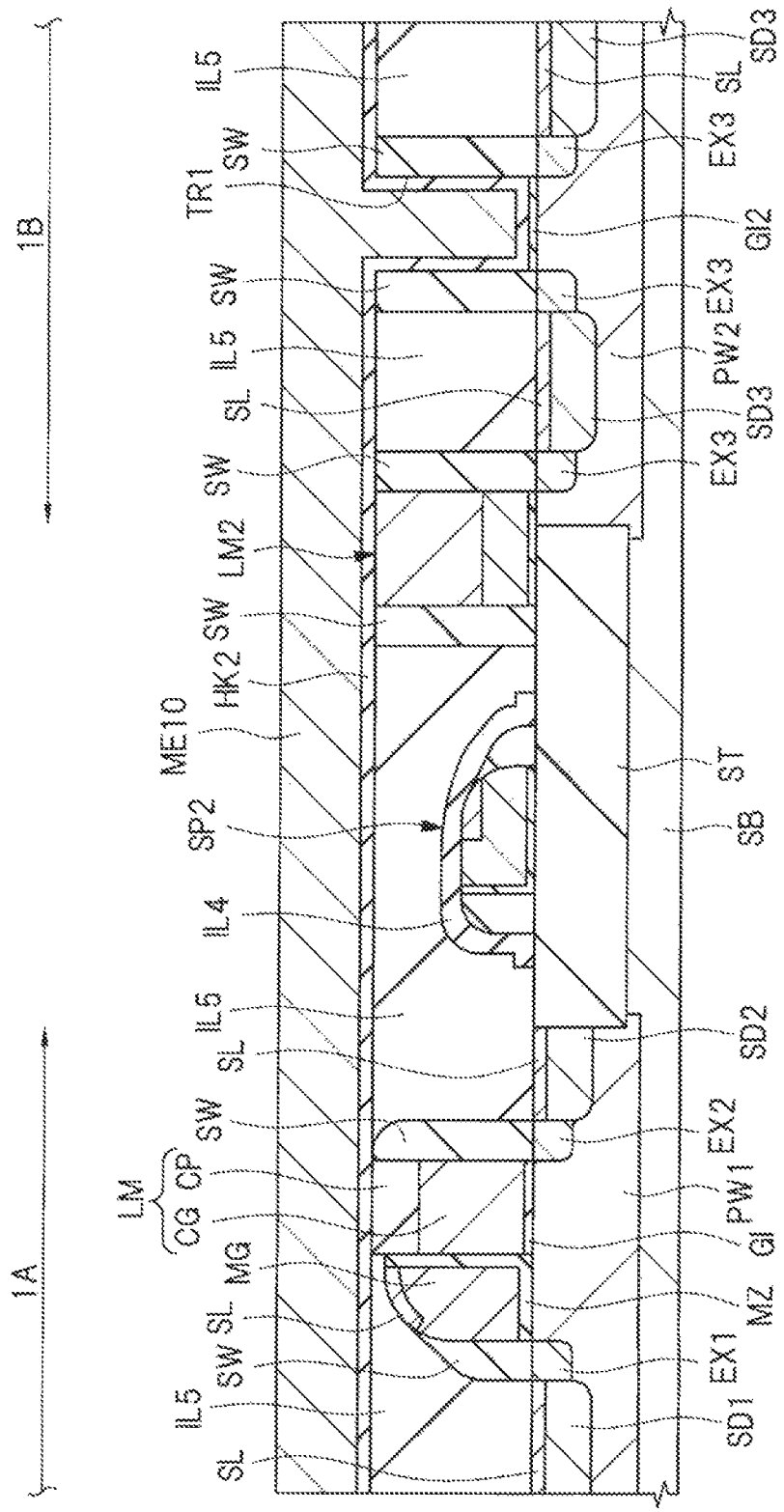
FIG. 85 is a main-portion cross-sectional view of the semiconductor device during the manufacturing process thereof, which is subsequent to FIG. 84.

Next, as shown in FIG. 85, over the semiconductor substrate SB, i.e., over the insulating film IL5 including the inside (bottom portion and side walls) of the trench TR1, the insulating film HK2 is formed. Then, over the insulating film HK2, a metal film ME10 is formed as a conductive film so as to fill the trench TR1.

The insulating film HK2 is a film similar to the foregoing insulating film HK and can be formed by a similar method. Accordingly, similarly to the foregoing insulating film HK, the insulating film HK2 is also a high-dielectric-constant film. Examples of a material for the insulating film HK2 are also the same as those of the foregoing insulating film HK.

Similarly to the foregoing metal film ME3 and the foregoing metal film ME9, the metal film ME10 is a conductive film showing metal conduction. The metal film ME10 is not limited to a single-element metal film (pure metal film) and an alloy film and may also be a metal compound film (such as a metal nitride film or a metal carbide film) showing metal conduction. The metal film ME10 can also be a laminated metal film. The metal film ME10 can be formed using, e.g., a sputtering method or the like.

Figure 86:
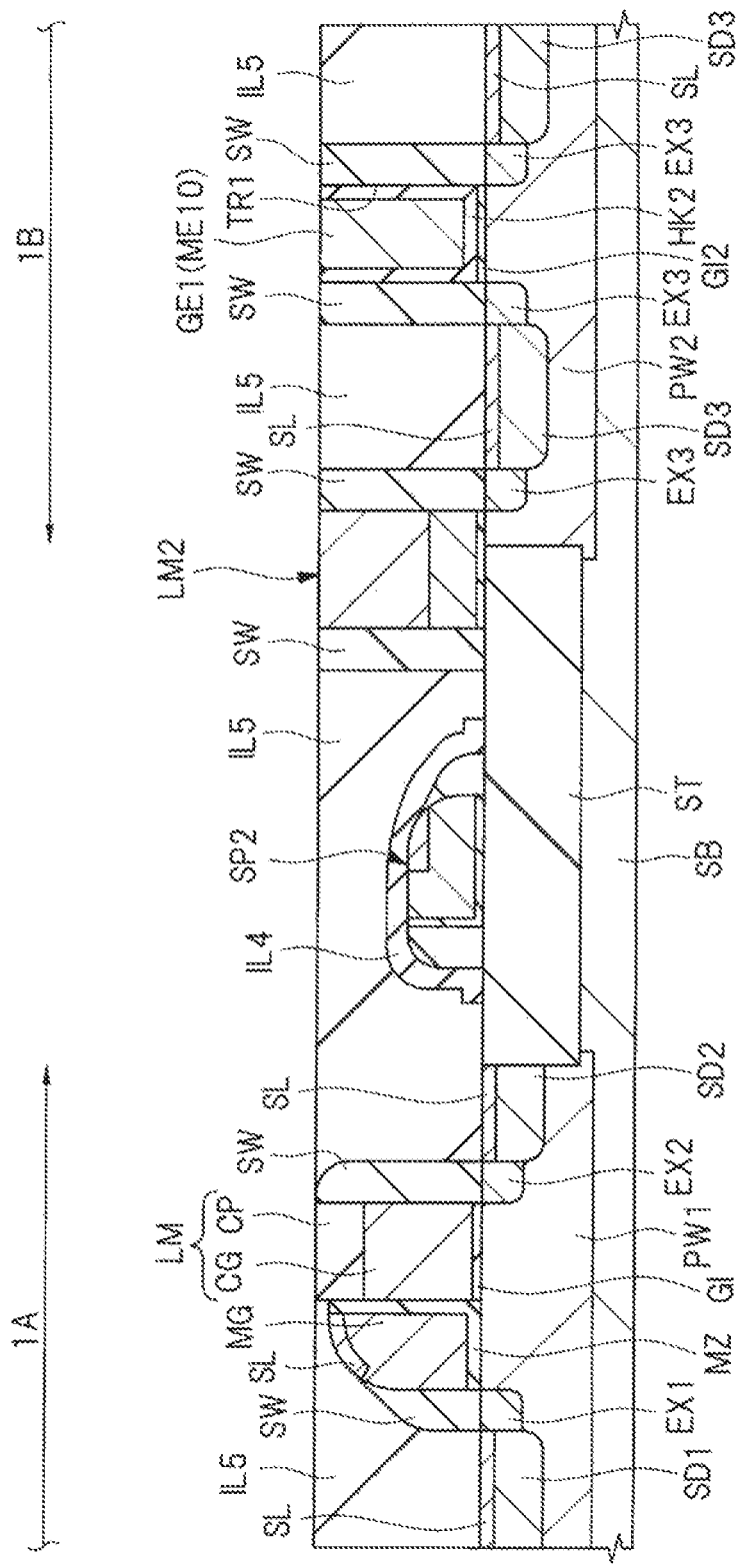
FIG. 86 is a main-portion cross-sectional view of the semiconductor device during the manufacturing process thereof, which is subsequent to FIG. 85.

Next, as shown in FIG. 86, the unneeded metal film ME10 and the unneeded insulating film HK2 which are located outside the trench TR1 are removed by a CMP method or the like to be embedded in the trench TR1. This results in a state where the insulating film HK2 and the metal film ME10 are embedded in the trench TR1.

The metal film ME10 embedded in the trench TR1 serves as the gate electrode GE1 of the MISFET, and the insulating film HK2 embedded in the trench TR1 functions as the gate insulating film of the MISFET. The gate electrode GE1 is the metal gate electrode. The insulating film HK2 is formed over the bottom portion (bottom surface) and side walls of the trench TR1. The gate electrode GE1 has the bottom portion (bottom surface) and side walls (side surfaces) thereof which are adjacent to the insulating film HK2. Between the gate electrode GE1 and the semiconductor substrate SB (p-type well PW2), the insulating films GI2 and HK2 are interposed. Between the gate electrode GE1 and each of the sidewall spacers SW, the insulating film HK2 is interposed. The insulating films GI2 and HK2 immediately under the gate electrode GE1 function as the gate insulating film of the MISFET. However, the insulating film HK2 that is the high-dielectric-constant film functions as a high-dielectric-constant gate insulating film.

In Embodiment 3 also, the subsequent process is the same as in Embodiment 2 described above. That is, after the steps in FIGS. 59 to 61 described above or the steps in FIGS. 64 to 67 are performed, the steps in FIGS. 59 to 61 described above can be performed.

Since the manufacturing process in Embodiment 3 is also basically the same as the manufacturing process in Embodiment 1 described above, substantially the same effect as described above in Embodiment 1 can also be obtained in Embodiment 3. However, the conductive films for the gate electrode GE or the conductive films for forming the gate electrode GE described above in Embodiment 1 are referred to as the conductive films for the dummy gate electrode GD or the conductive films for forming the dummy gate electrode GD in the case of Embodiment 3. Specifically, each of the conductive films for forming the gate electrode GE in Embodiment 1 described above or the conductive films for forming the gate electrode GE in Embodiment 3 corresponds to the laminated film of the foregoing metal film ME1 and the silicon film PS3.

In Embodiment 3, in addition to the effect obtained in Embodiment 1 described above, an effect as shown below can also be obtained.

That is, in Embodiment 3, after the dummy gate electrode GD is removed, the conductive film is embedded in the region (corresponding to the foregoing trench TR1) from which the dummy gate electrode GD has been removed to form the gate electrode GE1 of the MISFET. The conductive film corresponds to the foregoing metal film ME10. Consequently, the gate electrode GE1 is kept appropriately from receiving heat loads resulting from various heating steps prior to the formation of the conductive film (corresponding to the foregoing metal film ME10). For example, the gate electrode GE1 is kept appropriately from receiving the heat load during the activation anneal in Step S31 described above. As a result, it is possible to inhibit or prevent the reliability of the MISFET in the peripheral circuit region 1B, as well as the performance thereof, from being degraded by the reception of the heat load by the gate electrode of the MISFET. Therefore, it is possible to further improve the performance of the semiconductor device.

In particular, the metal gate electrode includes a metal film and, when the metal film receives a heat load, the reliability of the MISFET, as well as the performance thereof, may be degraded. In Embodiment 3, the entire metal film forming the metal gate electrode can be formed after the removal of the dummy gate electrode GD. This can further improve the reliability of the MISFET including the metal gate electrode, as well as the performance thereof.

In Embodiment 3, after the removal of the dummy gate electrode GD, the insulating film HK2 as the high-dielectric-constant gate insulating film is formed. As a result, the insulating film HK2 as the high-dielectric-constant gate insulating film is kept appropriately from receiving heat loads resulting from various heating steps prior to the formation of the insulating film HK2. For example, the insulating film HK2 is kept appropriately from receiving the heat load during the activation anneal in Step S31 described above. As a result, it is possible to inhibit or prevent the reliability of the MISFET in the peripheral circuit region 1B, as well as the performance thereof, from being degraded by the reception of the heat load by the high-dielectric-constant gate insulating film of the MISFET. Therefore, it is possible to further improve the performance of the semiconductor device.

Next, referring to FIGS. 87 to 92, a description will be given of the advantage provided by forming the dummy gate electrode GD not of a single-layer silicon film, but of the laminated film of the metal film ME1 and the silicon film PS3 over the metal film ME1 in Embodiment 3.

FIGS. 87 to 92 are main-portion cross-sectional views of the semiconductor device in Embodiment 3 during the manufacturing process thereof, which show partially enlarged cross-sectional views of the peripheral circuit region 1B, similarly to FIGS. 78 to 82 described above.

Figure 83:
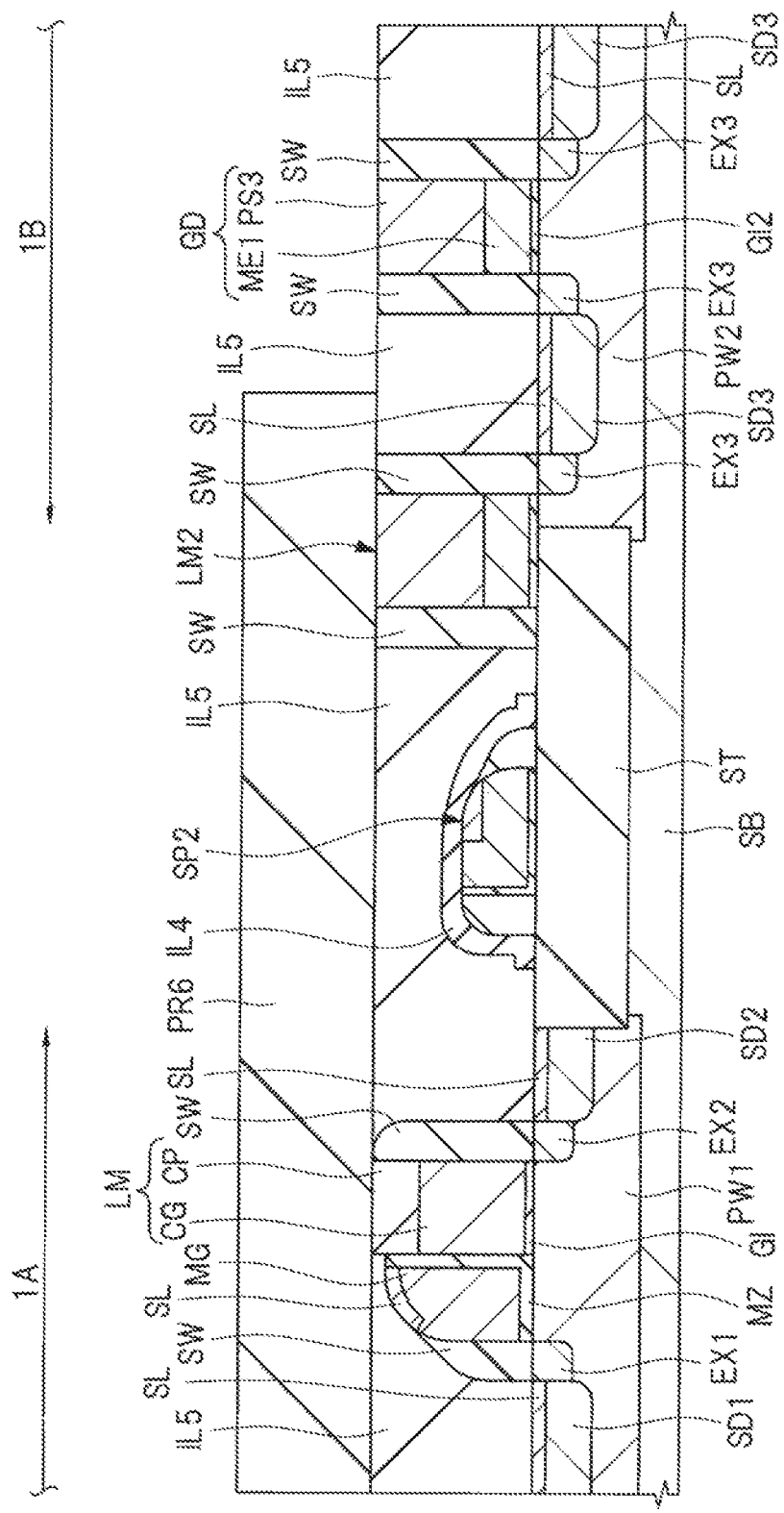
FIG. 83 is a main-portion cross-sectional view of a semiconductor device in still another embodiment during the manufacturing process thereof.
Figure 87:
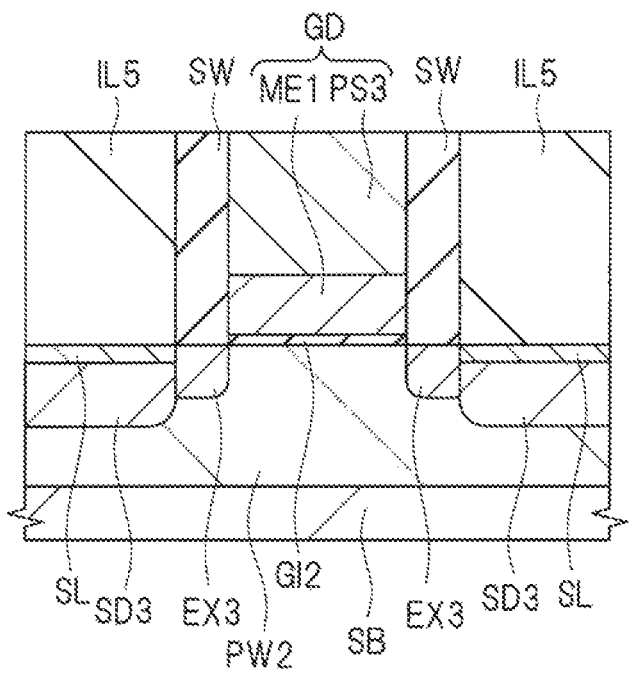
FIG. 87 is a main-portion cross-sectional view of the semiconductor device in the still another embodiment during the manufacturing process thereof.

FIG. 87 shows the partially enlarged cross-sectional view of the peripheral circuit region 1B at the same process stage as shown in FIG. 83 described above.

FIG. 87 shows the process stage corresponding to FIG. 79 described above. Embodiment 3 in FIG. 87 is different from Embodiment 2 in FIG. 79 described above in that, in Embodiment 3, the insulating film HK is not formed while, in Embodiment 2 described above, the laminated film of the insulating film GI2 and the insulating film HK is interposed between the dummy gate electrode GD and the semiconductor substrate SB (p-type well PW2). As a result, as shown in FIG. 87, a state is established where the dummy gate electrode GD including the metal film ME1 and the silicon film PS3 over the metal film ME1 is formed over the semiconductor substrate SB (p-type well PW2) via the insulating film GI2.

Figure 88:
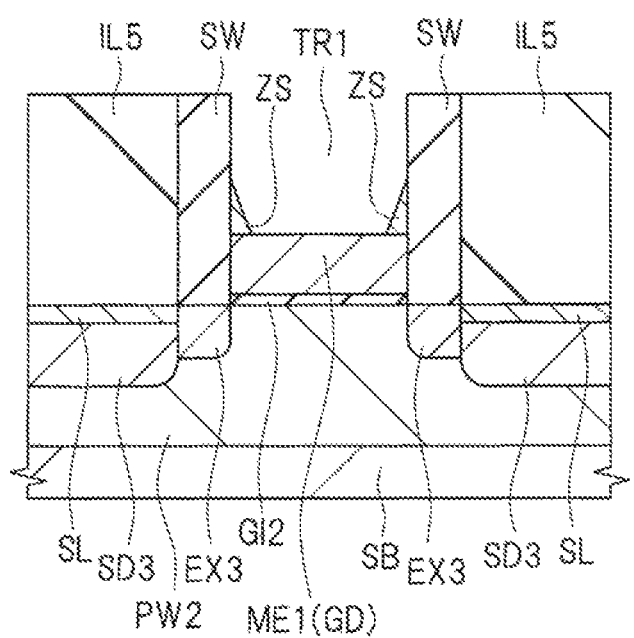
FIG. 88 is a main-portion cross-sectional view of the semiconductor device during the manufacturing process thereof, which is subsequent to FIG. 87.
Figure 89:
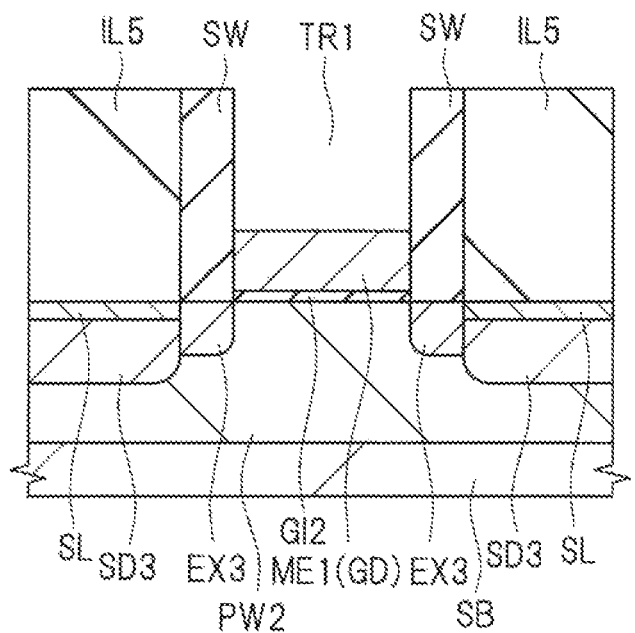
FIG. 89 is a main-portion cross-sectional view of the semiconductor device during the manufacturing process thereof, which is subsequent to FIG. 88.
Figure 90:
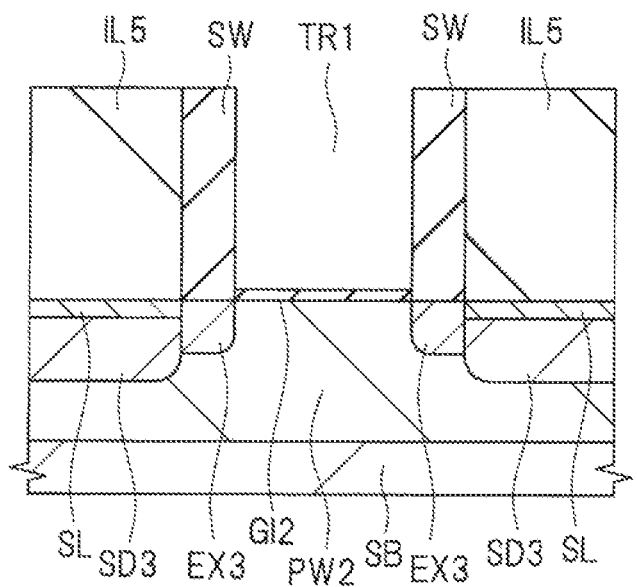
FIG. 90 is a main-portion cross-sectional view of the semiconductor device during the manufacturing process thereof, which is subsequent to FIG. 89.

FIGS. 88 to 90 show the process stage corresponding to FIG. 84 described above.

In Embodiment 3, not only the silicon film PS3 of the dummy gate electrode GD, but also the metal film ME1 is removed. As a method for removing the silicon film PS3 of the dummy gate electrode GD, the same method as the method of removing the silicon film PS3 of the dummy gate electrode GD in Embodiment 2 described above can be used.

That is, as shown in FIGS. 83 and 88 described above, after the photoresist pattern PR6 is formed, the silicon film PS3 included in the dummy gate electrode GD is etched to be removed. At this time, dry etching is used preferably, and anisotropic dry etching is particularly preferred. Thereafter, the photoresist pattern PR6 is removed. The removal of the photoresist pattern PR6 is the same as in Embodiment 2 described above.

When the silicon film PS3 included in the dummy gate electrode GD is dry-etched, as shown in FIG. 88, the residues ZS of the silicon film PS3 resulting from the etching thereof may remain over the metal film ME1 included in the dummy gate electrode GD. Accordingly, the residues ZS are removed by wet treatment (wet etching) using ammonia, potassium hydroxide, or the like. FIG. 89 shows a state where the residues ZS have been removed by wet treatment. In addition, prior to the wet treatment using ammonia, potassium hydroxide, or the like, treatment for removing the oxide films in the surfaces of the residues ZS using a hydrofluoric acid or the like is performed preferably as pre-treatment.

Accordingly, it is preferable to perform dry etching for removing the silicon film PS3 of the dummy gate electrode GD, subsequently perform wet treatment using a hydrofluoric acid or the like to remove oxide films in the surfaces of the residues ZS, and then perform wet treatment using ammonia, potassium hydroxide, or the like to remove the residues ZS.

However, in the case where the metal film ME1 is not formed and the entire dummy gate electrode GD is formed of a silicon film unlike in Embodiment 3, it follows that the insulating film GI2 is exposed to dry etching for removing the silicon film, to the wet treatment subsequently performed using a hydrofluoric acid or the like, and further to the wet treatment subsequently performed using ammonia, potassium hydroxide, or the like. This may give damage to the insulating film GI2, cause the etching of the insulating film GI2, or give damage to the semiconductor substrate SB, but it is desired to minimize the possibility thereof.

By contrast, in Embodiment 3, in the dummy gate electrode GD, the metal film ME1 is present under the silicon film PS3 and can function as a protective film for the insulating film GI2 and the semiconductor substrate SB. Since the metal film ME1 is present over the insulating film GI2, when the silicon film PS3 of the dummy gate electrode GD is removed, it is possible to prevent the insulating film GI2 or the semiconductor substrate SB from being damaged or prevent the insulating film GI2 from being etched. For example, in the dry etching for removing the silicon film PS3 of the dummy gate electrode GD, in the wet treatment subsequently performed using a hydrofluoric acid or the like, and in the wet treatment subsequently performing using ammonia, potassium hydroxide, or the like, the insulating film GI2 has not been exposed. As a result, it is possible to prevent the insulating film GI2 or the semiconductor substrate SB from being damaged or prevent the insulating film GI2 from being etched. This can improve the reliability of the MISFET and improve the reliability of the manufactured semiconductor device. Therefore, it is possible to improve the performance of the semiconductor device.

Then, as shown in FIG. 90, the metal film ME1 that has formed the dummy gate electrode GD is removed. The removal of the metal film ME1 is preferably performed by wet treatment (wet etching).

In Embodiment 3, the metal film ME1 of the dummy gate electrode GD is removed and not used as the gate electrode. Accordingly, as a material for the metal film ME1, a material appropriate for a metal film for a metal gate electrode need not be used. Instead, a material for the metal film ME1 is selected preferably from the viewpoint of allowing easy removal of the metal film ME1 without adversely affecting the insulating film GI2 and the semiconductor substrate SB. From this viewpoint, in Embodiment 3, a titanium nitride (TiN) film can be used appropriately as the metal film ME1. It is possible to selectively remove the titanium nitride (TiN) film, while inhibiting the insulating film GI2 made of a silicon oxide film or a silicon oxynitride film or the semiconductor substrate SB from being damaged or etched. For example, using an aqueous hydrogen peroxide or a hydrochloric acid, the metal film ME made of the titanium nitride (TiN) film can be selectively removed.

Figure 91:
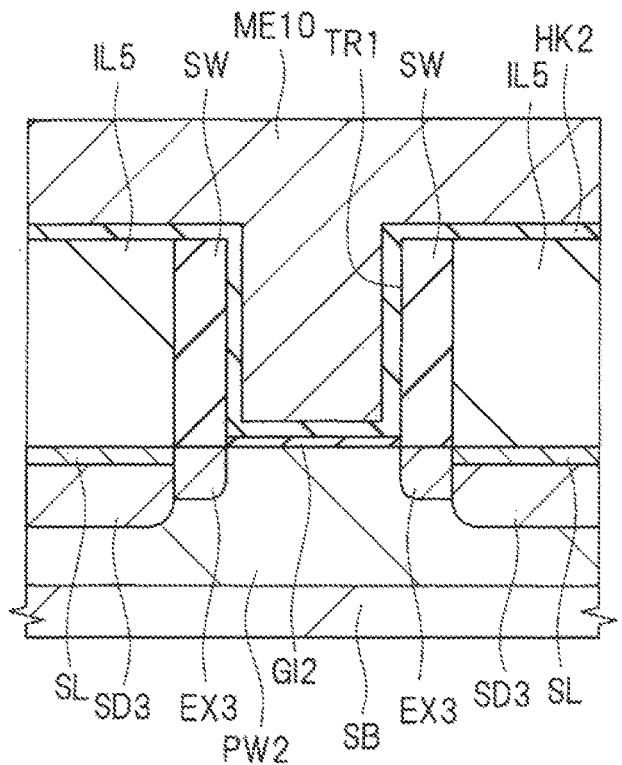
FIG. 91 is a main-portion cross-sectional view of the semiconductor device during the manufacturing process thereof, which is subsequent to FIG. 90.
Figure 92:
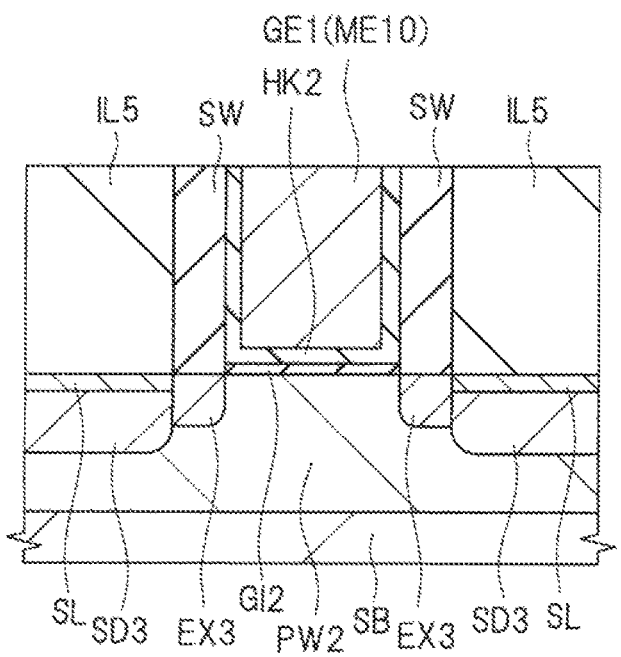
FIG. 92 is a main-portion cross-sectional view of the semiconductor device during the manufacturing process thereof, which is subsequent to FIG. 91.

Then, as shown in FIG. 91 and FIG. 85 described above, the insulating film HK2 for the high-dielectric-constant gate insulating film and the metal film ME10 for the metal gate electrode are successively formed so as to fill the trench TR1. Then, as shown in FIG. 92 and FIG. 86 described above, by removing the metal film ME10 and the insulating film HK2 which are located outside the trench TR1, the insulating film HK2 and the metal film ME10 are embedded in the trench TR1 to be able to form the gate electrode GE1 and the gate insulating film.

In Embodiment 3, the metal film ME1 of the dummy gate electrode GD can function as a protective film for the insulating film GI12 or the semiconductor substrate SB when the silicon film PS3 of the dummy gate electrode GD is removed. Thus, in Embodiment 3, by forming the dummy gate electrode GD not of a single-layer silicon film, but of the laminated film of the metal film ME1 and the silicon film PS3 over the metal film ME1, it is possible to inhibit or prevent the insulating film GI2 or the semiconductor substrate SB from being damaged or etched. This can improve the reliability of the semiconductor device. Therefore, it is possible to improve the performance of the semiconductor device.

Here, it is attempted to generally summarize Embodiment 2 described above and Embodiment 3.

In Embodiment 2, after a part (which is the silicon film PS3 herein) of the dummy gate electrode GD is removed, the conductive film is embedded in the region (corresponding to the foregoing trench TR1) from which the dummy gate electrode GD has been removed to form the gate electrode GE1 of the MISFET. The conductive film corresponds to the foregoing metal film ME3, ME4, or ME5, the foregoing metal film ME6, or the metal film ME9.

On the other hand, in Embodiment 3, after the entire dummy gate electrode GD (which includes the silicon film PS3 and the metal film ME1 herein) is removed, the conductive film is embedded in the region (corresponding to the foregoing trench TR1) from which the dummy gate electrode GD has been removed to form the gate electrode GE1 of the MISFET. The conductive film corresponds to the foregoing metal film ME10.

Thus, if Embodiment 2 described above and Embodiment 3 are to be generally summarized, after at least one part of the dummy gate electrode GD is removed, the conductive film is embedded in the region (corresponding to the foregoing trench TR1) from which the dummy gate electrode GD has been removed to form the gate electrode GE1 of the MISFET.

Also, it can be considered that the method of removing at least one part of the dummy gate electrode GD is used commonly to Embodiment 2 described above and Embodiment 3. That is, after the insulating film IL5 is formed over the semiconductor substrate SB so as to cover the control gate electrode CG, the memory gate electrode MG, and the dummy gate electrode GD, the upper surface of the insulating film IL5 is polished to expose the dummy gate electrode GD, and then at least one part of the dummy gate electrode GD is removed. Thereafter, the conductive film is embedded in the region from which the dummy gate electrode GD has been removed to form the gate electrode GE1.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device comprising a memory cell of a nonvolatile memory formed in a semiconductor substrate located in a first region, and a MISFET formed in the semiconductor substrate located in a second region, the memory cell including a first gate electrode, and a second gate electrode which are formed over the semiconductor substrate to be adjacent to each other, a first gate insulating film formed between the first gate electrode and the semiconductor substrate, and a second gate insulating film formed between the second gate electrode and the semiconductor substrate and having a charge storage portion therein, the MISFET including a third gate electrode formed over the semiconductor substrate, and a third gate insulating film formed between the third gate electrode and the semiconductor substrate, the method comprising the steps of:

(a) providing the semiconductor substrate;

(b) forming, over the semiconductor substrate located in the first region, the first gate electrode via the first gate insulating film, and the second gate electrode via the second gate insulating film;

(c) forming, over the semiconductor substrate, a first insulating film so as to cover the first gate electrode and the second gate electrode;

(d) polishing an upper surface of the first insulating film to planarize the upper surface of the first insulating film;

(e) after the step (d), forming, over the semiconductor substrate, a first film including a first conductive film so as to cover the first gate electrode, the second gate electrode, and the first insulating film;

(f) patterning the first film to form a dummy gate electrode for forming the third gate electrode in the second region;

(g) after the step (f), removing the first insulating film;

(h) after the step (g), forming, over the semiconductor substrate, a second insulating film so as to cover the first gate electrode, the second gate electrode, and the dummy gate electrode;

(i) polishing an upper surface of the second insulating film to expose the dummy gate electrode;

(j) after the step (i), removing at least one part of the dummy gate electrode; and (k) embedding a second conductive film in a region from which the dummy gate electrode has been removed in the step (j) to form the third gate electrode.

2. A method of manufacturing the semiconductor device according to claim 1,
wherein the first conductive film has a first metal film, and a first silicon film over the first metal film, and
wherein the third gate electrode is a metal gate electrode.

3. A method of manufacturing the semiconductor device according to claim 2,
wherein the first metal film is a titanium nitride film.

4. A method of manufacturing the semiconductor device according to claim 2,
wherein, in the step (j), the first silicon film of the dummy gate electrode is removed, and
wherein, in the step (k), the first metal film that has formed the dummy gate electrode and the second conductive film over the first metal film form the third gate electrode.

5. A method of manufacturing the semiconductor device according to claim 2,
wherein, in the step (j), the first silicon film of the dummy gate electrode and the first metal film thereof are removed, and
wherein, in the step (k), the second conductive film forms the third gate electrode.

6. A method of manufacturing the semiconductor device according to claim 2, further comprising, after the step (g) and prior to the step (h), the step of:
(g1) forming a semiconductor region for a source or drain of the memory cell in the semiconductor substrate located in the first region and forming a semiconductor region for a source or drain of the MISFET in the semiconductor substrate located in the second region.

7. A method of manufacturing the semiconductor device according to claim 1, further comprising, after the step (e) and prior to the step (f), the step of:
(e1) removing a portion of the first film which covers the first gate electrode, the second gate electrode, and the first insulating film to leave the first film over the semiconductor substrate located in the second region.

8. A method of manufacturing the semiconductor device according to claim 1,
wherein the step (b) includes the steps of:
(b1) forming, over a main surface of the semiconductor substrate, a third insulating film for the first gate insulating film;
(b2) forming, over the third insulating film, a third conductive film for the first gate electrode;
(b3) patterning the third conductive film to form the first gate electrode in the first region;
(b4) forming, over the main surface of the semiconductor substrate, a fourth insulating film for the second gate insulating film so as to cover the first gate electrode;
(b5) forming, over the fourth insulating film, a fourth conductive film for the second gate electrode;
(b6) etching back the fourth conductive film to leave the fourth conductive film over a side wall of the first gate electrode via the fourth insulating film and thus form the second gate electrode; and
(b7) removing a portion of the fourth insulating film which is uncovered with the second gate electrode.

9. A method of manufacturing the semiconductor device according to claim 8,
wherein each of the third conductive film and the fourth conductive film is a silicon film.

10. A method of manufacturing the semiconductor device according to claim 8,
wherein, in the step (b3), the third conductive film is left in the second region, and
wherein, in the step (c), the first insulating film is formed over the semiconductor substrate so as to cover the first gate electrode, and the second gate electrode each located in the first region, and the third conductive film located in the second region,
the method further comprising, after the step (d) and prior to the step (e), the step of:
(d1) removing the third conductive film from the second region.

11. A method of manufacturing the semiconductor device according to claim 10,
wherein, in the step (b2), over the third insulating film, a first laminated film having the third conductive film, and a fifth insulating film over the third conductive film is formed,
wherein, in the step (b3), the first laminated film is patterned to form a laminated body including the first gate electrode in the first region, while the first laminated film remains in the second region,
wherein, in the step (b4), over the main surface of the semiconductor substrate, the fourth insulating film is formed so as to cover the laminated body,
wherein, in the step (b6), the fourth conductive film is etched back to remain the fourth conductive film over a side wall of the laminated body via the fourth insulating film and thus form the second gate electrode, and wherein, in the step (d1), the first laminated film is removed from the second region.

\* \* \* \* \*